United States Patent
Rabkin et al.

(10) Patent No.: US 8,923,048 B2
(45) Date of Patent: Dec. 30, 2014

(54) 3D NON-VOLATILE STORAGE WITH TRANSISTOR DECODING STRUCTURE

(71) Applicant: SanDisk Technologies Inc., Plano, TX (US)

(72) Inventors: Peter Rabkin, Cupertino, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 66 days.

(21) Appl. No.: 13/733,030

(22) Filed: Jan. 2, 2013

(65) Prior Publication Data

US 2013/0272069 A1    Oct. 17, 2013

Related U.S. Application Data

(60) Provisional application No. 61/624,102, filed on Apr. 13, 2012.

(51) Int. Cl.

| | | |
|---|---|---|
| G11C 11/34 | (2006.01) | |
| H01L 29/792 | (2006.01) | |
| H01L 29/786 | (2006.01) | |
| H01L 27/115 | (2006.01) | |
| H01L 29/66 | (2006.01) | |
| G11C 16/08 | (2006.01) | |
| H01L 21/04 | (2006.01) | |
| H01L 29/423 | (2006.01) | |
| G11C 16/04 | (2006.01) | |
| G11C 16/06 | (2006.01) | |
| H01L 29/78 | (2006.01) | |
| H01L 21/265 | (2006.01) | |

(52) U.S. Cl.
CPC ...... *H01L 29/78642* (2013.01); *H01L 29/7926* (2013.01); *H01L 29/785* (2013.01); *H01L 29/78696* (2013.01); *H01L 27/11556* (2013.01); *H01L 29/66787* (2013.01); *H01L 27/11582* (2013.01); *G11C 16/08* (2013.01); *H01L 29/66477* (2013.01); *H01L 29/66742* (2013.01); *H01L 21/04* (2013.01); *H01L 29/42384* (2013.01); *G11C 16/0483* (2013.01); *H01L 29/6675* (2013.01); *G11C 16/06* (2013.01); *H01L 21/26513* (2013.01)
USPC ............ 365/185.05; 365/185.17; 365/185.33

(58) Field of Classification Search
USPC .......................... 365/185.05, 185–17, 185.33
See application file for complete search history.

(56) References Cited

U.S. PATENT DOCUMENTS

| | | |
|---|---|---|
| 5,315,143 A | 5/1994 | Tsuji |
| 5,442,215 A | 8/1995 | Chae |

(Continued)

FOREIGN PATENT DOCUMENTS

| | | |
|---|---|---|
| EP | 0553774 A1 | 8/1993 |
| JP | 61-125174 A | 6/1986 |

(Continued)

OTHER PUBLICATIONS

International Search Report and Written Opinion of the International Searching Authority dated Jun. 28, 2013, PCT Application No. PCT/US2013/036213, filed Apr. 11, 2013, 10 pages.

(Continued)

*Primary Examiner* — Trong Phan
(74) *Attorney, Agent, or Firm* — Vierra Magen Marcus LLP

(57) ABSTRACT

Disclosed herein are 3D stacked memory devices having WL select gates. The 3D stacked memory device could have NAND strings. The WL select gates may be located adjacent to a word line hookup area of a word line plate. The word line plate may be driven by a word line plate driver and may have many word lines. The WL select gates may select individual word lines or groups of word lines. Therefore, smaller units that the entire block may be selected. This may reduce capacitive loading. The WL select gates may include thin film transistors. 3D decoding may be provided in a 3D stacked memory device using the WL select gates.

30 Claims, 78 Drawing Sheets

(56) References Cited

U.S. PATENT DOCUMENTS

| | | | |
|---|---|---|---|
| 6,667,511 B1* | 12/2003 | Fang | 365/185.33 |
| 7,132,685 B2 | 11/2006 | Chen | |
| 7,558,141 B2 | 7/2009 | Katsumata et al. | |
| 7,588,971 B2 | 9/2009 | Wang et al. | |
| 7,768,013 B2 | 8/2010 | Kim et al. | |
| 8,379,458 B1* | 2/2013 | Or-Bach et al. | 365/185.18 |
| 8,395,942 B2* | 3/2013 | Samachisa et al. | 365/185.17 |
| 8,486,791 B2* | 7/2013 | Lue | 365/185.05 |
| 8,599,616 B2* | 12/2013 | Roizin et al. | 365/185.05 |
| 8,649,219 B2* | 2/2014 | Li et al. | 365/185.17 |
| 8,724,391 B2* | 5/2014 | Nakamura et al. | 365/185.17 |
| 8,724,393 B2* | 5/2014 | Lue et al. | 365/185.18 |
| 2003/0141505 A1 | 7/2003 | Isobe et al. | |
| 2004/0178446 A1 | 9/2004 | Sundaresan | |
| 2005/0158970 A1 | 7/2005 | Chau et al. | |
| 2006/0145144 A1 | 7/2006 | Lee et al. | |
| 2008/0061370 A1 | 3/2008 | Matsuo | |
| 2009/0268522 A1 | 10/2009 | Maejima | |
| 2009/0310415 A1 | 12/2009 | Jin et al. | |
| 2010/0006922 A1 | 1/2010 | Matsuoka et al. | |
| 2011/0233681 A1 | 9/2011 | Matsuo | |
| 2011/0291172 A1 | 12/2011 | Hwang et al. | |

FOREIGN PATENT DOCUMENTS

| | | |
|---|---|---|
| JP | 2-206173 A | 8/1990 |
| JP | 2002009289 A | 1/2002 |

OTHER PUBLICATIONS

Lee et al., "Low-temperature polysilicon TFT with counter-doped lateral body terminal", Electronics Letter, IEE Stevenage, GB, vol. 38, No. 5, Feb. 28, 2002, pp. 255-256, 2 pages.

Fobelets et al., "A novel 3D embedded gate filed effect transistor—Screen-grid FET-Device concept and modelling", Solid State Electronics, Elsevier Science Publishers, Barking, GB, May 2007, vol. 51, No. 5, 8 pages.

Wu et al., "Stacked 3-D Fin-CMOS Technology", IEEE Electron Device Leters, IEEE Service, Jun. 1, 2005, vol. 26, No. 6, 3 pages.

International Search Report and Written Opinion of the International Searching Authority dated Jun. 28, 2013, PCT Application No. PCT/US2013/036208, filed Apr. 11, 2013, 9 pages.

International Search Report and Written Opinion of the International Searching Authority dated Jun. 21, 2013, PCT Application No. PCT/US2013/036217, filed Apr. 11, 2013, 12 pages.

English Abstract of Foreign Patent Reference JP 2-206173, Published Aug. 15, 1990, Applicant NEC Corp, 1 page.

English Abstract of Foreign Patent Reference JP 61-125174, Published Jun. 12, 1986, Applicant Agency IND Science Techn, 1 page.

English Abstract of Foreign Patent Reference JP 2002009289, Published Jan. 11, 2002, Applicant NEC Corp, 1 page.

U.S. Appl. No. 14/020,621, filed Sep. 6, 2013.

Office Action dated Mar. 10, 2014, U.S. Appl. No. 13/733,039, filed Jan. 2, 2013, 20 pages.

U.S. Appl. No. 13/733,039, filed Jan. 2, 2013.

U.S. Appl. No. 13/733,046, filed Jan. 2, 2013.

Restriction Requirement for U.S. Appl. No. 13/733,046, filed Jan. 2, 2013, mailed Apr. 21, 2014.

Response to Office Action mailed Mar. 10, 2014 for U.S. Appl. No. 13/733,039, filed Jan. 2, 2013, filed Jun. 9, 2014.

Response to Restriction Requirement mailed Apr. 21, 2014, for U.S. Appl. No. 13/733,046, filed Jan. 2, 2013, filed Jun. 20, 2014.

Notice of Allowance for U.S. Appl. No. 13/733,039, filed Jan. 2, 2013, mailed Jun. 25, 2014.

Hung et al., "A Highly Scalable Vertical Gate (VG) 3D NAND Flash with Robust Program Disturb Immunity Using a Novel PN Diode Decoding Structure," 2011 Symposium on VLSI Technology Digest of Technical Papers, Jun. 2011, pp. 68-69, 2 pages.

Kalkofen et al., "A simple two-step phosphorus doping process for shallow junctions by applying a controlled adsorption and diffusion in an oxidising ambient," Materials Science and Engineering, Symposium B, Dec. 2004, pp. 362-366, vols. 114-115, Elsevier B.V., 5 pages.

Mazzocchi et al., "Boron and Phosphorus dopant activation in germanium using Laser annealing with and without preamorphization implant," 17th IEEE International Conference on Advanced Thermal Processing of Semiconductors, RTP 2009, Sep. 29-Oct. 2, 2009, 5 pages.

Paviet-Salomon et al., "Experimental and analytical study of saturation current density of laser-doped phosphorus emitters for silicon solar cells," Solar Energy Materials & Solar Cells, Aug. 2011, pp. 2536-2539, vol. 95, Issue 8, Elsevier B.V., 4 pages.

Non-final Office Action dated Aug. 18, 2014, U.S. Appl. No. 13/733,046, filed Jan. 2, 2013.

Response to Office Action dated Nov. 3, 2014, U.S. Appl. No. 13/733,046, filed Jan. 2, 2013.

* cited by examiner

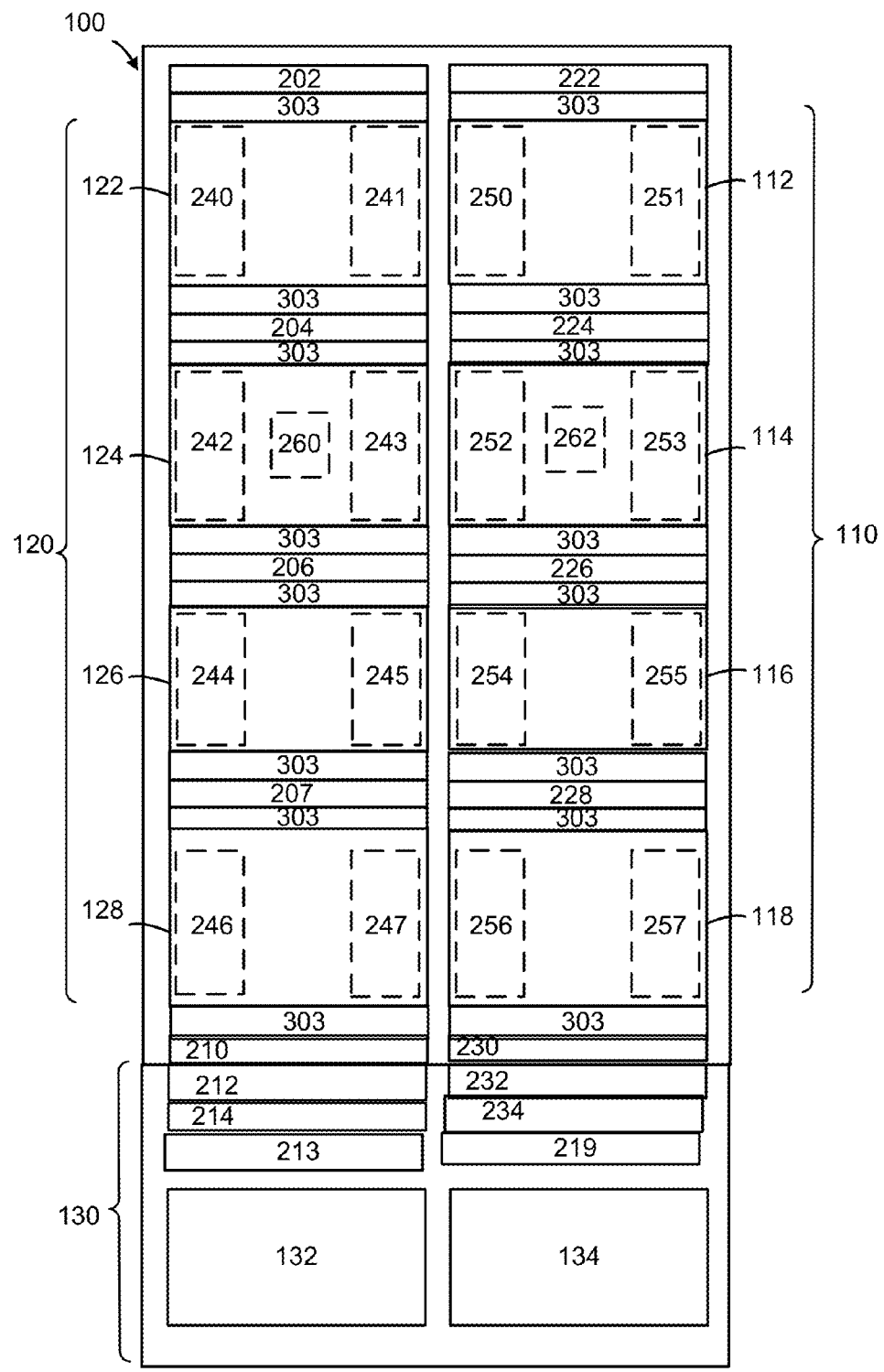

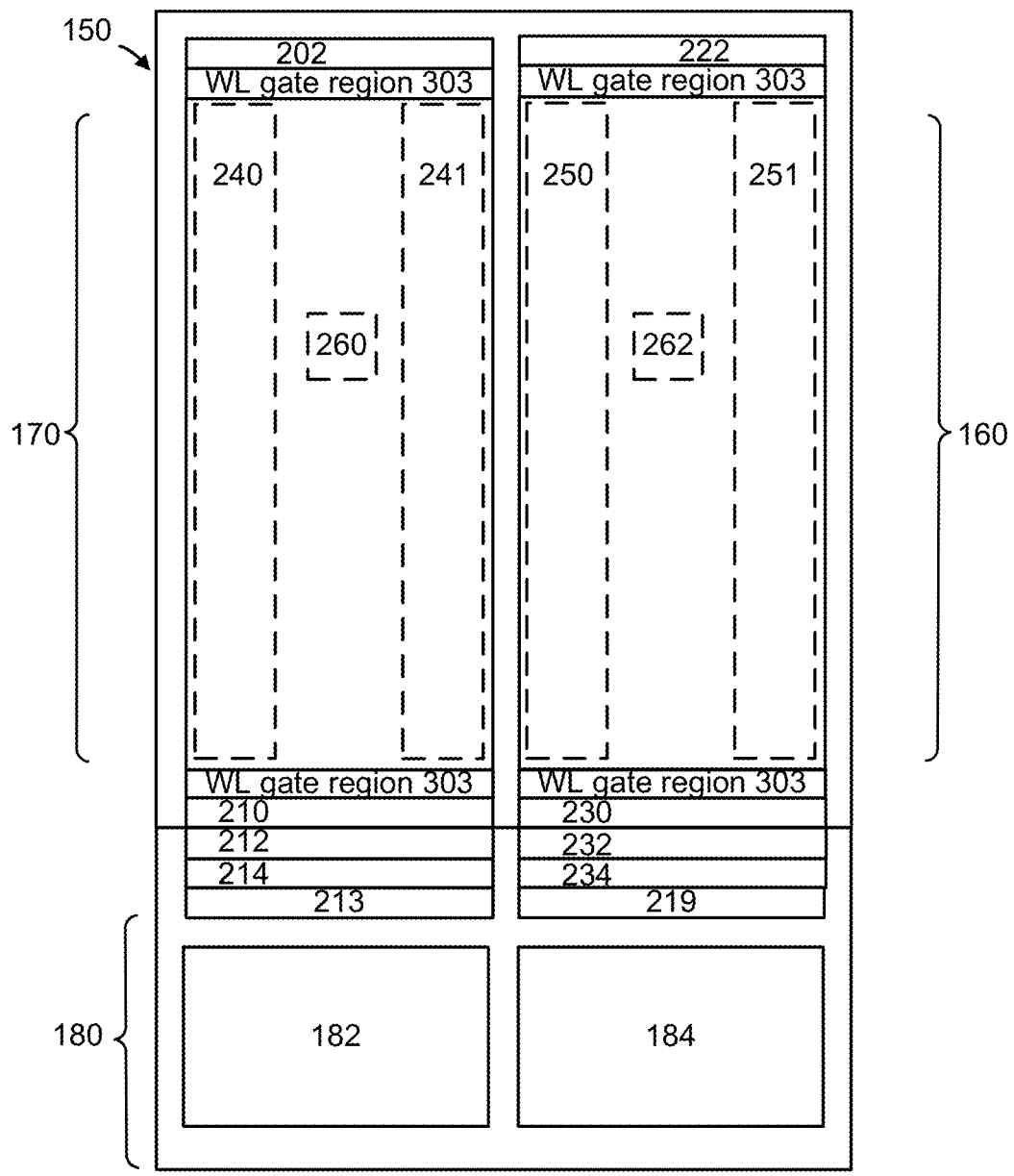

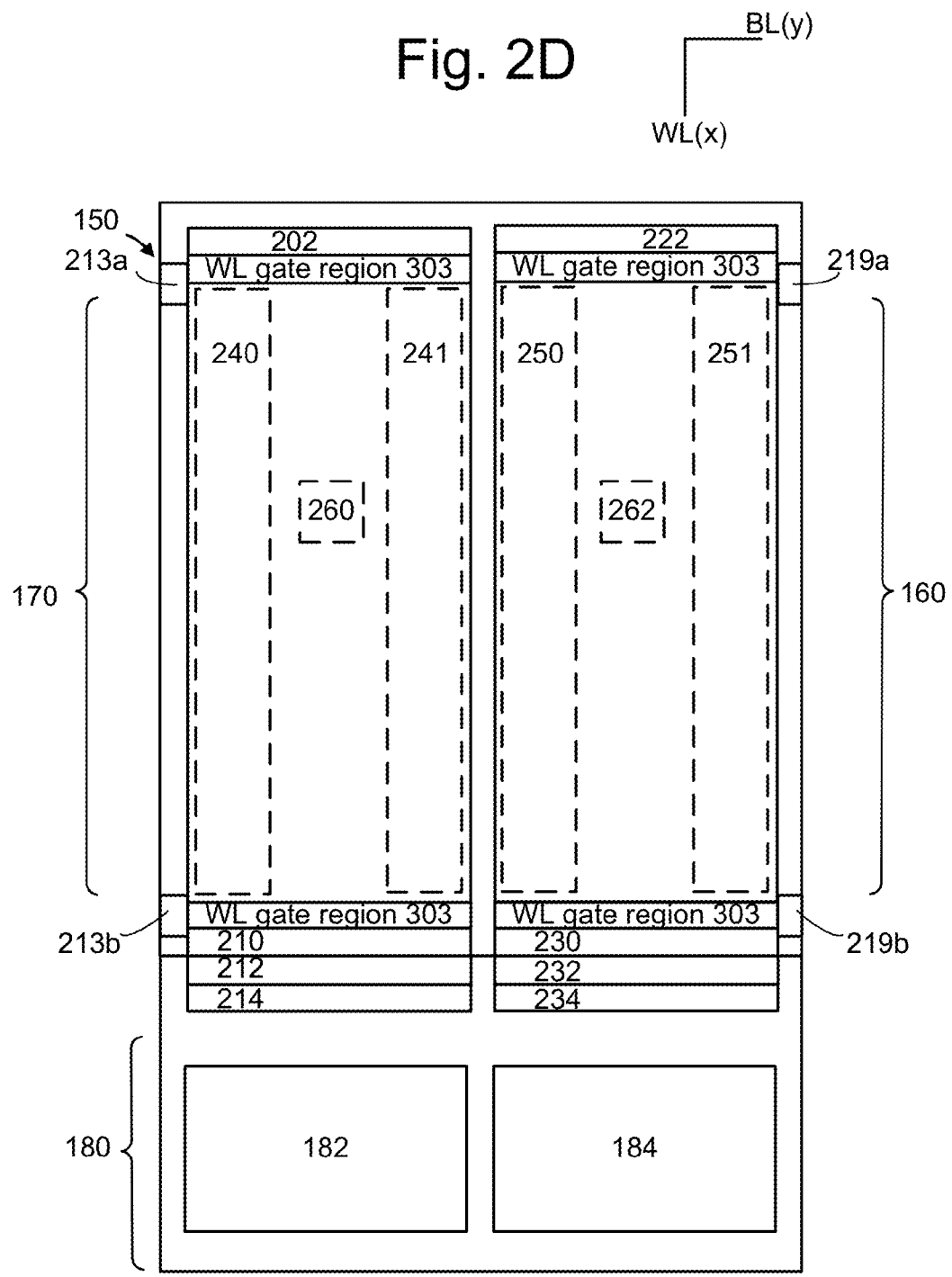

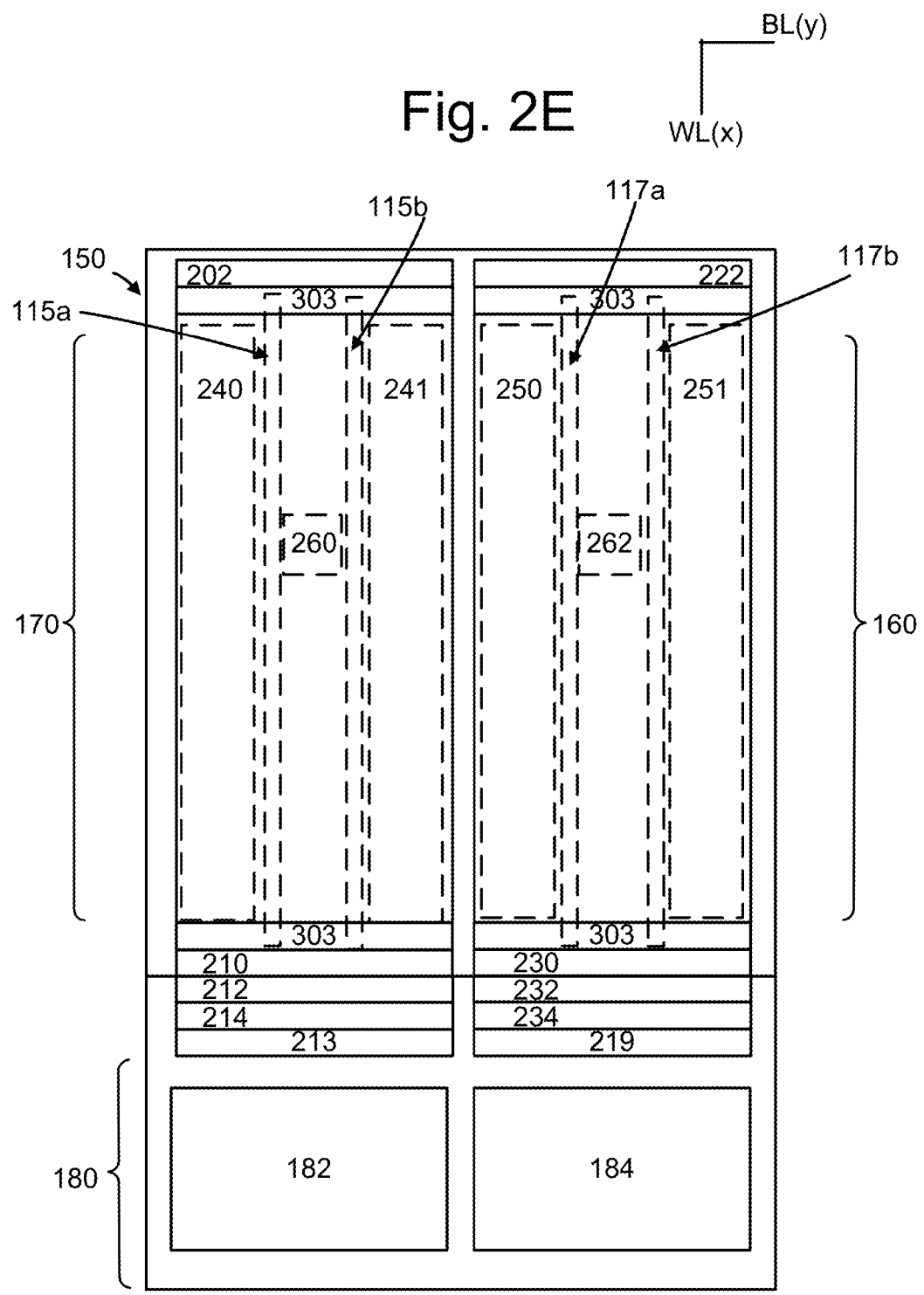

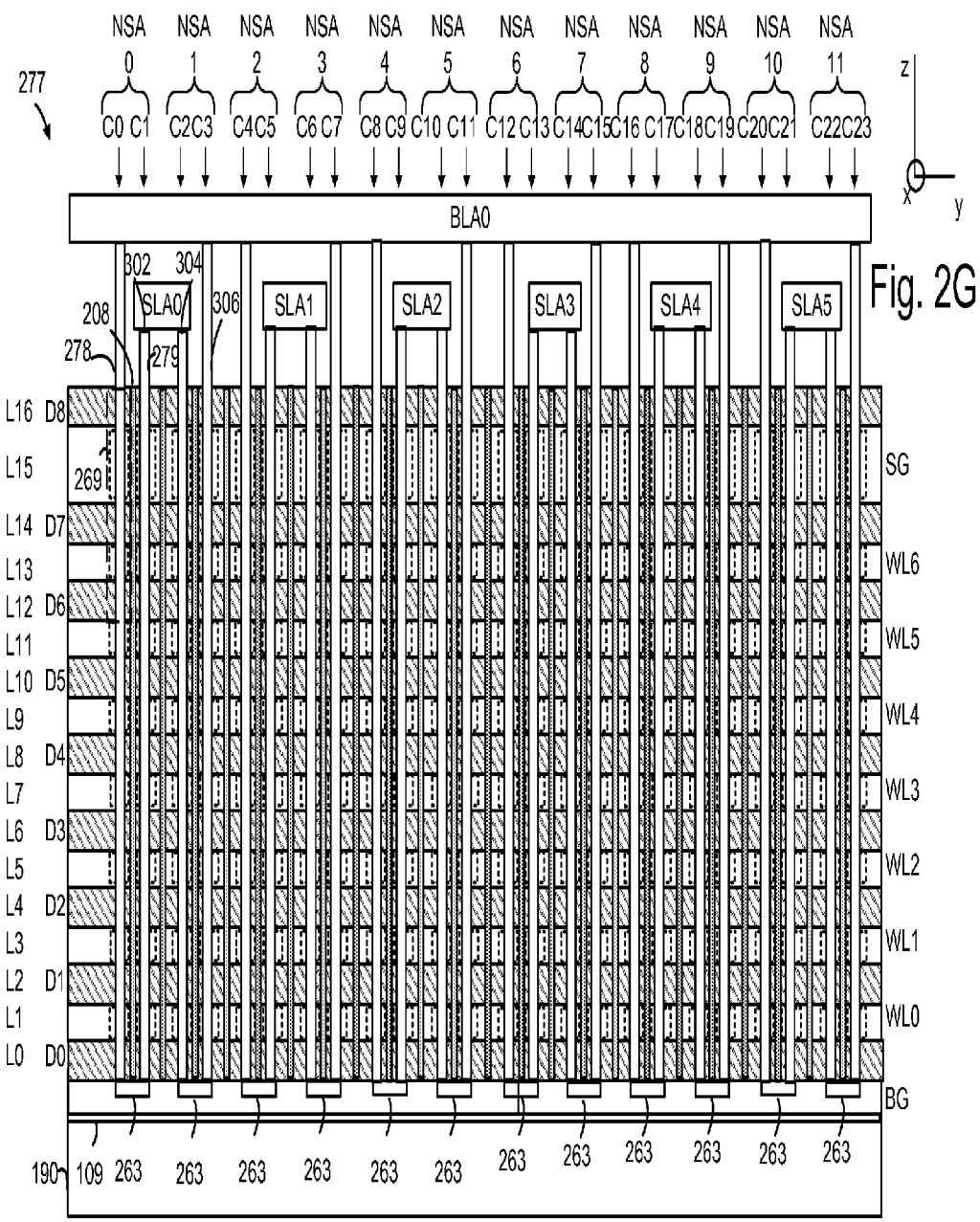

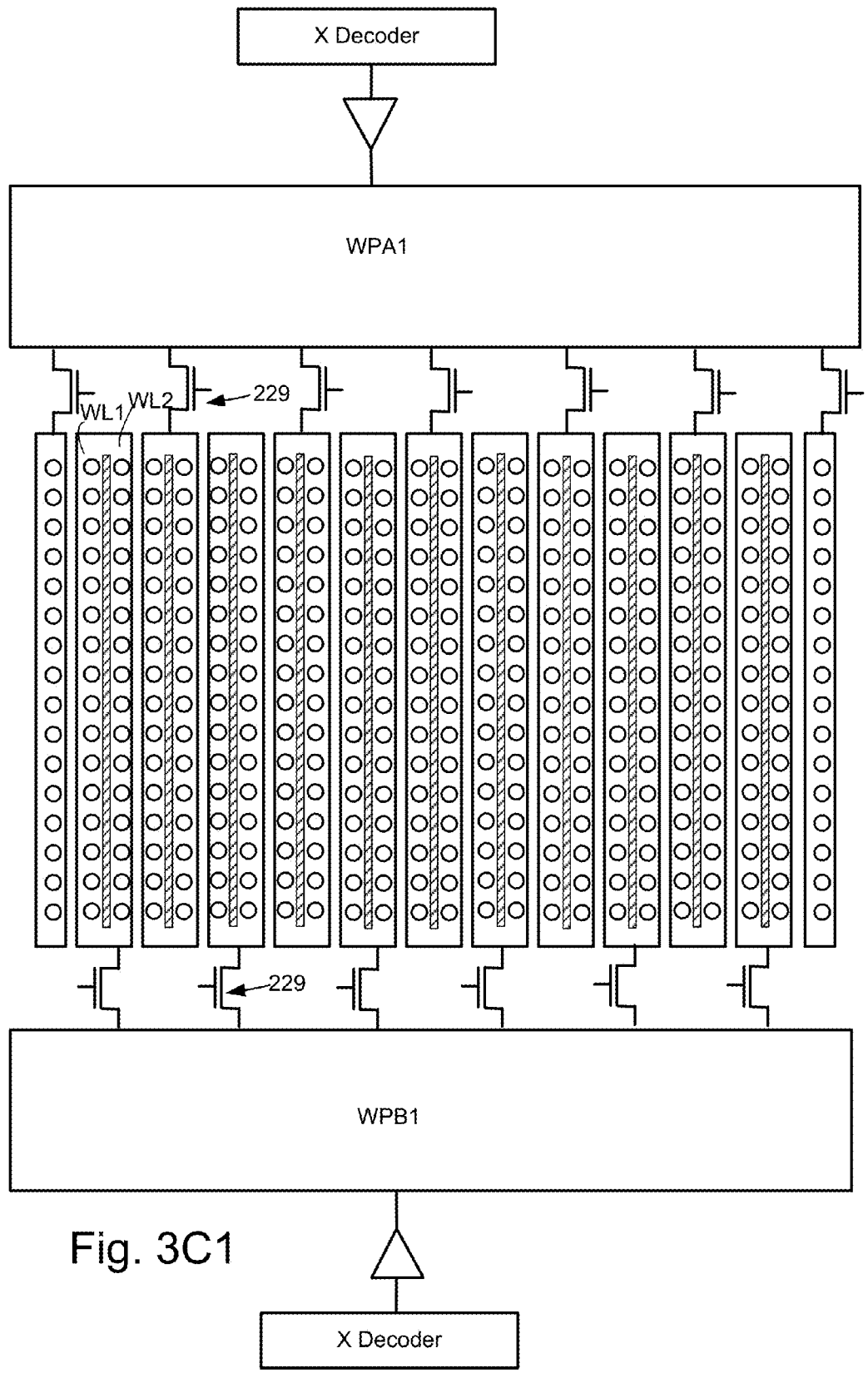
Fig. 3C1

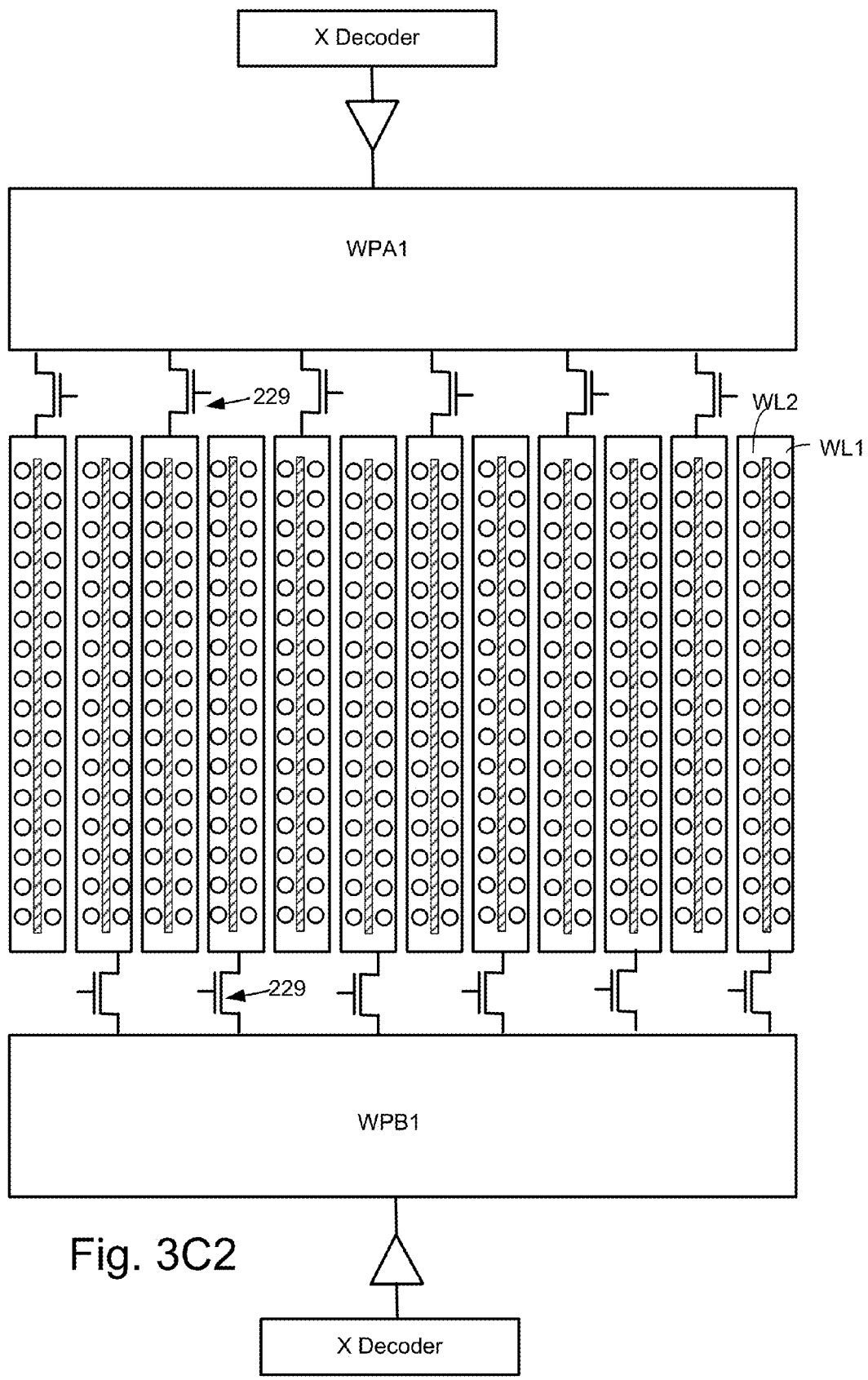
Fig. 3C2

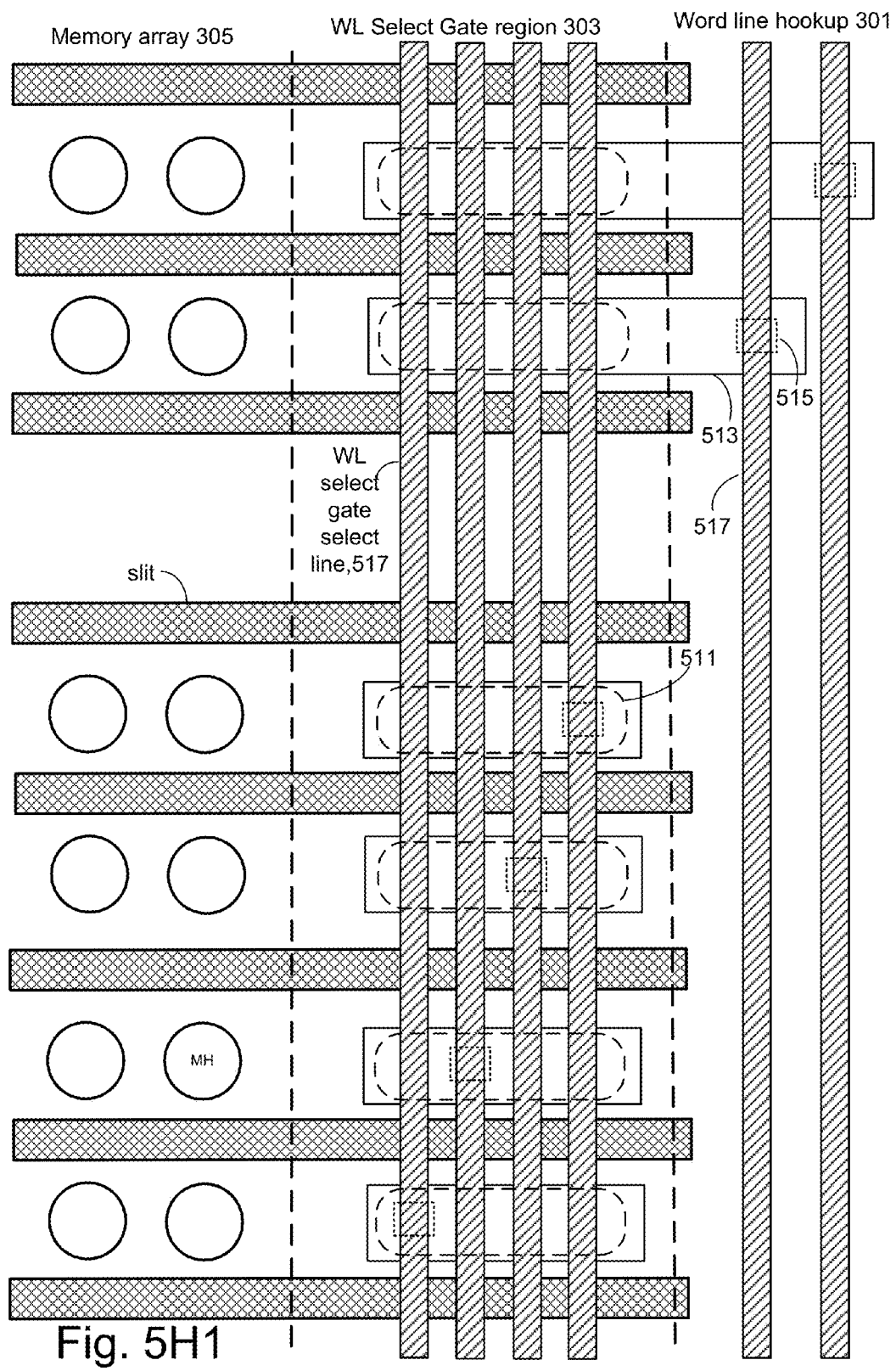
Fig. 5H1

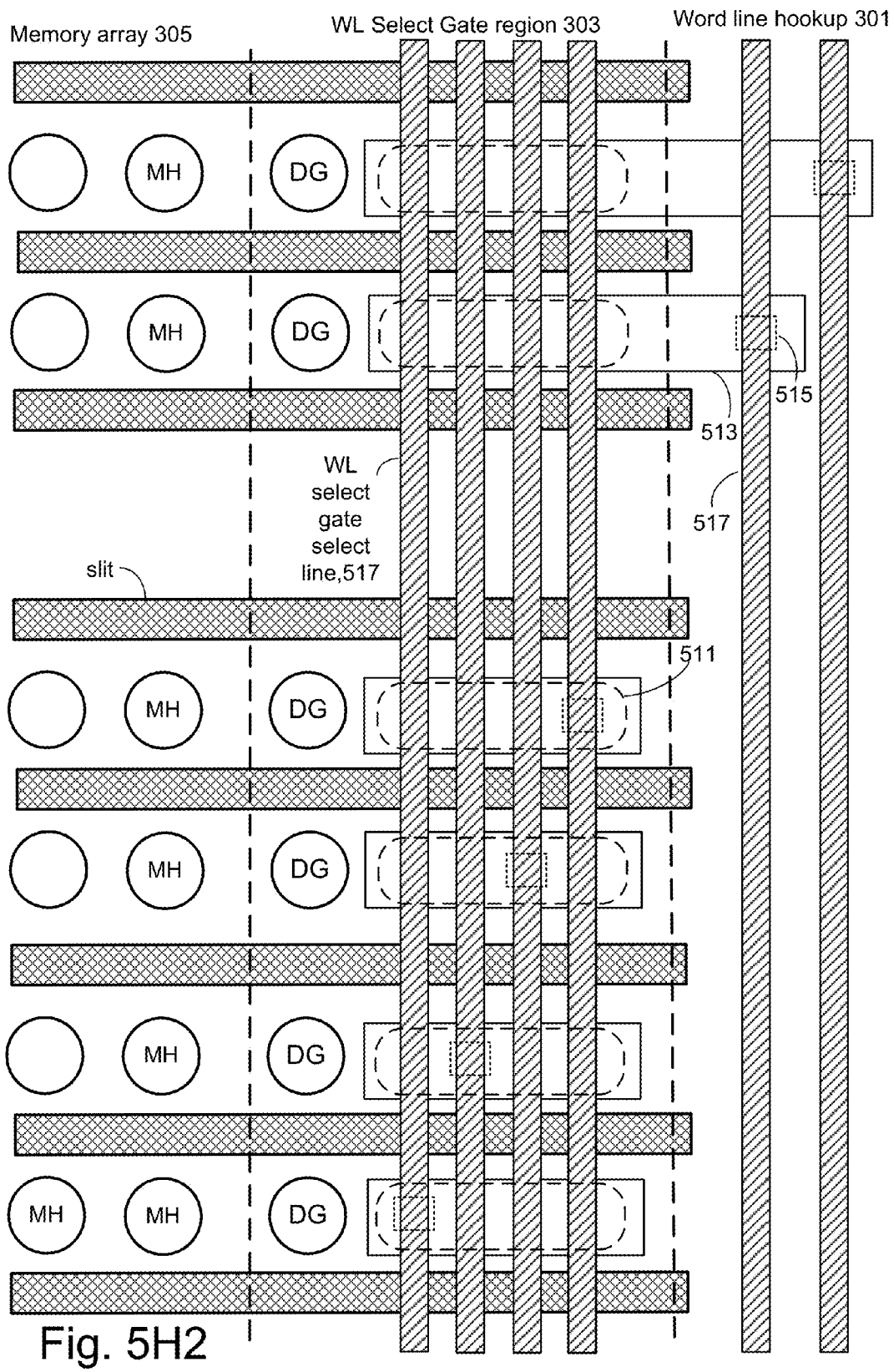
Fig. 5H2

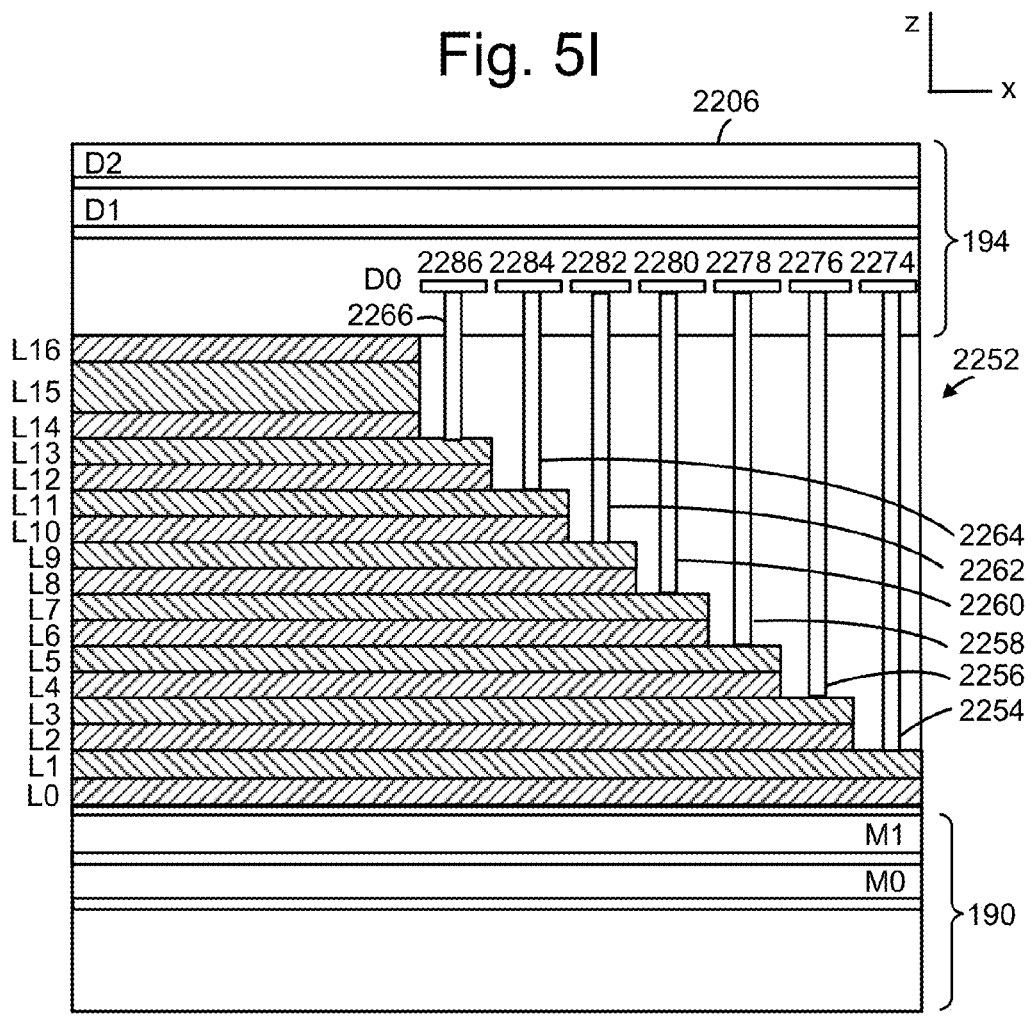

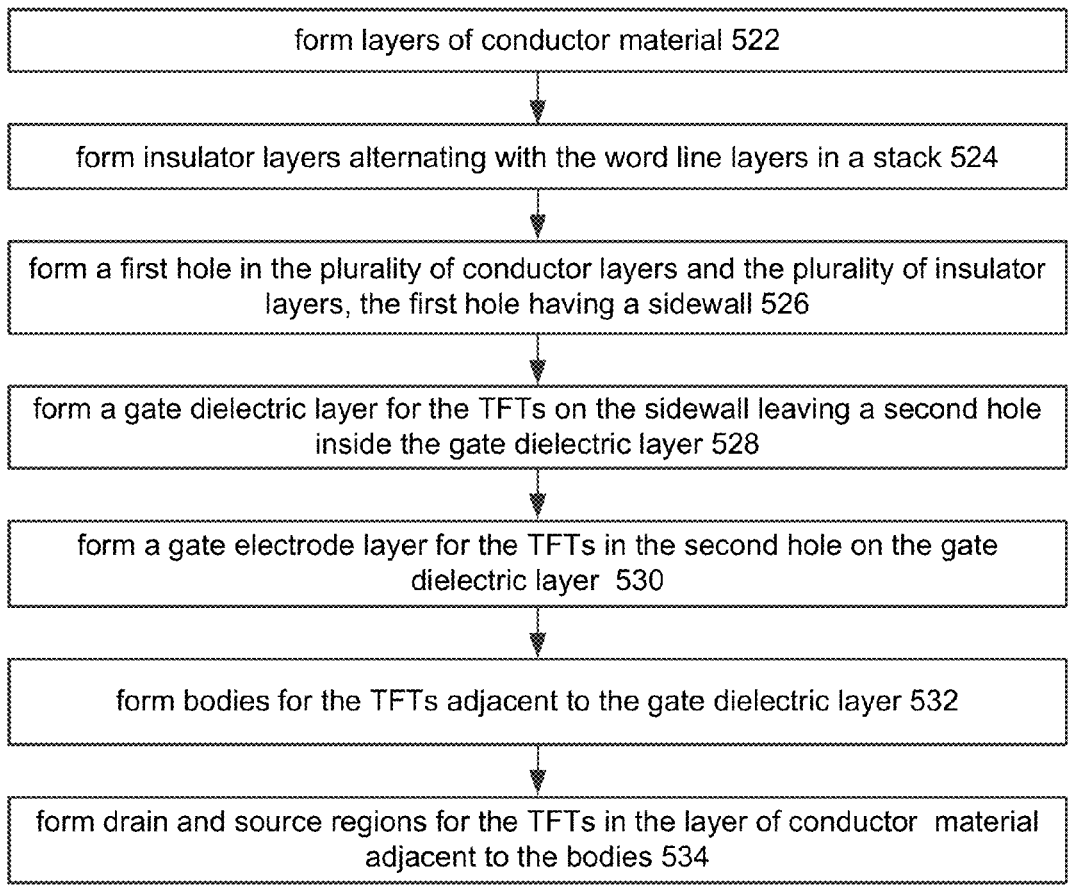
Fig. 5L1
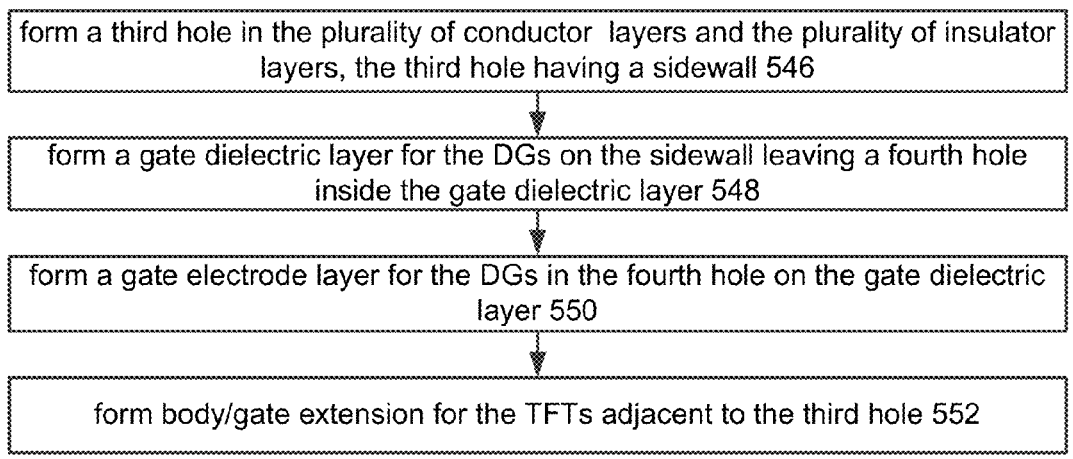
Fig. 5L2

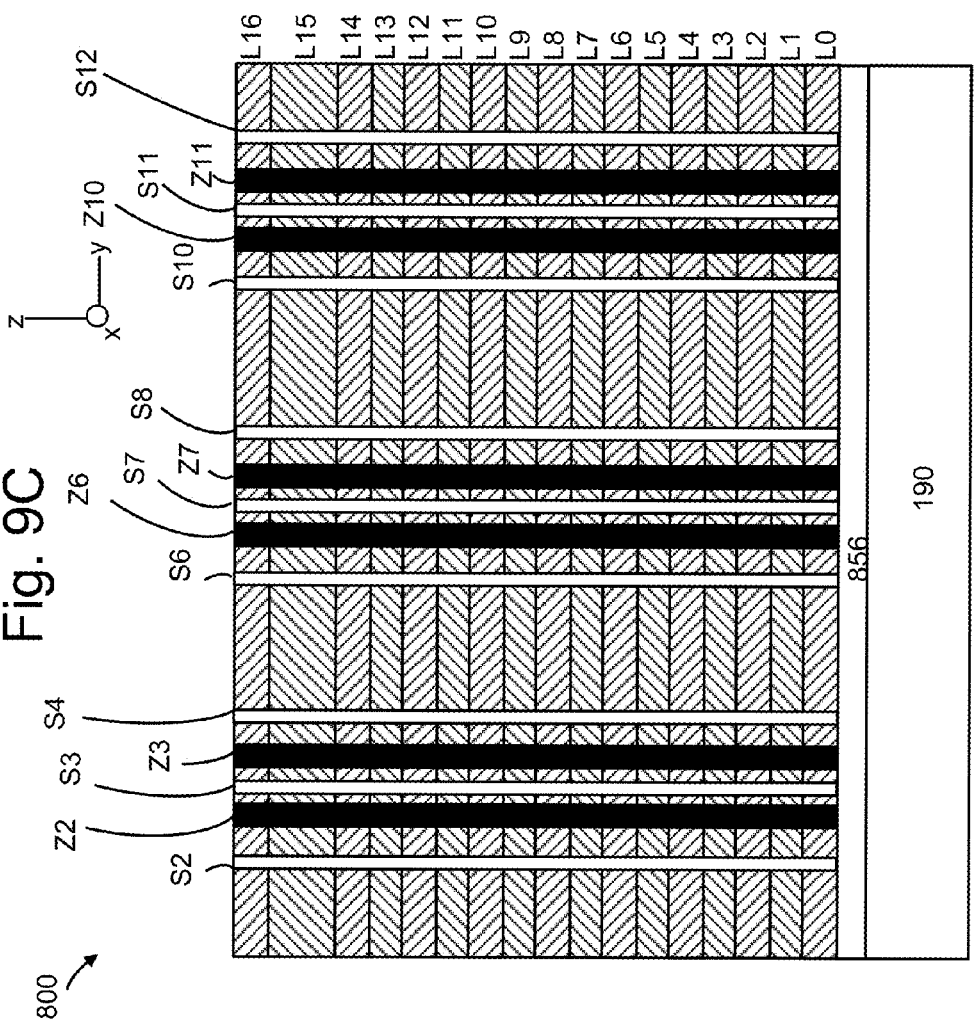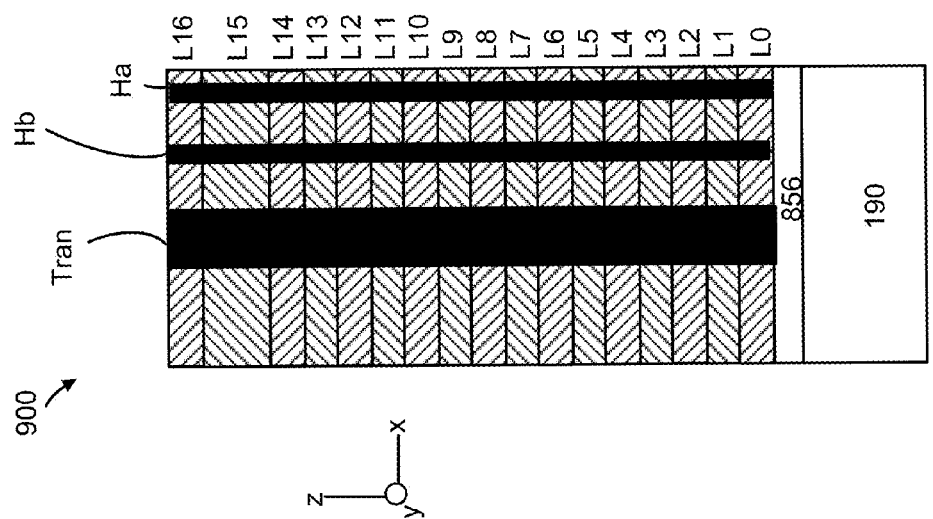

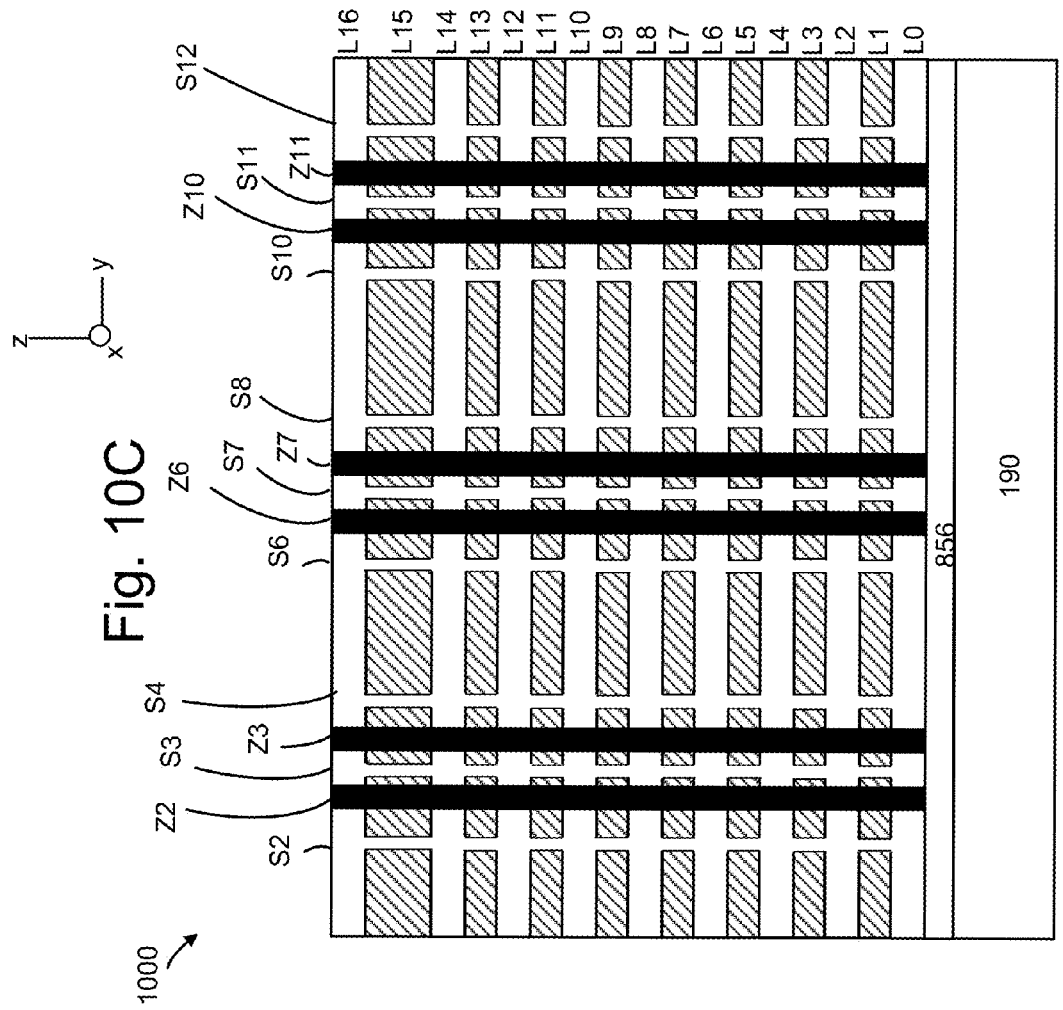
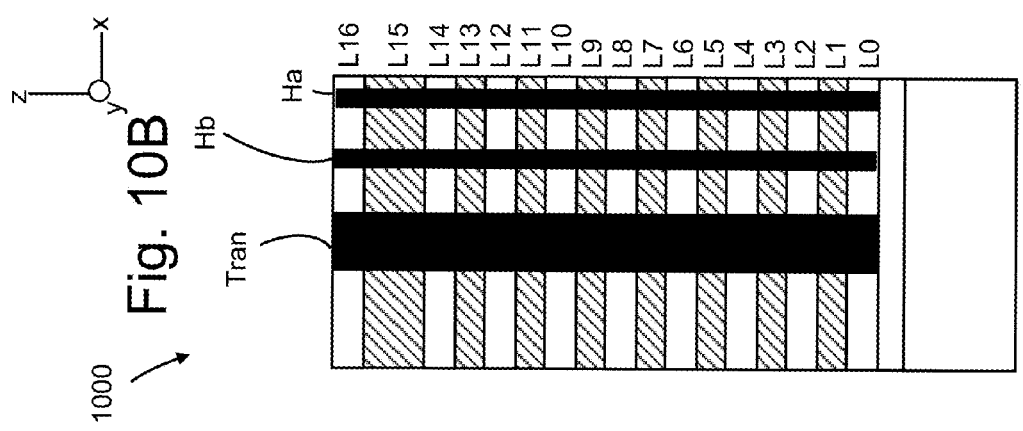

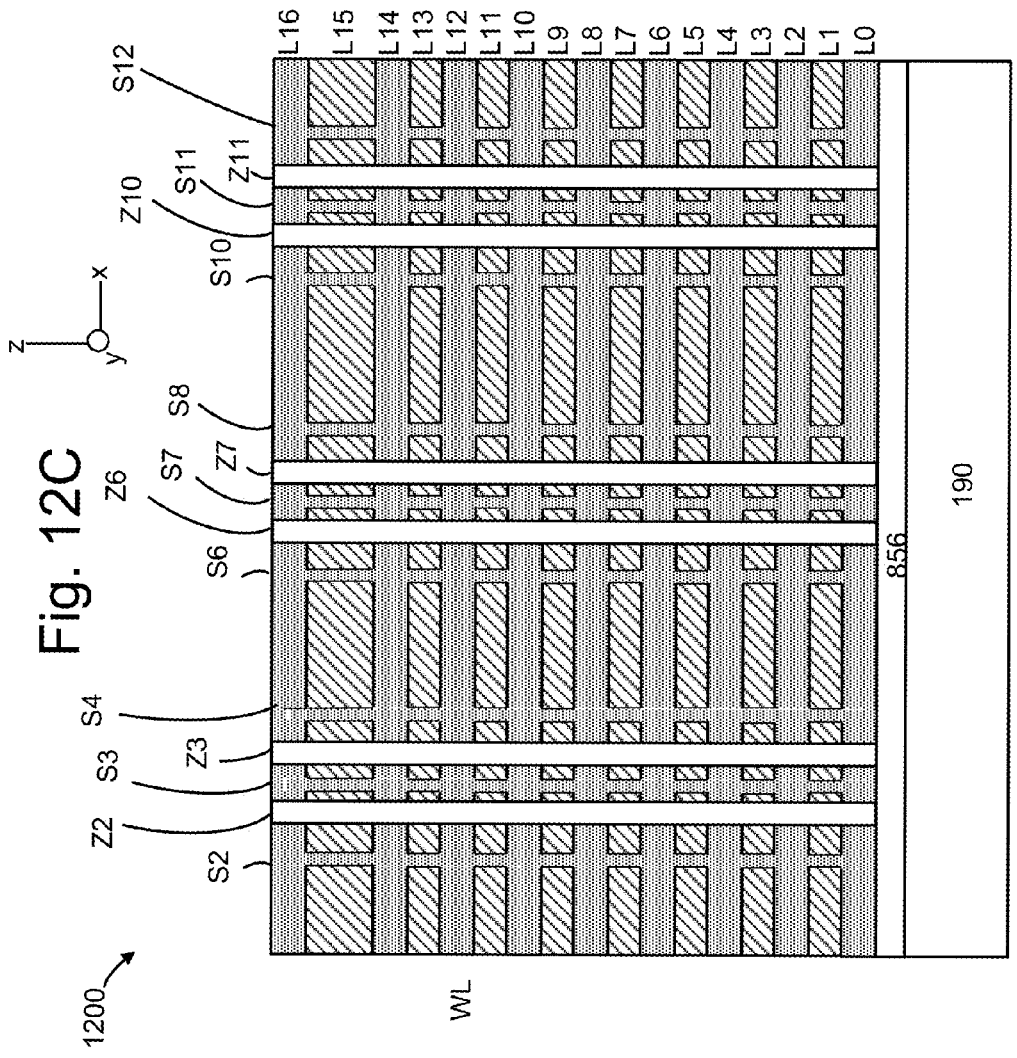
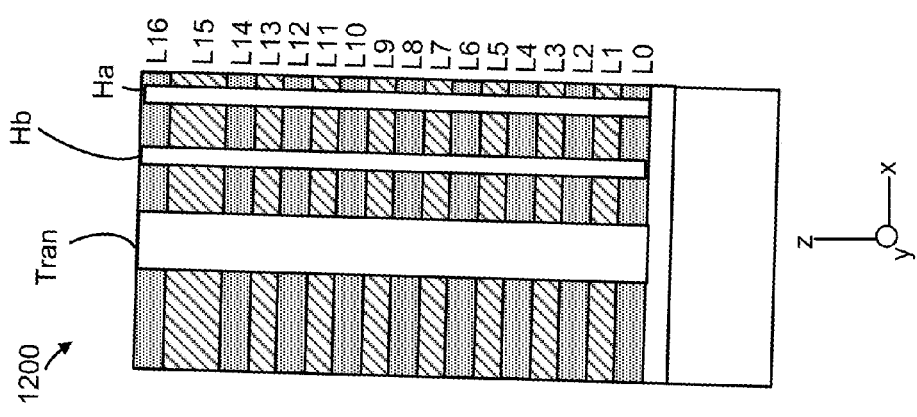

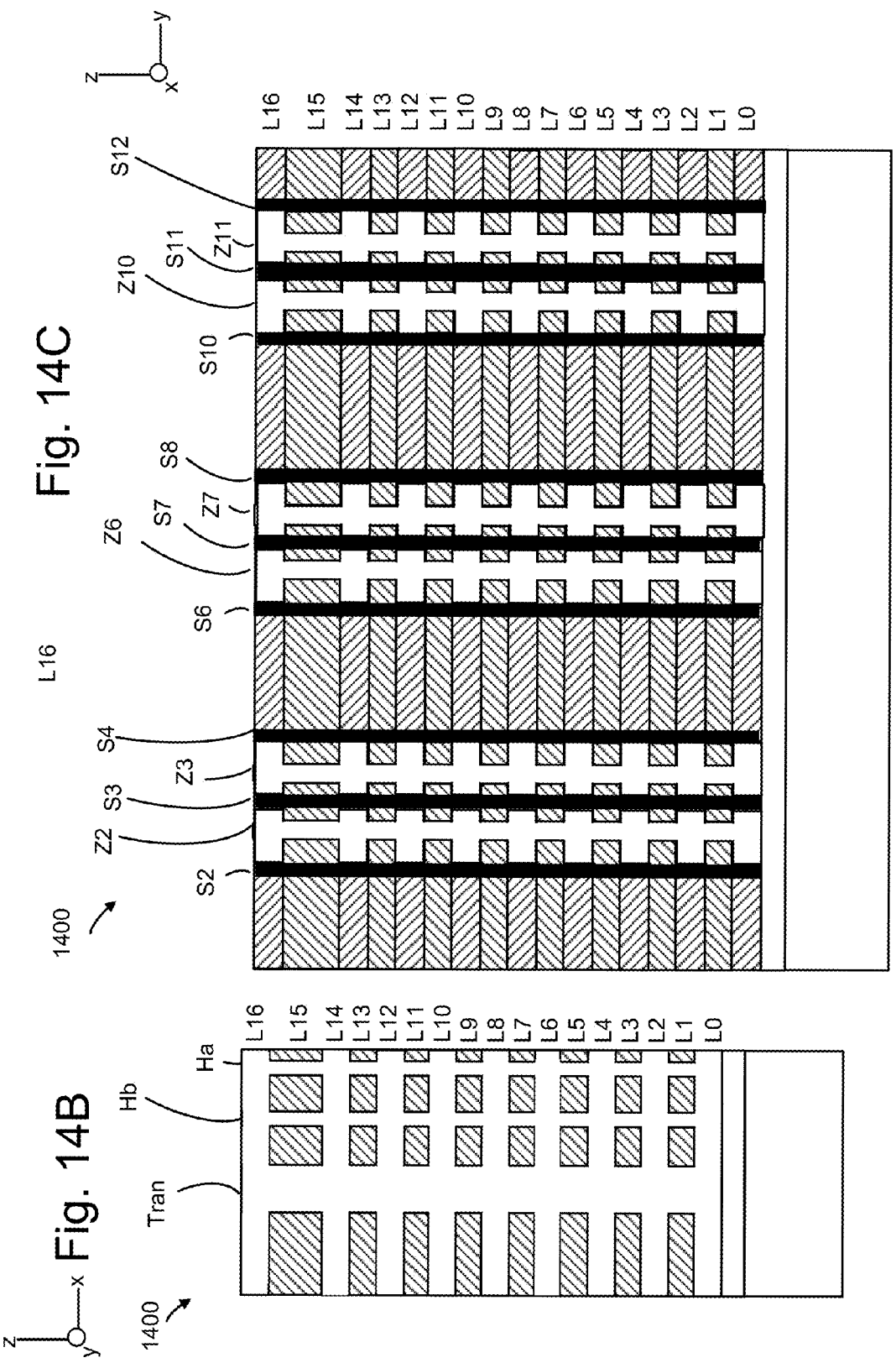

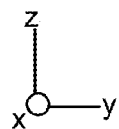
Fig. 15A
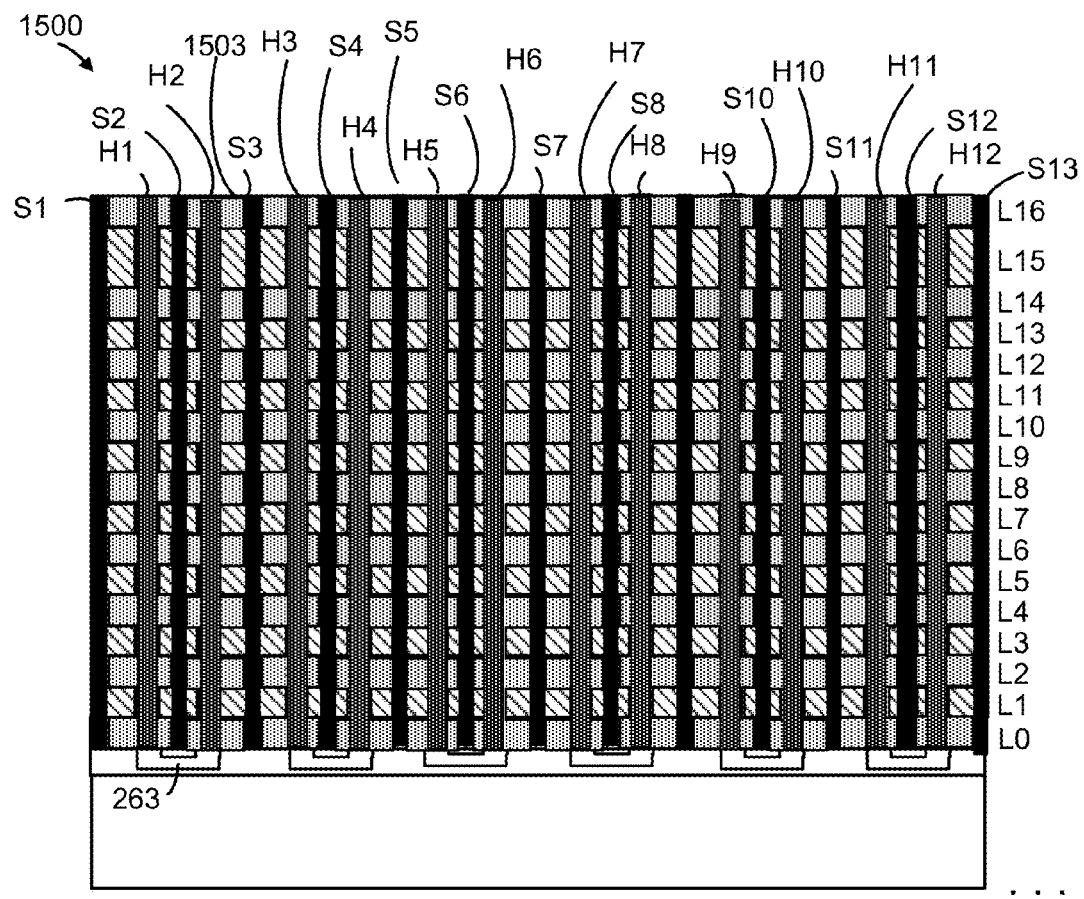

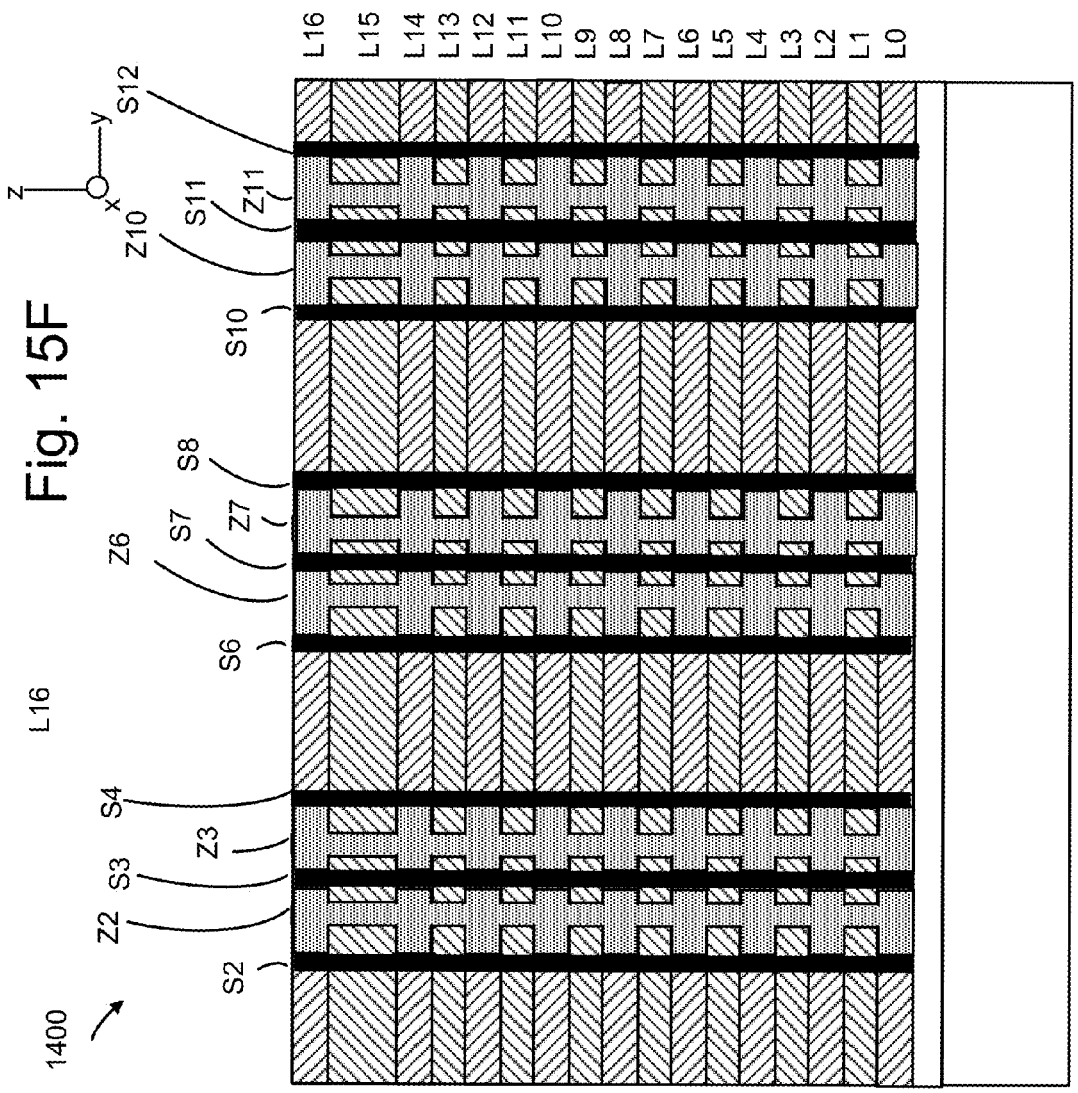
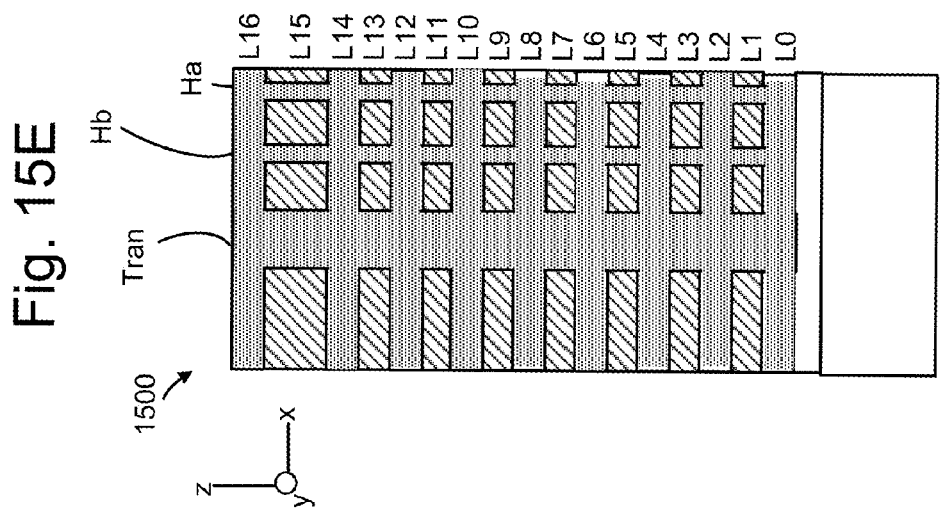

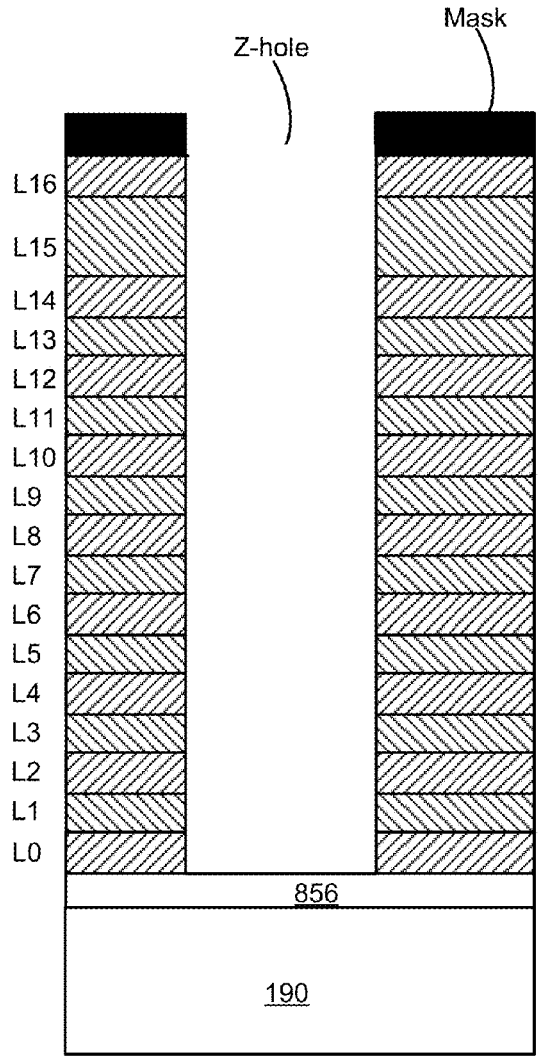
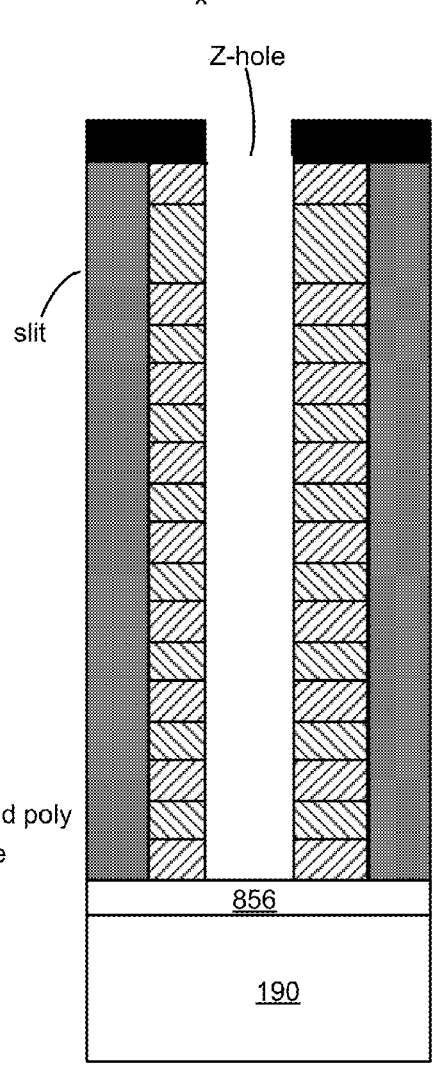
Fig. 18A
Fig. 19

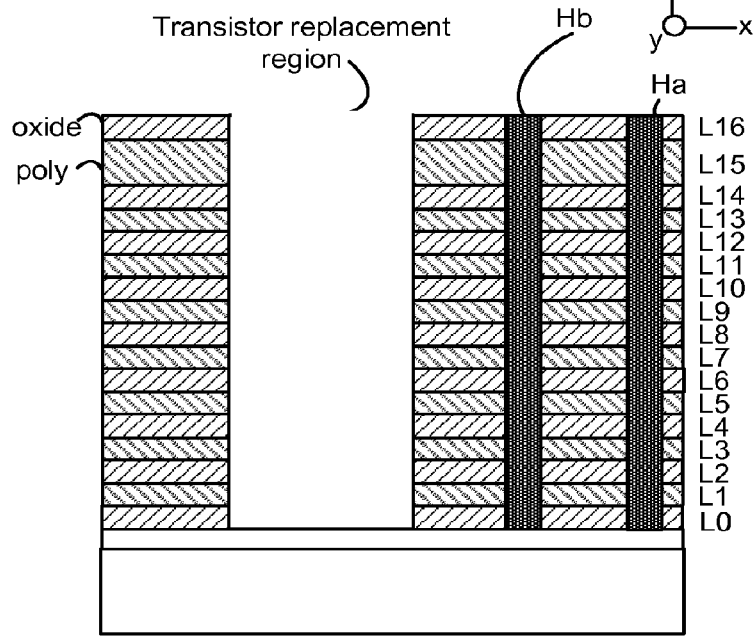
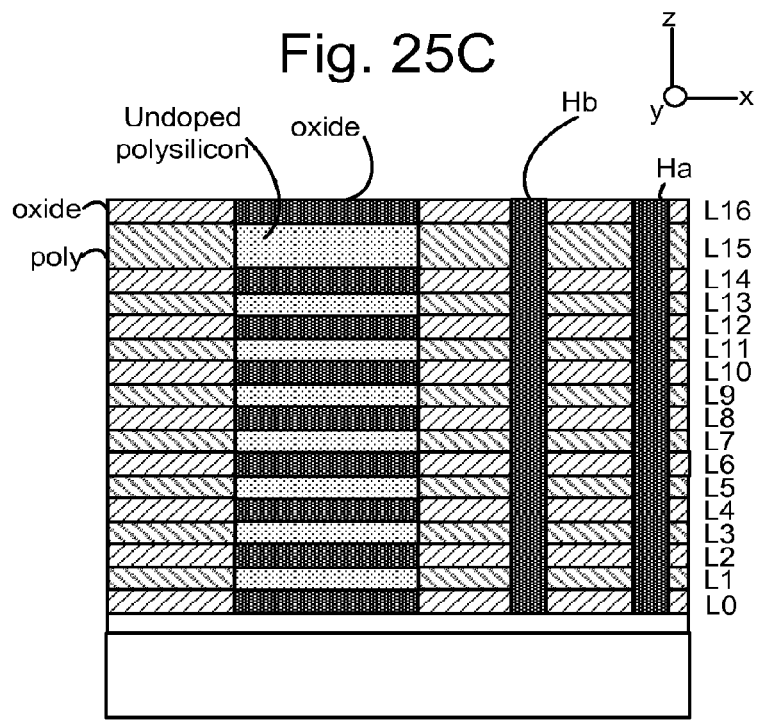

HTFT Operation (Example)
- Transistor on:
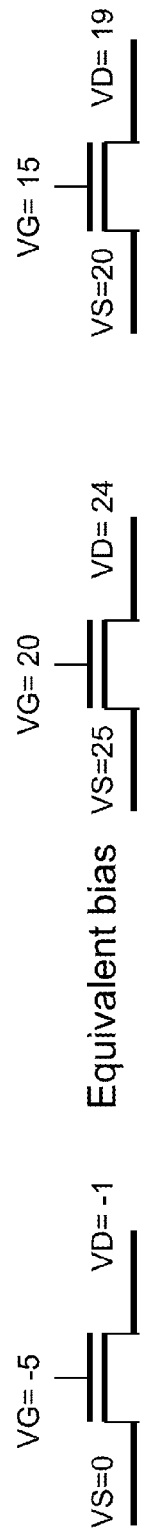
- Transistor off:
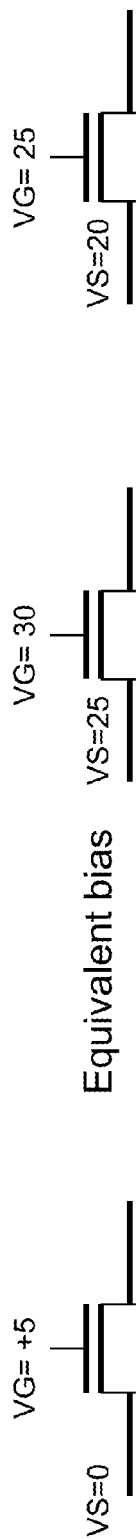
Fig. 26

3D NON-VOLATILE STORAGE WITH TRANSISTOR DECODING STRUCTURE

PRIORITY

This application claims the benefit of U.S. Provisional Application No. 61/624,102, entitled "3D Non-Volatile Memory with Transistor Decoding Structure," by Higashitani et al., filed on Apr. 13, 2012, incorporated herein by reference.

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

BRIEF DESCRIPTION OF THE DRAWINGS

Like-numbered elements refer to common components in the different figures.

FIG. 2A depicts a top view of the 3D stacked non-volatile memory device 100 of FIG. 1A.

FIG. 2C is an example in which the planes are not divided into sub-arrays.

FIG. 2D is an example in which the plane is not divided into sub-arrays similar to FIG. 2C.

FIG. 2E depicts a top view of the 3D stacked non-volatile memory device 150 of FIG. 1B.

FIG. 2G depicts a cross-sectional view of a block of a 3D non-volatile memory device.

FIG. 3C1 is a schematic illustration of the block of FIG. 3A.

FIG. 3C2 depicts a configuration in which all of the word line select gates couple to and select a pair of word lines.

FIG. 5H1 shows further details of one embodiment of forming contacts from select lines to WL select gates.

FIG. 5H2 shows further details of one embodiment of forming contacts from select lines to WL select gates having asymmetrical TFTs.

FIG. 5I depicts contact structures of the terraced portion.

FIG. 5L1 is a flowchart of one embodiment of a method of forming a set of thin film transistors (TFT).

FIG. 5L2 shows further details of one embodiment of contacts from select lines to WL select gates.

FIGS. 9A-9C depict a layered semiconductor material 900 which is obtained from the layered semiconductor material 800 after filling the memory holes and z-holes with insulation.

FIGS. 10A-10C depict a layered semiconductor material 1000 which is obtained from the layered semiconductor material 900 after performing a wet etch via the slits in the cell and WL select gate regions.

FIGS. 12A-12C depict a layered semiconductor material 1200 which is obtained from the layered semiconductor material 1100 after cleaning out the memory holes and the transistor holes.

FIGS. 14A-14C depict a layered semiconductor material 1400 which is obtained from the layered semiconductor material 1300 after performing a wet etch via the memory holes and z-holes.

FIGS. 15A-15C depict a layered semiconductor material 1500 which is obtained from the layered semiconductor material 1400 after filling in memory holes and z-holes.

FIGS. 15D-15F depict a layered semiconductor material which is obtained from the layered semiconductor material 1400 after filling in recesses, memory holes and z-holes.

FIG. 18A shows a z-hole that has been opened using a mask.

FIG. 19 shows a z-hole that has been opened using a mask.

FIG. 25B is a cross-section align line 4207 from FIG. 25A.

FIG. 25C is a cross-section align line 4207 later in the process.

FIG. 26 shows example operation of WL select gates.

DETAILED DESCRIPTION

Figure 1A:
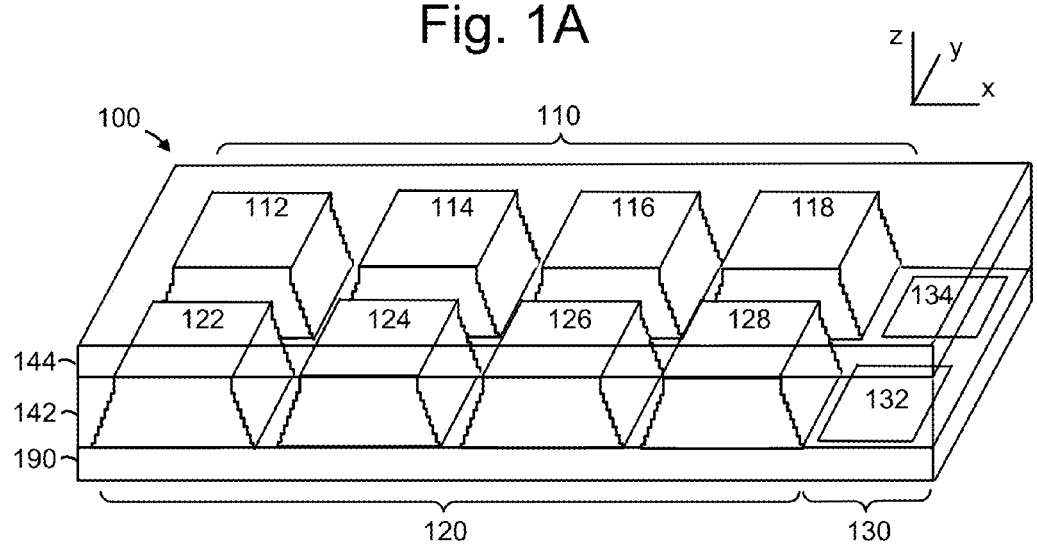
FIG. 1A is a perspective view of a 3D stacked non-volatile memory device 100 in which a plane of memory cells is arranged in separate subarrays.

One problem with many 3D stacked non-volatile memory devices is large capacitance and coupling when driving word line plates. A word line plate may be associated with many word lines. A word line plate may be connected to a driver in order to provide a voltage to the word lines to control gates of memory cells. If all of the word lines associated with a single word line plate are driven at the same time, substantial capacitive loading may occur. To handle this capacitive loading, bigger charge pumps could be used. However, this increases chip size in the peripheral region. Also, the word lines could be segmented to reduce capacitance. Note that segmenting the word lines reduces the size of the word line plates. However, this may increase the size of the memory array. Furthermore, large capacitive coupling may cause overshoots and undershoots when charging or discharging word line plates. Another possible problem is pump ripple from unselected word line plates injecting noise into selected word line plates. Other possible implications are device reliability, performance, and power.

Another problem with many 3D stacked non-volatile memory devices is the inability to select relatively small sections of the memory. For example, some 3D stacked non-volatile memory devices select all of the word lines associated with an entire word line plate at a time. Thus, when performing operations such as read, write, or erase, all memory cells associated with that word line plate are selected, for some devices. As a result, all memory cells associated with that WL plate are electrically stressed. Further details of this are described below.

Disclosed herein are techniques for reducing capacitance when selecting memory cells in a 3D stacked memory device. The 3D stacked memory device could have NAND strings. Word line (WL) select gates are provided, in one embodiment. A WL select gate includes one or more thin film transistors (TFT), in one embodiment. The WL select gates may be located adjacent to a word line plate hookup region of a word line plate. The word line plate may be driven by a word line plate driver that connects to the word line plate hookup region. A given WL select gate may be located between the word line plate hookup region and a word line in order to select that word line. Thus, by driving a given word line plate and selecting a given WL select gate a particular word line associated with the given word line plate may be selected. In one embodiment, a single WL select gate selects more than one word line. In one embodiment, a word line is associated with a set of non-volatile storage elements on different NAND strings that form a single line.

Because word lines may be selected individually (or in small groups), the capacitive loading is substantially less than if selecting all word lines an entire word line plate. Therefore, requirements on charge pumps are less. This saves space in the peripheral region. Also, the word lines themselves can be longer since there is less capacitive loading. For example, word lines do not need to be segmented. Segmenting of word lines may take extra space. Thus, the 3D stacked memory array may be formed without segmenting word lines, thereby saving space.

Also disclosed herein are decoding techniques in a 3D stacked memory device. In one embodiment, WL select gates allow small sub-blocks in a 3D stacked memory device to be selected. The decoding may lead to better performance, reduced power consumption, and better reliability. As one example, a small fraction of a block may be selected for erase. In one embodiment, one-half of each NAND string in a 3D stacked memory device may be selected for erase. In one embodiment, single NAND strings in a 3D stacked memory device may be selected for erase.

Note that 3D decoding is provided for, in one embodiment. In one embodiment, the WL select gates allow word lines to be selected using "z-decoding," bit lines may be selected using "y-decoding," and word line plates may be selected using "x-decoding." Note that the z-decoding may be also referred to as sub-block decoding.

In one embodiment, a 3D memory device has horizontal layers comprising a material that is a conductor alternating with horizontal insulator layers in a stack. There are a set of thin film transistors (TFT) in different ones of the horizontal layers of conductor material. The TFTs each have a gate electrode. Moreover, the gate electrodes of the set of TFTs may be coupled together by conductor material. There may be a decoder coupled to the gate electrodes. Thus, this set of TFTs can be selected together.

A 3D decoding system may allow many improvements including (but not limited to) possible re-definition of block and sub-block, various new modes of operation, disturb and inhibit control, and architectural changes to optimize design to take advantage of the 3D decoding.

A major plane of the gate electrode of the TFTs may be vertically oriented with respect to a horizontal layer of conductor material in which it resides. For example, the TFTs may have a gate dielectric adjacent to the gate electrode, wherein a plane at an interface between the gate electrode and gate dielectric intersect runs vertically with respect to the horizontal layer. Also, the TFTs may have a body adjacent to the gate dielectric, wherein a plane at an interface between the gate dielectric and body meet runs vertically with respect to the horizontal layer. In one embodiment, the TFT is referred to as a vertical gate/width TFT. A TFT may have a channel width that is defined by a thickness of the horizontal layer of conductor material in which it resides. The horizontal layer may include the TFT body and source and drain regions. The conductive channel of the TFT may be formed in the TFT body region adjacent to the gate dielectric by applying appropriate bias to the gate. The channel current may run in the horizontal direction, between source and drain.

In one embodiment, each conductor layer comprises at least one word line plate and word lines, with each of the word line plates associated with multiple ones of the word lines. A TFT may have a channel that runs in the direction of the word lines.

Also disclosed herein are methods of fabricating a 3D stacked memory device having WL select gates. Techniques are disclosed herein for achieving desired doping profiles in a body of a WL select gate. The bodies of the WL select gates may be formed from the same material that the word lines are formed. The word lines may be highly doped polysilicon. However, it can be desirable to have the transistors' bodies doped at a different level, or even the opposite conductivity.

In one embodiment, the body of a WL select transistor (or WL select gate) is counter doped to achieve a desired doping level. For example, the word lines may be heavily doped with boron. Later, the regions in which the WL select transistor bodies are to be formed may be counter doped with phosphorous, as one example. Note that the WL select transistor could end up with either a p-type body or an n-type body. Thus, the WL select transistor could operate in either depletion mode or enhancement mode. Note that the body may be weakly doped.

In one embodiment, gas flow doping is used to counter dope the WL select gate bodies. In one embodiment, ion implantation is used to counter dope the WL select gate bodies. In one embodiment, a combination of gas flow doping and ion implantation is used to counter dope the WL select gate bodies.

In one embodiment, WL dopant concentration reduction is used reduce the level of doping in the WL select gate bodies. For example, the concentration of boron in the word lines may be reduced. WL dopant concentration reduction may be combined with counter doping. For example, boron reduction may be combined with phosphorous counter doping to achieve a desired doping of the WL select gate bodies.

In one embodiment, WL doping concentration reduction (e.g., boron concentration reduction) is achieved by oxidizing sidewalls of holes in which WL select gates are to be formed. This may oxidize portions of heavily doped polysilicon and remove dopant from the heavily doped polysilicon in regions where bodies of the word line select gates are being formed. The oxide may then be removed.

In one embodiment, WL doping concentration reduction (e.g., boron concentration reduction) is achieved using a pre-amorphization implant (PAI) in regions in which bodies of the word line select gates are being formed to reduce the active concentration of the heavily doped polysilicon. This may be followed with a subsequent re-crystallization anneal. Optionally, counter doping is performed in the regions in which the bodies of the word line select gates are being formed after performing the PAI.

In one embodiment, WL doping concentration reduction (e.g., boron concentration reduction) is achieved by filling a hole (note that the body may be around the hole) in which WL select gates are being formed with undoped polysilicon and performing a thermal anneal to diffuse dopant from the body to the undoped polysilicon. The polysilicon that was filled into the hole may then be removed.

In one embodiment, regions in which word line select gates are being formed are etched to remove portions of alternating layers of insulator and portions of heavily doped polysilicon. This etching may remove portions of heavily doped polysilicon where bodies of the word line select gates are being formed. Then, alternating layers of insulator and undoped polysilicon may be deposited. The insulator and undoped polysilicon may be aligned with the alternating layers of insulator and heavily doped polysilicon, respectively. A thermal anneal may be performed. This thermal anneal may form an electrical connection between heavily doped polysilicon where word lines are being formed and polysilicon where the bodies are being formed. In one embodiment, some of the dopant from the heavily doped WL region may diffuse into the undoped polysilicon to achieve a desired doping level for the WL select gate bodies. Note that drain and source regions of the WL select transistors may be formed as a result.

In one embodiment, TFTs are formed by forming a first hole in a layer of conductor material (e.g., doped polysilicon). Then, a gate dielectric layer is formed on the sidewalls of the first hole leaving a second hole inside the gate dielectric layer. Next, a gate electrode layer is formed in the second hole on the sidewalls of the gate dielectric layer. A body is formed in the layer of conductor material adjacent to the gate dielectric layer. Drain and source regions are formed in the layer of polysilicon adjacent to the body. The foregoing may form a structure that includes two TFTs (in a single layer of e.g., polysilicon) in parallel. The width of the TFT channel may be defined by the thickness of the polysilicon layer.

In one embodiment alternating layers of polysilicon and insulator are formed. Then, a hole is etched in the alternating layers. Next, TFTs may be formed in each of the layers of polysilicon using a technique in which gate electrodes and gate dielectrics are formed in the hole, and bodies are formed outside the hole. The gate electrodes of TFTs of different layers may be electrically connected. Thus, a set of TFTs in different layers can be selected together.

In one embodiment, a TFT is symmetrical. For example, the drain and source may both be located at about the same distance from the gate. In one embodiment, a TFT is asymmetrical. For example, the drain may both be located further from the gate than the source. An asymmetrical TFT may have a gate/drain offset. Stated another way, an asymmetrical TFT may have a body/channel extension.

FIG. 1A is a perspective view of a 3D stacked non-volatile memory device 100 in which a plane of memory cells is arranged in separate subarrays. In the memory device 100, a substrate 190 carries an example plane 110 of memory cells in subarrays 112, 114, 116 and 118, an example plane 120 of memory cells in subarrays 122, 124, 126 and 128, and a peripheral area 130 with peripheral regions 132 and 134 which include circuitry for use by the subarrays. The substrate 190 can also carry circuitry under the subarrays, along with one or more lower metal layers which are patterned in conductive paths to carry signals of the circuitry. A plane could be associated with a common substrate region such as a p-well. An x-y-z coordinate system is shown.

If there is no peripheral circuitry under array, there is no need to form wells in the substrate. On the other hand, if some peripheral circuits are placed under the array, the configuration of wells should correspond to transistors and other elements in those circuits. For instance, NMOS transistors are typically placed in a p-well, and PMOS transistors are placed in an n-well. Some NMOS transistors can be placed directly in the silicon substrate, which is typically p-type. A triple-well could also be used, e.g., a p-well placed inside an n-well, in a p-substrate. An NMOS transistor can be placed in such triple-well. An advantage of a triple-well is that the bias can be easily supplied to the transistor body, if necessary, e.g., a p-well can be biased for an NMOS that is placed in the triple-well.

The subarrays are formed in an intermediate region 142 of the memory device. In an upper region 144 of the memory device, one or more upper metal layers are patterned in conductive paths to carry signals of the circuitry. Each subarray comprises a stacked area of memory cells, where alternating levels of the stack represent word lines. In one possible approach, each subarray has opposing tiered sides from which vertical contacts extend upward to an upper metal layer. Additionally, a gap between each subarray is a hook up area which allows vertical contacts to extend upward from the substrate to an upper metal layer. The gap is also a word line transfer area which allows word line segments in different subarrays to be connected. The space in the word line hookup and transfer area can also be used to carry signals from under to over array, by high aspect ratio vias, connecting metal wiring under array to metal wiring over array. For instance, if sense amplifier is placed under array, the space can be used to carry power signals, such as VDDSA, SRCGND (source ground), VSS and so forth.

The one or more lower metal layers extend at a height which is below a height of a bottom layer of each subarray, and the one or more upper metal layers extend at a height which is above a height of a top layer of each subarray.

In one possible approach, the length of the plane, in the x-direction, represents a direction in which signal paths to word lines extend in the one or more upper metal layers, and the width of the plane, in the y-direction, represents a direction in which bit lines extend in the one or more upper metal layers. Source lines may also extend in the x-direction. The z-direction represents a height of the memory device 100.

Figure 1B:
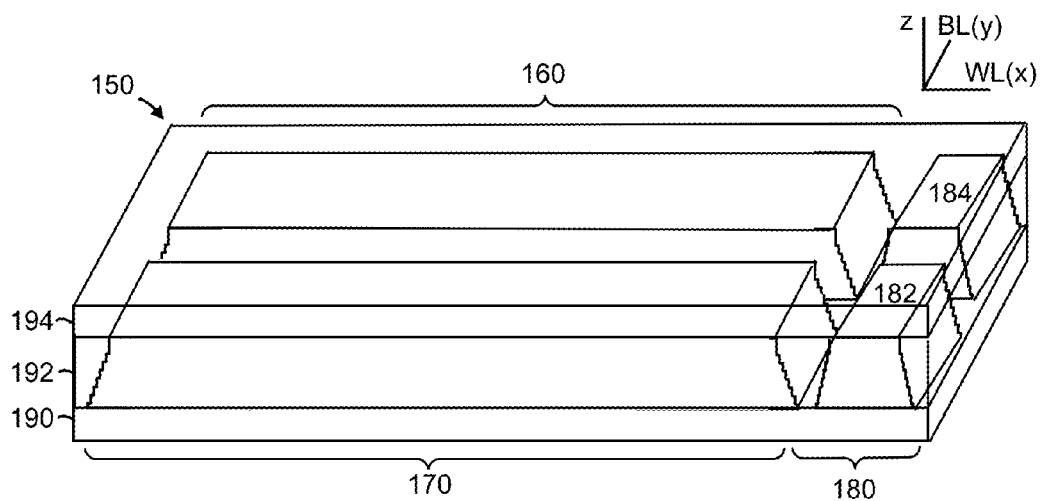
FIG. 1B is a perspective view of a 3D stacked non-volatile memory device 150 in which a plane of memory cells may be considered to have one contiguous sub-array.

FIG. 1B is a perspective view of a 3D stacked non-volatile memory device 150 in which a plane of memory cells may be considered to have one contiguous sub-array. A substrate 190 carries example planes, 160, 170 of memory cells. The cells may use common circuitry and/or control or power signals. A peripheral area 180 includes peripheral regions 182 and 184. In practice, peripheral regions can extend on one or more sides of a 3D stacked memory array which comprises one or more planes such as planes 160 and 170. For simplicity, the peripheral area 180 is depicted on one side of the 3D stacked memory array. An x-y-z coordinate system is shown having a bit line direction BL(y), and a word line direction WL(x).

As an alternative, the plane 170 can include undivided subarrays, where space is saved due to the lack of gaps between subarrays. A subarray can be a portion of a memory array which uses common circuitry and/or control or power signals. In one approach, multiple subarrays in a plane have common word line signals, but have different sets of bit line and sense amplifier signals.

The planes are formed in an intermediate region 192 of the memory device. In an upper region 194 of the memory device, one or more upper metal layers are patterned in conductive paths to carry signals of the circuitry. The upper and lower metal layers may be considered to be wiring layers. In one possible approach, each plane, rather than each subarray, has opposing tiered sides from which vertical contacts extend upward to an upper metal layer.

Each array can further include one or more blocks. The blocks are insulated from one another by insulation-filled dividers/slits, which run in the x-direction. As one example, a width of a block may include 12 U-shaped NAND strings. An example of a physical width of a block (in the y-direction) is approximately $3 \times 10^{-6}$ to $4 \times 10^{-6}$ meters.

FIG. 2A depicts a top view of the 3D stacked non-volatile memory device 100 of FIG. 1A. Like-numbered elements correspond to one another in the different figures. Each subarray can include sense amplifier circuitry, for instance, which is used for read and verify operations of the memory cells in the subarray. The sense amplifier circuitry can include, e.g., latches, processing circuitry and bit line hookups. The sense amplifier circuitry can provide signals such as Vdd, source ground and Vss. In one approach, the sense amplifier circuitry is provided on opposing sides of each subarray, in a double-sided configuration. For example, in the plane 120, subarrays 122, 124, 126 and 128 include sense amplifier circuitry 240 and 241; 242 and 243; 244 and 245; and 246 and 247, respectively.

The plane 120 can include column circuitry 260 as well, which is under the subarray 124 in this example. Regions 202, 204, 206, 207 and 210 are hook up areas where contacts can be fabricated to extend upward to the one or more metal layers, for instance. For example, a lower metal layer such as M0 can be connected to an upper metal layer such as D2. In one approach, of the lower metal layers, M0 is below M1, and of the upper metal layers, D0 is below D1 and D1 is below D2. Regions 204, 206 and 207 are also word line transfer areas in which signal paths for word lines can be joined among the different subarrays. In this approach, a set of word lines extends in segments across the subarrays, with word line hook-up and transfer areas between the subarrays.

WL select gates are formed in regions 303 adjacent to the WL hookup regions 202, 204, 206, 207 and 210 in one embodiment. Also, WL select gates are formed in regions 303 adjacent to the WL hookup regions 222, 224, 226, 228, and 230, in one embodiment. WL select gates may be used to select word lines. WL select gates will be discussed below.

One advantage of separating the plane into subarrays is to provide greater flexibility to configure power busses/connections for sense amplifiers.

These regions are also gaps between the subarrays. In the peripheral area 130, a region 212 may be used for providing vertical contact structures between a source line driver in the substrate and corresponding signals paths in the one or more upper metal layers. A region 214 may be used for providing vertical contact structures between row and column core drivers and corresponding signals paths in the one or more upper metal layers. A row decoder (x) provides signals for word line plates. Note that there may be additional column (e.g., y) decoding circuits at the peripheral of the memory array long the vertical sides (not depicted in FIG. 2A). Column (e.g., y) decoders may provide signals for bit lines. The region 132 may include other circuitry, e.g., for use by the plane 120.

Embodiments of the memory array 150 also have "z-decoding." Z-decoders may provide signals for WL select gates. Selecting WL gates may be referred to herein as "z-decoding." Region 213 may provide vertical contact structures that are used in selection of WL select gates. The z-decoding allows for selecting of sub-blocks, in one embodiment. Region 213 may provide vertical contact structures between WL select gate select drivers and corresponding signals paths in the one or more upper metal layers. Many techniques may be used to form connections between decoders and the WL select gates.

In one embodiment, regions 213 and 214 may be physically combined. For example, circuitry that provides for row (e.g., x) decoding may alternate with circuitry that provides for sub-block (e.g., z) decoding.

Similarly, in the plane 110, subarrays 112, 114, 116 and 118 include sense amplifier circuitry 250 and 251; 252 and 253; 254 and 255; and 256 and 257, respectively. The plane 110 can include column circuitry 262 as well, which is under the subarray 114 in this example. Regions 222, 224, 226, 228 and 230 are hook up areas where contacts can be fabricated to extend upward to the one or more metal layers, for instance. Regions 224, 226 and 228 are also word line transfer areas in which signal paths for word lines can be joined between the different subarrays. These regions are also gaps between the subarrays.

In the peripheral area 130, a region 232 may be used for providing vertical contact structures between a source line driver in the substrate and corresponding signals paths in the one or more upper metal layers. A region 234 may be used for providing vertical contact structures between row and column core drivers and corresponding signals paths in the one or more upper metal layers. Region 219 may provide vertical contact structures that are used in selection of WL select gates. The z-decoding allows for selecting of sub-blocks, in one embodiment. Region 219 may provide vertical contact structures between WL select gate select drivers and corresponding signals paths in the one or more upper metal layers. The region 134 may include other circuitry, e.g., for use by the plane 110. The regions 204, 206 and 207, and 224, 226 and 228 may consume about 10% of the area of the overall memory array area, in one embodiment. The memory array may include, e.g., the set of one or more arrays on the memory device chip.

In the example of FIG. 2A, the word lines runs from top to bottom. In this example, the word lines are segmented into four sections, one section per subarray. However, segmenting the word lines is not required.

Figure 2B:
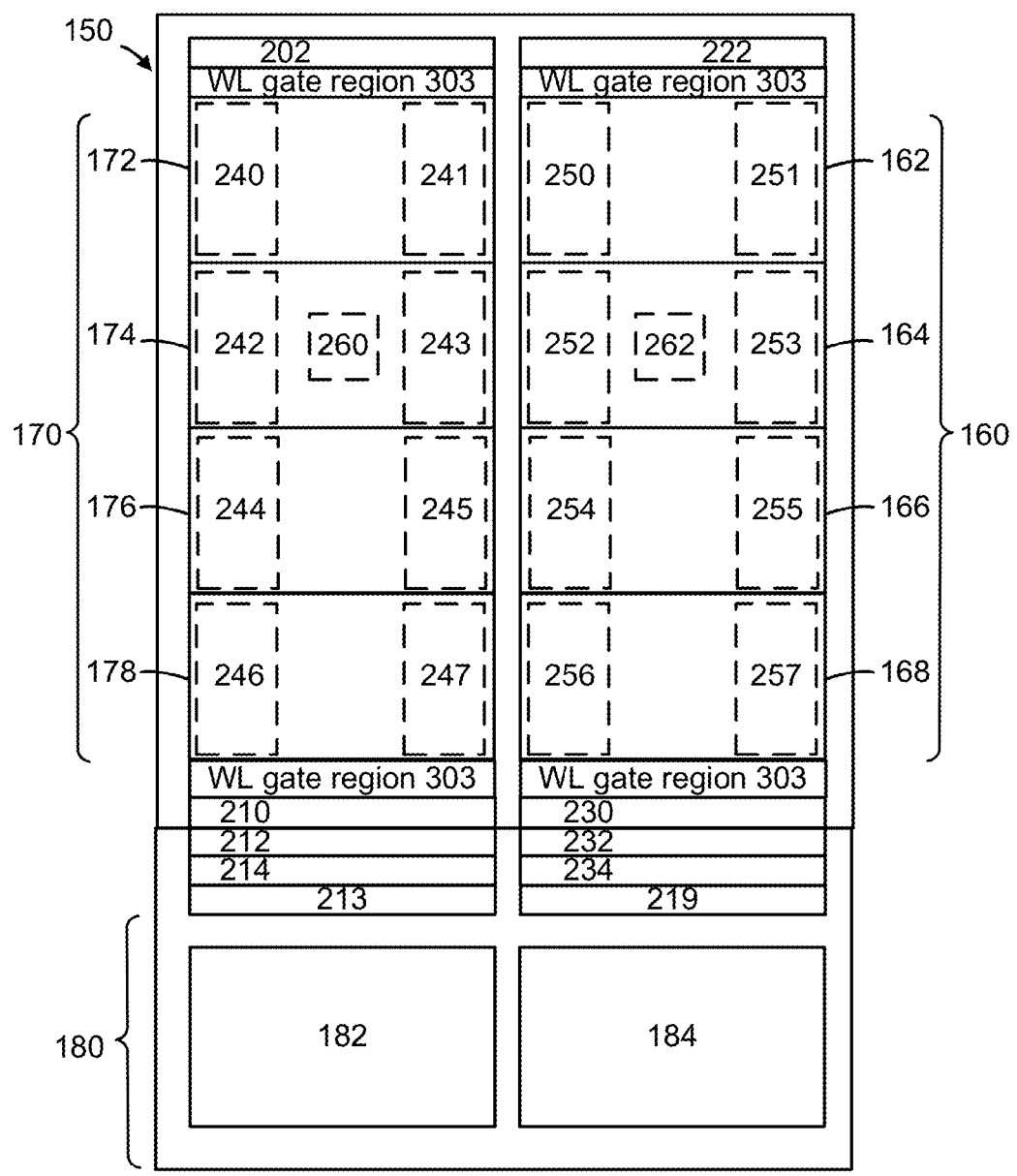
FIG. 2B depicts a top view of the 3D stacked non-volatile memory device 150 of FIG. 1B.

FIG. 2B depicts a top view of the 3D stacked non-volatile memory device 150 of FIG. 1B. In this example, the word lines are not segmented. The memory device 150 differs from the memory device 100 in that the regions 204, 206 and 207, and 224, 226 and 228 are not present, so that the area consumed by the memory device is reduced. The regions 204, 206 and 207, and 224, 226 and 228 are not needed since the word lines are not segmented. Therefore, some of the word line plate hookup regions can be avoided. However, word line plate hookup regions 202, 210, 222, and 230 are still present. In FIG. 2B, WL select gate regions 303 are depicted between the WL hookup regions and the memory array. The WL select gate regions 303 may contain WL select gates that include TFT transistors.

Embodiments of the memory array 150 also have "z-decoding." Selecting WL select gates may be referred to herein as "z-decoding." Region 213 may provide vertical contact structures that are used in selection of WL select gates. The z-decoding allows for selecting of sub-blocks, in one embodiment. Regions 213 and 219 may provide vertical contact structures between WL plate select drivers and corresponding signals paths in the one or more upper metal layers.

In one embodiment, regions 213 and 214 may be physically combined. For example, circuitry that provides for row (e.g., x) decoding may alternate with circuitry that provides for sub-block (e.g., z) decoding.

In FIG. 2B, each plane is divided into four sub-arrays. This allows various circuitry such as sense amplifier circuitry 240 and 241; 242 and 243; 244 and 245; and 246 and 247, to serve smaller regions of the memory array 150. However, the plane does not need to be divided into sub-arrays.

FIG. 2C is an example in which the planes are not divided into sub-arrays. FIG. 2C corresponds to one embodiment of FIG. 1B in which the word lines in a plane are not segmented. There is one WL plate hookup region 202, 210 on each end of plane 170 in this example. Likewise, there is one WL plate hookup region 222, 230 one each end of plane 160 in this example.

Embodiments of the memory array 150 also have "z-decoding." Selecting WL select gates may be referred to herein as "z-decoding." Region 213 may provide vertical contact structures that are used in selection of WL select gates. The z-decoding allows for selecting of sub-blocks, in one embodiment. Regions 213 and 219 may provide may provide vertical contact structures between WL plate select drivers and corresponding signals paths in the one or more upper metal layers.

In one embodiment, regions 213 and 214 may be physically combined. Likewise, regions 219 and 234 may be physically combined. For example, circuitry that provides for row (e.g., x) decoding may alternate with circuitry that provides for sub-block (e.g., z) decoding.

In FIG. 2C, the sense amplifier circuitry 240, 241 is used for all of plane 170. Likewise, sense amplifier circuitry 250, 251 is used for all of plane 160.

FIG. 2D is an example in which the plane is not divided into sub-arrays similar to FIG. 2C. In FIG. 2D, z-decoding circuitry has an alternative location relative to FIG. 2C. Z-decoding circuitry 213a, 213b for plane 170 may reside under the array. Z-decoding circuitry 219a, 219b for plane 160 may reside under the array. Similarly, the examples of FIGS. 2A and 2B could be modified to have Z-decoding circuitry in this alternative location. Other locations for the z-decoding circuitry may be used.

FIG. 2E depicts a top view of the 3D stacked non-volatile memory device 150 of FIG. 1B. In the plane 170, in-plane interconnect areas 115a, 115b are provided which extend along a length of the plane. These interconnect areas 115a, 115b provide for connection to the sense amplifiers 240, 241 respectively. In one embodiment, there is a single interconnect area, which may be located about midway across the y-direction, or in another location. Similarly, in the plane 160, interconnect areas 117a, 117b are provided which extend along a length of the plane. Connections to the sense amplifiers 240, 241, 250, 251 may be made by high aspect ratio vias.

In one embodiment, connections to WL select gate select lines are made through a portion of the in-plane interconnect areas 115, 117. The WL select gate select lines may be connected to gates of the WL select transistors, thereby allowing selection of WL select gates. In one embodiment, connections are made through a region of the interconnect 115, 117 that extends outside the memory array. The interconnect 115, 117 does not necessarily extend to the WL hookup region 202, 210, 222, 230. In one embodiment, the connections to the WL select gate select lines may be similar to the connections to the bit lines. However, note that connections can be made in another manner. In one embodiment, the connections to the WL select gate select lines are made without using the interconnect region 115, 117. As one example, the connections to the WL select gate select lines can be made in the WL hookup region 202, 210, 222, 230.

In one embodiment, memory array includes one or more blocks. As noted herein, a memory array may include one or more planes. Each plane may include one or more sub-arrays. Each sub-array may include one or more blocks. In one embodiment, a sub-array includes hundreds of blocks. A sub-array could include more or fewer than hundreds of blocks.

Figure 2F:
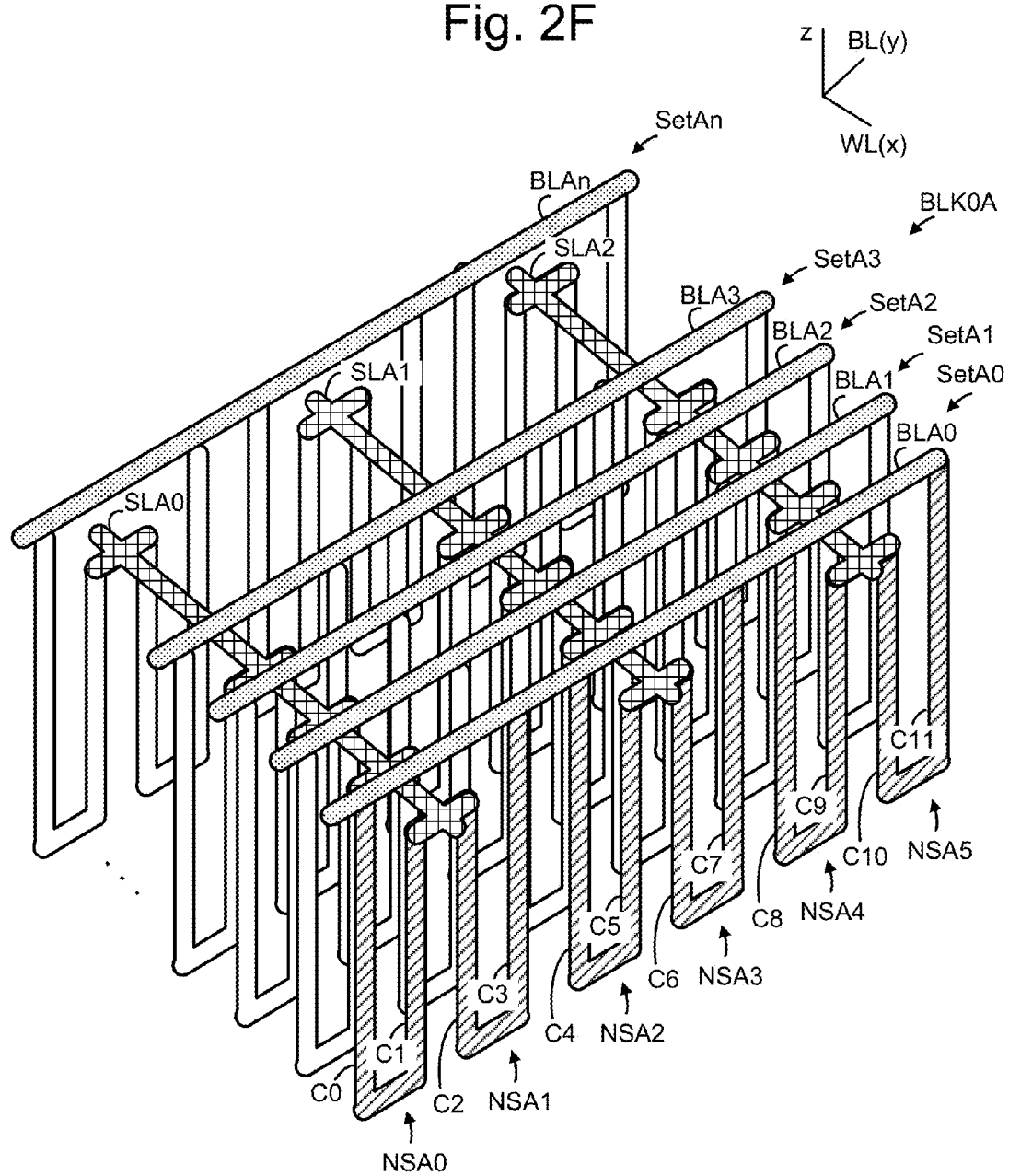
FIG. 2F depicts an embodiment of a block that includes U-shaped NAND strings.

FIG. 2F depicts an embodiment of a block BLK0A that includes U-shaped NAND strings. The block includes U-shaped NAND strings arranged in sets (SetA0, SetA1, SetA2, SetA3, . . . , SetAn, where there are n−1 sets in a block). Each set of NAND strings is associated with one bit line (BLA0, BLA1, BLA2, BLA3, . . . , BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example. In FIG. 2F there are six NAND strings; however, there could be more or fewer NAND strings in a block.

FIG. 2G depicts a cross-sectional view of a block of a 3D non-volatile memory device. FIG. 2G has 12 NAND strings. The stack includes alternating insulator (e.g., dielectric) and conductor layers (a conductor layer may be one that is formed from or more conductors). In one embodiment, the insulator layers are an oxide. However, a different insulator could be used. The insulator layers include D0 to D8 and may be made of $SiO_2$, for instance. The conductor layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. These various layers may also be referred to herein as layers L0-L16. The insulator layers D0-D8 correspond to the even layers of L0-L16, in this example. The conductor layers correspond to the odd layers L1-L15, in this example.

Columns of memory cells C0 to C23 are depicted in the multi-layer stack. The stack 277 includes the substrate 190, an insulating film 109 on the substrate, and a back gate layer BG, which is a conductor layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 which connect the columns. Each connecting portion 263 thus connects the two columns of each U-shaped NAND string. A connection portion 263 may include a pipe connection and a back gate. The pipe connection may be made of undoped polysilicon, as well as other materials. A back gate may surround the pipe connection to control conduction of the pipe connection. The back gate may also ensure connectivity of the pipe connection. For example, NSA0 includes columns C0 and C1 and connecting portion 263. NSA0 has a drain end 278 and a source end 302. NSA1 includes columns C2 and C3 and connecting portion 263. NSA1 has a drain end 306 and a source end 304. NSA2 includes columns C4 and C5 and connecting portion 263. NSA3 includes columns C6 and C7 and connecting portion 263. NSA4 includes columns C8 and C9 and connecting portion 263. NSA5 includes columns C10 and C11 and connecting portion 263. NSA6 includes columns C12 and C13 and connecting portion 263. NSA7 includes columns C14 and C15 and connecting portion 263. NSA8 includes columns C16 and C17 and connecting portion 263. NSA9 includes columns C18 and C19 and connecting portion 263. NSA10 includes columns C20 and C21 and connecting portion 263. NS11 includes columns C22 and C23 and connecting portion 263.

The source line SLA0 is connected to the source ends 302 and 304 of two adjacent memory strings NSA0 and NSA1, respectively. The source line SLA0 is also connected to other sets of memory strings which are behind NSA0 and NSA1 in the x direction. Recall that additional U-shaped NAND strings in the stack 277 extend behind the U-shaped NAND strings depicted in the cross-section, e.g., along the x-axis.

The U-shaped NAND strings NSA0 to NSA11 are each in a different sub-block, but are in a common set of NAND strings (SetA0).

A slit portion 208 is also depicted as an example. In the cross-section, multiple slit portions are seen. Some slit portions are between the drain- and source-side columns of a U-shaped NAND string. These slits serve to separate word lines on the source and drain side of the NAND string. Other slit portions are between the source-sides of two adjacent NAND strings. Other slit portions are between the drain-sides of two adjacent NAND strings. The slits between two adjacent NAND strings are not required. Portions of the source lines SLA0-SL5 are also depicted. A portion of the bit line BLA0 is also depicted. Short dashed lines depict memory cells and select gates, as discussed further below.

Figure 3A:
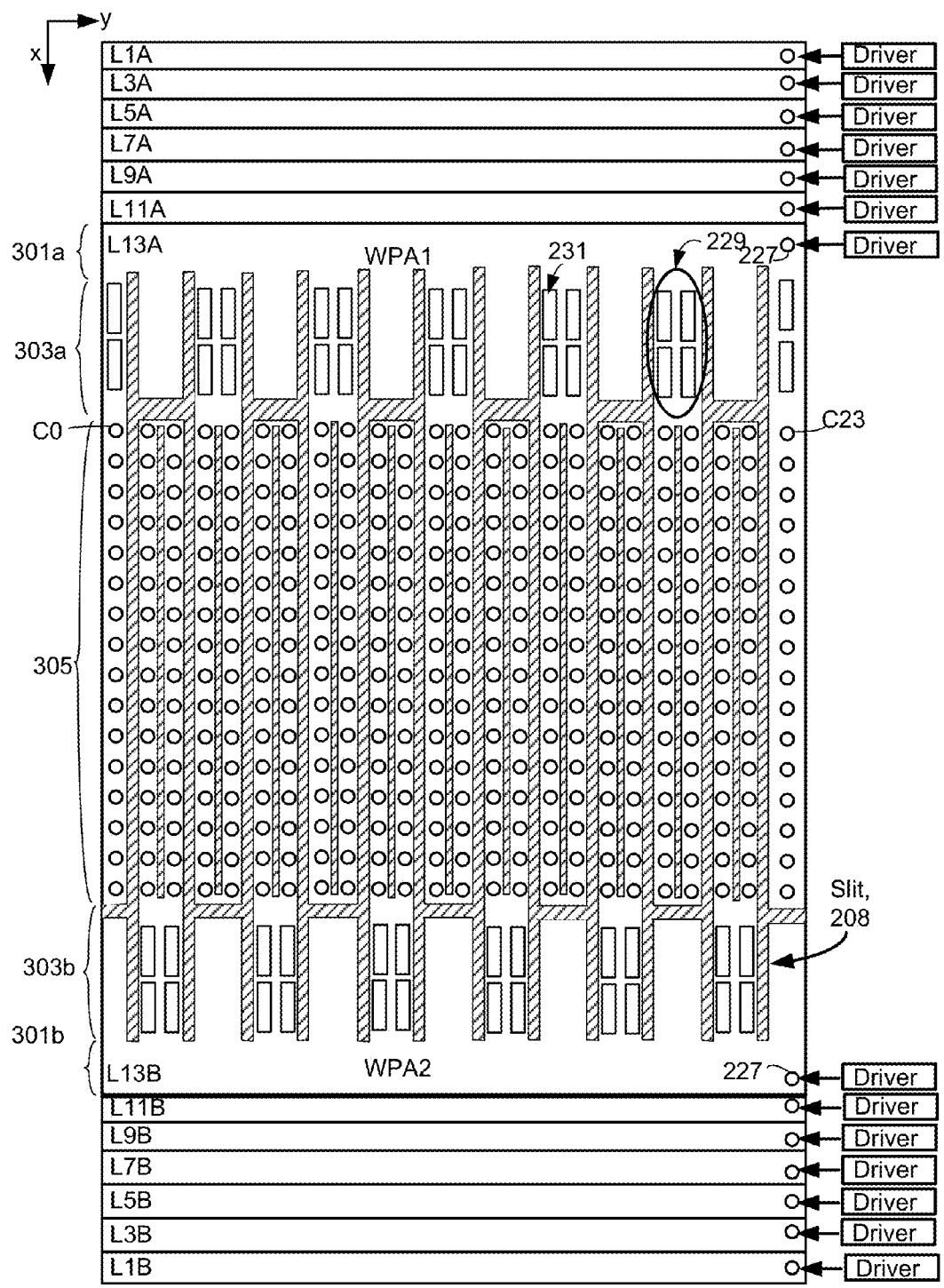
FIG. 3A depicts a top view of a block in a 3D non-volatile memory device.

FIG. 3A depicts a top view of a block in a 3D non-volatile memory device. In this example, there are 12 NAND strings across the width of the block. This view is a cross section of layer 13 (L13) of the structure of FIG. 2G, looking downward. Layer 13 is a representative layer among the multiple word line layers in a stack. Portions of layers 1, 3, 5, 7, 9 and 11 may also be seen because in this embodiment, the layers form a terrace structure with lower levels being slightly larger. This allows electrical connections to be made, as will be discussed below. The conductor layers may include doped polysilicon or metal silicide, for instance.

Level 13 in FIG. 3A depicts a horizontal slice of one block. Note that a block may include multiple layers. Also note that the word line layer may have any number of horizontal block slices. For purposes of discussion, the horizontal slice of the block will be discussed as having five separate regions. There is a first word line plate WPA1 and a second word line plate WPA2. There is a first word line plate hookup region 301a, a first WL select gate region 303a, a memory array region 305, a second WL select gate region 303b, and a second word line plate hookup region 301b.

The first word line plate hookup region 301a is in communication with a first word line plate driver. The first word line plate hookup region 301a has a contact 227 to allow this communication. FIGS. 5I and 5J show examples of contact structures. The second word line plate hookup region 301b is in communication with a second word line plate driver. The second word line plate hookup region 301a has a contact 227 to allow this communication. Word line plate drivers are also is in communication with word line plate hookup regions at other levels. The memory array region 305 includes memory cells, each of which may be associated with a NAND string. The NAND string is not depicted in FIG. 3A, as NAND strings may run in and out of the page in this top view.

Each block includes memory holes or pillars, represented by circles. The memory holes are formed in a conductive region. In this example, there are 24 memory holes in a row (in the y-direction in FIG. 3A). These 24 memory holes correspond to columns C1-C23 in FIG. 2G. One of the memory holes is labeled C0 and another C23. Other memory holes are not labeled are not depicted, so as to not obscure the drawing. In some embodiments, there are dummy memory cells. For example, there could be one additional column of memory holes in FIG. 3A. As one example, dummy cells may be on the right edge or left edge of the block. Dummy memory cells are not depicted in FIG. 3A. In this example, 16 memory holes are shown in the x-direction. There may be many more memory holes in the x-direction. The number of memory holes in the x-direction may be referred to as a page.

The block has slits, each of may be a void or narrow trench which extends vertically in the stack, typically from just above a pipe connection at the bottom to at least a top layer of the stack. The slit can be filled with insulation. The silts 208 in FIG. 3A correspond to the slits 208 depicted in FIG. 2G. In one embodiment, slits provide electrical isolation between word lines on a source side and a drain side of NAND strings. Note that there may also be slits that separate blocks. These slits can run deeper and may cut through the back gate plate on both sides of the block. Therefore, they may provide electrical isolation between blocks. The slits between blocks are not depicted in FIG. 2G.

Each WL select gate region 303 includes a number of WL select gates 229. In one embodiment, a WL select gate 229 has one or more thin film transistors (TFTs). In one embodiment, a WL select gate 229 has one or more TFT structures. A TFT structure includes two TFTs in parallel, in one embodiment. FIG. 4D, to be discussed below, shows one embodiment of a TFT structure that includes two TFTs in parallel.

In the example of FIG. 3A, some WL select gates 229 have four WL select transistor structures, others have two. A single TFT transistor structure 231 out of four in a WL select gate 229 is referenced in FIG. 3A. A WL select gate 229 may have any number of WL select transistors. Note that the slits 208 may extend into the WL select gate region 303 to provide electrical isolation between WL select gates 229. In one embodiment, a given WL select gate 229 is between two slits. The slits may help the WL select gate 229 to select the appropriate memory cells. The two slits may serve to define a set of memory cells to be selected by the WL select gate 229.

Note that the location of the word line hook up regions 301a, 301b and word line select gate regions 303a, 303b are roughly depicted. They may be located in another manner.

Figure 3B:
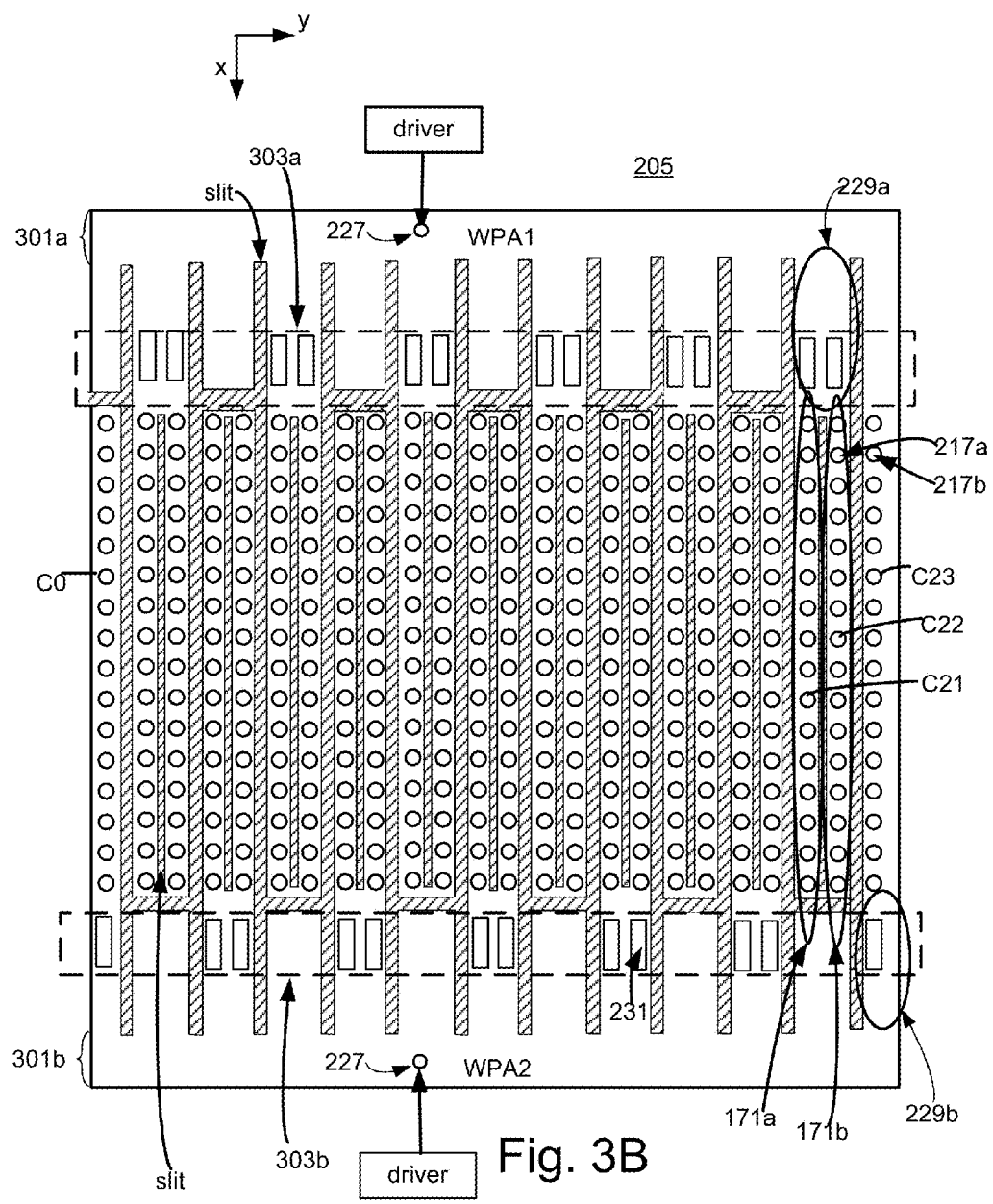
FIG. 3B shows one level of the block similar to the example from FIG. 3A.

FIG. 3B shows one level of the block 205 similar to the example from FIG. 3A. In one embodiment, two of the memory holes are associated with one U-shaped NAND string. For example, memory holes 217a and 217b may be associated with the same U-shaped NAND string (e.g., NSA11 in FIG. 2G). Each block includes a slit pattern. The slit pattern provides electrical isolation.

For purposes of discussion, the circles will be referred to as memory cells at this level of the 3D memory array. The first and second WL select gate regions 303a, 303b each include WL select gates, respectively and slits. In this example, there are two WL select transistor structures for some WL select gates, and one for others. For example, WL select gate 229a has two structures and WL select gate 229b has one structure. Each WL select gate region 303 allows individual portions of the memory array region 305 to be switchably coupled electrically to either the first or second word line plate hookup regions 301a, 301b. This may be accomplished by selecting one of the WL select gates 229. For example, WL select gate 229a will be assumed to be selected, whereas other WL select gates are not selected. This selects the two sets of circled memory cells 171a, 171b on this level.

The set of the circled memory cells 171a may be considered to be associated with one word line. The set of the circled memory cells 171b may be considered to be associated with another word line. In other words, a word line may be defined as the conductive region running in the x-direction that is associated with a single line of memory cells. Thus, memory cell 217a and others in group 171b may be selected by selecting transistors 229a. This also selects memory cells in group 171a, in this example. Memory cell 217b may be selected by selecting transistor 229b. Note that in this example, selection of WL select gates 229a may result in two word lines being selected. However, also note that in this example only one memory cell per NAND string is selected at a time. For example, memory cells in group 171a may be associated with an NSA 10, whereas memory cells in group 171b may be associated with an NSA11 (see FIG. 2G). In other words, group 171a may be associated with column C21, whereas memory cells in group 171b may be associated with column C22.

Also note that bit lines run horizontally (e.g., y-direction) across the memory cells in one embodiment such that memory cells in a row (from the perspective of FIG. 3B) may be selected. Thus, by selecting the appropriate bit line, one of the memory cells in group 171b may be selected when WL select gate 229a is selected. Also note that the driver connected to WPA1 should be selected when selecting WL select gate 229a if it is desired to select the word lines associated with WL select gate 229a. Note that WL select gates 229a allow a small portion of the block associated with WPA1 to be selected, which substantially reduces capacitive loading.

A given WL select gate 229 may be associated with a word line or a group of two or more word lines. This may allow the WL select gate 229 to select the associated word lines. A given WL select gate 229 may be coupled between the contact 227 associated with the word line plate and a given word line. Therefore, when the driver provides a voltage to the hook up region 301 via the contact 227, the WL select gate 229 is able to transfer the voltage to its associated word line. It may also be stated that a given WL select gate 229 may be coupled between the word line plate hookup region 301 and a given word line. This may allow the given WL select gate 229 to select the word line(s) associated with the WL select gate 229 (or to transfer the voltage to the word line(s)).

In FIG. 3A there may be four transistor structures 231 in some WL select gates 229 (and two with some). In FIG. 3B there may be two transistor structures 231 in some WL select gates 229 (and one transistor structure 231 in some). However, there could be more or fewer transistor structures 231 per WL select gate 229. Also, transistor structures 231 are depicted both in series and parallel in FIG. 3A, and in parallel in FIG. 3B. In one embodiment, there are two or more transistor structures 231 in series, but none in parallel. In one embodiment, there are two or more transistor structures 231 in parallel, but none in series (as in FIG. 3B). In one embodiment, there is a single transistor structure 231 in a WL select gate 229. For example, in WL select gate 229b, there may be a single transistor structure 231.

FIG. 3C1 is a schematic illustration of the slice of the block of FIG. 3A. This schematically illustrates one embodiment in which WL select gates 229 are coupled between word line plates (e.g., WPA1, WPB1) and word lines. In this example, most of the WL select gates 229 select two word lines (e.g., WL1 and WL2). However, the WL select gates 229 at each end select a single word line. These end word lines are each in communication with the first word line plate WPA1 via the WL select gates. Five of the word line pairs are in communication with the first word line plate WPA1 through the first set of WL select gates. The other six word line pairs are in communication with the second word line plate WPB1 through the second set of WL select gates. In this example, pairs of word lines may be joined by a conductive region near the WL select gate 229. However, each such pair may be electrically isolated from other WL pairs.

Each WL select gate 229 in the upper set may be selected independently of the others at this level. However, in some embodiments, the gate electrodes of transistors in the WL select gates from different levels are connected together. Depending on the architecture, other configurations may be possible. A z-decoder (not depicted in FIG. 3C1) may be used to select the WL select gate. An x-decoder for selecting the word line plates in depicted. FIG. 3C2 depicts a similar configuration in which all of the word line select gates 229 couple to and select a pair of word lines.

Figure 3D:
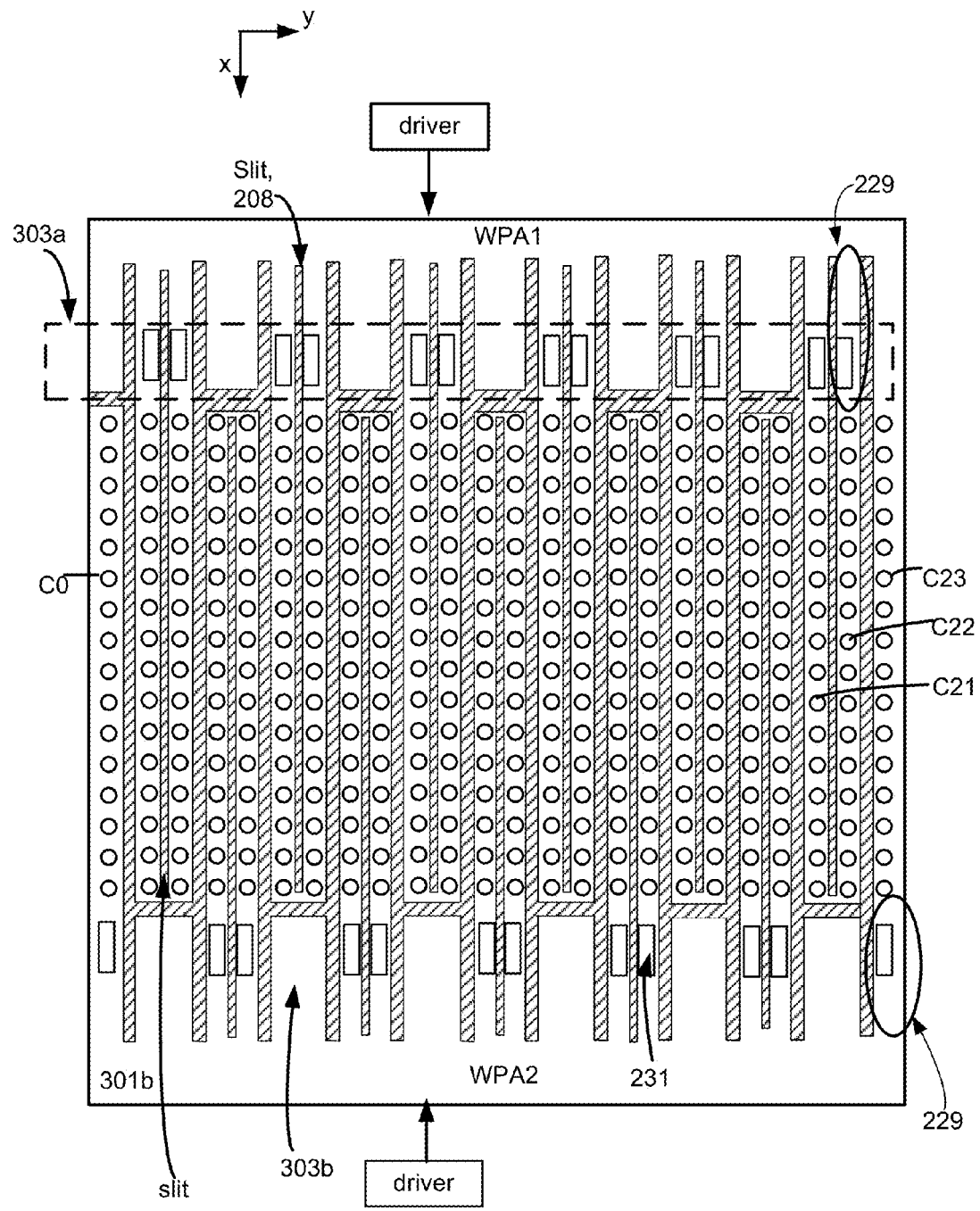
FIG. 3D is a diagram of one embodiment of a block having WL select gates that each select a single word line at this level of the memory array.

In one embodiment each WL select gate 229 selects a single word line. FIG. 3D is a diagram of one embodiment of a horizontal slice of a block having WL select gates 229 that each select a single word line at this level of the memory array. This example is similar to the embodiment of FIG. 3B, but slits 208 extend into the WL select gate region 303 to provide electrical isolation between a pair of adjacent WL select gates 229. This allows each member of the pair to select one word line.

Figure 3E:
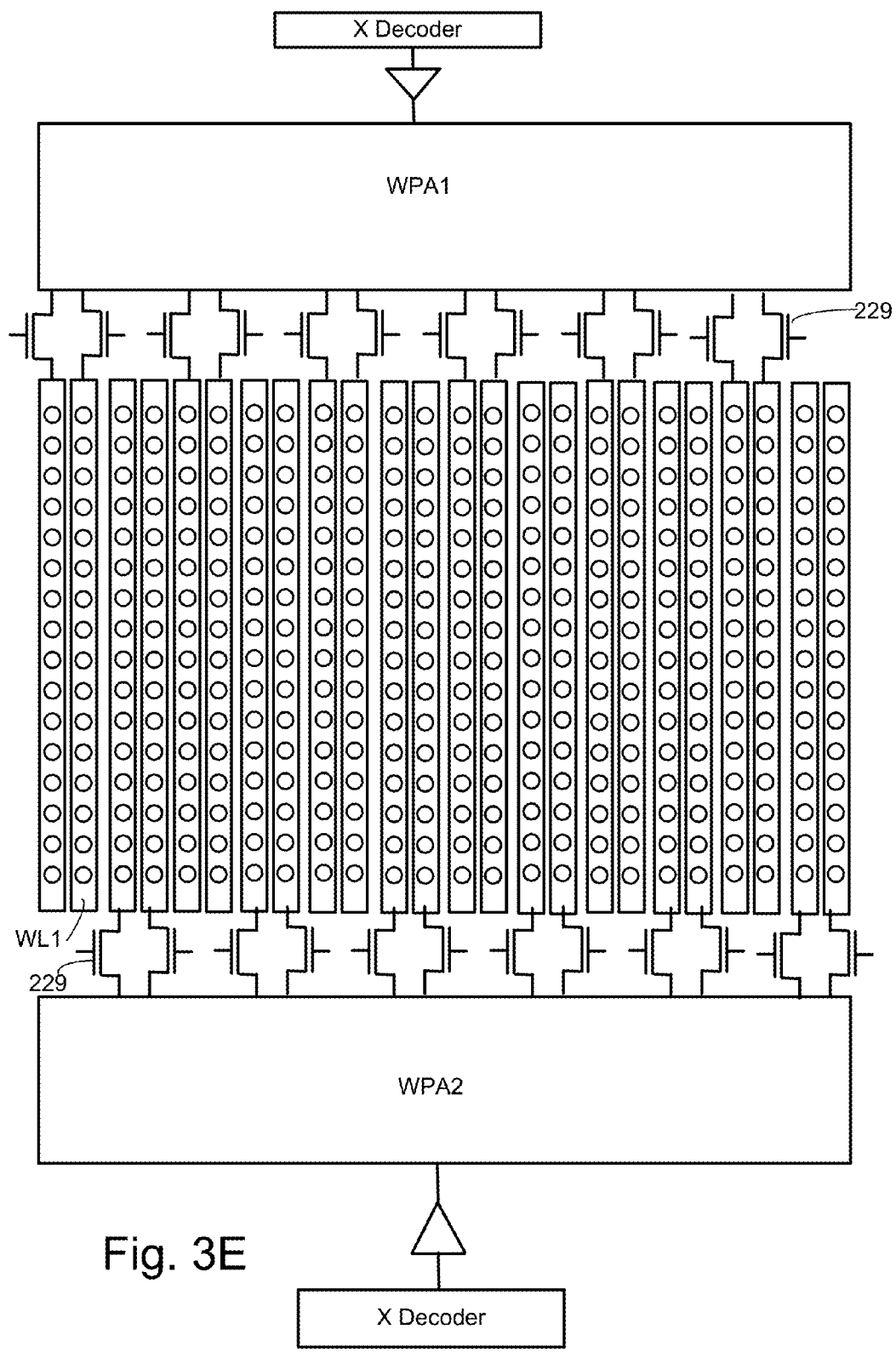
FIG. 3E is a schematic illustration of the block of FIG. 3D.
Figure 3F:
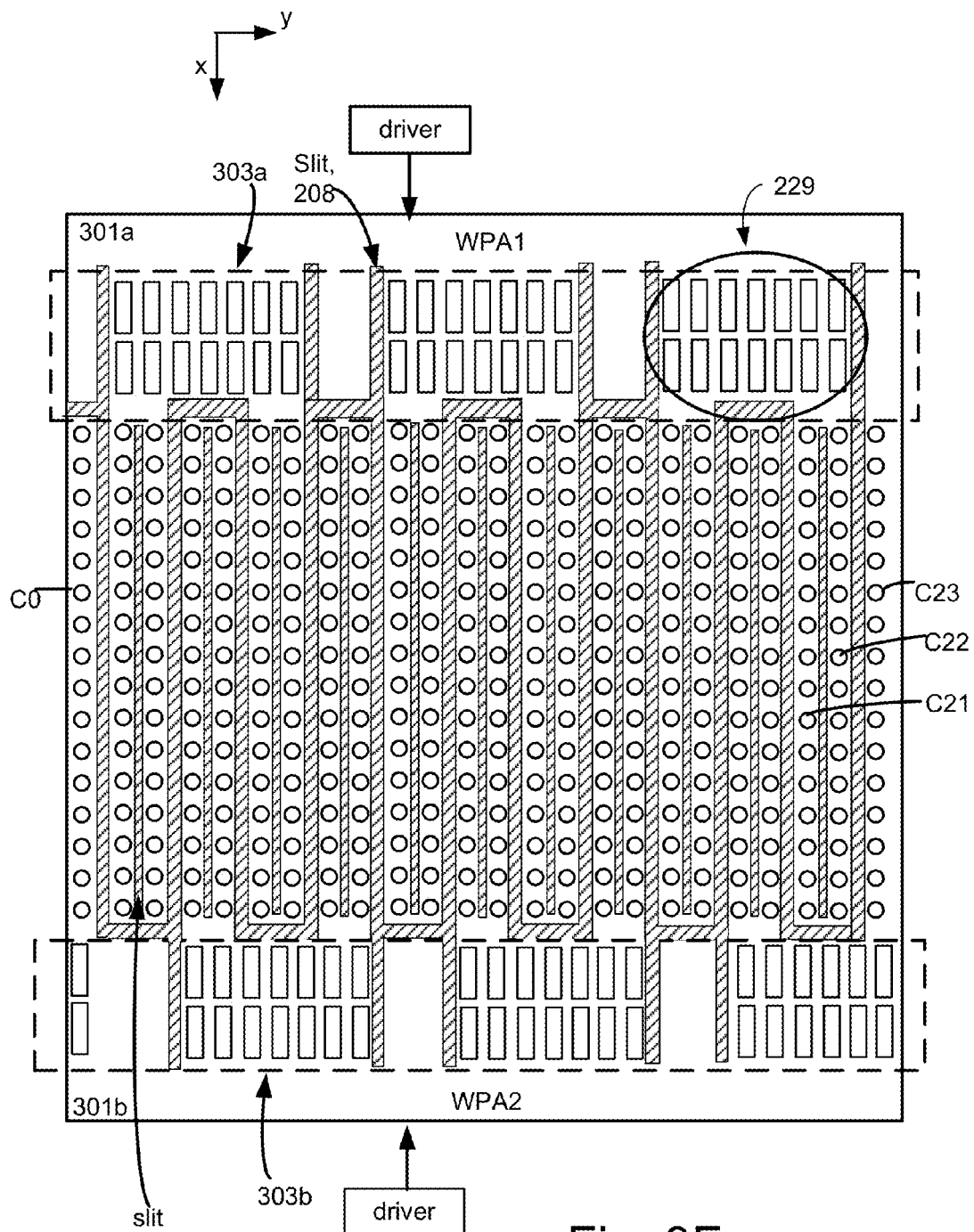
FIG. 3F shows one level of the block for one embodiment in which a WL select gate may select more than one word line.
Figure 3G:
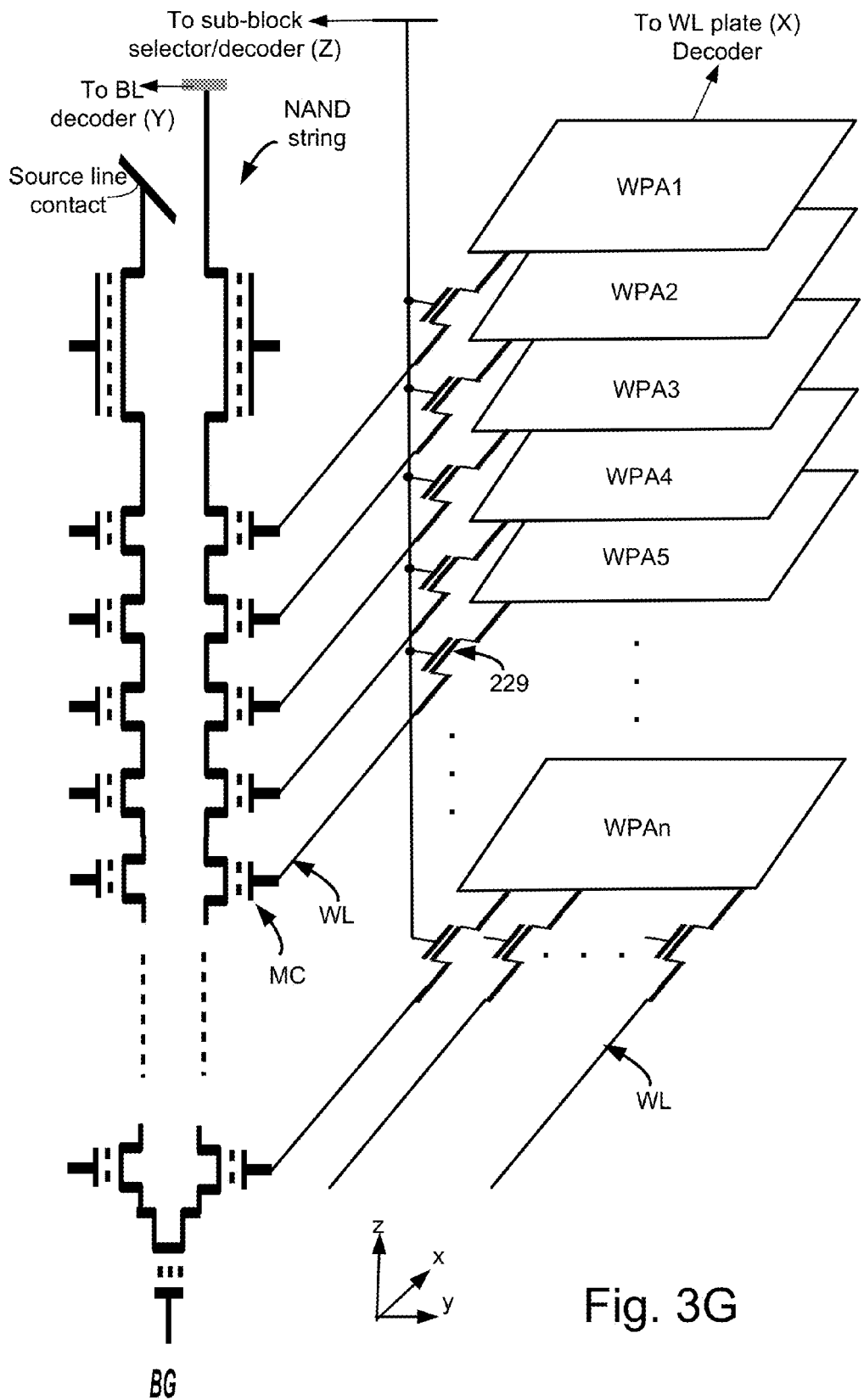
FIG. 3G is a diagram showing how WL select gates at different levels may have their gate electrodes connected.

FIG. 3E is a schematic illustration of the slice of the block of FIG. 3D. A z-decoder (not depicted in FIG. 3E) may select one of the WL select gates 229 from the upper group in order to select one word line (e.g., WL1) at this level of the memory array. Alternatively, the z-decoder may select one of the WL select gates 229 from the lower group to select one word line at this level of the memory array. Note that the z-decoder may select WL select gates that are associated with different levels of the memory array (not depicted in FIG. 3E) and that have their gate electrodes connected. In this example, each word line may be electrically isolated from others. The z-decoder may simultaneously select a set of WL select gates that are at different levels of the block. FIG. 3G depicts one example of this.

Note that a WL select gate 229 could select more than two word lines. FIG. 3F shows one level of the block similar to the example from FIG. 3A. In this example, a WL select gate 229 may select more than one word line. The upper WL select gate region 303a includes three WL select gates 229. Each of these selects four word lines. Those four word lines are each associated with plate WPA1.

The lower WL select gate region 303b includes four WL select gates 229, in this example. Two of the WL select gates 229 select four word lines. The WL select gate 229 to the right selects three word lines. The WL select gate 229 to the left selects a single word line. Other configurations could be used.

FIG. 3G is a diagram showing how WL select gates 229 at different levels of a block may have their gate electrodes connected. The diagram shows word line plates WPA1-WPAn. Each of these plates is at a different level of the 3D memory device. The depicted plates WPA1-WPAn may be in the same block. For example, referring to FIG. 2G, one plate could be at level WL6, one at level WL5, etc. Six plates are depicted for ease of illustration; there may be any number of levels. Also note that at each level there may be many plates. In one embodiment, there are two plates per block per level, such as in FIG. 3A. The other plate in this block (per level) is not depicted in FIG. 3G for ease of illustration. There may be other blocks in the 3D NAND device.

At a given level, a WL select gate 229 has one terminal connected to its respective word line plate (e.g., WPAn). Another terminal of the WL select gate 229 is connected to its respective word line (WL). As noted above, a WL select gate 229 could be associated with (e.g., could select) more than one WL. The word line connects to control gates of memory cells (MC). One U-shaped NAND string is depicted to show the connection between memory cells and WL select gates 229. However, typically there are many NAND strings per block. Thus, a word line may be associated with one memory cell on many different NAND strings. Note that each memory cell on a given NAND string connects to a different word line in one embodiment. Thus, each memory cell that is associated with a given word line is part of a different NAND string in one embodiment.

The gate electrodes of the depicted WL select gates 229 in FIG. 3G are connected together by an electrically conductive line. Thus, these WL select gates 229 form one group that may be selected in common by the z-decoder. Therefore, word lines at different levels of a block may be selected together in one embodiment. This may be referred to herein as "sub-block" decoding.

The gates of the WL select gates 229 are connected to a sub-block or z decoder, in one embodiment. One end of the NAND string is connected to a bit line (BL) or y-decoder, in one embodiment. Note that other NAND strings associated with the same bit line may be selected together with the NAND string that is depicted in FIG. 3G. Each word line plate is connected to a word line (WL) plate or x-decoder, in one embodiment. Thus, 3D decoding is possible, in one embodiment.

As was mentioned above, in some conventional 3D memory arrays all memory cells associated with that WL plate are electrically stressed. The following example will be provided to illustrate a problem with a conventional architecture that does not have the ability to select relatively small sections of the memory, such as individual word lines. Suppose we want to program one memory cell (selected cell) in a NAND string. This may include biases the respective WL to a high positive bias (e.g. 18-25V). At the same time, for the selected NAND string to which the selected cell belongs, the source line may be biased to low potential (e.g. 0V) and the BL of that string may also be biased to low potential (e.g. 0V). At the same time SGD and SGS of the selected string may be biased to a high enough potential (higher than SGD & SGS Vt), so that SGD and SGS transistors are turned on. This transfers BL and SL potential (here 0V) to the channel (body poly-Si of the string). This creates a high potential difference between the selected WL (control gate of the selected cell) and the channel of the selected string.

Electrons tunnel from the channel to charge trapping layer of the selected cell and the cell is programmed. However in order to bias the selected WL (of the selected cell of the selected string), the whole WL plate within one block needs to be biased in some conventional systems. For others half of the WL plate needs to be biased if it's a comb structure. Therefore, all cells on the same WL plate, belonging to other, UNSELECTED strings within the same block, are biased to the same potential of 18-25V. These cells are UNSELECTED cells, not intended to be programmed. For them, their WL is "unintentionally selected." Therefore, these unselected cells are subject to stress every time any cell belonging to the same WL plate is programmed. Hence, the issue of program disturb.

To prevent unselected cells in unselected strings, especially on the same BL, from being programmed during selected cell program operation, all SGD and SGS transistors in unselected strings may be biased to low potential (below SG Vt, e.g. 0V). Then, SG transistors are shut off, and the BL potential (here 0V), and source line potential (here 0V) are not transferred to the unselected string channels. In other words, by shutting SGD and SGS transistors off in unselected strings, the channels of those strings become isolated from BL and SL potential. Meanwhile there is a high potential on the selected WL. This potential will be coupled to the isolated channel leading to the channel potential boosting. Boosted channel potential can be very high, e.g. 10-15V. The potential difference between the selected WL and boosted channel potential in unselected strings becomes low, not sufficient to program/disturb unselected cells (ideally). However, the possibility of program disturb of unselected cells can be an issue. In embodiments disclosed herein, with WL select gate selecting just one WL (or a few WLs), disturbing the other cells (or majority of the cells) belonging to the same WL plate within block and sharing the same BL may be avoided.

Figure 4A:
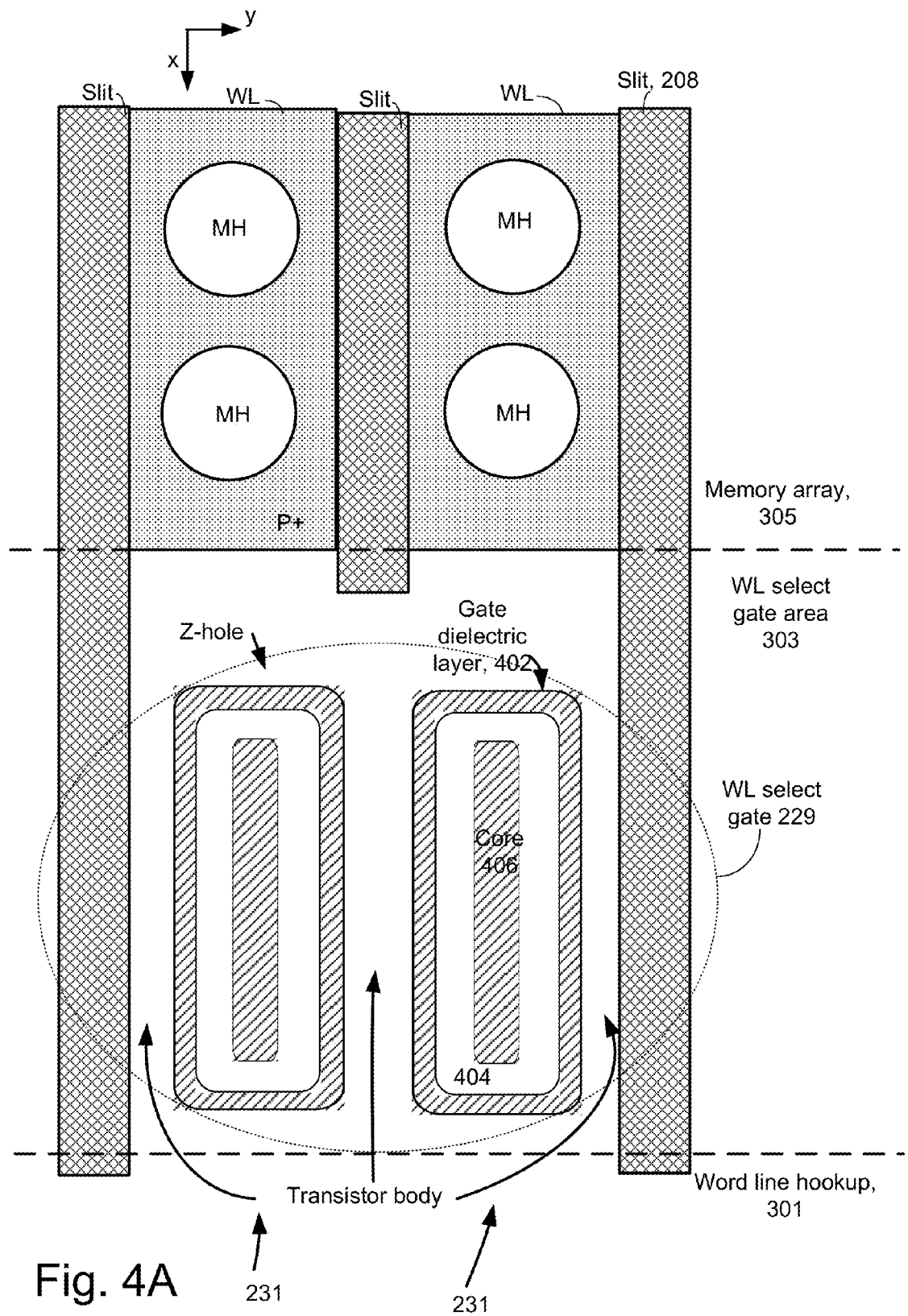
FIG. 4A is a diagram of one embodiment of WL select gates in a WL select gate region between a memory array and a word line hookup area.

FIG. 4A is a diagram of one embodiment of a WL select gate 229 in WL select gate area 303 between a memory array region 305 and a word line hookup area 301. The general region of the WL select gate 229 is circled. Memory holes (MH) in the memory array region 305 are also depicted. The diagram is consistent with FIG. 3B. There are several slits 208, which may provide electrical isolation between memory cells associated with different word lines. The memory cells may be formed in the word lines. In this example, the WL select gate 229 includes two transistor structures 231 in parallel. These two transistor structures 231 may together select both word lines. For example, during operation both transistor structures 231 are selected together, resulting in both word lines being selected. Note that another option is to replace the two transistor structures 231 with a single transistor structure 231 that selects both word lines. As noted earlier, transistor structures 231 may also be placed in series, although this is not depicted in FIG. 4A.

A portion of each transistor structure 231 may be formed in what is referred to herein as a Z-hole portion that may be formed in doped silicon (e.g., polysilicon) or another semiconductor. In one embodiment, Z-holes are similar to memory holes in that they may be columnar structures. However, the z-holes may have a different horizontal (e.g., xy plane) cross sectional shape from the memory holes. Z-holes are of roughly rectangular shape in FIG. 4A. After lithography and etch process they can become oval shape. In one embodiment, Z-holes have a square shape in layout (same as one embodiment of memory holes). After lithography and etch process they can become circular in shape. For a circular shaped Z-hole, several TFT transistors in series may be used for better TFT control, in one embodiment.

The Z-hole portion in general includes a gate dielectric layer 402, a gate electrode layer 404, and a core 406, in one embodiment. The gate dielectric layer 402 may be formed from one or more layers of a dielectric such as silicon oxide and silicon nitride. The gate electrode layer 404 may be formed from a conductor material such as highly doped polysilicon. The core region 406 may be an insulator such as silicon dioxide. As noted, the region around the Z-holes may be doped semiconductor. Various portions of this region may serve as the body, drain, and source (src) for one or more of the transistors. In FIG. 4A, the bodies are roughly pointed to on the right and left of the gate dielectric layer 402. Source and drains may be more heavily doped than the bodies. The location of the source and drain can vary. In one embodiment, the source and drains begin roughly at the edge of the gate dielectric layer 402. This is will discussed more fully below.

In one embodiment, a single one of the transistor structures 231 operates as two transistors in parallel. The gate electrode layer 404 may serve as two gate electrodes that are back to back, separated by the core 406. The gate dielectric layer 402 may serve as two separate gate electrodes, one for each transistor. FIG. 4D, to be discussed below, provides additional details of one embodiment.

Figure 4B:
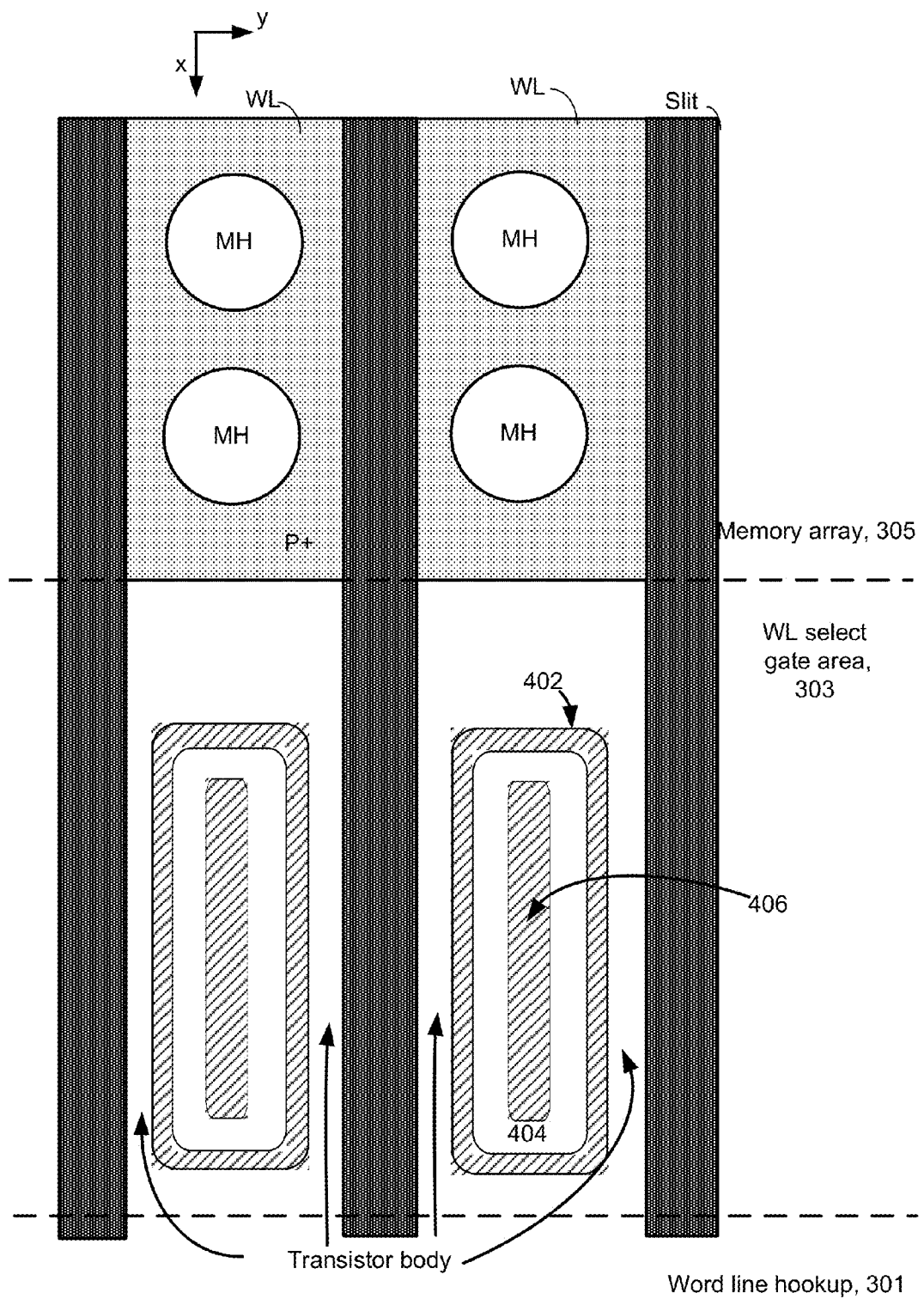
FIG. 4B is a diagram of one embodiment of WL select gates in a WL select gate region between a memory array and a word line hookup area in which each word line is selected independently.

FIG. 4B is a diagram of one embodiment of two WL select gates 229 in a WL select gate area 303 between a memory array and a word line hookup area 301 in which each word line is selected independently. In this example, the word lines are P+. The transistor body area may be doped n-type or p-type. The net doping concentration in the body area may be significantly lower than the dopant concentration in the word lines.

Figure 4C:
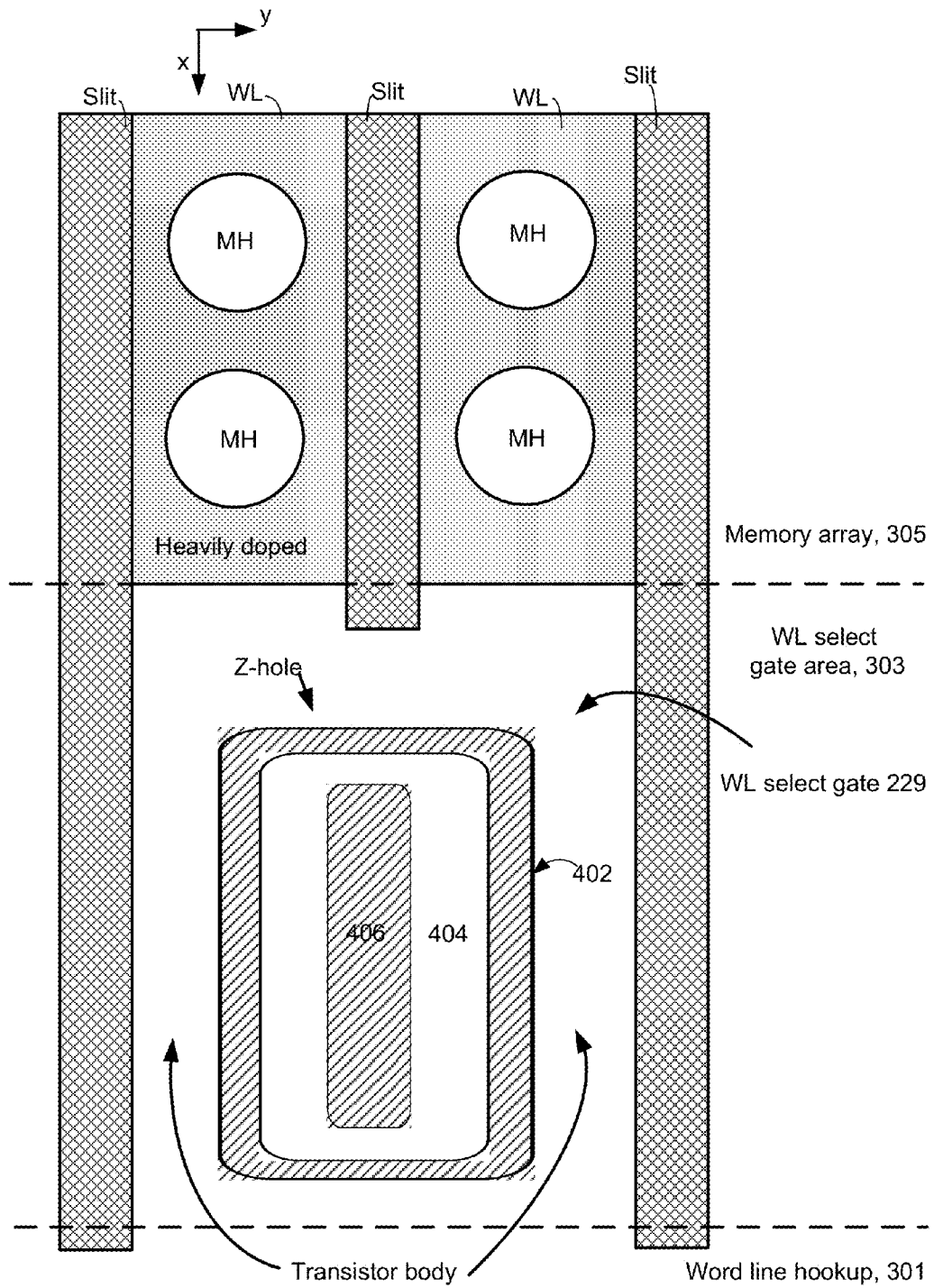
FIG. 4C is a diagram of one embodiment of a WL select gate in a WL select gate region between a memory array and a word line hookup area in which two adjacent word lines are selected together.
Figure 4D:
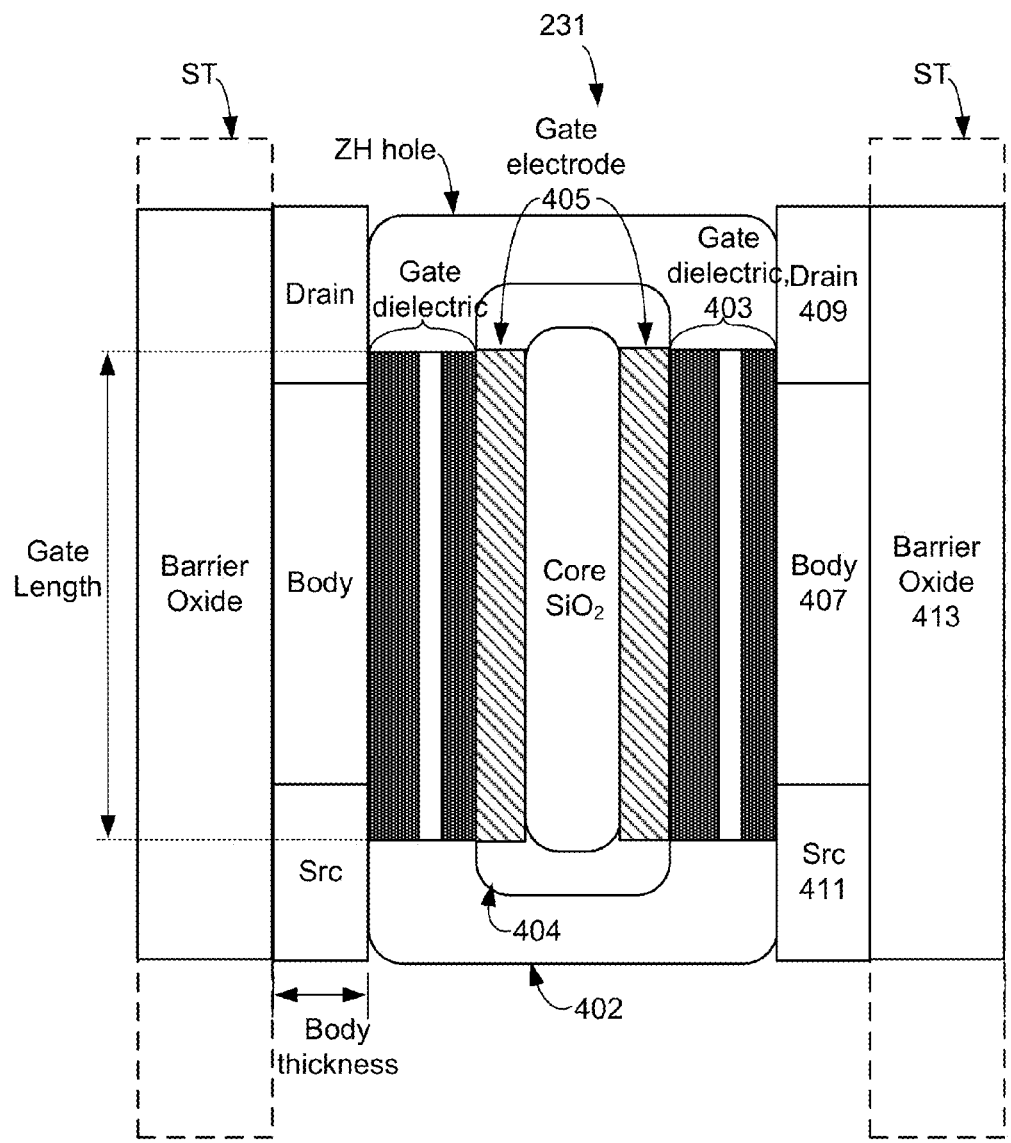
FIG. 4D is a diagram illustrating various elements of a TFT structure of a WL select gate in accordance with one embodiment.

FIG. 4C is a diagram of one embodiment of a WL select gate 229 in a WL select gate area 303 between a memory array and a word line hookup area in which two adjacent word lines are selected together. In this example, a single transistor structure is used as a selector. The transistor structure includes body regions, a gate dielectric layer 402, a gate electrode layer 404, and a core 406. The single transistor structure may operate as two TFTs in parallel.

FIG. 4D is a diagram illustrating various elements of a TFT structure 231 in accordance with one embodiment. FIG. 4D corresponds to the TFT structure of the WL select gate 229 example of FIG. 4C. FIG. 4D depicts a transistor structure 231 that may operate as two TFTs in parallel. Various elements such as a gate electrode, gate oxide (or gate dielectric), body, source and drain are represented. Note that the device is represented as having two gate electrodes, two gate dielectrics, two bodies, etc. Starting from the center of the transistor structure and working outward, the core may be an insulator (e.g., dielectric) such as $SiO_2$.

Moving outward, a gate electrode is depicted on each side of the core. Note that the gate electrodes may be formed from a portion of the gate electrode layer 404. As mentioned before, the gate electrode layer 404 may be formed from doped polysilicon. This doped polysilicon may completely surround the core. However, for purpose of analysis a gate length is shown in FIG. 4D. Note that the length of the gate electrode may be adjusted to achieve desired performance, such as leakage current.

Moving further out, there is a gate dielectric 403 between each gate electrode and the corresponding body. The gate dielectric may be formed from portions of the dielectric layer 402. In one embodiment, the gate dielectric is formed from several layers, such as silicon oxide, silicon nitride, silicon oxide (e.g., ONO).

A transistor body 407 is depicted adjacent to each gate dielectric. The body 407 may be formed from doped polysilicon. The doping may be different (e.g., lower) from the doping of the word lines, however. Various techniques are discussed herein for doping the body. Selecting a suitable doping profile for the body is one way to achieve desirable performance, such as leakage current. The body thickness is depicted in FIG. 4D. To each side of each body 407 are a drain 409 and a source 411. A portion of the slit (ST) may serve as a barrier oxide 413 next to each body 407. Note that the slits (ST) in FIG. 4D may correspond to the slits in FIG. 4C. The TFT of FIG. 4D may be referred to as a symmetric configuration. In one embodiment, the TFT has an asymmetric configuration.

The body 407 may also be referred to as a channel. In the embodiment depicted in FIG. 4D, the body 407 does not extend past the gate electrode 405. However, the body 407 could extend beyond the gate electrode 405, as will be described below. The location of the source 411 and drain 409 are shown on each side of the body 407.

In one embodiment, the gate electrode 405 of the transistor is doped P+. In one embodiment, the word lines are heavily doped (e.g., P+). However, the body region 407 of the transistors may be lightly doped p-type or n-type. Techniques are disclosed herein for modifying the doping levels in the body region to achieve a desired doping level and conductivity.

In one embodiment, the transistors are thin film transistors (TFT). The transistor is an enhancement type NMOS device, in one embodiment. In this case, the word lines may be N+ and the TFT body may be p-type. In this case, the TFT Vt may be positive. Applying a positive voltage to the transistor gate that is greater than its Vt should turn the transistor on. Applying a negative or zero voltage to the transistor gate should shut the transistor off. The body thickness, gate length, and other parameters may be tailored for desired performance.

The transistor is a depletion type NMOS device, in one embodiment. In this case, the word lines may be N+ and the TFT body may be n-type. In this case, the TFT Vt may be negative. Applying a zero or positive voltage to the transistor gate should turn the transistor on. Applying a negative voltage (that has an absolute value higher than the absolute value of Vt) to the transistor gate should shut the transistor off. In other words, a negative bias that is less than Vt should turn the TFT off. The body thickness, gate length, and other parameters may be tailored for desired performance.

The transistor is an enhancement type PMOS device, in one embodiment. In this case, the word lines may be P+ and the TFT body may be n-type. In this case, the TFT Vt may be negative. Applying a negative voltage (that has an absolute value higher than the absolute value of Vt) to the transistor gate should turn the transistor on. In other words, a negative bias that is less than Vt should turn the transistor on. Applying a zero or positive voltage to the transistor gate should turn the transistor off.

The transistor is a depletion type PMOS device, in one embodiment. In this case, the word lines may be P+ and the TFT body may be p-type. In this case, the TFT Vt may be positive. Applying a negative or zero voltage to the transistor gate should turn the transistor on. Applying a positive voltage to the transistor gate that is greater than its Vt should turn the transistor off.

In one embodiment, the transistor gate electrode is P+, the body is n− and the source/drain is P+. An example doping concentration for a p-type gate electrode is about $1.0\times10^{21}/cm^3$. An example range of doping concentration for an n-type body is about $1.0\times10^{17}/cm^3$ to $5.0\times10^{18}/cm^3$. An example doping concentration for a p-type source or drain is about $1.0\times10^{21}/cm^3$. However, any of these concentrations or ranges concentrations may be higher or lower. An example of a p-type dopant is boron. An example of an n-type dopant is phosphorous. In some embodiments, a net doping concentration is achieved by a mix of p-type and n-type dopants (e.g., by counter doping).

In one embodiment, the transistor gate electrode is P+, the body is p− and the source/drain is P+. An example doping concentration for a p-type gate electrode is about $5.0\times10^{19}/cm^3$. An example range of doping concentration for a p-type body is about $1.0\times10^{17}/cm^3$ to $5.0\times10^{18}/cm^3$. An example doping concentration for a p-type source or drain is about $1.0\times10^{21}/cm^3$. However, any of these concentrations or ranges may be higher or lower. An example of a p-type dopant is boron. An example of an n-type dopant is phosphorous. In some embodiments, a net doping concentration is achieved by a mix of p-type and n-type dopants (e.g., by counter doping).

In one embodiment, the word lines are n-doped. The word lines may be heavily doped (e.g., N+). In this case, the body of the TFT transistors are p-type (e.g., enhancement NFET TFT) in one embodiment. The body of the TFT transistors are n-type (e.g., depletion NFET TFT), in one embodiment. In one embodiment, the gate electrodes are N+ when the word lines are N+.

Figure 4E:
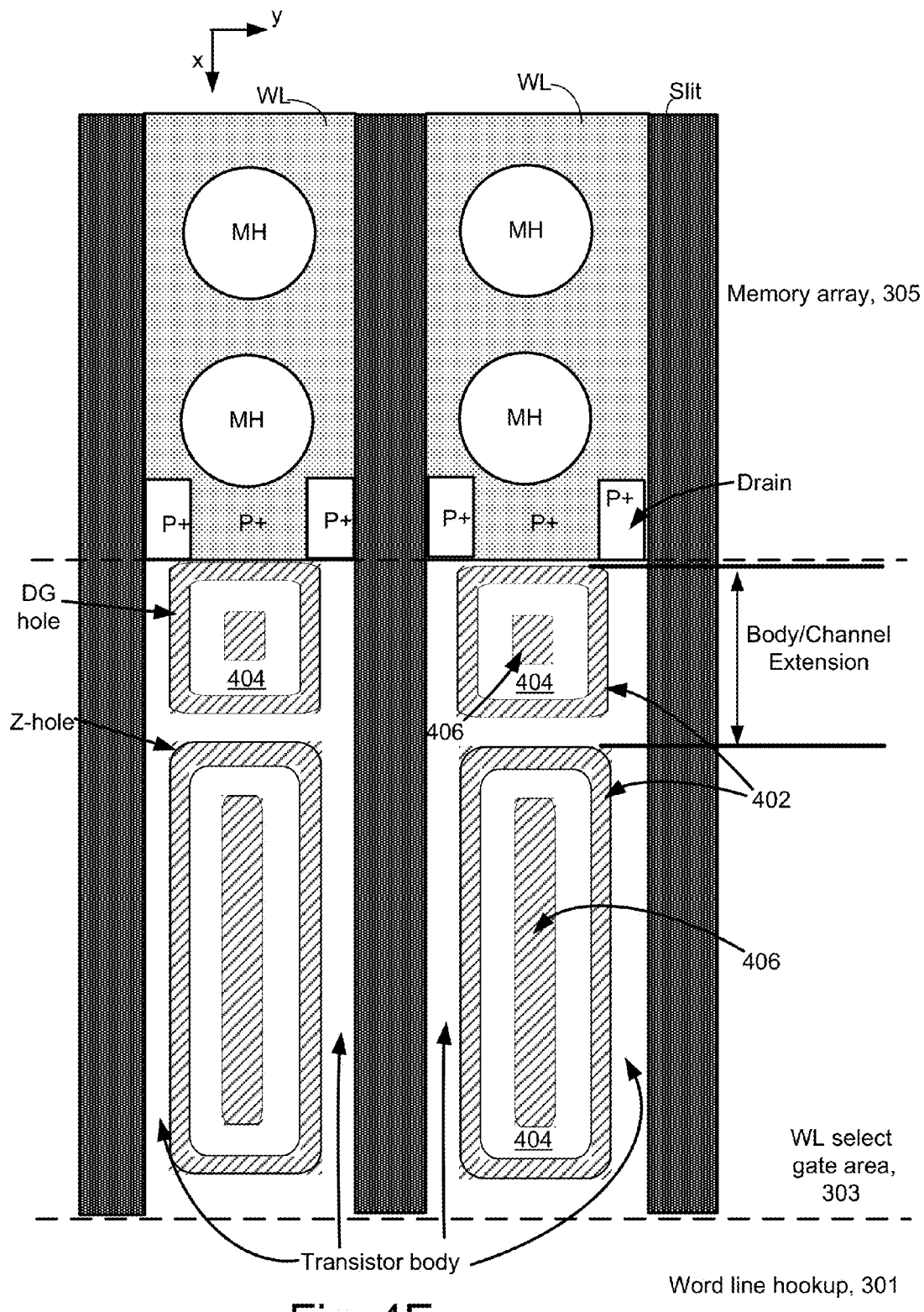
FIG. 4E depicts one embodiment of TFTs having a body/channel extension. This may also be referred to as having an offset drain.

FIG. 4E depicts one embodiment of TFTs having a body/channel extension. This may also be referred to as having an offset drain or gate/drain offset. In addition to the z-holes, there are two dummy gate holes ("DG-hole"). In this case, there is one dummy gate hole between each z-hole and the memory array region 305. The extent of one of the body/channel extensions is labeled. There are four body/channel extensions in FIG. 4E. The location of four drain regions are also roughly depicted. In this example, the drains are P+, but could be N+ for some TFTs. As can be seen, the drains are offset from the gate electrode layer 404 of the z-hole.

The dummy gate holes may be filled similar to how the z-holes are filled. Thus, there may be a gate dielectric layer 402, a gate electrode layer 404, and a core 406, in one embodiment. However, the gate electrode layer 404 does not need to be electrically connected to any signal line. In other words, the dummy gate does not need to be driven during operation. One reason for connecting the dummy gate to a separate signal line is to fine-tune transistor operation, such as for better control of drive current and leakage.

Figure 4F:
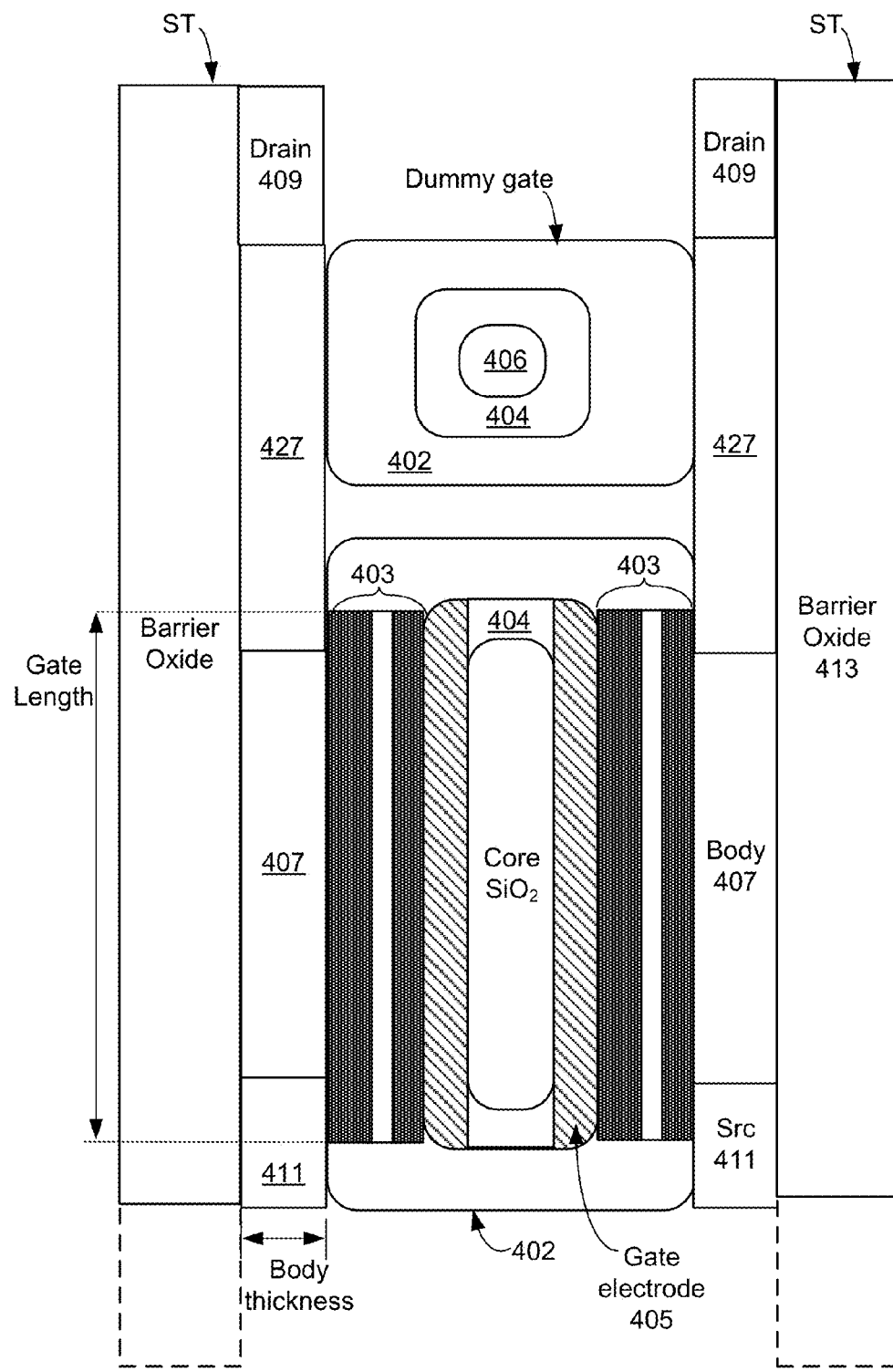
FIG. 4F is a diagram illustrating various elements of a TFT structure 231 in accordance with one embodiment.

FIG. 4F is a diagram illustrating various elements of a TFT structure 231 in accordance with one embodiment. FIG. 4F shows a single transistor structure 231 for an embodiment with an extended channel. The single transistor structure 231 is similar to the one depicted in FIG. 4E, with differences including an extended body/channel 427, and the drain 409 being offset from the gate electrode 405. Elements of the dummy gate are also depicted.

In the embodiment depicted in FIG. 4D, the body 407 extends past the gate electrode 405, as a result of the body/channel extension 427. The location of the source 411 and drain 409 are shown on each side of the body 407. The body/channel extension 427 could also be referred to as a gate/drain offset in that the drain 409 is offset from the gate electrode 405. Note that the body (channel) could be extended on the source side in addition to, or instead of, the extension on the drain side.

Note that the length of the gate electrode may be adjusted to achieve desired performance, such as leakage current. The channel extension 427 may reduce the on current ($I_{on}$), as a result of higher series resistance. However, $I_{on}$ can be increased by modulating the channel length. A tradeoff can be made between leakage current and $I_{on}$ by selection of the gate length and the channel extension 427.

A TFT having a channel extension may significantly reduce GIDL (Gate Induced Drain Leakage). A possible reason for this is a reduction of band to band (BTB) carrier generation. A TFT having a channel extension may allow for a higher gate to drain voltage during operation without encountering problems such as GIDL. In one embodiment, GIDL can be well controlled, even for potential difference between source and drain 25V or more.

A TFT having a channel extension may significantly reduce source to drain breakdown. A TFT having a channel extension may have low GIDL, low leakage current, higher breakdown voltage, and additional room to optimize performance and $I_{on}$/leakage current tradeoffs.

Figure 4G:
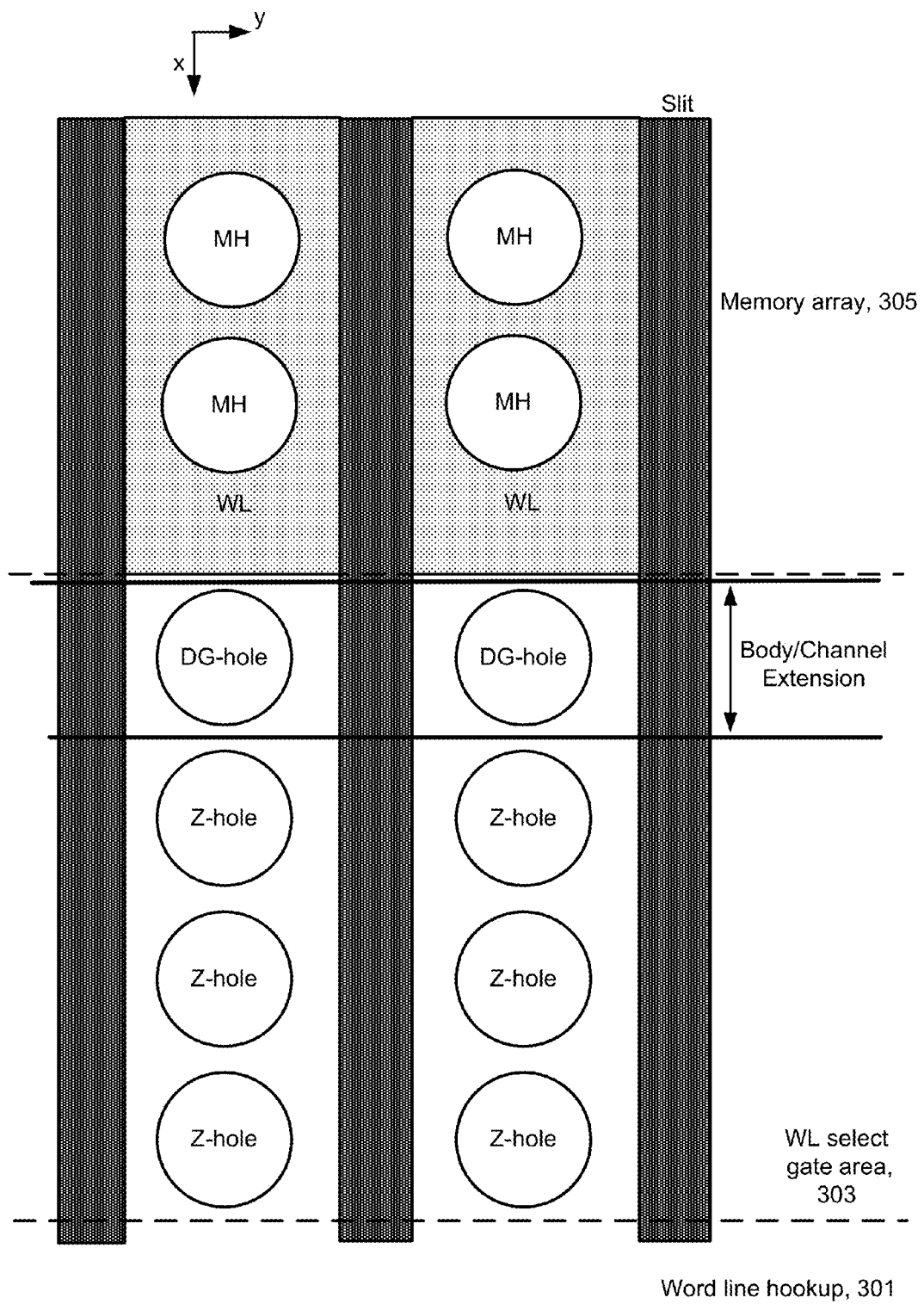
FIG. 4G is a diagram of a process layout in accordance with one embodiment.

FIG. 4G is a diagram of TFTs in series in accordance with one embodiment. In this embodiment, there are three z-holes for forming three TFTs in series (for each WL). There is a DG-hole for forming a dummy gate. The region of the word line around the z-hole (e.g., between the z-hole and the slits) will be the body of the TFTs. The region of the word line around the DG-hole (e.g., between the DG-hole and the slits) will be the body/channel extension.

Figure 5A:
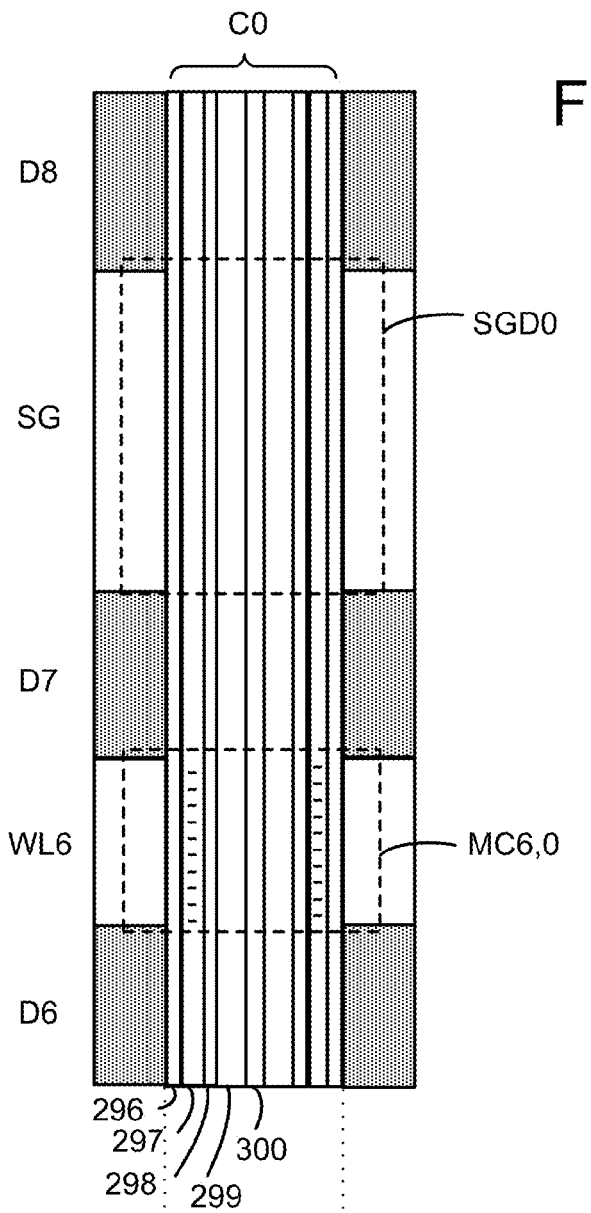
FIG. 5A depicts a close-up view of a region 269 of the column C0 of FIG. 2G, showing a drain-side select gate SGD0 and a memory cell.
Figure 5B:
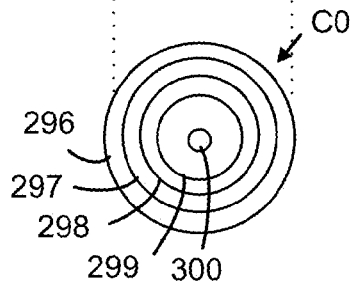
FIG. 5B depicts a cross-sectional view of the column C0 of FIG. 2F.

FIG. 5A depicts a close-up view of a region 269 of the column C0 of FIG. 2G, showing a drain-side select gate SGD0 and a memory cell. The region shows portions of the dielectric layers D6 to D8 and the conductor layers WL6 and SG. Each column includes a number of layers which are deposited along the sidewalls of the column. These layers can include oxide-nitride-oxide and polysilicon layers which are deposited, e.g., using atomic layer deposition or CVD. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns. FIG. 5B depicts a cross-sectional view of the column C0 of FIG. 2F. Each layer is ring-shaped in one possible approach, except the core filler which is cylindrical.

When a memory cell is programmed, electrons are stored in a portion of the charge trapping layer which is associated with the memory cell. For example, electrons are represented by "−" symbols in the charge trapping layer 297 for MC6,0. These electrons are drawn into the charge trapping layer from the polysilicon body, and through the tunnel oxide. The threshold voltage of a memory cell is increased in proportion to the amount of stored charge. During an erase operation, a voltage in the polysilicon body may be raised due to GIDL, while a voltage of one or more selected word line layers floats. GIDL may occur due to high potential difference between bit line bias and drain side select gate bias (SGD), and similarly, between source line bias and select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. Memory cells of the unselected word lines will experience little or no Vth downshift, and as a result, they will not be erased. Other techniques may be used to erase.

Figure 5C:
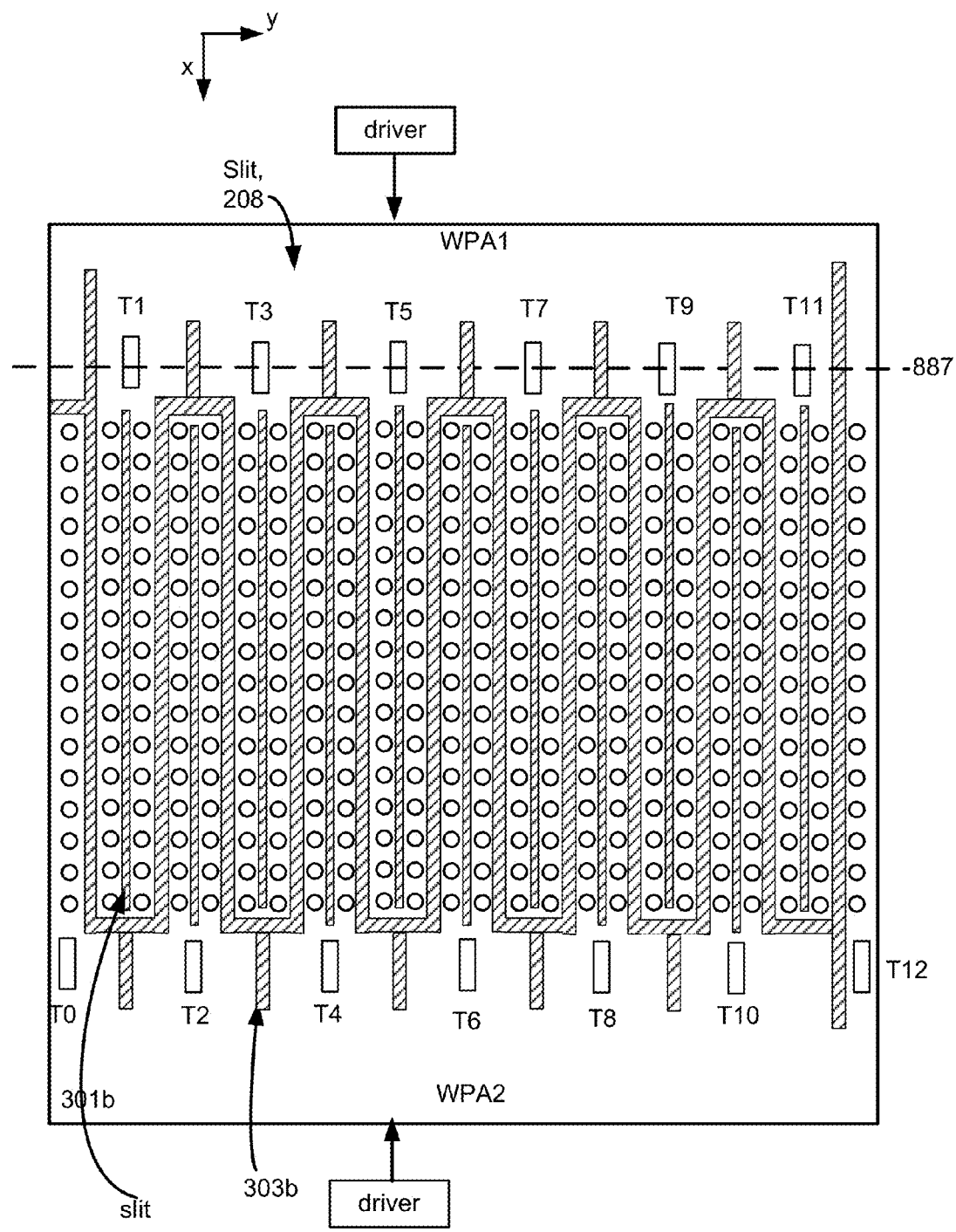
FIG. 5C is a diagram of one embodiment of a block of a 3D stacked memory array.

FIG. 5C is a diagram of one embodiment of a horizontal (e.g., xy plane) slice of a block of a 3D stacked memory array. In this embodiment, there is one WL select gate 229 per each two word lines. At the bottom are WL select gates T2, T4, T6, T8, T10, and T12. Odd numbered WL select gates T1, T3, T5, T7, T9, and T11 are at the top.

Figure 5D:
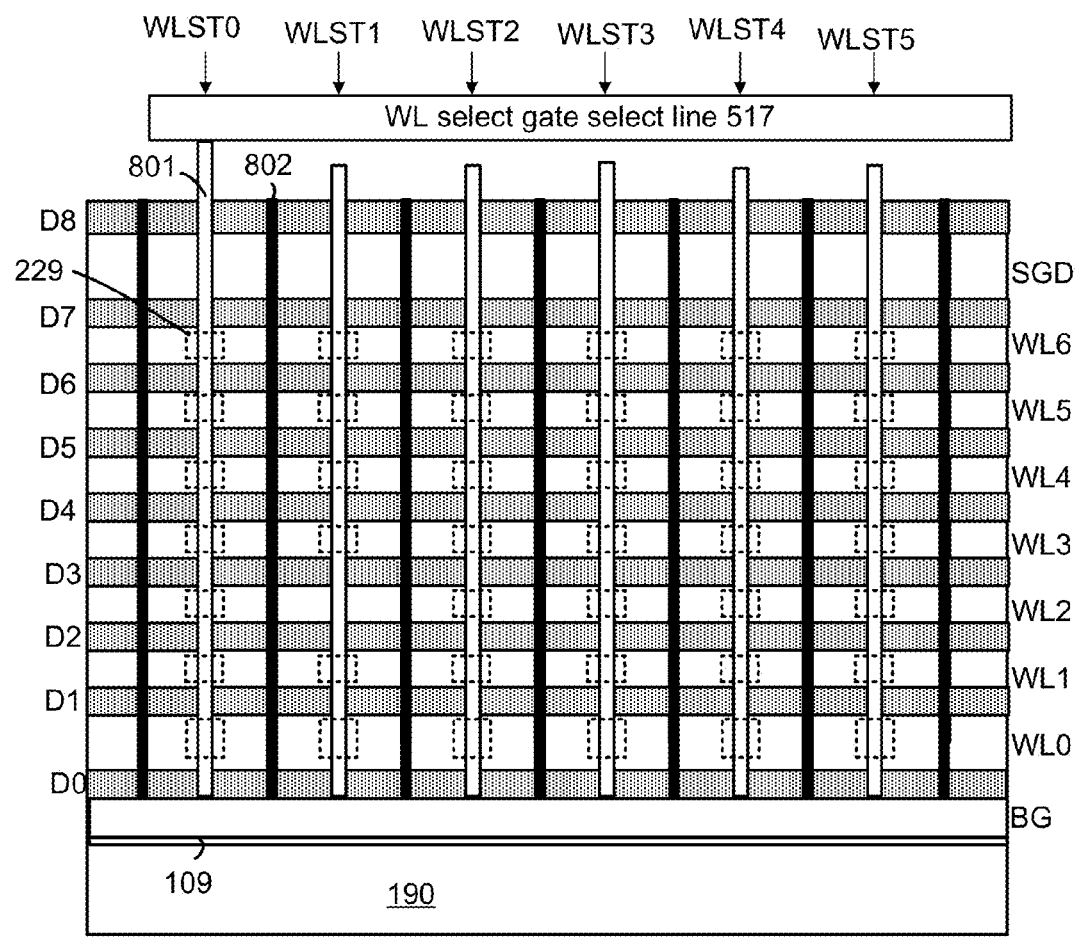
FIG. 5D shows a cross-sectional view of the block of a 3D non-volatile memory device along line 887 in a WL select gate region of FIG. 5C.

FIG. 5D shows a cross-sectional view of the block of a 3D non-volatile memory device along line 887 in a WL select gate region of FIG. 5C. The diagram is similar in perspective to the one of FIG. 2G that depicts a cross section showing NAND strings in a memory array. Columns (WLST0-WLST5) of WL select gates are depicted in the multi-layer stack. One column 801 is labeled. The stack includes a substrate 190, an insulating film 109 on the substrate. In one embodiment, the substrate 190 is crystalline silicon. The slit 802 from FIG. 5C is also depicted with other slits. A portion of one WL select gate select line 517 that connects to column 801 is also depicted. Other WL select gate select lines (not depicted in FIG. 5D) connect to other WL select gate columns. A WL select gate select line 517 may connect to a decoder to allow selection of the WL select gates in a column. Dashed lines on the WL select gate columns depict WL select gates 229, as discussed further below. WL0-WL6 represent word line layers or word line layer portions which are at levels L0-L6, respectively.

Figure 5E:
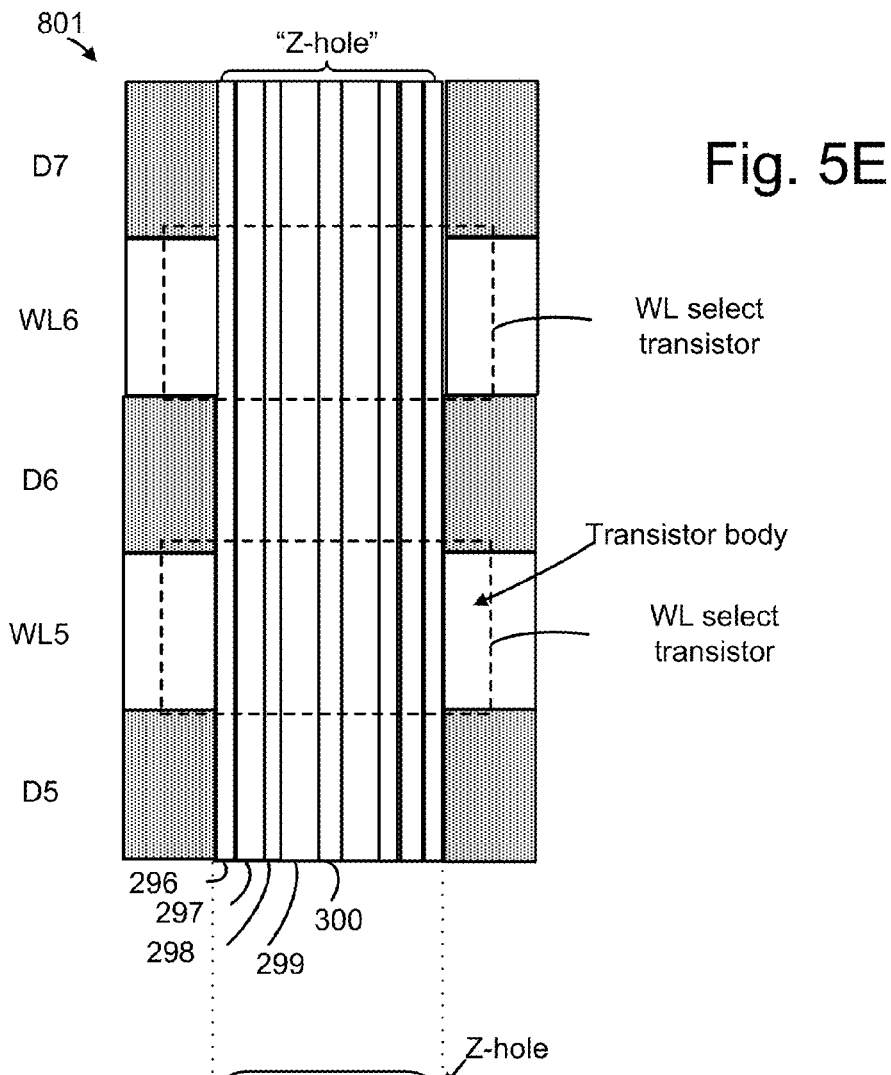
FIG. 5E is a side section view that shows further details of a column of WL select gates.
Figure 5F:
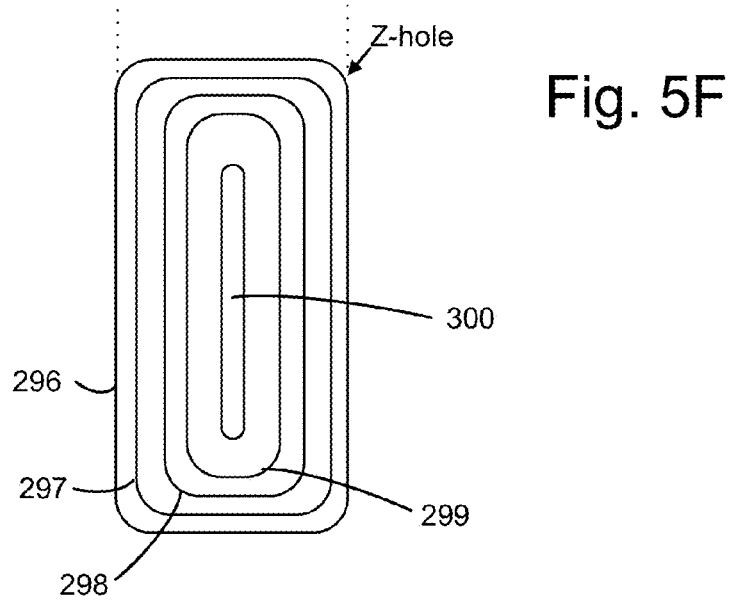
FIG. 5F depicts a cross-sectional view of the column of FIG. 5E.
Figure 5G:
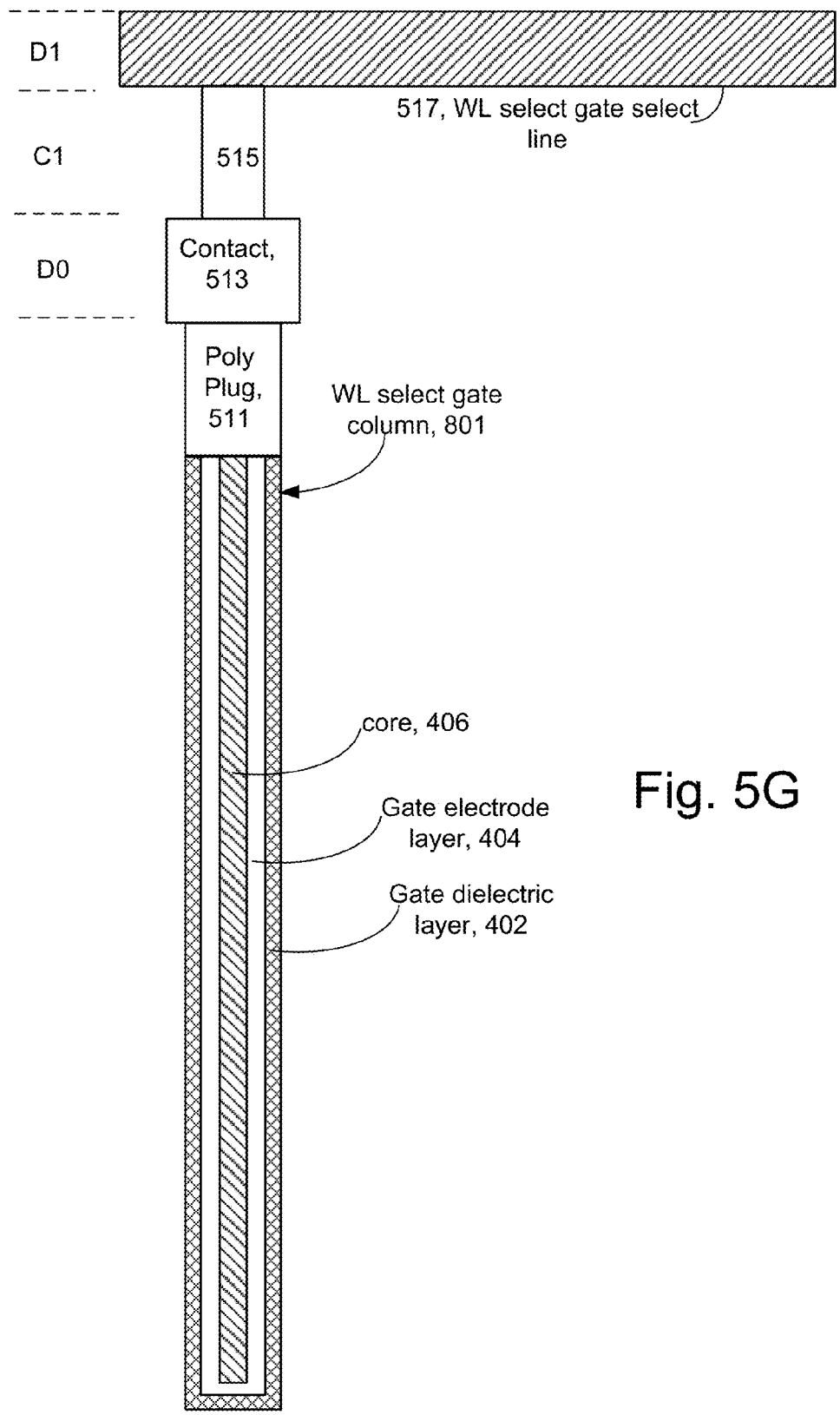
FIG. 5G is a diagram that shows further details of making a contact to a column of WL select gates.
Figure 5J:
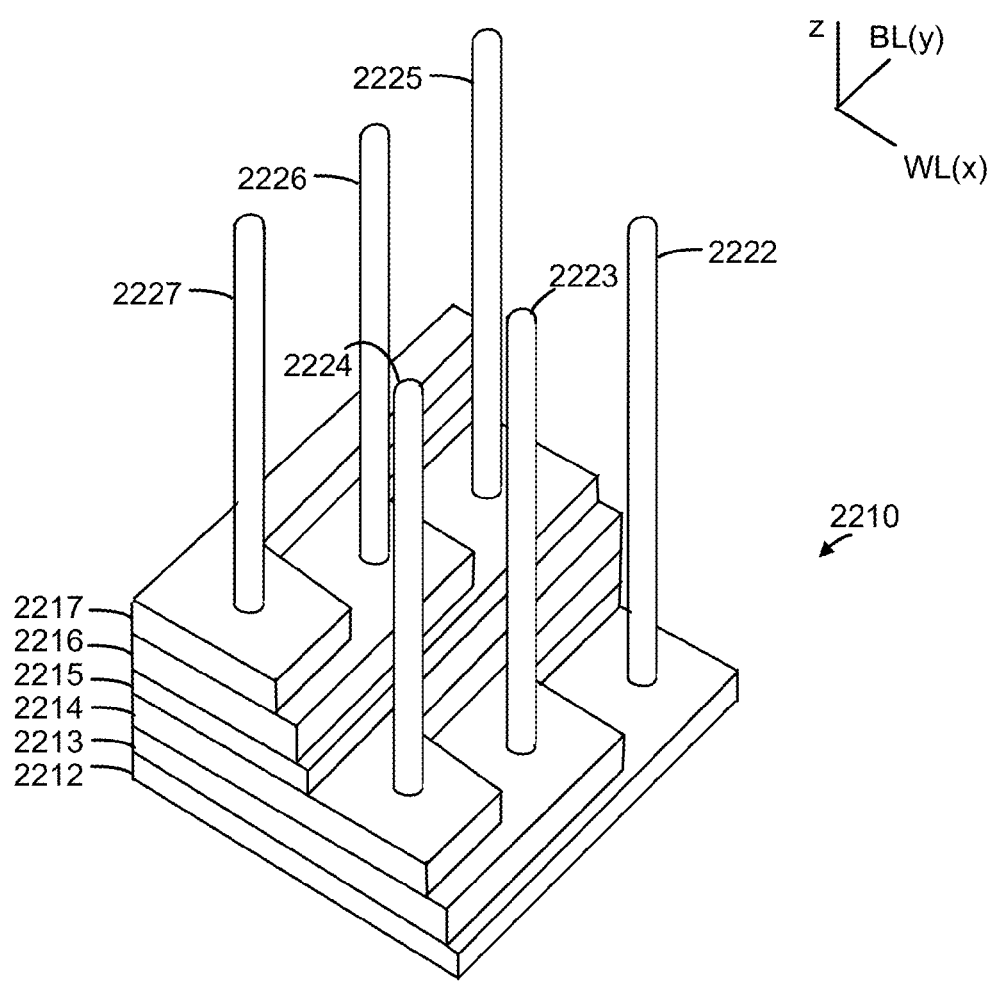
FIG. 5J depicts an example alternative terraced portion of a cell area with contact structures.

FIG. 5E is a side section view that shows further details of a column 801 of WL select gates. Layers D5, WL5, D6, WL6, and D7 from column 801 of FIG. 5D are depicted. Each column includes a number of layers which are deposited along the sidewalls of the column. FIG. 5F depicts a cross-sectional view of the column of FIG. 5E. Each layer is ring-shaped in one possible approach, except the core filler which is cylindrical. Note that the ring-shape is not limited to a circular shape, as the ring may be elongated.

In one embodiment, these layers are the same as those of a memory cell. However, this is not a requirement. These layers can include oxide-nitride-oxide and polysilicon layers which are deposited, e.g., using atomic layer deposition. For example, an oxide can be deposited as layer 296, a nitride such as SiN can be deposited as layer 297, an oxide can be deposited as layer 298, a polysilicon gate can be deposited as layer 299, and a core filler dielectric can be deposited as region 300. Additional WL select gates 229 may be similarly formed throughout the columns. The body of the WL select gate 229 is outside of the "z-hole" region.

5G is a diagram that shows further details of making a contact to a column 801 of WL select gates. The column 801 includes a core 406, gate electrode layer 404, and gate dielectric layer 402, as previously discussed. At the top of the column there is a polysilicon plug 511. Above that is a contact 513, which may be metal, such as tungsten. This is at a layer that may be referred to as D0. Above that is a contact or via 515 that is referred to as C1. Above that is a WL select gate select line 517. This may be at the level referred to as D0. The WL select gate select line 517 may connect to many WL select gate columns. For example, a single WL select gate select line 517 may connect to WL select gate columns in different blocks. Also note that the gate electrode layer 404 may extend the length of the column 801. Note that the gate electrode layer 404 may serve as the gate electrode for transistors at different levels of the 3D memory array. The gate electrode layer 404 may serve to form an electrical connection between the gate electrodes of transistors at different levels in the column 801.

FIG. 5H1 shows further details of one embodiment of contacts from WL select gate select lines 517 to WL select gates 229. FIG. 5H1 is a top view that shows a WL select gate region 303, neighbored by a portion of the memory array 305 and word line plate hookup region 301. Running vertically in this view are a number of WL select gate select lines 517. The WL select gate select lines 517 may be at the same level as the bit lines. However, the bit lines are not depicted. The bit lines run parallel to the WL select gate select lines 517 in one embodiment. Contacts or vias 515 are staggered in one embodiment. Some of the contacts 513 may be made longer than others, as shown. The polysilicon plug 511 may be roughly the same size and shape as the z-hole, but that is not required. The polysilicon plug 511 should make good electrical contact to the gate electrode portion at the top of the WL select gate column; however, it should be electrically isolated from the body. Note that each WL select gate select line 517 may extend further such that it runs over many blocks. In one embodiment, a given WL select gate select line 517 has a contact down to one WL select gate column in a given block. As noted, the WL select gate line 517 may have separate contacts to WL select gate columns in other blocks (one per block).

FIG. 5H2 shows further details of one embodiment of contacts from WL select gate select lines 517 to WL select gates 229 having asymmetrical TFTs. In this embodiment, dummy gates (DG) are depicted adjacent to the memory array 305. The dummy gates (DG) do not require any electrical contact to a signal source. Therefore, no contacts are made to the DG in one embodiment. However, one alternative is to provide an electrical contact to the dummy gates. The gate electrode portion of the dummy gate could be electrically connected to the gate electrode of its TFT. As another alternative, the dummy gates (DG) could be driven by a different voltage than the gate electrode of its TFT.

In one embodiment, the 3D stacked memory array has a terraced structure to allow contact to word line plates. FIG. 5I depicts contact structures of the terraced portion 2252. Contact structures 2254, 2256, 2258, 2260, 2262, 2264 and 2266 extend upward from L1, L3, L5, L7, L9, L11 and L13, respectively, to portions 2274, 2276, 2278, 2280, 2282, 2284 and 2286, respectively, of an upper metal layer D0. The contact structures and upper portions are one example of contacts 227 to word line plates. Therefore, individual word line plates may be selected. D1 and D2 2206 are example additional upper metal layers above D0. A substrate region 190 having two metal layers M0 and M1 is depicted.

In one embodiment, contacts from the z-decoder to the WL select gate select lines 517 are made in a similar manner as the contacts to the word line plates.

FIG. 5J depicts an example alternative terraced portion 2210 of a cell area with contact structures. In one embodiment, contacts to word line plates are formed this way. This terraced portion includes a terrace or stair steps which are etched in both the x and y directions. The terraced portion thus extends in two perpendicular directions. As an example, each conductor layer 2212 to 2217 (such as a metal silicide word line layer) can be connected to a respective portion of an upper metal layer (not shown) via a respective contact pillar 2222 to 2227, respectively. The dielectric layers are between the conductor layers but are not depicted for simplicity. Moreover, the terraced portion may be used for one block, while an adjacent block has a similar but mirror image terraced portion. The blocks can be separated by an insulation-filled slit, as mentioned. This type of terrace configuration can similarly be provided in any of the other examples.

Figure 5K:
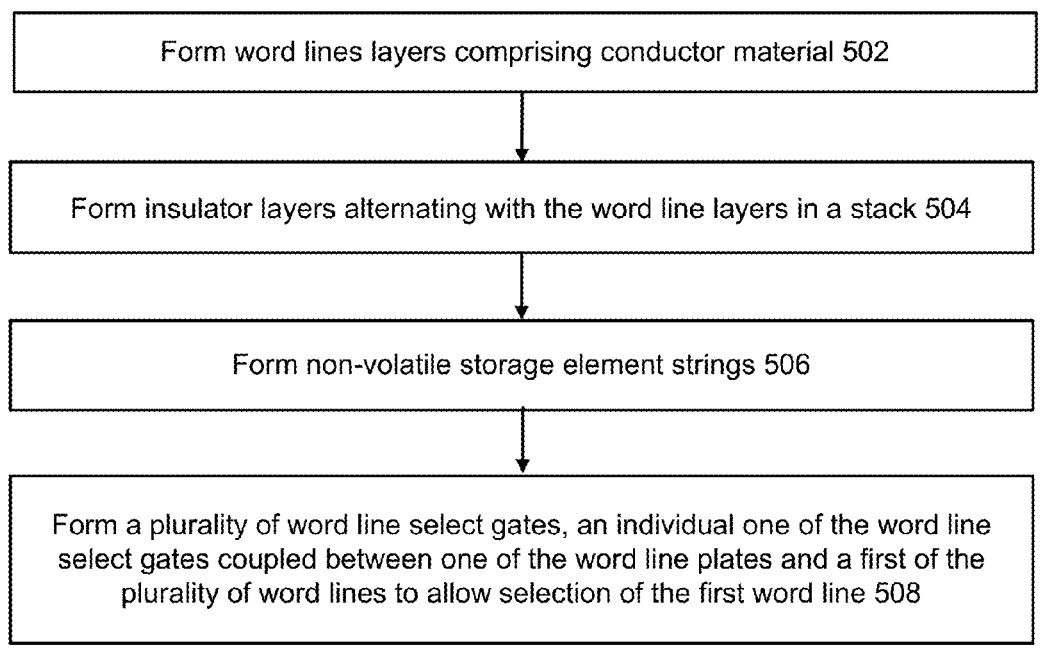
FIG. 5K is a flowchart of one embodiment of a process of forming a 3D stacked non-volatile storage device.

FIG. 5K is a flowchart of one embodiment of a process of forming a 3D stacked non-volatile storage device. The process may be used to form devices having word line select gates coupled between word line plates and word lines.

Step 502 includes forming word lines layers comprising conductor material. The conductor material could be doped polysilicon. This may be heavily doped polysilicon. In one embodiment, it is P+. In one embodiment, it is N+. Each word line layer may comprise a word line plate and word lines that include heavily doped polysilicon. For example, the word lines may be formed from heavily doped polysilicon. Each of the word line plates may be associated with multiple ones of the word lines. The word line plates and word lines could be similar to those depicted in FIG. 3A, 3B, 3D, 3F, 5C, as some examples. Many other possibilities exist.

Step 504 includes forming insulator layers alternating with the word line layers in a stack. The alternating conductor and insulator layers could be layers such as layers L0-L16 depicted in FIG. 2G, or layers WL0-WL6 and D0-D8 depicted in FIG. 5D. Many other possibilities exist.

Figure 27:
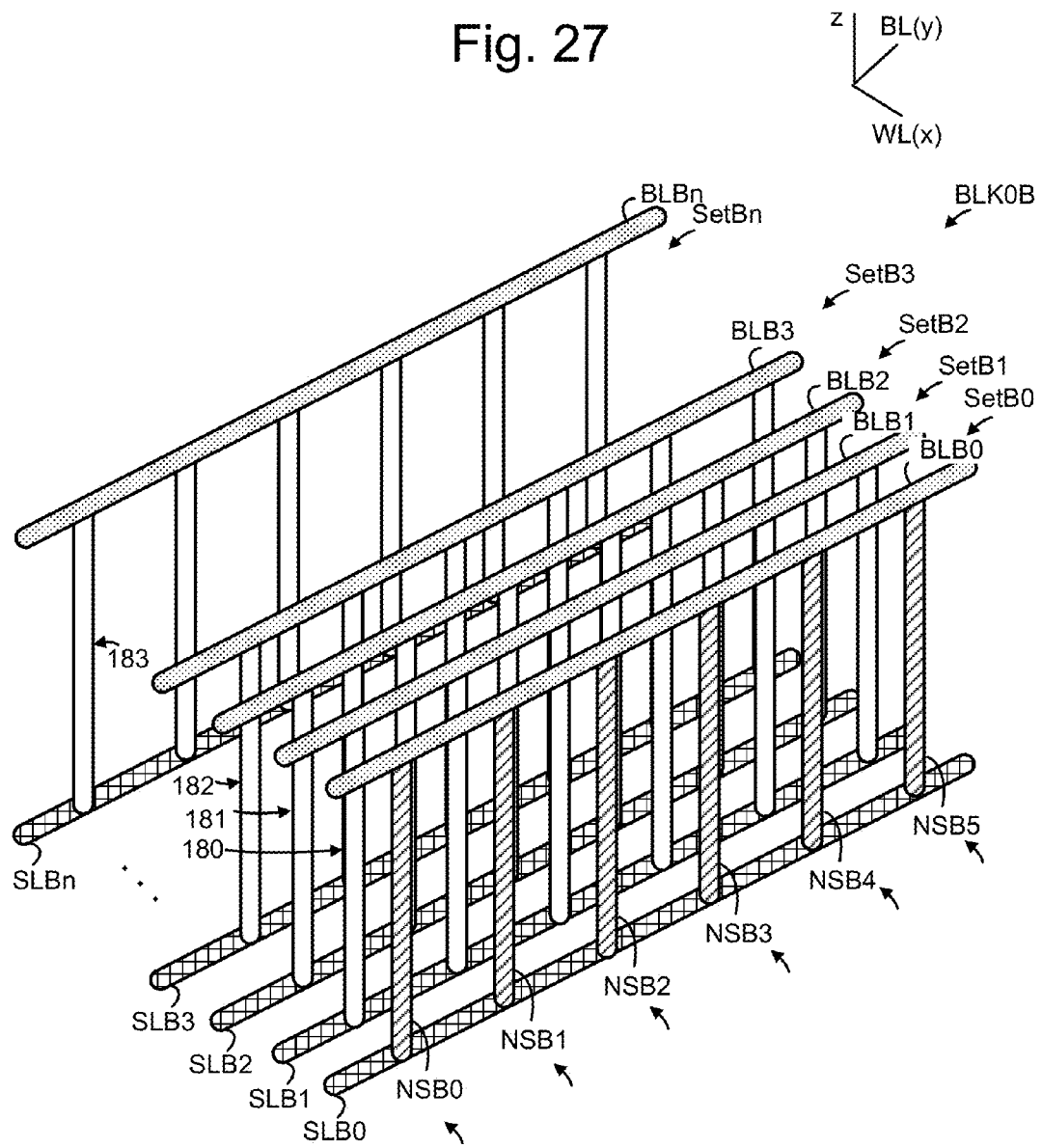
FIG. 27 depicts an embodiment of a block which includes straight NAND strings.

Step 506 includes forming non-volatile storage element strings. In one embodiment, these are NAND strings. These may be U-shaped NAND strings, straight NAND strings, or possibly some other configuration. Each non-volatile storage element string comprises non-volatile storage elements. Each of the non-volatile storage elements is associated with one of the word lines. In one embodiment, U-shaped strings such as those depicted in FIG. 2G are formed. In one embodiment, straight strings such as those depicted in FIG. 27 are formed.

Step 508 includes forming word line select gates 229. An individual one of the word line select gates 229 may be coupled between one of the word line plates and a first of the word lines to allow selection of the first word line. Step 508 may form structures such as the one depicted in FIG. 4D. As noted, this structure may comprise a pair of thin film transistors (TFT). In one embodiment, the structure operates as two TFTs in parallel. As noted herein, a single WL select gate 229 may include multiple such structures. These structures may be in series, parallel, or both. In one embodiment, the word line select gates 229 are physically formed in the word line layers. In one embodiment, a given word line select gate 229 is physically between one of the word line plates and a first of the word lines to allow selection of the first word line. In one embodiment, a given word line select gate 229 is formed between two slits that provide electrical isolation such that the word line select gate 229 can be used to select its associated word line. The two slits may define the set of memory cells to be selected, although that is not required. For example, additional slits may be used to define the set of memory cells to be selected (see FIG. 3F, for example).

Many possibilities exist for the word line select gates 229 formed in step 508. In FIG. 3A, a single WL select gate 229 may have four of the transistor structures. Most of the WL select gates 229 in FIG. 3A select two word lines. Thus, it is understood that when one of the word line select gates 229 is coupled between one of the word line plates and a first of the word lines to allow selection of the first word line that it may select one or more word lines. FIGS. 3B, 3D, 3F and 5C show some, but not all, other possibilities.

As mentioned above, the body of the transistors may be doped with different doping types than the word lines. The bodies may be formed from the same material that the word lines are formed, with suitable adjustments to the doping. In one embodiment, forming the word line select gates includes heavily doping polysilicon in regions in which bodies of the word line select gates are being formed as a part of forming heavily doped polysilicon word lines. Then, the heavily doped polysilicon is counter-doped in regions in which the bodies of the word line select gates are being formed. Further details are discussed below.

In one embodiment, forming the word line select gates includes heavily doping polysilicon in regions in which bodies of the word line select gates are being formed as a part of forming the heavily doped polysilicon word lines. Then, dopant is removed from the heavily doped polysilicon in regions in which the bodies of the plurality of word line select gates are being formed to reduce the doping concentration. Further details are discussed below.

FIG. 5L1 is a flowchart of one embodiment of a method of forming a set of thin film transistors (TFT). Step 526-534 may be used when forming word line select gates in step 508 of the process of FIG. 5K. However, note that the process of forming TFTs is not limited to the process of FIG. 5K. The process of FIG. 5L1 could be used to form TFTs in a device other than a memory device.

Step 522 includes forming layers of conductor material. In one embodiment, these may be word line layers. However, the layers are not required to be word line lines. The conductor material may be polysilicon. In one embodiment, it is heavily doped polysilicon.

Step 524 includes forming insulator layers alternating with the layers of conductor material in a stack. In one embodiment, steps 522 and 524 together may form layers in a stack of a 3D memory array. However, the alternating conductor and insulator layers are not required to be layers in a stack of a 3D memory array.

Step 526 includes forming a first hole in the alternating layers of conductor material and the insulator layers. It is not required that every one of the layers that is formed have a hole etched into it. However, the hole may be etched into any number of the layers of conductor material. This first hole has sidewalls, for the purpose of discussion. In one embodiment, a z-hole is formed.

Step 528 includes forming a gate dielectric layer 402 for the TFTs on the sidewalls of the first hole leaving a second hole inside the gate dielectric layer 402.

Step 530 includes forming a gate electrode layer 404 for the TFTs in the second hole on the gate dielectric layer 402.

Step 532 includes forming bodies for the TFTs adjacent to the gate dielectric layer 402. Step 532 may include reducing the doping concentration of the conductor layers. In one embodiment, forming bodies for the TFTs includes forming a first TFT of the TFTs having a channel width that is defined by a thickness of a first of the layers of conductor material. In one embodiment, forming bodies for the TFTs includes forming a channel for a TFT that runs in a direction that the layer of conductor material in which the body is formed runs.

In one embodiment, forming the gate dielectric layer 402 includes forming a gate electrode for a first of the TFTs that is within a first of the layers of conductor material and forming bodies for the TFTs includes forming a body for the first TFT that is within the first layer of conductor material.

Step 534 includes forming drain and source regions for the TFTs in the layer of conductor material adjacent to the bodies. In one embodiment, drain and source regions have about the same level of doping as the conductor layers (e.g., heavily doped polysilicon). Thus, it may not be necessary to take an additional step to achieve desired source/drain doping concentrations. In one embodiment, forming the bodies involves modifying the doping concentration in the conductor layers, which may have an impact of the doping concentration in the source and drain regions. Note that there may be some diffusion of dopants near the border between the body and source/drain regions. Thus, the doping profile may have a gradient near the border.

FIG. 5L2 is a flowchart of one embodiment of a method of forming a channel extension for TFTs. This process may be used in combination with the process of FIG. 5L1. The process of FIG. 5L2 may be used when forming word line select gates in step 508 of the process of FIG. 5K. However, note that the process of forming TFTs is not limited to the process of FIG. 5K. The process of FIG. 5L2 could be used to form TFTs in a device other than a memory device.

For the sake of discussion it will be assumed that steps 522 and 524 of FIG. 5L1 have been performed to form a stack of alternating conductor and insulator layers. The process of FIG. 5L2 discusses forming a dummy gate hole ("DG-hole"). Also, it will be assumed that a z-hole is also formed as described in FIG. 5L1. Note that FIG. 5L1 discussed forming a first hole (z-hole) and second hole (hole inside of the z-hole after deposition of gate dielectric layer).

Step 546 of FIG. 5L2 includes forming a third hole in the alternating layers of conductor material and the insulator layers. This third hole is the DG-hole. This may be formed at the same time that the z-hole is formed. It is not required that every one of the layers that is formed have a DG-hole etched into it. However, the DG-hole may be etched into any number of the layers of conductor material. This third hole has sidewalls, for the purpose of discussion.

Step 548 includes forming a gate dielectric layer 402 for the DGs on the sidewalls of the third hole leaving a fourth hole inside the gate dielectric layer 402. This layer is referred to as a gate dielectric layer 402 because it may be formed when forming the gate dielectric layer 402 in the z-holes. However, this layer typically does not function as a gate dielectric in the DG-holes during circuit operation.

Step 550 includes forming a gate electrode layer 404 for the DGs in the fourth hole on the gate dielectric layer 402 that is in the DG-holes. This layer is referred to as a gate electrode layer 404 because it may be formed when forming the gate electrode layer 404 in the z-holes. However, this layer typically does not function as a gate electrode in the DG-holes during circuit operation.

Step 552 includes forming body/channel extensions for the TFTs adjacent to the third hole. In other words, this is outside of the gate dielectric layer 402 that was deposited in the DG-holes. In one embodiment, forming body/channel extensions for the TFTs includes forming a channel extension for a TFT that runs in a direction that the layer of conductor material in which the body is formed runs. The body/channel extensions may be formed when forming the bodies in step 532 of FIG. 5L1. Step 552 may include reducing the doping concentration of the conductor layers.

Figure 5M:
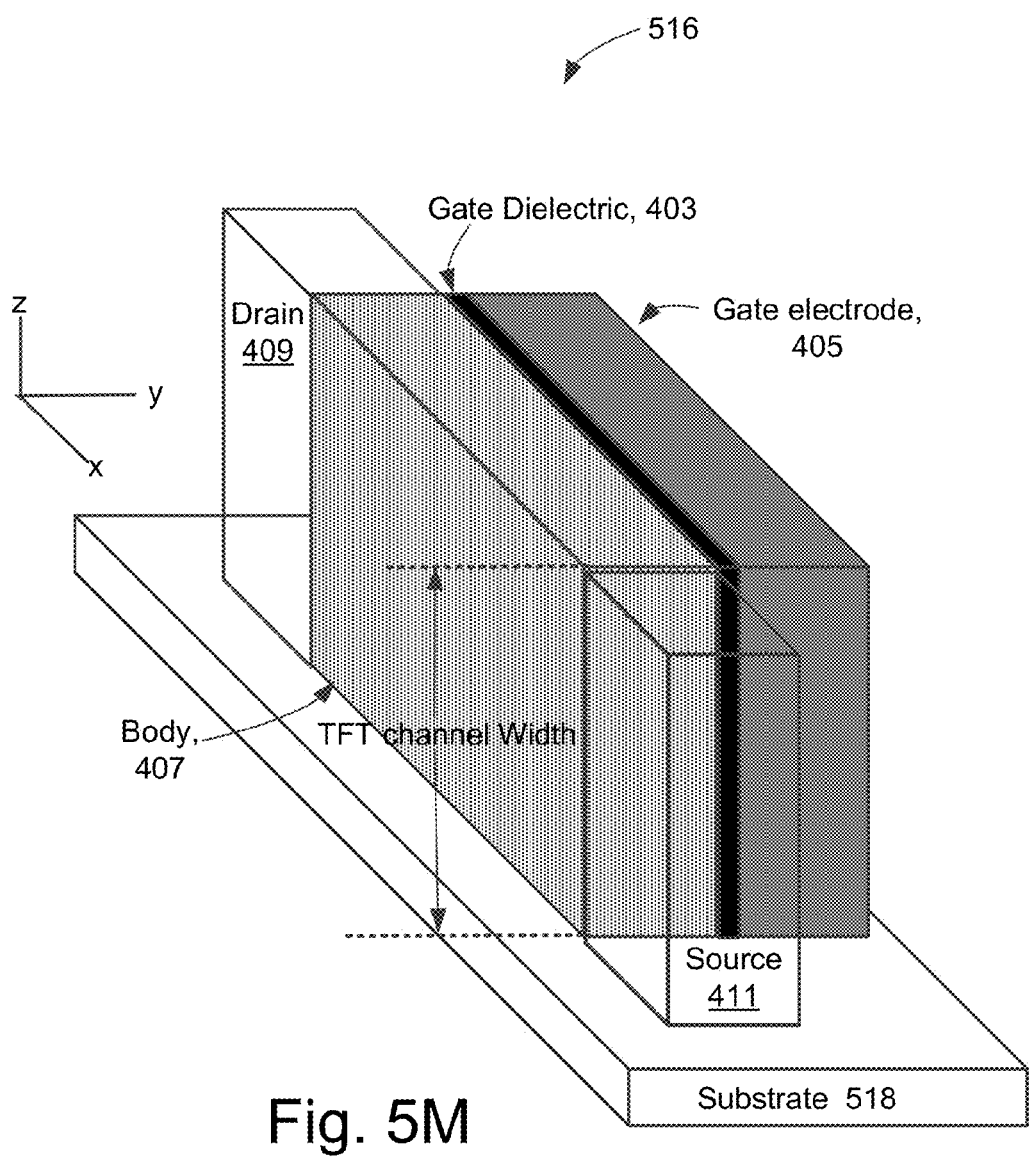
FIG. 5M is a diagram of one embodiment of a TFT.

When performing the process of FIG. 5L2, the drains may be formed at some distance away from the gate electrodes. In one embodiment, drain and source regions have about the same level of doping as the conductor layers (e.g., heavily doped polysilicon). Thus, it may not be necessary to take an additional step to achieve desired source/drain doping concentrations. There may be some diffusion of dopants at the border between the body/channel extension and the drain (or source). Thus, the doping profile may have a gradient near this border. FIG. 5M is a diagram of one embodiment of a TFT 516 over a substrate 518. The TFT 516 may be formed using the process of FIG. 5L, or another process. The TFT 516 includes a gate electrode 405, gate dielectric 403, body 407, drain 409, and source 411. The TFT 516 may be formed within a horizontal layer of polysilicon (not depicted in FIG. 5M) that has a major surface (or major plane) in the xy plane. The TFT may be formed over a substrate layer. The substrate layer 518 may be any material, such as insulator layer in the example in which the TFT is formed in a 3D memory array. The substrate layer 518 may have a major surface (or major plane) in the xy plane. The TFT channel width may be defined by the thickness of the horizontal layer of polysilicon. The channel runs in the x-direction in FIG. 5M. In one embodiment, the TFT is formed in a 3D memory array. In this case, the channel length may run in the same direction as the word lines (x-direction). However, the TFT could be used in applications other than 3D memory arrays. Note that the process of FIG. 5L1 or 5L2 may form what may be referred to as a "vertical gate/width TFT." The example of FIG. 5M will be used to illustrate. In one embodiment, a major surface (or major plane) of the gate electrode 405 extends vertically with respect to the horizontal conductor layers. In one embodiment, a major surface of the gate electrode 405 is in the xz plane. For example, the interface between the gate dielectric 403 and gate electrode 405 runs perpendicular to an xy plane of the layer of conductor material. In one embodiment, the interface between the gate dielectric 403 and body 407 runs perpendicular to an xy plane of on the layer of conductor material. In the example of the 3D memory, the layers of conductor material may be horizontal. For example, they may be horizontal with respect to a substrate (such as, but not limited to, a crystalline substrate). Thus, the major plane of the gate electrode 405 may be vertical with respect to the layers of conductor material (or with respect to the substrate). Thus, the TFT 516 may be termed a "vertical gate TFT". In one embodiment, the TFT 516 can be termed a "vertical gate/width and horizontal channel TFT", with the channel running in horizontal direction. In the example of the 3D memory, the TFT channel runs in the direction of word lines comprised of stripes of conductor material running horizontally. In one embodiment, the TFT 516 is formed directly on a substrate 518 such as an insulator layer.

In one embodiment, the width of the channel of the TFT is defined by the thickness of the conductor material (e.g., the thickness of word line layers). Thus, the TFT may be termed a "vertical width TFT".

The embodiment depicted in FIG. 5M may be referred to as a symmetrical TFT. However, the TFT is asymmetrical in one embodiment. As described herein, the channel may be extended in the x-direction in an asymmetrical TFT.

The TFT may also be termed a "inside gate/outer body TFT." The refers to the fact that the gate electrode is formed from the gate layer inside of the z-hole with the body on the outside.

Figure 6:
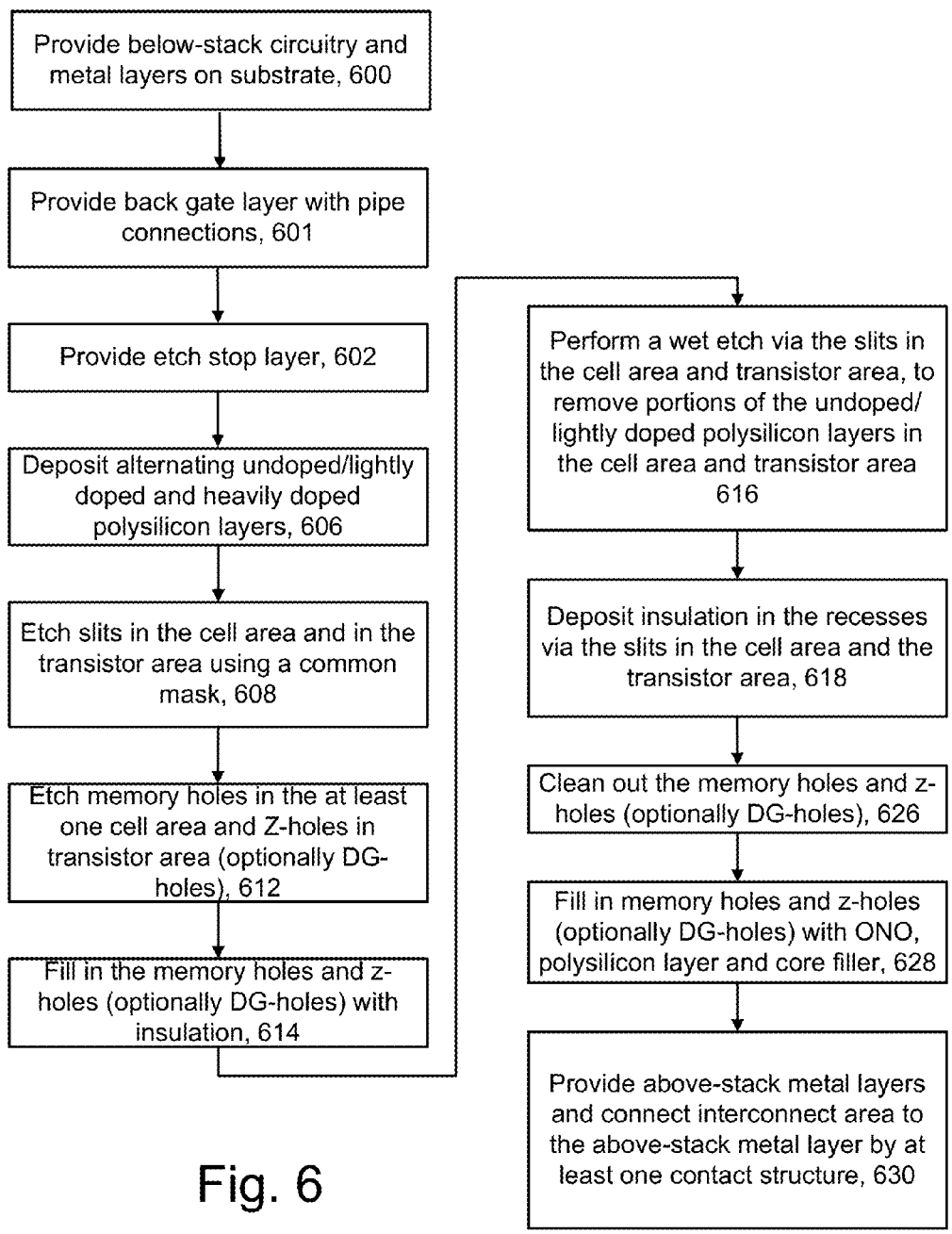
FIG. 6 is a flowchart of one embodiment of a process of forming a memory array having WL select gates.
Figure 7A:
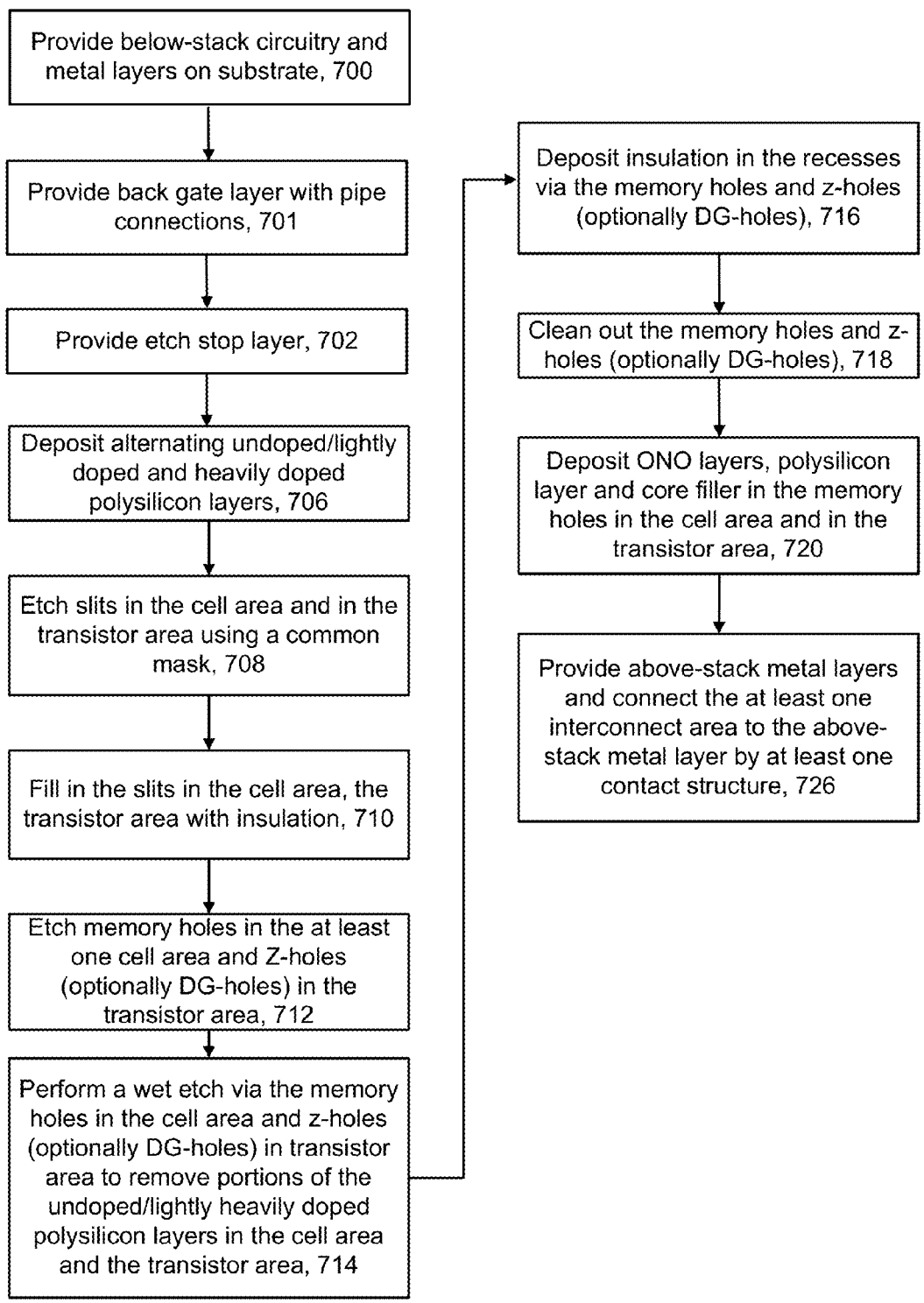
FIG. 7A depicts a method for fabricating a 3D stacked non-volatile memory device.
Figure 7B:
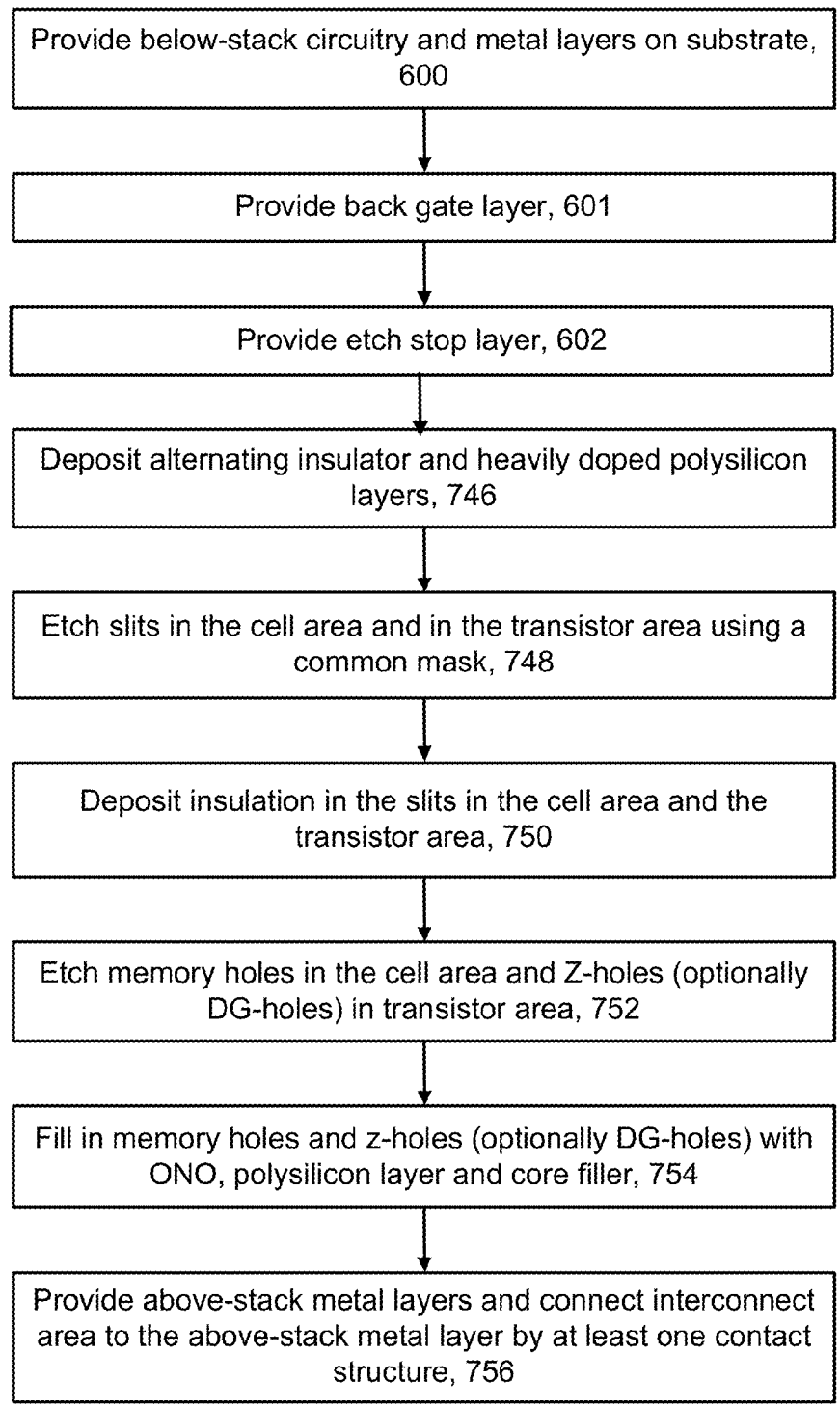
FIG. 7B depicts a method for fabricating a 3D stacked non-volatile memory device.

FIG. 6 is a flowchart of one embodiment of a process of forming a memory array having WL select gates 229. In this process, Z-holes are formed and processed to form WL select gates 229. The WL select gates 299 may include vertical gate/width TFTs. FIG. 6 depicts a method for fabricating a 3D stacked non-volatile memory device according to the structures of FIGS. 8-12C, where a wet etch is performed via slits. In contrast, the process of FIG. 7A involves a wet etch via memory holes and z-holes. In FIGS. 6 and 7A, first alternating layers of undoped polysilicon and heavily doped polysilicon are formed. FIG. 7B shows a process in which initially, alternating layers of insulator and heavily doped polysilicon are formed.

Figure 8:
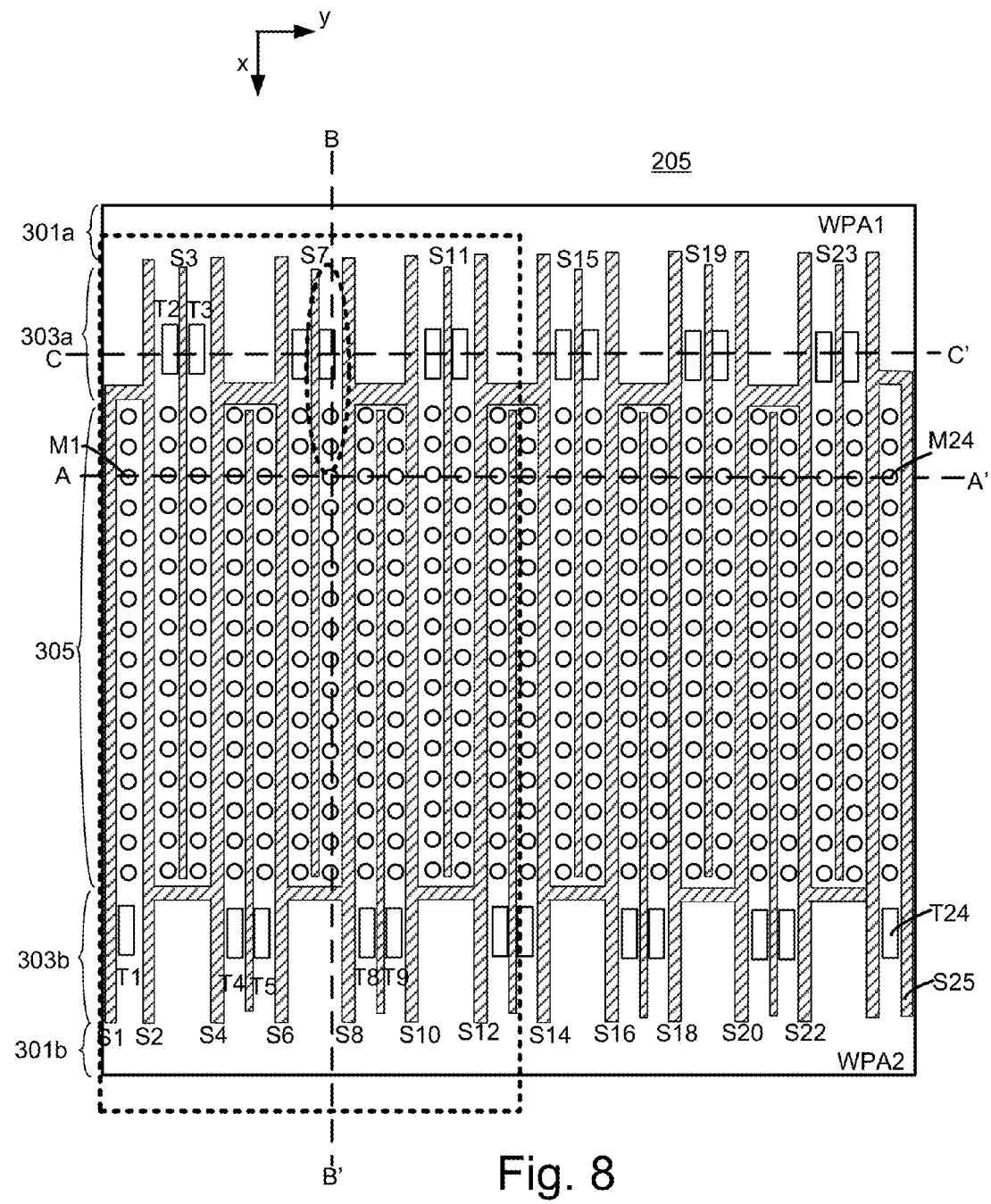
FIG. 8 is a diagram of a portion of a memory array to help illustrate the processes of FIGS. 6 and 7A.

FIG. 8 is a diagram of a portion of a memory array to help illustrate the process of FIG. 6. FIG. 8 shows a top view of a block of a memory array. The block includes two WL select gate regions 303*a*, 303*b*. One WL select gate region 303*a* includes transistors T2, T3, T6, T7, T10, T11, T14, T14, T18, T19, T22, and T23 (not all are labeled in FIG. 8). The other WL select gate region 303*b* includes transistors T1, T4, T5, T8, T9, T12, T13, T16, T17, T20, T21, and T24 (not all are labeled in FIG. 8). The memory area region 305 includes rows and columns of memory cells. Memory cells M1-M24 (cells M1 and 24 labeled) are depicted along line A-A'. Formation of memory cells in a cross section along a portion of line A-A' will be discussed below. This portion corresponds to memory cells M1-M12. Note that memory holes H1-H12 correspond to these memory cells. Slits S1-S25 (not all slits labeled) are also along line A-A'. Slits S1-S13 are in the region for which fabrication is depicted in later drawings. Line B-B' runs in the WL(x) direction. A portion of this line that includes two memory cells and transistor T8 are circled, and will be discussed below. Formation of transistors in a cross section along a portion of line C-C', which runs in the BL(y) direction in one of the WL select gate regions will be discussed below. That portion of line C-C' includes transistors T2, T3, T6, T7, T11, and T12. Two word line hook up regions 301*a*, 301*b* are depicted. Note that the location of the word line hook up regions 301*a*, 301*b* and word line select gate regions 303*a*, 303*b* are roughly depicted. They may be located in another manner.

In the process of FIG. 6, steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed. Step 600 includes providing below-stack circuitry and metal layers on substrate. Step 601 includes forming a back gate layer 856. The back gate layer 856 may include pipe connections and back gates. One embodiment of forming back gate layer 856 includes depositing doped polysilicon for the back gate (BG) layer 856. This polysilicon may be a plate that is common to one block. Then, portions of the polysilicon may be etched out. This may form strips and shallow trenches where the pipe connections for each of the U-shaped NAND strings are to be formed. They are etched out only to the portion of BG thickness, in one embodiment. Then these "pipe connections" may be filled in with undoped polysilicon, and possibly other materials. The back gate layer 856 doped polysilicon is still underneath pipe connections and will become the BG electrode. When memory holes are etched and then cleaned out, undoped polysilicon in pipe connections will be also removed. Then, when memory hole intrinsic layers are later deposited (e.g., in step 628 MONOS dielectric may be deposited) these layers may also be deposited into the pipe connections. Thus, pipe connections may become natural continuations of memory hole columns of the U-shaped strings, and may connect all layers within memory holes with the respective layers in pipe connections. Note that a pipe connection may thus comprise ONO dielectric, undoped polysilicon, and a core of $SiO_2$, in one embodiment. The pipe connection and BG (made of GB polysilicon plate) form a BG transistor. Contact to the BG poly plate may be provided in the same terrace used for WL and SG contacts (discussed above). The BG plate may common for each block. Therefore, is single contact for BG is used per one block, in one embodiment. The BG transistor may be used to control and ensure conductivity of pipe connections by appropriate bias of the BG transistor.

Step 602 includes providing an etch stop layer over the back gate layer 856. One purpose of the etch stop layer is not to allow shallow trenches to cut the pipe connection or cut the BG plate. The exception is only at a block edges, in one embodiment, where the back gate should be cut to insulate the BG from one block to the next.

Step 606 includes depositing alternating undoped/lightly doped and heavily doped polysilicon layers. Undoped or lightly doped poly may have a doping concentration of $1.0\times 10^{15}$ to $1.0\times 10^{17}$ cm-3 or less, for instance. The term "undoped/lightly doped polysilicon" or the like denotes polysilicon which is undoped or relatively lightly doped. The term "heavily doped polysilicon" or the like denotes polysilicon which is relatively highly doped. An example of heavily doped poly is p-type doped poly with a doping concentration of $1.0\times 10^{20}$ to $1.0\times 10^{21}$ cm-3 or more. An example p-type dopant is Boron. High doping is desirable for less word line resistance, and for better silicidation. The sheet resistance of heavily doped poly is about 500-1000 ohm/square, for instance. The sheet resistance of a partially silicided poly layer in a 3D stack is about 20-100 ohm/square—about ten times lower than for unsilicided heavily doped poly.

Undoped polysilicon may be conductive with much higher resistance than that of highly doped or silicided polysilicon. Pure or undoped polysilicon may have a resistivity of at least about 10 kilo-ohm·cm. Lightly doped or p type polysilicon may have a resistivity of about 1-10 ohm·cm. For purposes of discussion, undoped polysilicon and lightly doped polysilicon will be considered to be semiconductors, as opposed to conductors. Highly doped or p+ type polysilicon may have a resistivity of about 0.01 ohm·cm or less. An insulator is a material with low conductivity. A dielectric is a type of insulator which can be polarized by an applied electric field. The polarizability is expressed by the dielectric constant. $SiO_2$, SiN, or a combination of $SiO_2$ and SiN, are examples of insulators which are also dielectrics. Generally, oxide, nitride or a combination of oxide and nitride are examples of dielectrics. Highly doped polysilicon or metal silicide is considered to be a conductor material or conductors. There are many other conductors, as is well known. A dielectric such as oxide, nitride or a combination of oxide and nitride is not considered to be a conductor material. Rather, these are examples of insulators. There are many other insulators, as is well known.

Figure 8A:
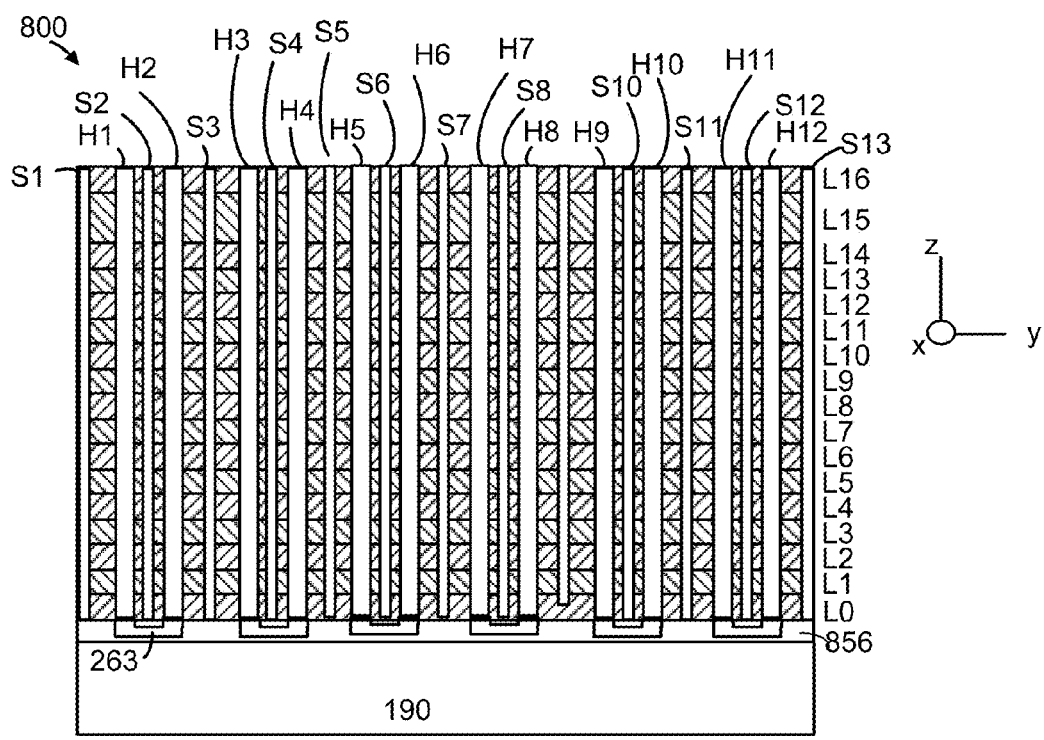
FIG. 8A depicts a layered semiconductor material 800 which is consistent with a cross-sectional view of the memory area region 305 of the 3D stacked non-volatile memory device of FIG. 8 along the line A-A'.
Figure 8C:
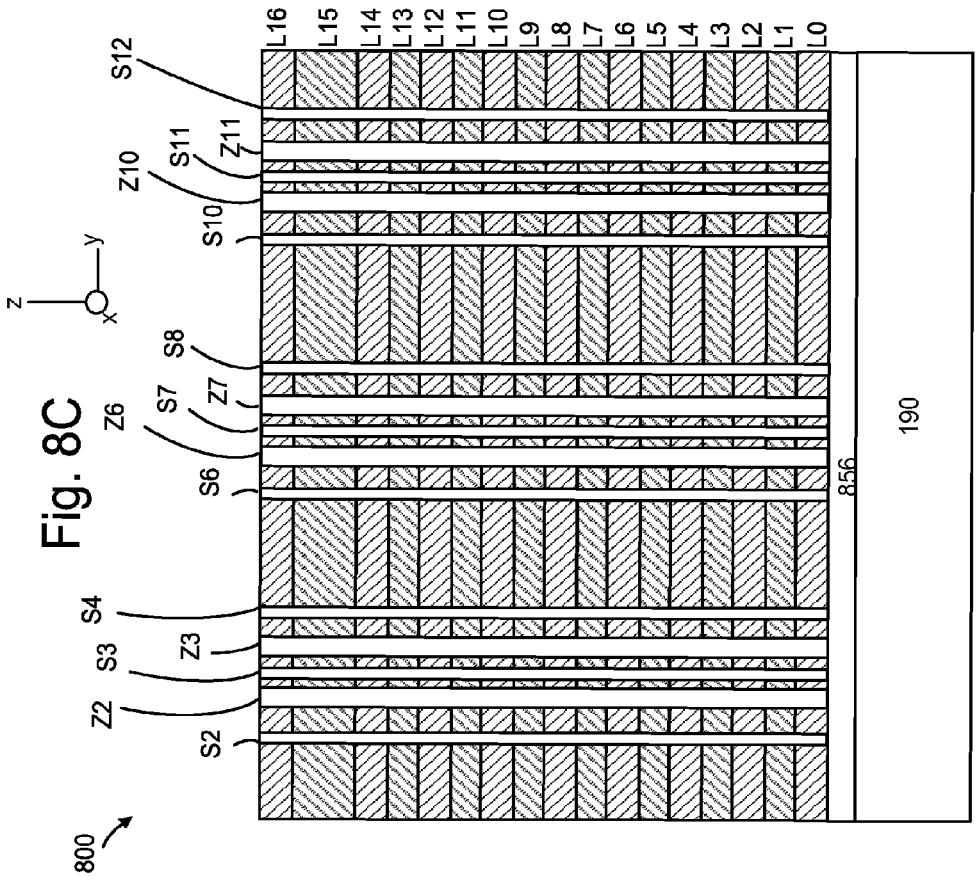
FIG. 8C depicts a layered semiconductor material 800 which is consistent with a cross-sectional view of the WL select gate region 303b of the 3D stacked non-volatile memory device of FIG. 8 along a portion of line C-C' from FIG. 8.
Figure 8B:
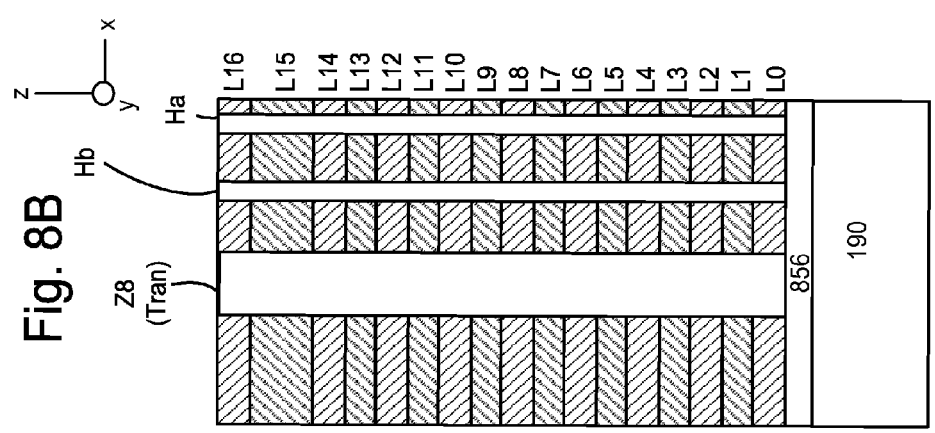
FIG. 8B shows a cross section view along the word line (x) direction and is a cross section along the circled portion of line B-B' from FIG. 8 for one embodiment.

Step 608 includes etching slits in a memory cell region 305 and in a WL select gate region 303 using a common mask. Step 612 includes etching memory holes in the memory cell region 305 and z-holes in the transistor area. In one embodiment, step 612 includes etching DG-holes. In one embodiment, step 612 includes performing a reactive ion etch in the memory cell region 305 using a memory hole mask which protects the interconnect area. A reactive ion etch (RIE) may also be performed in the transistor region using a z-hole mask (and optionally DG-hole mask). FIGS. 8A-8C depict results after one embodiment of step 612.

FIG. 8A depicts a layered semiconductor material 800 which is consistent with a cross-sectional view of the memory area region 305 of the 3D stacked non-volatile memory device of FIG. 8 along the line A-A', showing slits S1 to S13 and memory holes H1 to H12 in the cell area. A slit can be a trench which may have various widths. Note that there is another mask that can define wider trenches than those used for the slits in the array. These (the mask and trench itself) are used, e.g., to separate the peripheral and array regions. Both narrow and wide trenches can be used as applicable.

FIG. 8B shows a view along the word line (x) direction. Specially, this is the view along the circled portion of line B-B', which includes the WL select gate region and a small portion of the memory array. This line only shows formation of two memory cells and the adjacent WL select transistor. The z-hole is Z8 (Tran) for transistor T8 being formed. The holes are labeled Ha and Hb for reference.

FIG. 8C depicts a layered semiconductor material 800 which is consistent with a cross-sectional view of the WL select gate region of the 3D stacked non-volatile memory device of FIG. 8. Since this WL select gate region corresponds to the upper half (e.g., near WPA1), only half of the transistors are being formed. The z-holes will be used to form WL select gates. The z-holes are Z2, Z3, Z6, Z7, Z10, and Z11.

In one embodiment, the memory holes (H1-H12) are etched at the same time that the z-holes for the WL select transistors are etched. Although FIG. 8C only shows holes Z2, Z3, Z6, Z7, Z10, and Z11, note that other z-holes (not depicted in FIG. 8C) may be etched at the same time.

Referring to FIG. 8A, the substrate region 190 includes a semiconductor substrate such as a silicon wafer and a BG layer 856. Various circuits may be formed in the substrate 190, but are not depicted so as to not obscure the diagram. For example, a metal layer M0 can be used, e.g., for power line and global control signals, and a metal layer M1 can be used, e.g., for bit line and bus signals. The metal layers can be fabricated from a patterned metal film. For example, Aluminum can be used for the top metal layer, while the other layers are Tungsten. Potentially, Cu can be used instead of Al for upper layer, using a corresponding integration scheme. For silicidation, Ni, Ti, Co or W can be used, for instance.

Connecting portions 263 are provided in the BG layer 856, for instance, to join vertical columns of memory cells in a U-shaped NAND configuration. The connecting portions may include connection pipes and back gates. In particular, trenches are provided in portions of the layer 856 below pairs of columns of memory cells of a U-shaped NAND string. Layers of materials which are provided in the columns to form the memory cells are also provided in the trenches, and the remaining space in the trenches is filled with a semiconductor material to provide the pipe connections as conductive regions which connect the columns. The pipe connection thus connects the two columns of each U-shaped NAND string. Each NAND string has its own back gate which serves to control conductivity of the string. Note that the back gate may be common for each block of NAND strings. A contact to the back gate may be provided in a word line hook up area, where the back gate is the lowest contact, since the back gate poly is below the word line poly stack.

The slits generally do not extend down to touch the pipe connections. Also, the slits are placed not only between memory holes of the same NAND string, e.g., slits S2, S4, S6, S8, S10 and S12, but may also between memory holes of adjacent NAND strings, e.g., slits S3, S5, S7, S9, S11 and S13. Note that slits are not required between adjacent NAND strings. Sometimes slits are used to improve mechanical strength of stacked structure. For example, when ST is filled in with, e.g., SiO2, it serves as structure anchors, especially when memory holes are opened and used for undoped polysilicon removal, as in step 714 of FIG. 7A. Another purpose of ST between the strings may be, in one embodiment, to improve silicidation of WL poly. In one embodiment, STs are used for silicidation. In such a process, STs are opened, and e.g., Ni is deposited on ST sidewalls. After thermal anneal, the WL poly will become Ni-silicided (e.g. NiSi), and WL resistance is reduced. Having additional ST between strings allow silicidation of a bigger volume of WLs poly leading to less resistance. In cases of silicided WLs, one option to control TFT body doping, is to remove the whole WL/oxide stack in TFT body region, and replace this stack in that region with controlled doping poly/oxide stack. To use other techniques, such as various types of counter-doping, doping reduction with counter-doping, etc.—one needs to prevent silicidation in the TFT body areas. An etch step layer (not depicted in FIG. 8A) may be provided over the BG layer 856. This etch stop layer may prevent slits from cutting the pipe connections and/or back gates. The etch stop layer is patterned to isolate the blocks.

Alternating layers of undoped/lightly doped and heavily doped polysilicon, for example, are provided as layers L0 to L16. This example results in vertical columns of six memory cells, where the heavily doped polysilicon layers are provided at L3, L5, L7, L9, L11 and L13 as control gates, at L1 as a lower select gate and at L15 as an upper select gate. This is an example, as fewer or more layers can be used. L1 is a bottom layer of doped heavily doped polysilicon. L15 is taller (thicker) than the other heavily doped polysilicon layers in this example; therefore, the upper select gates will be taller than the memory cell control gates. L1 might also be made thicker so that the lower control gate can be thicker. In one approach, the doping of the polysilicon layers is performed in situ. For example, undoped/lightly doped polysilicon for L0 is deposited (optionally while being lightly doped in situ), then polysilicon for L1 is deposited while being heavily doped, e.g., using p-type Boron, then undoped/lightly doped polysilicon for L2 is deposited, then polysilicon for L3 is deposited while being heavily doped, and so forth. L1, L3, L5, L7, L9, L11, L13 and L15 are the heavily doped layers, and L0, L2, L4, L6, L8, L10, L12, L14 and L16 are the undoped/lightly doped layers.

After the layers of undoped/lightly doped and doped polysilicon are deposited, the slits and memory holes are fabricated. Reactive ion etching can be used.

Figure 9A:
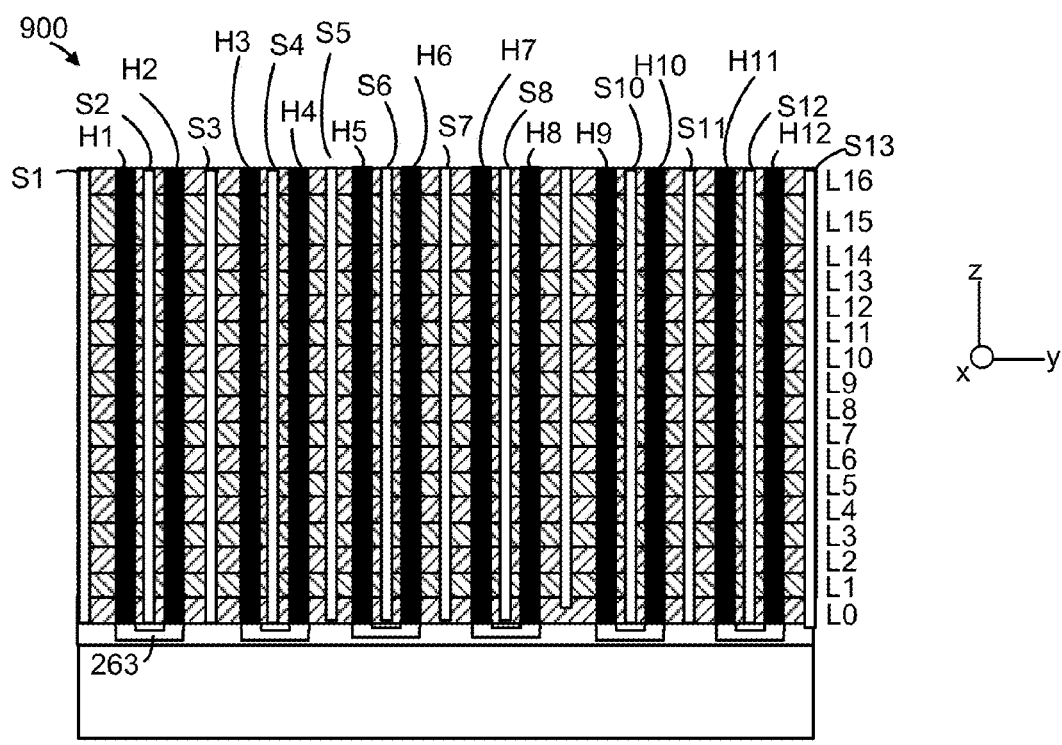

Step 614 includes filling in the memory holes and z-holes with insulation. Optionally, the DG-holes are filled if they were formed in step 612. FIGS. 9A-9C depict a layered semiconductor material 900 which is obtained from the layered semiconductor material 800 after filling the memory holes and z-holes with insulation. FIG. 9A is a cross section of the memory array region in the BL (y) direction along a portion of line A-A' from FIG. 8. FIG. 9B is a cross section in the WL (x) direction along a portion of line B-B' from FIG. 8. FIG. 9C is a cross section of the WL select gate region in the BL(y) direction.

Figure 10A:
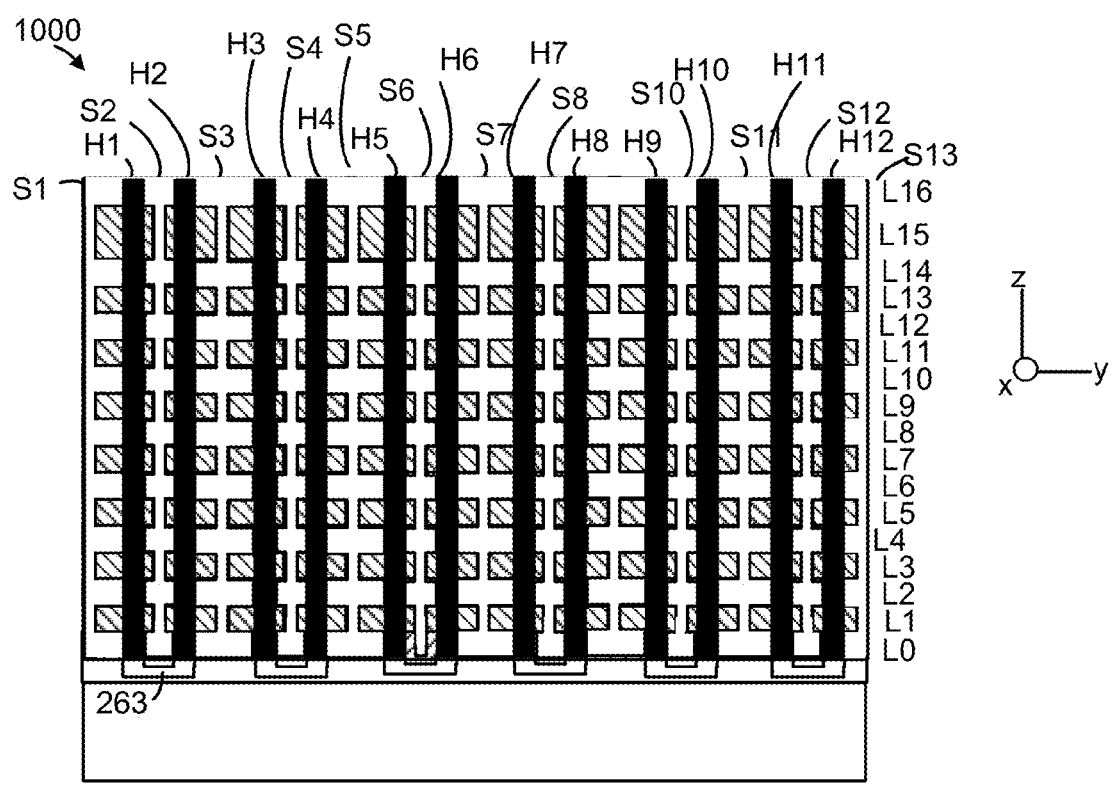

Step 616 includes performing a wet etch via the slits in the memory cell region 305 to remove portions of the undoped/lightly doped polysilicon layers in the cell area and WL select gate region. FIGS. 10A-10C depict a layered semiconductor material 1000 which is obtained from the layered semiconductor material 900 after performing a wet etch via the slits in the cell and WL select gate regions. FIG. 10A is a cross section of the memory array region in the BL (y) direction along a portion of line A-A' from FIG. 8. FIG. 10B is a cross section in the WL (x) direction along a portion of line B-B' from FIG. 8. FIG. 10C is a cross section of the WL select gate region in the BL(y) direction.

The wet etch can involve introducing an etchant via the slits of the at least one cell area, which has a higher selectivity for the undoped/lightly doped polysilicon layers, removing portions of the undoped/lightly doped polysilicon layers which are adjacent to the slits of the at least one cell area. Selectivity indicates a ratio of etch rates. The wet etch has a relatively higher selectivity (e.g., by a factor of 1000, or more generally, 100 or more) for the undoped/lightly doped polysilicon relative than for the heavily doped polysilicon.

That is, the wet etch is not relatively highly selective of the heavily doped polysilicon so that it is not substantially removed. The wet etch should remove essentially the entire undoped/lightly doped polysilicon layers in the cell areas, so that when the regions of the removed undoped/lightly doped polysilicon are replaced by dielectric, the dielectric will extend in substantially the entire layer in the cell areas. This ensures that the word line layers at different levels are isolated from one another and not shorted together. This applies regardless of the wet etch method, e.g., whether the etchant is introduced via the slits, memory holes, other holes or voids, or combinations thereof. The insulation-filled slits serve as anchors which support the heavily doped poly layers when the undoped/lightly doped poly is removed.

In one embodiment, the doped poly layers (at least in the cell area) are silicidated. The silicidation of the doped poly layers in the cell area can result in essentially all, or a large portion, of the doped poly in the respective area being transformed to metal silicide. A word line layer which is partly metal silicide and partly doped poly will still function as a conductor layer. In fact, the resistance of partly silicided word line layer will be mostly determined by its silicided part with lower resistance.

In the array area, the memory holes are placed densely. A minimum density of memory holes allows essentially all undoped/lightly doped poly in the cell areas to be removed when a wet etch is performed via the memory holes. For example, the memory holes can have a width of 55-80 nm, a pitch of about 110-125 nm in the word line or x-direction, and a pitch of about 150-165 nm in the bit line or y-direction. The slits can have a width of about 30-60 nm. These are example ranges of widths and pitches, other ranges could be used. In other areas, such as the word line hook areas at opposing ends of the array, essentially all of the undoped/lightly doped poly can be removed as well in a wet etch. In those areas, memory holes need not be provided. However, holes referred to as replacement (or inactive) holes may be used to remove undoped/lightly doped poly. These holes can be arranged with a similar density as in the array.

The term "hole" or "columnar hole" or the like as used herein is meant to include a memory hole, z-hole, DG-hole, replacement hole or similar vertically-extending columnar void which can be filled while still be recognizable as a hole.

Figure 11A:
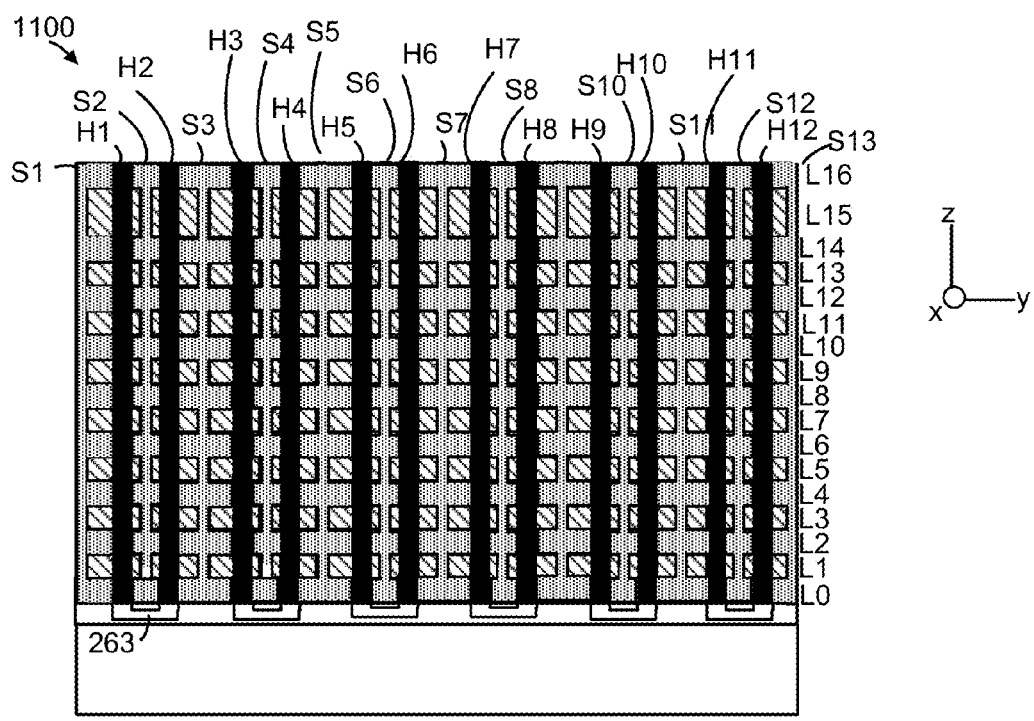
FIG. 11A-11C depicts a layered semiconductor material 1100 which is obtained from the layered semiconductor material 1000 after filling in voids with insulation via the slits in the cell and WL select gate regions.
Figure 11C:
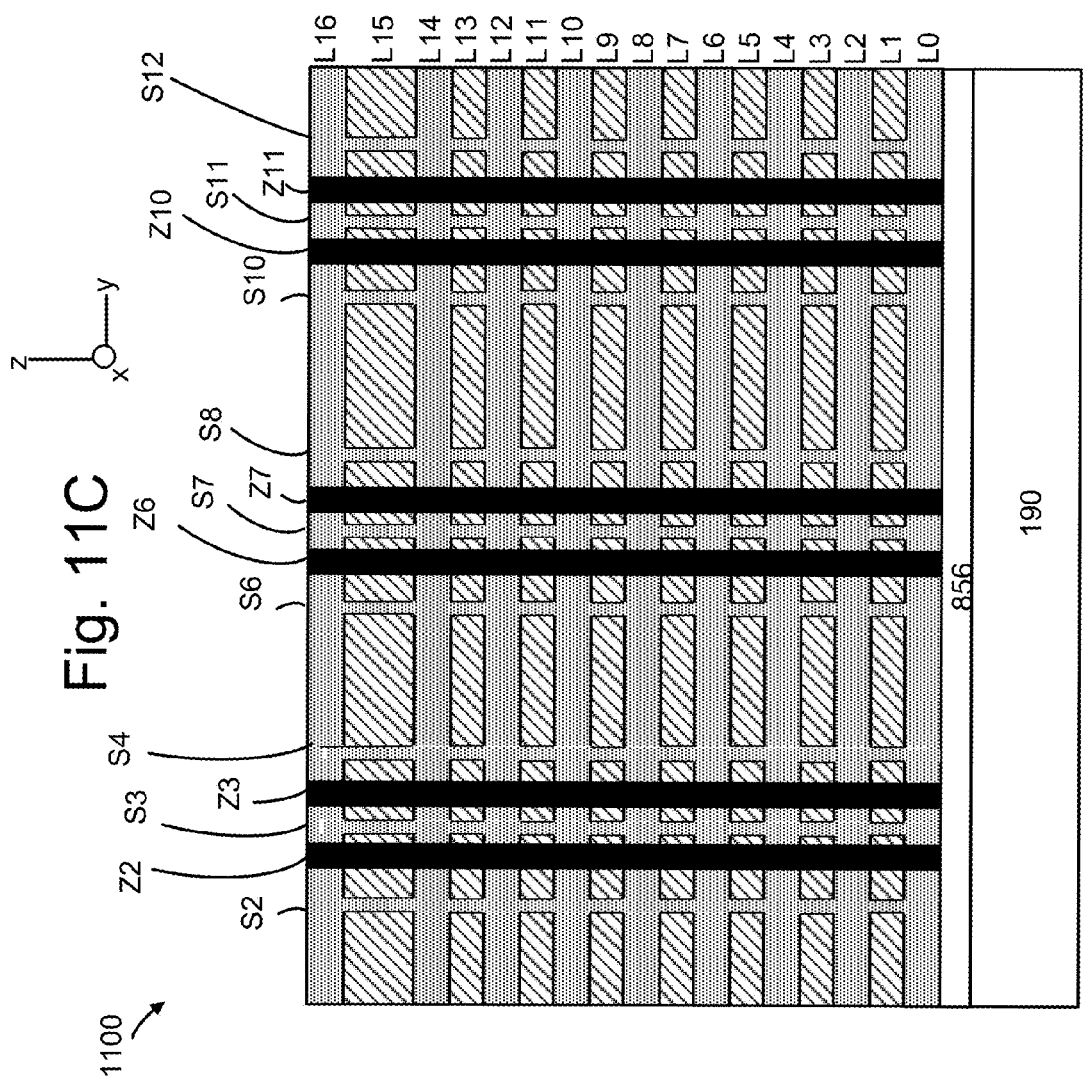
Figure 11B:
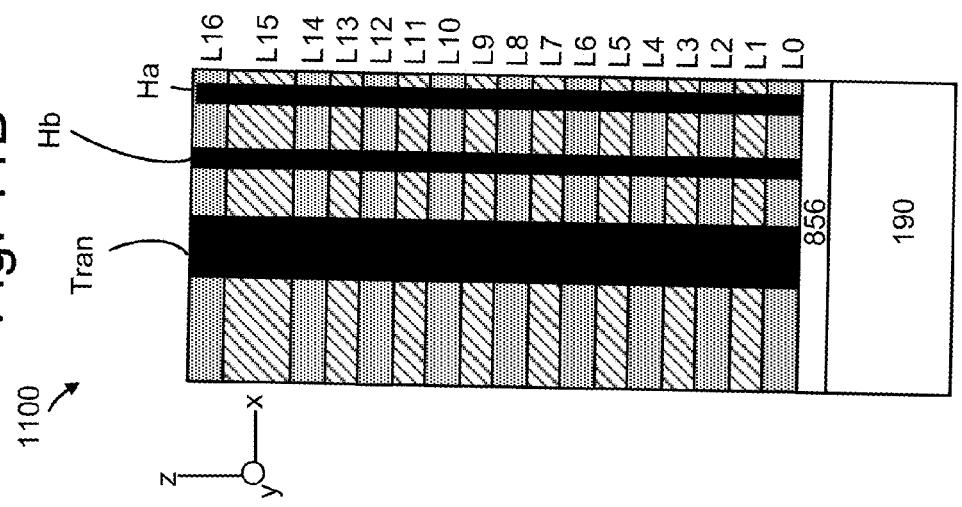

Step 618 includes depositing insulation (e.g., one or more layers) in the recesses via the slits in the at least one cell area. FIG. 11A-11C depicts a layered semiconductor material 1100 which is obtained from the layered semiconductor material 1000 after filling in voids with insulation via the slits in the cell and WL select gate regions. FIG. 11A is a cross section of the memory array region in the BL (y) direction along a portion of line A-A' from FIG. 8. FIG. 11B is a cross section in the WL (x) direction along a portion of line B-B' from FIG. 8. FIG. 11C is a cross section of the WL select gate region in the BL(y) direction.

Insulation is provided in the slits to fill the recesses (e.g., region 1050) which were created by the wet etch, as indicated by the shading. The insulation can be a dielectric material which insulates the word line layers from one another. The insulator, which is deposited via the slits with the intention to fill in the voids between the layers of heavily doped polysilicon will inevitably be deposited somewhat on the sidewalls of the slits. The slits in the cell area can be cleaned out to remove theses deposits. This can occur with the cleaning out of the slits in the interconnect area, or separately.

In this scheme, slits are used to fill in voids between poly with insulation. Then, the slits are cleaned out (opened) before silicidation. Otherwise, the insulator on the sidewalls can prevent metal (e.g., Ni) from being deposited on poly, thereby preventing silicidation.

In one embodiment, silicidation is performed at least in the memory array region. Silicidation is an annealing process resulting in the formation of metal-Si alloy (silicide) from the heavily doped poly. For example, it can include depositing a metal such as Ni, Ti, Co or W in the slits in the cell area followed by annealing which transforms the affects portions of the heavily doped polysilicon layers to a metal silicide. Chemical vapor deposition (CVD) or atomic layer deposition (ALD) could be used to deposit the metal. A silicide is an alloy of silicon and metal and has the advantage of reduced resistivity compared to heavily doped polysilicon. The silicidation results in metal silicide regions in place of heavily doped poly regions in the cell area.

Figure 12A:
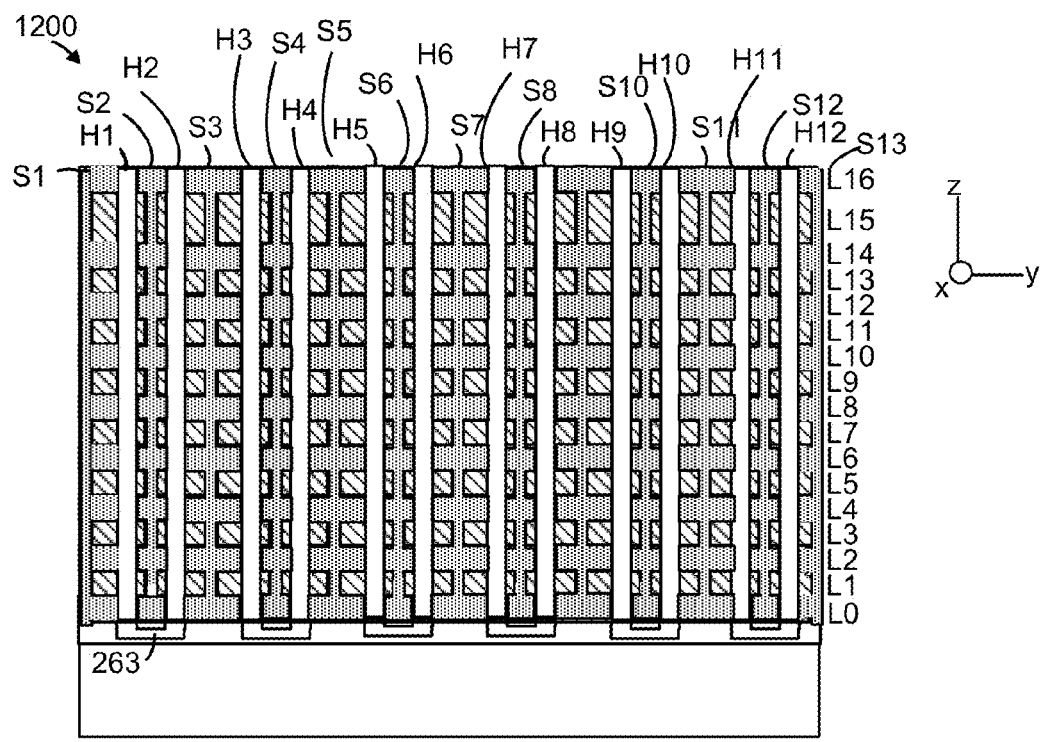

Step 626 includes cleaning out the memory holes and z-holes. Optionally, the DG-holes are cleaned if they were formed in step 612. FIGS. 12A-12C depict a layered semiconductor material 1200 which is obtained from the layered semiconductor material 1100 after cleaning out the memory holes and the transistor holes (or z-holes). FIG. 12A is a cross section of the memory array region in the BL (y) direction along a portion of line A-A' from FIG. 8. FIG. 12B is a cross section in the WL (x) direction along a portion of line B-B' from FIG. 8. FIG. 12C is a cross section of the WL select gate region in the BL(y) direction.

The memory holes H1 to H12 in the cell area are cleaned out, e.g., by etching. Also, the z-holes are cleaned out, e.g., by etching (not all z-holes depicted in FIGS. 12B and 12C). The slits can be protected from the etching. Additionally, the drain-side memory holes H1, H3, H5, H7, H9, and H11 are extended up to a bit line BL, the source-side memory holes H2, H4, H6, H8, H10, and H12 are extended up to one or more source select lines Step 628 includes filling in memory holes and z-holes with oxide-nitride-oxide (ONO), polysilicon layer and core filler. Optionally, the DG-holes are filled if they were formed in step 612. The following describes details of one embodiment of filling memory holes and z-holes. In one approach, the memory holes and z-holes are filled in by depositing ONO and polysilicon layers on sidewalls of the columnar memory holes, e.g., using ALD. In one embodiment, layers such as layers 296-300 are formed in the memory holes (see FIG. 5A-5B). A block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300.

These same depositions can serve as the bases for a vertical gate/width TFT. Referring to FIGS. 5E-5F, an oxide can be deposited as layer 296, a nitride such as SiN can be deposited as layer 297, an oxide can be deposited as layer 298, a polysilicon gate can be deposited as layer 299, and a core filler dielectric can be deposited as region 300. Thus, note that the same layers may serve different purposes for the TFT. For example, layer 299 may be used for gate electrodes of the vertical gate/width TFTs, whereas layer 299 may be used for polysilicon bodies of the memory cells. The ONO layers form a dielectric stack, in one embodiment. The stack layers can be more complex, such as where at least one of these layers can be a combination of layers of oxide and nitride. With respect to the memory array region, if the optional metal (M) silicide of the word line is considered, and the polysilicon body (S), a MONOS stack and memory cell are formed. Alternatively, if the word line is poly (S), a SONOS stack and memory cell are formed. If the world line is silicided (metal silicide), this may be considered to be a MONOS stack.

Step 630 includes providing above-stack metal layers and connecting the interconnect area to the above-stack metal layer by at least one contact structure. Step 630 may include providing connections between z-decoders and WL select gates.

Figure 13A:
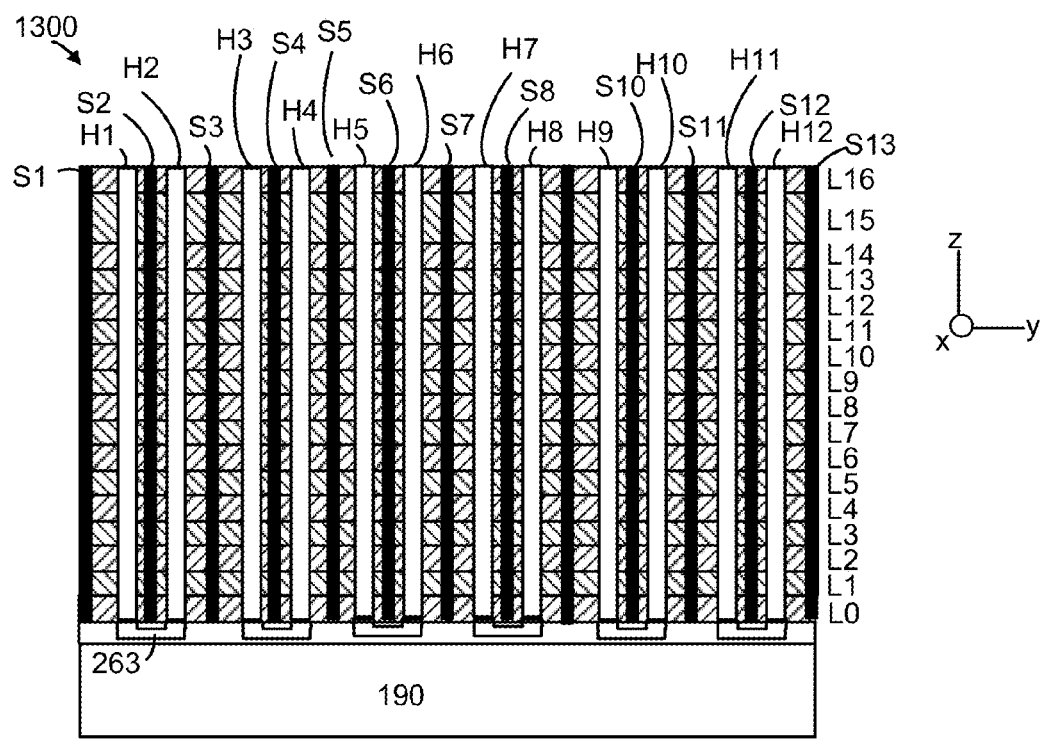
FIG. 13A depicts a layered semiconductor material 1300 which is consistent with a cross-sectional view of the line A-A' of FIG. 8 during the process of FIG. 7A.
Figure 13C:
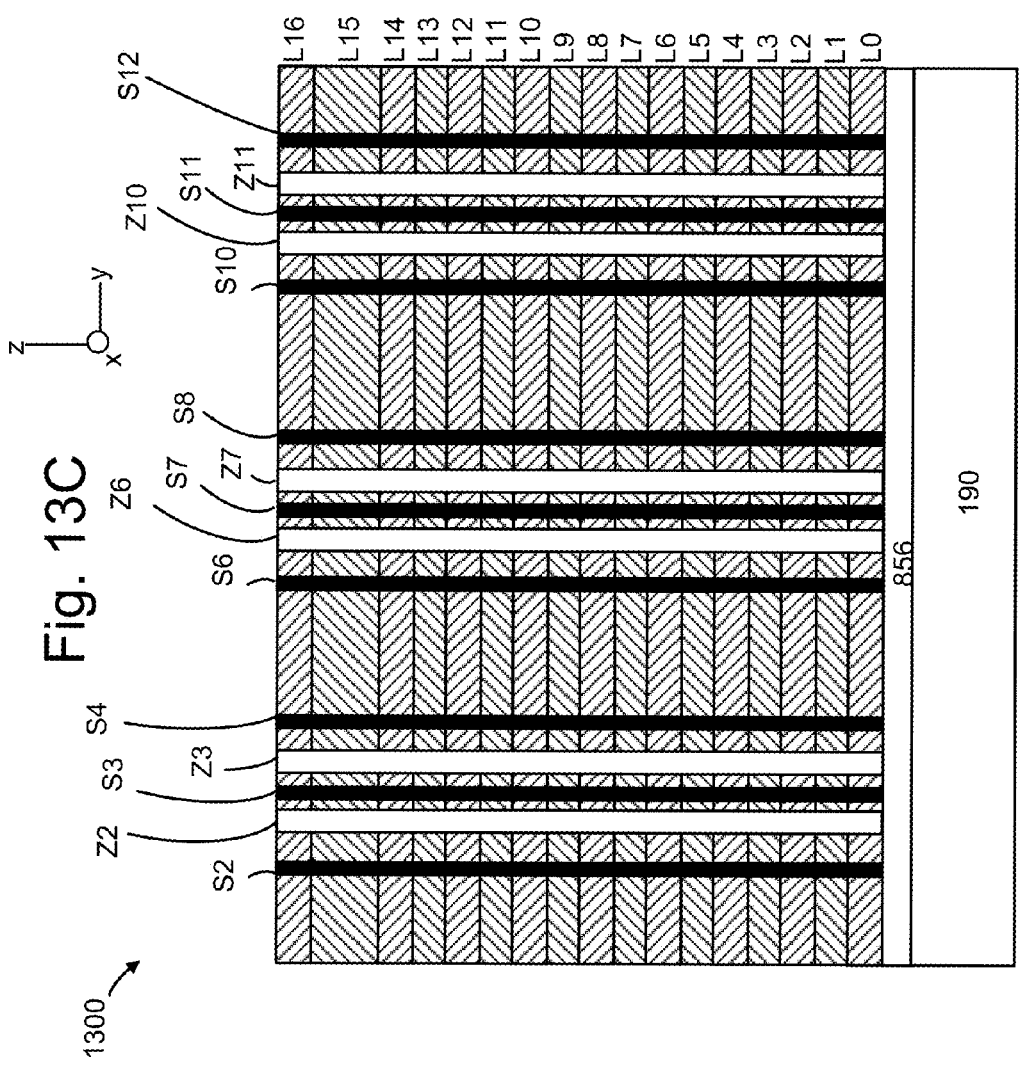
FIG. 13C depicts a cross section along a portion of line C-C' from FIG. 8 during the process of FIG. 7A.
Figure 13B:
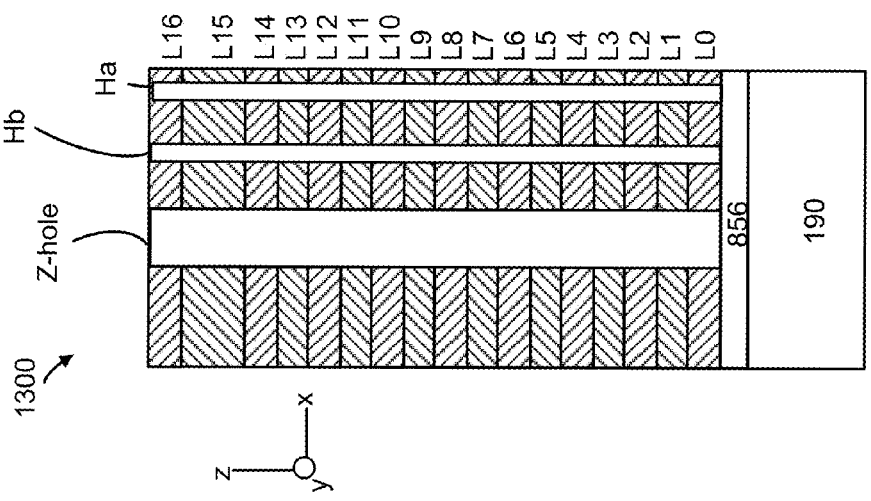
FIG. 13B depicts a cross section along the circled portion of line B-B' from FIG. 8 during the process of FIG. 7A.
Figure 14A:
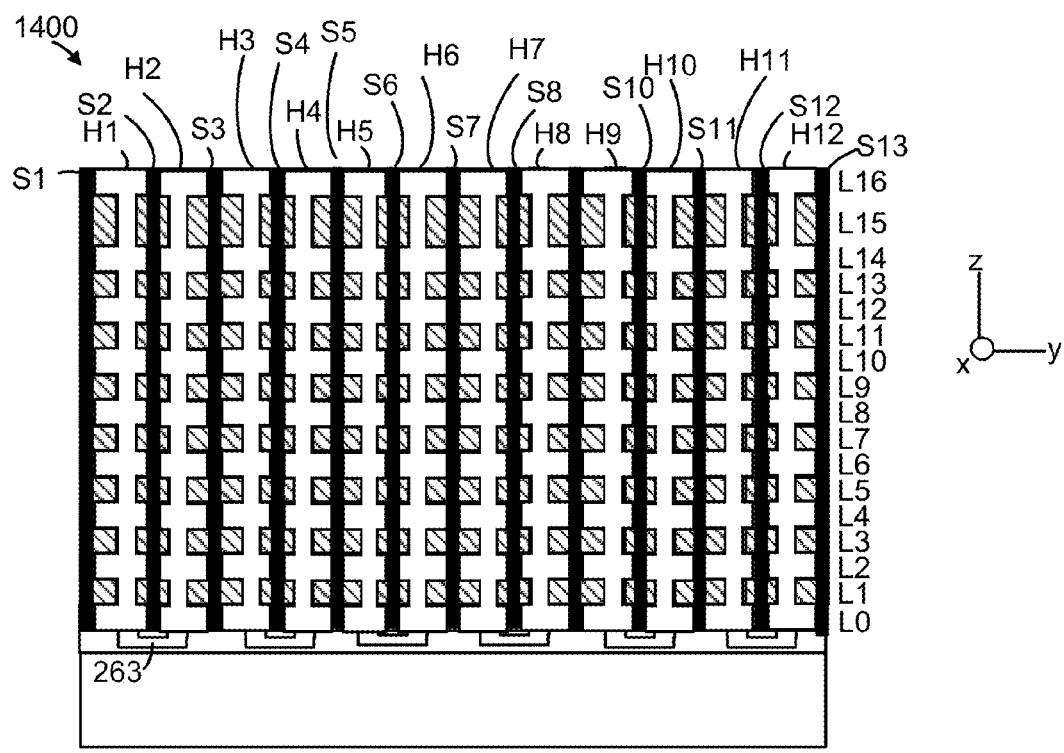
Figure 15C:
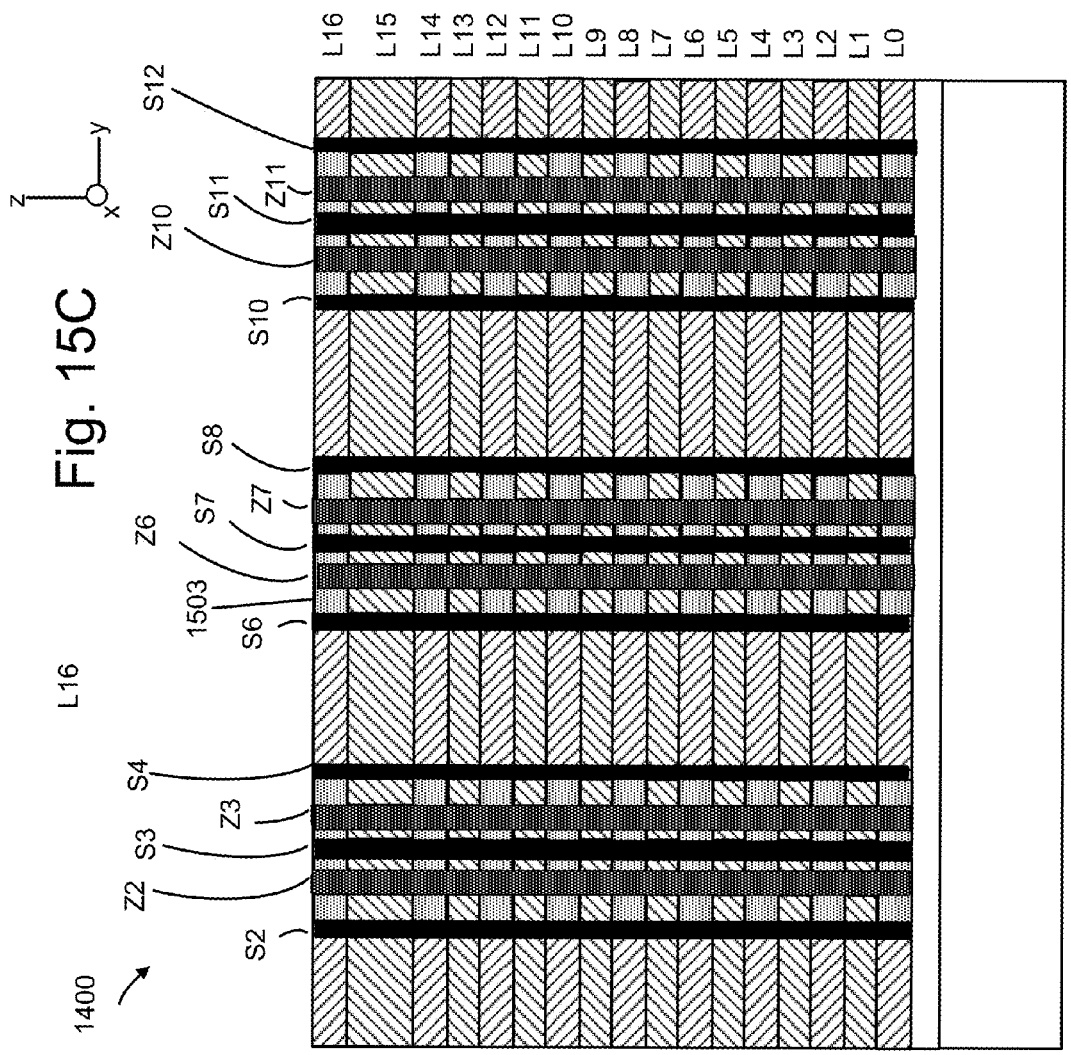

FIG. 7A depicts a method for fabricating a 3D stacked non-volatile memory device, corresponding to the structures of FIGS. 13A-15C, where a wet etch is performed via memory holes. FIGS. 13A, 14A, and 15A are cross sections of the memory array region in the BL (y) direction along a portion of line A-A' from FIG. 8. FIGS. 13B, 14B, and 15B cross sections in the WL (x) direction along a portion of line B-B' from FIG. 8. FIGS. 13C, 14*c*, and 15C are cross sections of the WL select gate region in the BL(y) direction.

In this scheme "wet etch through memory holes and z-holes", slits are formed first and filled in with $SiO_2$ (in one example). Then memory holes and z-holes are etched, and then wet etch is performed through memory holes and z-holes. At that time, with undoped/lightly doped poly removed in cell area and WL select gate region, slits serve as anchors to poly structure. Later slits may be etched to remove sacrificial fill material. Silicidation may be done through the slits. The steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed.

Step 700 includes providing below-stack circuitry and metal layers on substrate. Step 701 includes providing a back gate layer with pipe connections. Step 702 includes providing etch stop layer. Step 706 includes depositing alternating undoped/lightly doped and heavily doped polysilicon layers. Step 708 includes etching slits in the cell region 305 and in the WL select gate region 303 using a common mask.

Step 710 includes filling in the slits in the cell area and in the at WL select gate region with insulation.

Step 712 includes etching memory holes in the cell area and z-holes in the WL select gate region, 712. In one embodiment, step 712 includes etching DG-holes. FIGS. 13A-13C depict results after step 712. The alternating layers of undoped/lightly doped and heavily doped polysilicon are provided as before as layers L0 to L16 in FIGS. 13A-13C. After the layers of undoped/lightly doped and heavily doped polysilicon are deposited (step 706), the slits (steps 708-710), memory holes (step 712) and z-holes (step 712) are fabricated. Reactive ion etching can be used.

FIG. 13A depicts a layered semiconductor material 1300 which is consistent with a cross-sectional view of the line A-A' of FIG. 8, showing slits (S1-S13) and memory holes (H1-H12) in the cell region 305. The substrate region 190 is repeated. In this example, U-shaped NAND strings are being fabricated. However, straight NAND strings may be fabricated as an alternative. Straight NAND strings may connect to a source at the bottom of the string. No back gate (BG) is necessary since there is no pipe connection needed. With U-shaped NAND, both select gates are on the top, one connected to a bit line, one to a source line, and each made of metal, e.g., D1 and D2, for lower resistance.

FIG. 13B depicts a cross section along the circled portion of line B-B' from FIG. 8. FIG. 13B depicts formation of a z-hole in the WL select region 303 and two memory holes (Ha, Hb) in the memory region 305.

FIG. 13C depicts a cross section along a portion of line C-C' from FIG. 8. FIG. 13C depicts the opening of z-holes Z2, Z3, Z6, Z7, Z10, and Z11. Slits S2, S3, S4, S6, S7, S8, S10, S11, and S12 are filled in.

Step 714 includes performing a wet etch via the memory holes in the cell area and the WL select gate region to remove portions of the undoped/lightly doped polysilicon layers in the cell area and WL select gate region. Optionally, the wet etch may be performed via the DG-holes if they were formed in step 712.

FIGS. 14A-14C depict a layered semiconductor material 1400 which is obtained from the layered semiconductor material 1300 after performing a wet etch via the memory holes and z-holes. The wet etch can involve introducing an etchant via the memory holes of the at least one cell area, which has a higher selectivity for the undoped/lightly doped polysilicon layers, removing the undoped/lightly doped polysilicon layers. The wet etch is not relatively highly selective of the heavily doped polysilicon so that the heavily doped polysilicon is not substantially removed. As in the case of the wet etch via the slits, essentially all of the undoped/lightly doped poly in the cell areas is removed.

Note that the heavily doped polysilicon layers will be used for the transistor body in the WL select gate regions. However, the heavily doped polysilicon layers will be used for word lines in the memory cell region. Therefore, the desired doping profile may be different. In one embodiment, one or more additional steps are taken to modify the doping profile of the heavily doped polysilicon on the WL select gate region. Such steps may be taken at this point in the process. Further details are provided below.

In step 716, insulation (e.g., oxide) is formed in the recesses via the memory holes and z-holes. Optionally, the DG-holes may be used to help form insulation in the recesses.

In step 718, the memory holes and z-holes are cleaned out to remove any insulator that may adhere to the memory hole and z-hole walls. The DG-holes are also cleaned if formed in step 712.

Step 720 includes depositing ONO layers (as a dielectric or insulation) in the memory holes in the cell area and in the z-holes in the WL select gate region. Optionally, material is deposited in the DG-holes if they were formed in step 712.

For example, an ONO stack can be deposited into the memory holes and z-holes by CVD and/or ALD, which also fills the recesses or voids between the heavily doped poly layer or word line layers which were created by the wet etch. ONO is considered to be a dielectric material. Also, polysilicon and a core $SiO_2$ may be deposited in the in the cell area and in the z-holes in the WL select gate region.

Figure 15B:
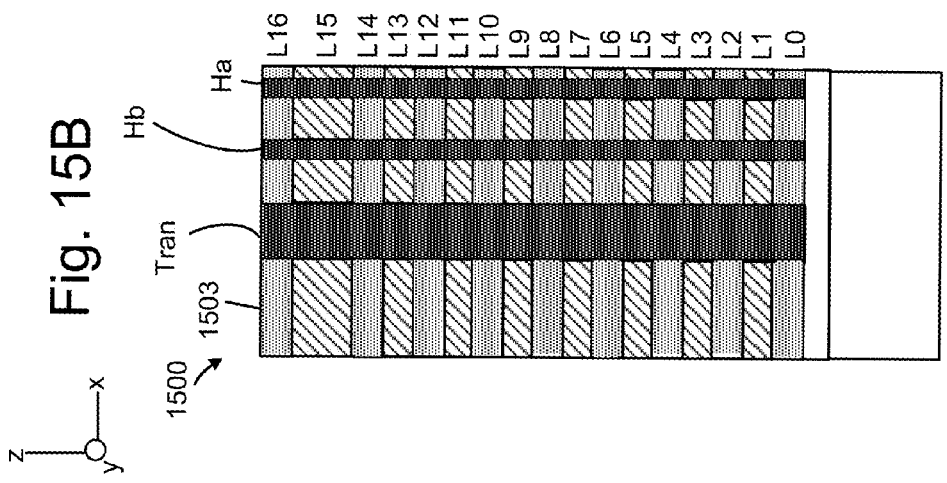

FIGS. 15A-15C depict a layered semiconductor material 1500 which is obtained from the layered semiconductor material 1400 after filling in the recesses between heavily doped poly layers with an insulator (step 716) and filling in memory holes and z-holes (step 720). These Figures show that there is now an insulator 1503 in what were recesses between heavily doped poly layers. This insulator could be $SiO_2$. The memory holes and z-holes are filled, as noted above with various layers. The layers are not explicitly depicted in FIGS. 15A-15C. However, an example of the layers (e.g., 296-300) have been depicted in FIGS. 5A, 5B, 5E and 5F.

Step 726 includes providing above-stack metal layers and connect the at least one interconnect area to the above-stack metal layer by at least one contact structure. This may include providing a contact 227 to a word line plate region.

Figure 15D:
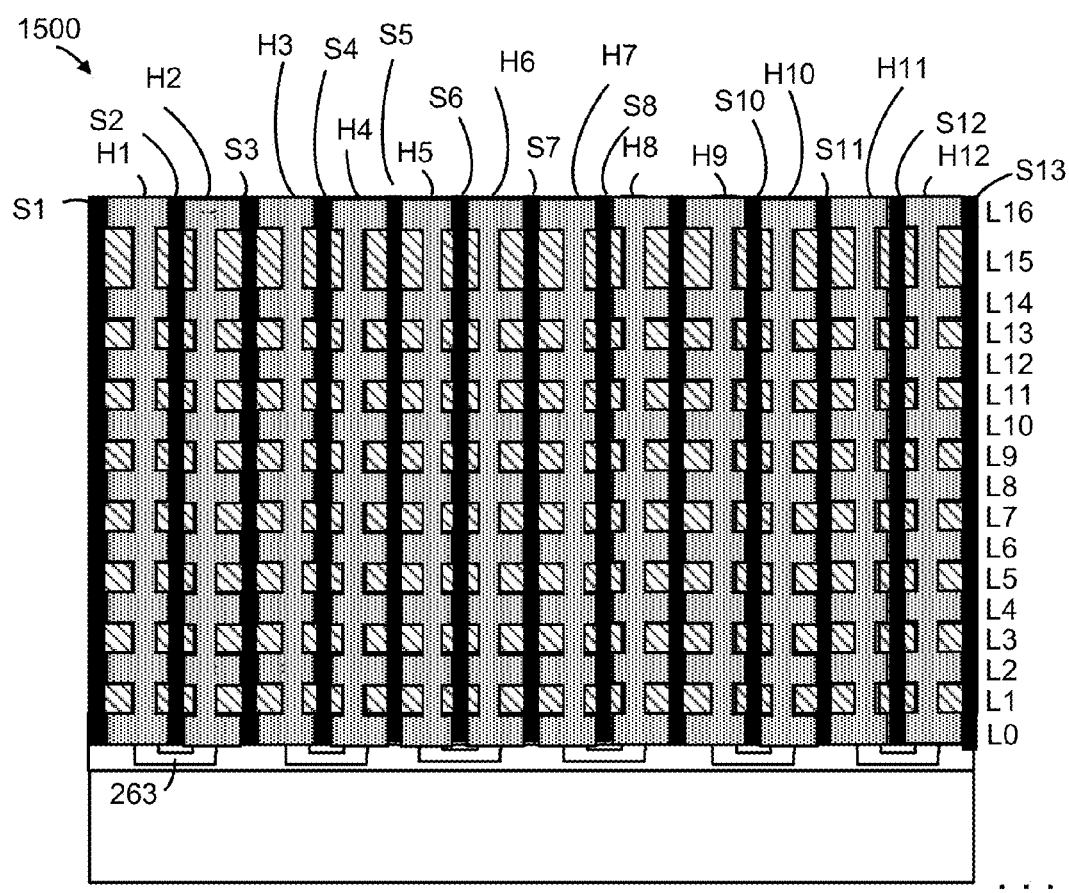

In one embodiment, steps 716 and 718 are not performed. Instead, the recesses between the heavily doped layers are filled with at least some of the material that is used to fill the memory holes and z-holes. For example, an ONO stack can be deposited into the memory holes and z-holes by CVD and/or ALD, which also fills the recesses or voids between the heavily doped poly layers or word line layers which were created by the wet etch. The ONO may serve as a dielectric in the layers between the heavily doped layers (outside of memory holes and z-holes). In step 720, a polysilicon layer and a core $SiO_2$ may also be deposited in the in the memory holes and in the z-holes in the WL select gate region. FIGS. 15D-15F depict results after this filling for one embodiment. In FIG. 15D a memory hole and what were recesses between the heavily doped polysilicon layers are depicted using the same shading. Note that the various layers are not depicted. In this case, the layers may not appear exactly as depicted in FIG. 5A. Rather, regions D6, D7, and D8 (outside of the memory hole) may be formed in part by layers 296, 297, and 298. It is also possible for other layers (e.g., 299 and 300) to extend into regions D6, D7, and D8. In one embodiment, at the word line layers, the layering (296-300) is as depicted in FIGS. 5A and 5B.

Also, the layers may not appear exactly as depicted in FIG. 5E. Rather, regions D5, D6, and D7 (outside of the z-hole) may be formed in part by layers 296, 297, and 298. It is also possible for other layers (e.g., 299 and 300) to extend into regions D5, D6, and D7. In one embodiment, at the word line layers, the layering (296-300) is as depicted in FIGS. 5E and 5F.

As noted above, in FIGS. 6 and 7A, alternating layers of undoped polysilicon and heavily doped polysilicon are first formed. FIG. 7B shows a process in which initially, alternating layers of insulator and heavily doped polysilicon are formed. Note that steps could be performed in a different order. In step 600, below stack circuitry and metal layers are provided on a substrate. Step 601 includes providing a back gate layer with pipe connections. In step 602, an etch stop layer is provided. In step 746, alternating layers of insulator and heavily doped polysilicon are deposited. In step 748, slits are etched in the cell area and in the transistor area using a common make. In step 750, insulation is deposited in the slits in the cell area and the transistor area. In step 752, memory holes are etched in the cell area and z-holes are etched in the transistor area. Optionally, DG-holes are etched in step 752.

In step 754, the memory holes are filled and the z-holes are filled. These may be filled with ONO, polysilicon and a core filler. Optionally, material is deposited in the DG-holes if they were formed in step 752.

In step 756, above-stack metal layers are provided. This may include proving contacts to the gate electrodes of the upper WL select gates.

As mentioned above, the body of the transistors may be doped with a different doping profile than the word lines. In one embodiment, forming the plurality of word line select gates includes heavily doping polysilicon in regions in which bodies of the plurality of word line select gates are being formed as a part of forming the heavily doped polysilicon word lines. Then, counter doping the heavily doped polysilicon in regions in which the bodies of the plurality of word line select gates are being formed.

In one embodiment, forming the plurality of word line select gates includes heavily doping polysilicon in regions in which bodies of the plurality of word line select gates are being formed as a part of forming the heavily doped polysilicon word lines. Then, removing a dopant from the heavily doped polysilicon in regions in which the bodies of the plurality of word line select gates are being formed to reduce the doping concentration.

Figure 16:
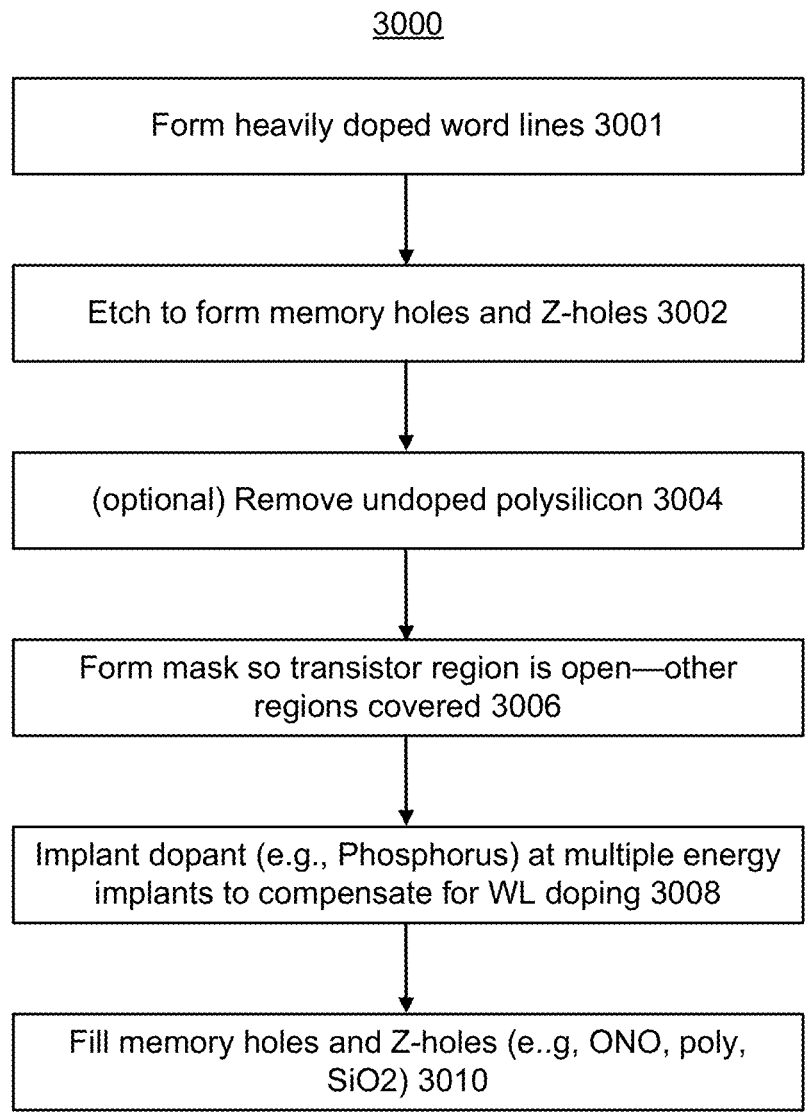
FIG. 16 is a flowchart of one embodiment of a process of doping the body of the transistors.

FIG. 16 is a flowchart of one embodiment of a process 3000 of doping the body of the TFT transistors. This process may also be used for doping a body/channel extension. In one embodiment, process 3000 is used with the process of FIG. 6. Recall that in FIG. 6, etching of the undoped polysilicon was performed via the slits. In one embodiment, process 3000 is used with the process of FIG. 7A. Recall that in FIG. 7A, etching of the undoped polysilicon was performed via the memory holes and z-holes. However, process 3000 can be used with other techniques. For example, rather than depositing layers of doped and undoped silicon, alternating layers of doped silicon and insulator (e.g., dielectric) may be deposited. Therefore, etching to remove the undoped polysilicon need not be performed. In one embodiment, process 3000 is used in the process of FIG. 7B, in which alternating layers of insulator and heavily doped polysilicon are deposited.

In step 3001, heavily doped word lines are formed. In one embodiment, a stack of alternating layers of heavily doped polysilicon and undoped polysilicon is formed. In one embodiment, a stack of alternating layers of heavily doped polysilicon and insulator (e.g., oxide) is formed. Slits may be etched in the stack to form word lines. The slits may be filled with insulator. Steps of etching and filling slits are described in FIGS. 6, 7A, and 7B, as some examples.

In step 3002, etching is performed to form memory holes and z-holes (optionally DG-holes). In one embodiment, this is performed as step 612 of FIG. 6. In one embodiment, this is performed as step 712 of FIG. 7A. In one embodiment, this is performed as step 752 of FIG. 7B. However, note that a different process could be used. Note that the etching does not remove regions where the bodies of TFTs are to be formed, in one embodiment.

In optional step 3004, etching (e.g., wet etch) is performed to remove undoped polysilicon. In one embodiment, this is performed as step 616 of FIG. 6. In one embodiment, this is performed as step 714 of FIG. 7A. If alternating layers of heavily doped silicon and insulator (e.g., oxide) are deposited, then step 3004 is not needed.

In step 3006, masking is performed so that the WL select gate region is open, but other regions are covered. Specifically, at least the body area in the WL select gate region should be open. If the DG-gates are being formed, then this region should also be open. The memory array region is covered by the mask. Therefore, the polysilicon being used to form word lines will not be impacted by later doping steps in this process.

In step 3008, a dopant is implanted in the WL select gate region using multiple energies. This doping is used to modify the doping profile in the highly doped polysilicon that was formed for the word lines. This doping is intended to alter the doping for all word line layers. Multiple energy implants may be used in step 3008 to modify the doping profiles appropriately in all levels. In one embodiment, the final doping profile for the transistor body is about $1.0\times10^{17}/cm^3$ to $5.0\times10^{18}/cm^3$. This may be p-type. In one embodiment, phosphorous is implanted. The phosphorous may nearly compensate for a dopant such as boron, which may have been used for doping the highly doped polysilicon layers. In one embodiment, the final doping in the transistor body is n-type. The final doping profile for the transistor n-type body may be about $1.0\times10^{17}/cm^3$ to $5.0\times10^{18}/cm^3$. As one example, the phosphorous implant over-compensates for boron doping of the word line layers.

In step 3010, the memory holes and z-holes (optionally DG-holes) are filled with ONO, polysilicon, and $SiO_2$. In one embodiment, step 628 of FIG. 6 is performed. In one embodiment, step 720 of FIG. 7A is performed. In one embodiment, step 754 of FIG. 7B is performed. However, another process could be used.

Figure 17:
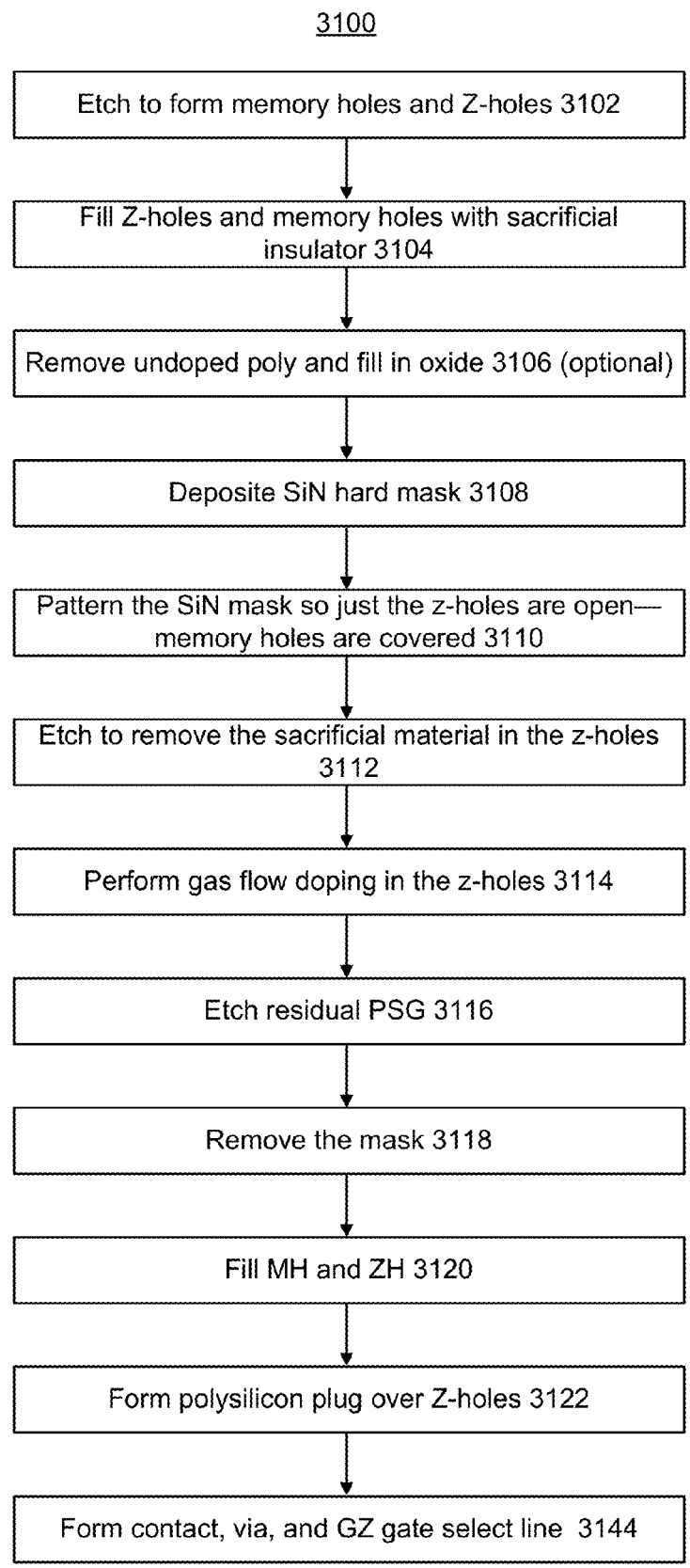
FIG. 17 is a flowchart of one embodiment of a process for doping transistor bodies. This process using a gas flow doping technique.

FIG. 17 is a flowchart of one embodiment of a process 3100 for doping transistor bodies. This process may also be used for doping a body/channel extensions. This process uses a gas flow doping technique. In one embodiment, process 3100 is used with the process of FIG. 6. In one embodiment, process 3100 is used with the process of FIG. 7A. In one embodiment, process 3100 is used in the process of FIG. 7B, in which alternating layers of insulator and heavily doped polysilicon are deposited. Note that steps of process 3100 are not necessarily performed in the order described.

In step 3102, etching is performed to form memory holes and z-holes (optionally DG-holes). Etching to form memory holes and z-holes is included in the processes of FIGS. 6, 7A, and 7B. However, another process could be used. Note that this step could etch alternating layers of insulator and heavily doped polysilicon or alternating layers of undoped (or lightly doped) polysilicon and heavily doped polysilicon. In one embodiment, step 612 of FIG. 6 is performed. In one embodiment, step 712 of FIG. 7A is performed. In one embodiment, step 752 of FIG. 7B is performed.

In step 3104, the z-holes (optionally DG-holes) and the memory holes are filled with a sacrificial material, such as $SiO_2$. In one embodiment, step 614 of FIG. 6 is performed. In one embodiment, step 3104 is performed between steps 718 and 720 of FIG. 7A. In one embodiment, step 3104 is performed between steps 752 and 754 of FIG. 7B.

In optional step 3106, undoped polysilicon is removed via wet etching. Also, a dielectric is deposited in the openings formed by the wet etch. In one embodiment, undoped polysilicon is removed via wet etching through slits. In one embodiment, steps 616 and 618 of FIG. 6 are performed. In one embodiment, undoped polysilicon is removed via wet etching through memory holes and z-holes. Also, a dielectric may be deposited in the openings formed by the wet etch. In one embodiment, steps 714 and 716 of FIG. 7A are performed.

Note that another option is to deposit alternating layers of heavily doped and dielectric (e.g., oxide) layers. In this case, there is no need to remove updoped polysilicon. Also, replacement of undoped polysilicon with dielectric could occur at a different point in the process. Also note that in one embodiment, wet etching is performed via memory holes and z-holes to remove the undoped polysilicon.

In step 3108, a layer for a hard mask (e.g., SiN) is deposited. In step 3110, the mask layer is patterned so that openings are formed over the z-holes (and optionally DG-holes). In step 3112, etching is performed based on the SiN mask to remove the sacrificial material in the z-holes. FIGS. 18A and 19 show results after step 3112. FIGS. 18A and 19 show a z-hole that has been opened using a mask. FIG. 18A is a cross section in the x or WL direction showing a z-hole. FIG. 19 is a cross section in the y or BL direction showing a z-hole Portions of the stack in which the transistor's bodies are to be formed are left in place, in one embodiment. In one embodiment, the z-hole roughly corresponds to the region that includes the gate dielectric(s), the gate electrode(s) and the core. FIGS. 18A and 19 show that the stack now is alternating layers of oxide and heavily doped polysilicon. In one embodiment, the doping is P+, for example boron. The doping could be N+. Rather than an oxide, another insulator could be used. FIG. 19 also shows two of the slits.

Figure 18B:
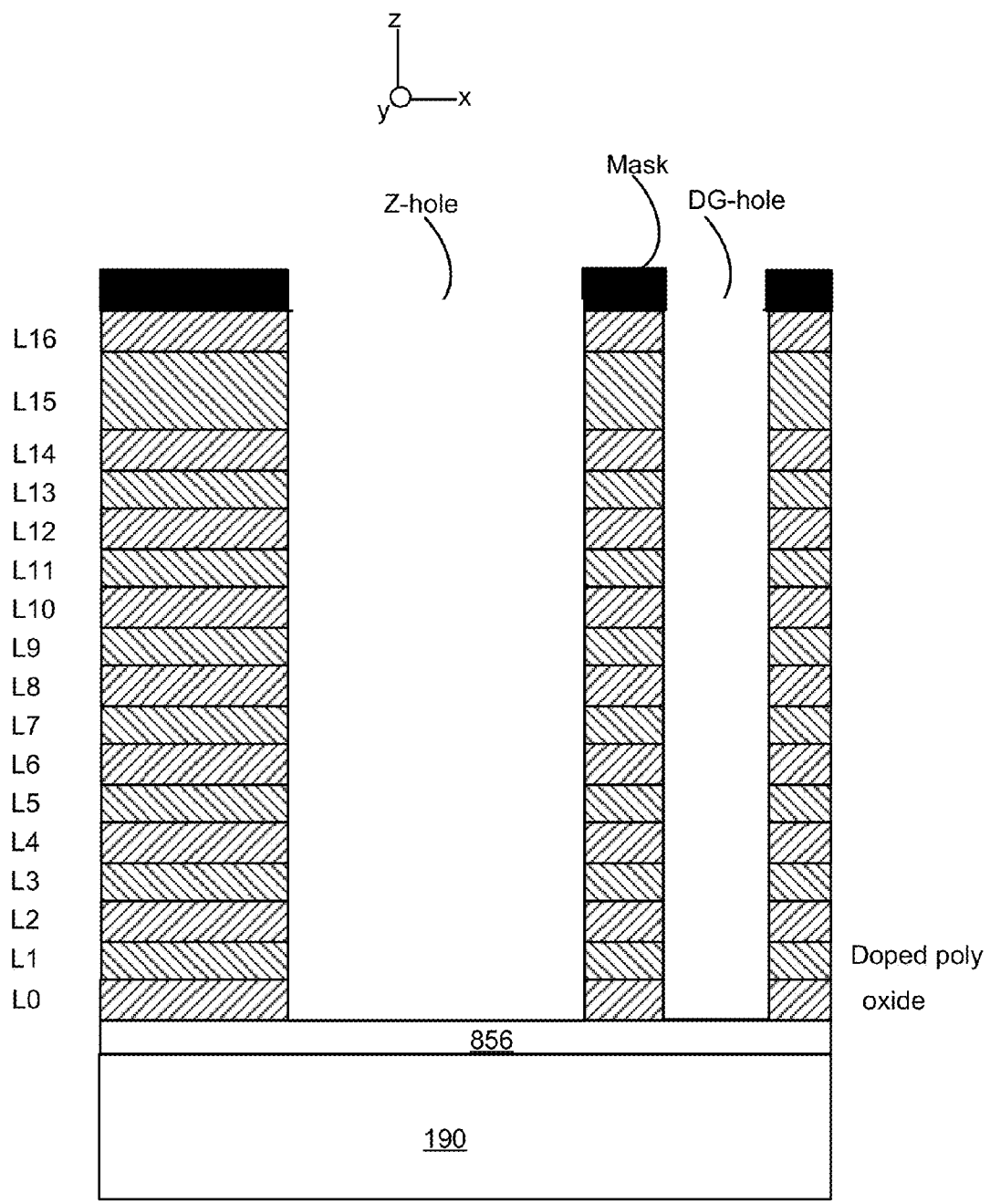
FIG. 18B shows a z-hole and DG hole that have been opened using a mask.

The process may also be used when forming DG-holes. FIG. 18B shows results after step 3112 for one such embodiment. This cross section shows the z-hole and DG-hole in the x or WL direction. The layers of oxide and doped poly are similar to FIG. 18A. In step 3114 gas flow doping is performed in the WL select gate regions. This step may achieve a desired doping profile for the transistor body (and optionally body/channel extension). Step 3114 may introduce phosphorous into the doped polysilicon layers, which counter dopes the heavily doped polysilicon layers. Thus, the net doping concentration in the doped polysilicon layers is reduced. Note that other steps may be made to further adjust the net doping concentration.

In one embodiment, a $POCl_3$ furnace diffusion is performed. As one example, this may be for about 5 to 15 minutes at 800 to 850 degrees C. However, this may for a longer or shorter period. Also, the temperature may be higher or lower.

In one embodiment, step 3114 includes rapid thermal processing (RTP) with phosphine rich gas diluted in nitrogen. In one embodiment, the temperature is ramped up for 60 seconds to 900 degrees C., held there for 30 seconds, and ramped down for 60 seconds. Both the ramp up and ramp down times cold be longer or shorter. The steady state temperature may be higher or lower than 900 degrees C. The doping pressure could be 1000 Pascals (Pa), which may correspond to a partial pressure of phosphine gas of about 100 Pa. In one embodiment, there is a maximum concentration of phosphorous of $1.2 \times 10^{20}$ $cm^3$, and a mean resistivity of 527 Ohm/sq. Note that 527 Ohm/sq is similar to Rs of boron-doped poly (unsilicided). Then, active P concentration by one method and active boron concentration in poly WL can be comparable to compensate each other.

In one embodiment, step 3114 includes a low pressure doping process carried out in a single RTP reactor chamber by using a two-step process: (1) controlled adsorption of phosphorus on silicon surface and (2) rapid thermal diffusion in an oxidizing ambient without the deposition of an oxide capping layer. Low concentration of 50 ppm phosphine diluted in hydrogen may allow sufficient phosphorus supply while the deposition of phosphorus on reactor walls may be insignificant. The phosphine may decompose on a clean silicon surface at a temperature of 550° C., at which the silicon surface is saturated by adsorbed phosphorus. Dopant diffusion may be defined by successive rapid RTA at temperatures above adsorption temperature. An oxygen pressure of 4.2e3 Pa during annealing may prevent phosphorus from desorption. This method may provide "shallow" diffusion depths of approximately 100 nm or less w/sheet resistances below 1000 Ohm/sq. Also, phosphorus concentration up to approximately 4-5e20 cm-3 (or greater) may be achieved.

In step 3116, residual phosphosilicate glass (PSG), if any, is removed from the z-holes. Note that PSG may form as a result of the phosphorous doping. In step 3118, the SiN hard mask is removed. Also, the sacrificial material that was deposited in the memory holes is removed.

In step 3120, material is formed in the memory holes and the z-holes (and optionally DG-holes) to form the memory cells and transistors for WL select gates. In one embodiment, the following layers are formed inward from the walls of the memory- and z-holes: silicon oxide (e.g., $SiO_2$), silicon nitride (SiN), silicon oxide, polysilicon (possibly doped in situ), and silicon oxide. The silicon nitride may serve as a charge trapping layer for memory cells. The inner polysilicon (doped) may serve as the body of the memory cell. The silicon oxide, silicon nitride, silicon oxide (ONO) may serve as a gate dielectric for the transistors. The inner polysilicon (doped) may serve as the gate of the transistor. Examples of step 3120 are describes in the processes of FIGS. 6, 7A and 7B.

In step 3122 a polysilicon plug 511 is formed over the z-holes (and optionally DG-holes). This polysilicon plug serves as a contact to the gate electrode of the TFT transistor. The polysilicon plug may be heavily doped. Then a contact may be formed over the polysilicon plug. The contact may be tungsten, as one example. In step 3144, a contact 513, a via 515, and a WL select gate select line 517 are formed.

As was discussed above, some embodiments counter dope the heavily doped polysilicon layers to achieve a desired doping profile for the transistor body (and optionally body/channel extension). For example, phosphorous may be used to counter dope boron. In some embodiments, boron (or another dopant) active doping is reduced in the transistor body area. Reducing boron active doping may be combined with phosphorous (or another dopant) counter doping. Combing these two techniques may make counter doping easier.

Figure 20:
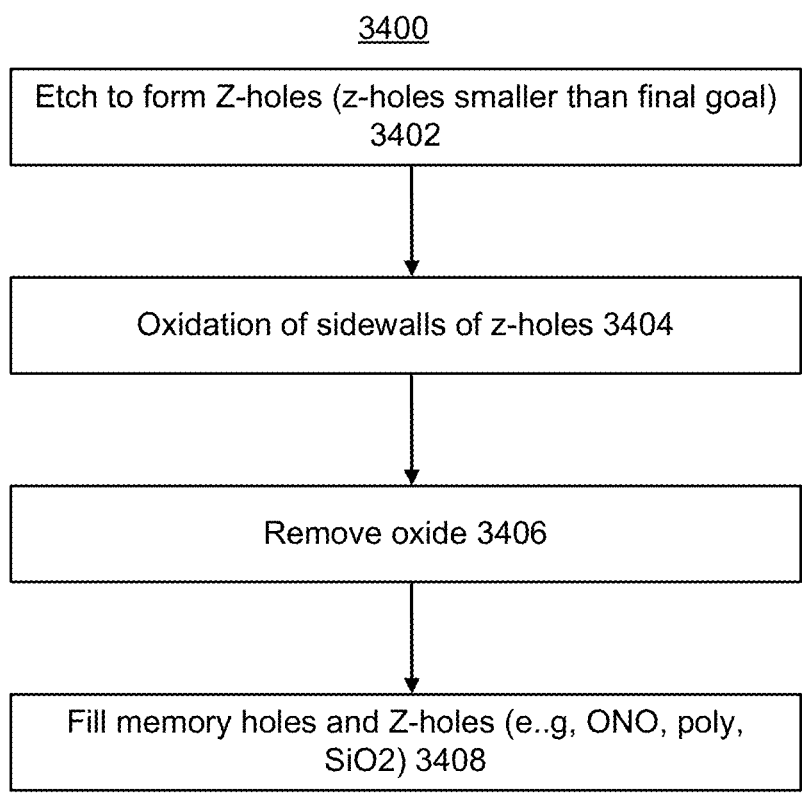
FIG. 20 is a flowchart of one embodiment of a process of reducing doping levels in the transistor body by sidewall oxidation of z-holes.

FIG. 20 is a flowchart of one embodiment of a process 3400 of reducing doping levels in the transistor body (and optionally body/channel extension) by sidewall oxidation of z-holes (and optionally DG-holes). Prior to the process, a stack may be constructed with alternating heavily doped layers and insulator (e.g., oxide) layers. Also, memory holes and z-holes (and optionally DG-holes) may be formed. Numerous techniques have been described herein for constructing a stack of alternating layers of heavily doped polysilicon and oxide. In this process, when forming the z-holes (and optionally DG-holes) the holes are made somewhat smaller than the final target size to account for expansion of the holes, as will be described below.

Figure 21A:
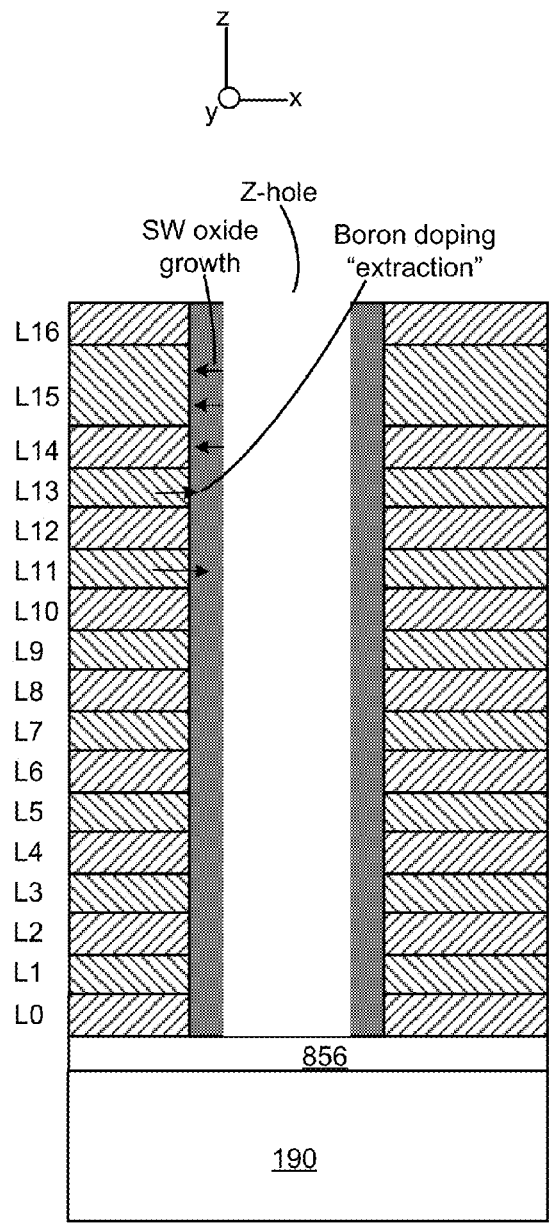
FIGS. 21A and 21B depict cross sectional views of a portion of the WL select gate region showing one z-hole.
Figure 21B:
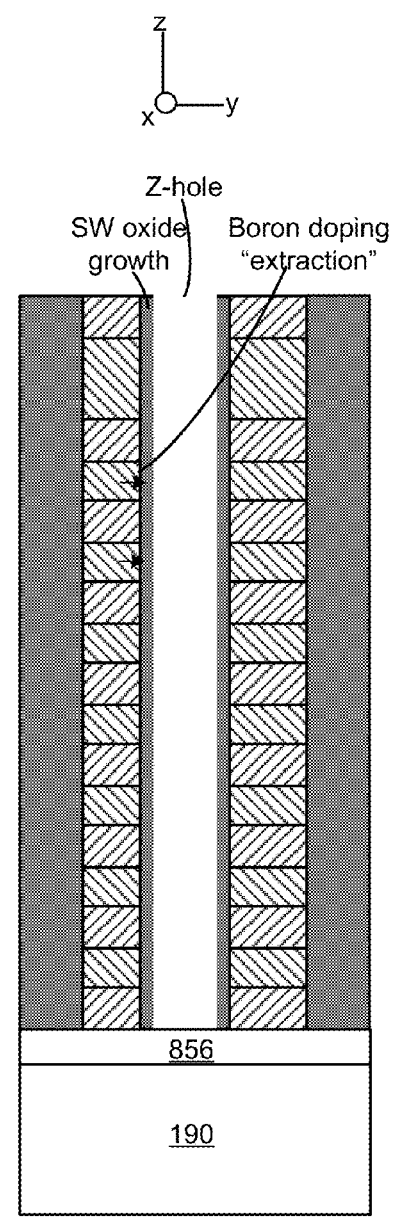

In one embodiment, process 3400 is used with the process of FIG. 6. In one embodiment, process 3400 is used with the process of FIG. 7A. In one embodiment, process 3400 is used in the process of FIG. 7B, in which alternating layers of insulator and heavily doped polysilicon are deposited. FIGS. 21A and 21B will be referred to when discussing process 3400.

Step 3402 is etching to form z-holes (and optionally DG-holes). As noted, the z-holes will initially be smaller than the target size. This may be for the target size of the region that is going to be the gate dielectric layer 402. There may be a gate electrode layer 404 and a core 406 inside of the gate dielectric layer 402. The final desired thickness of the TFT body should also be considered. The body thickness is the distance between the gate dielectric layer 402 and a slit, in one embodiment. The etching could be performed while etching to form memory holes, but that is not required. The memory holes may be filled with a sacrificial material.

In step 3404, the sidewalls of the z-holes (and optionally DG-holes) are oxidized. Note that sidewalls of memory holes should not be oxidized in this step. The oxide grows into the polysilicon that surrounds the z-holes (and optionally DG-holes). This removes boron (or other dopant) from the heavily doped polysilicon that will become the body (and optionally body extension) of the transistor due to diffusion and segregation at the polysilicon-oxide interface. Note that this does not necessarily remove all of the dopant. Note that the oxide may grow into the z-hole somewhat. The boron concentration can be significantly reduced depending on the duration and thermal budget of the z-hole sidewall oxidation. As one example, the boron might be reduced to $1.0 \times 10^{19}$ cm$^3$ or less.

FIGS. 21A and 21B depict cross sectional views of a portion of the WL select gate region showing one z-hole. FIG. 21A is a cross section along the WL direction. FIG. 21B is a cross section along the BL direction. These Figures show that the size of the z-hole (and DG-hole if used) expands due to sidewall oxidation growth. Also, diffusion of boron from heavily doped polysilicon into the sidewall oxide is depicted.

In step 3406, the z-holes (and DG-hole if used) are cleaned to remove the sidewall oxide. In step 3408, the z-holes (and memory holes and DG-hole if used) are filled. In one embodiment, this includes forming ONO, doped polysilicon, and a core oxide in successive layers working inwards. Example steps have been described with respect to FIGS. 6, 7A and 7B.

In one embodiment, boron reduction is achieved using pre-amorphization of the WL select gate region. This may be followed by re-crystallization anneal. In one embodiment, the pre-amorphization includes multiple implants of Ge, C, Ar. Embodiments may achieve a significant dopant (e.g., boron) loss. As one example, boron doping loss may be from (starting) $6 \times 10^{20}$ to (after process) $6 \times 10^{18}$ to $3 \times 10^{19}$. In one embodiment, the pre-amorphization implant (PAI) is done with Ar (Ar+C+Ge). For example, doses of Ar $5 \times 10^{15}$, C $5 \times 10^{15}$, Ge $3.5 \times 10^{15}$ cm$^2$ may be used. In one embodiment, multiple energies are used to account for different layers. Other areas such as memory holes should be protected when performing the PAI.

Figure 22:
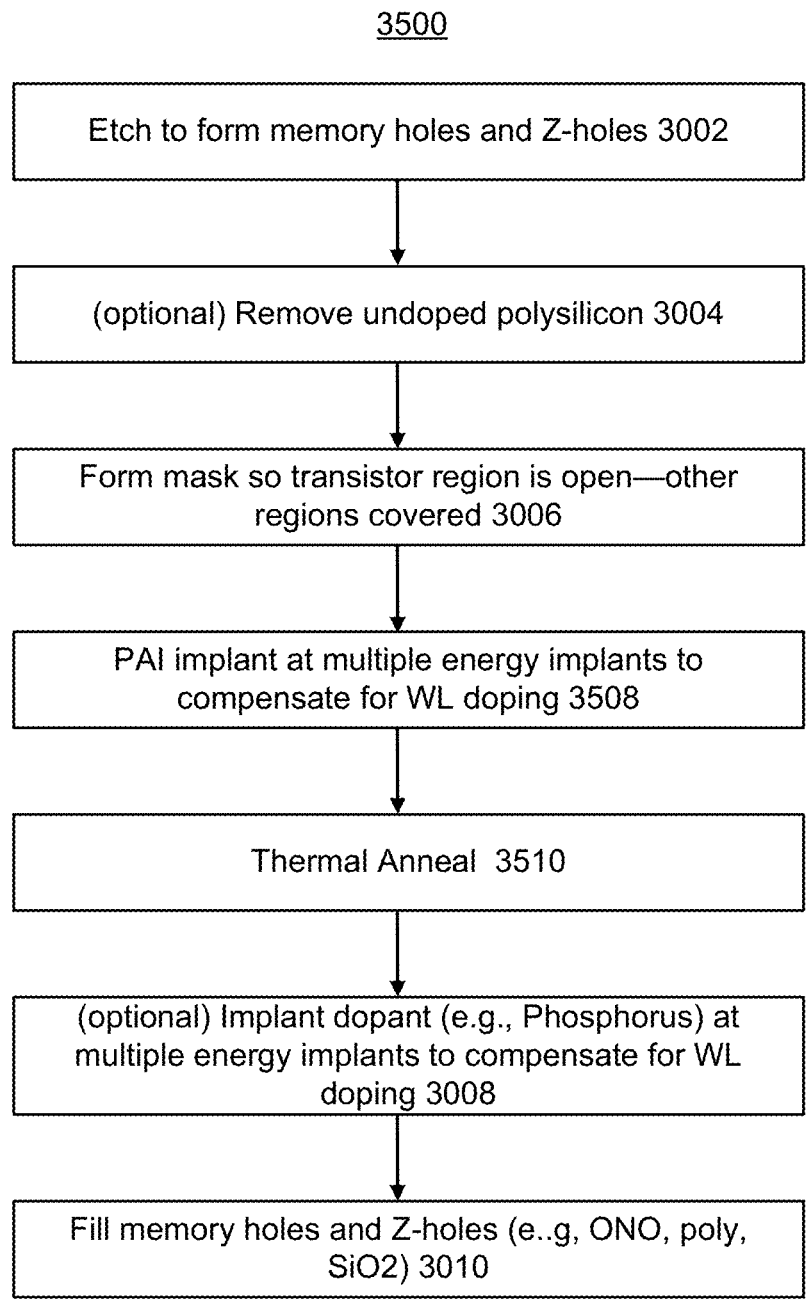
FIG. 22 is one embodiment of a flowchart that uses PAI to help create a desired doping profile for transistor bodies.

FIG. 22 is one embodiment of a process 3500 that uses PAI to help create a desired doping profile for transistor bodies. Optionally, process 3500 may be used to help create a desired doping profile for transistor body/channel extensions. In one embodiment, process 3500 is used with the process of FIG. 6. In one embodiment, process 3500 is used with the process of FIG. 7A. In one embodiment, process 3500 is used in the process of FIG. 7B, in which alternating layers of insulator and heavily doped polysilicon are deposited. Note that steps of process 3500 are not necessarily performed in the order described.

Some steps of process 3500 are similar to other processes so will not be described in detail. Memory- and z-holes (optionally DG-holes) may be etched in step 3002. Undoped polysilicon may be removed in step 3004, which has been discussed before. As noted, one option is to deposit polysilicon and oxide alternating layers to avoid the need to remove the undoped polysilicon. A mask is formed to open the WL select gate region in step 3006, but to protect other regions such as memory array.

In step 3508, a PAI is performed. PAI was discussed above. The PAI may be at multiple energies to account for the different heavily doped layers of polysilicon. In step 3510, a thermal anneal is performed.

Optionally, phosphorous is implanted to compensate for the WL doping in step 3008.

In one embodiment, steps 3508, 3510, and optionally step 3008 are performed between steps 626 and 628 of the process of FIG. 6. In one embodiment, steps 3508, 3510, and optionally step 3008 are performed between steps 718 and 720 of the process of FIG. 7A. In one embodiment, steps 3508, 3510, and optionally step 3008 are performed between steps 752 and 754 of the process of FIG. 7B.

In step 3010, memory holes and z-holes (optionally DG-holes) are filled. In one embodiment, this includes forming ONO, doped polysilicon, and a core oxide in successive layers working inwards. Example steps have been described with respect to FIGS. 6, 7A and 7B.

In one embodiment, boron (or another dopant) is diffused out from the heavily doped polysilicon that will form the body of transistors using an anneal. This is another technique for controlling the doping profile of the transistor body, and may be used with other techniques described herein for controlling the doping profile of the transistor body.

Figure 23:
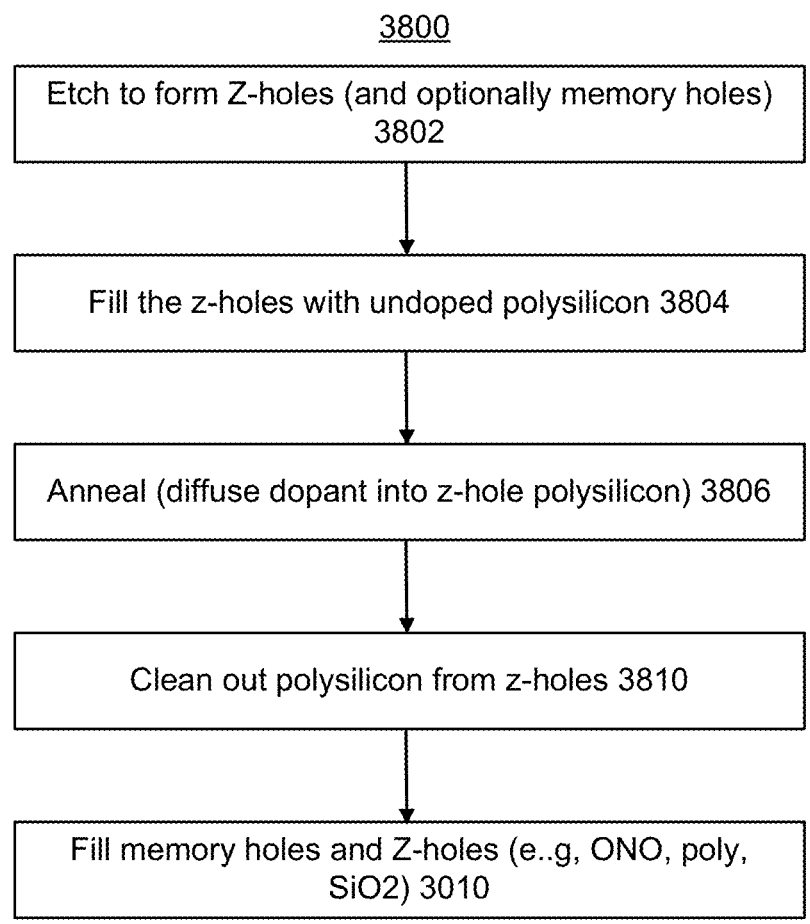
FIG. 23 is a flowchart of one embodiment of a process of annealing to diffuse dopant from the polysilicon that will form the body of a WL select gate.

FIG. 23 is a flowchart of one embodiment of a process 3800 of annealing to diffuse dopant from the polysilicon that will form the body (and optionally body/channel extension) of a WL select gate. In one embodiment, process 3800 is used with the process of FIG. 6. In one embodiment, process 3800 is used with the process of FIG. 7A. In one embodiment, process 3800 is used in the process of FIG. 7B, in which alternating layers of insulator and heavily doped polysilicon are deposited. Note that steps of process 3800 are not necessarily performed in the order described.

In step 3802, etching is performed to form z-holes (and optionally DG-holes). This step may also be used to form memory holes. In one embodiment, step 612 of the process of FIG. 6 is used. In one embodiment, step 712 of the process of FIG. 6 is used. In one embodiment, step 752 of the process of FIG. 6 is used.

In step 3804, the z-holes (and optionally DG-holes) are filled with undoped polysilicon. Note that the memory holes do not need to be filled with undoped polysilicon.

In step 3806, a thermal anneal is used to diffuse the dopant from the heavily doped polysilicon to the polysilicon that is in the z-holes (and optionally DG-holes). That it, the dopant from regions in which the WL select gates are to be formed has dopant removed therefrom (e.g., diffused).

In step 3810, the polysilicon is cleaned out from the z-holes (and optionally DG-holes).

In one embodiment, steps 3804-3810 are performed between steps 626 and 628 of the process of FIG. 6. In one embodiment, steps 3804-3810 are performed between steps 718 and 720 of the process of FIG. 7A. In one embodiment, steps 3804-3810 are performed between steps 752 and 754 of the process of FIG. 7B.

The process may continue with filling in the z-holes (and optionally DG-holes) and memory holes in step 3010. In one embodiment, this includes forming ONO, doped polysilicon, and a core oxide in successive layers working inwards. Example steps have been described with respect to FIGS. 6, 7A and 7B.

Figure 24:
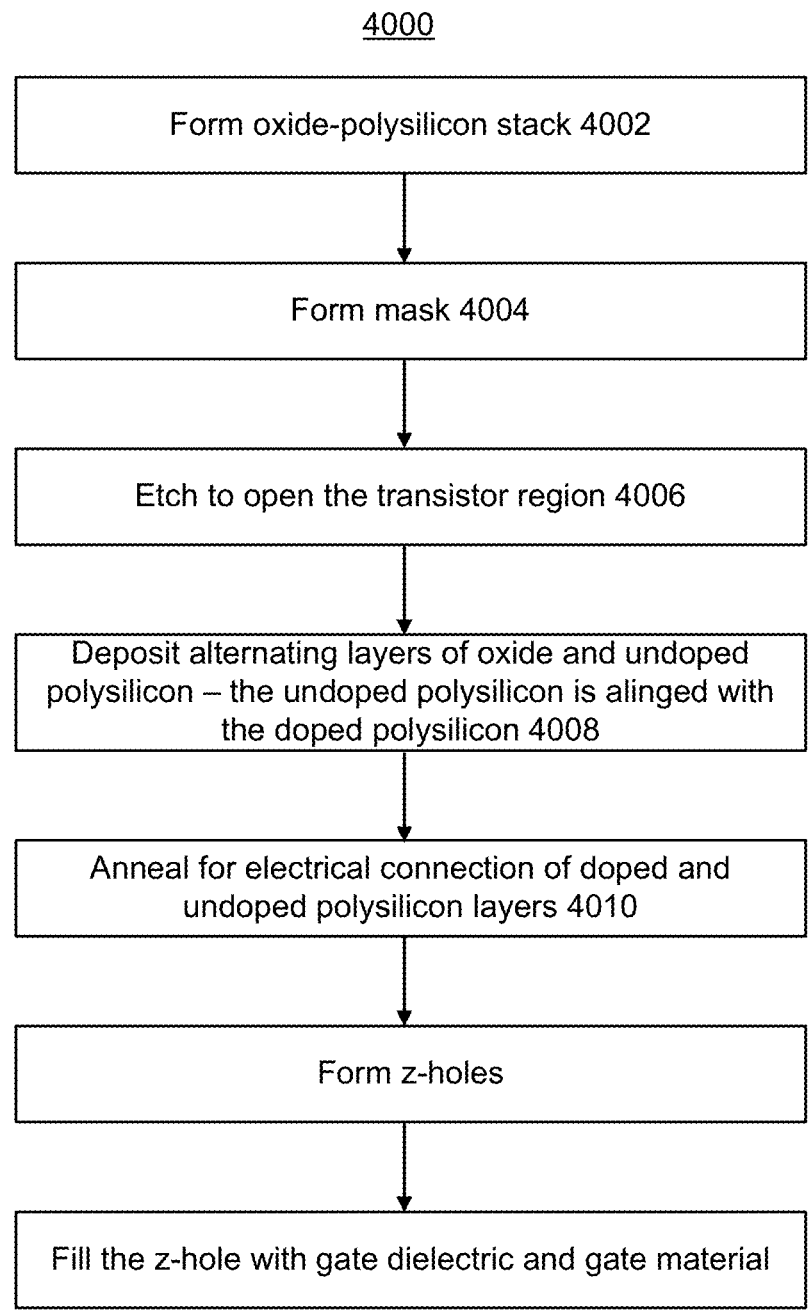
FIG. 24 is a flowchart of one embodiment of a process of stack replacement.

In one embodiment, a stack replacement in the WL select gate region is used. FIG. 24 is a flowchart of one embodiment of a process 4000 of stack replacement. In one embodiment, this process decouples memory hole and z-hole processing. It may also decouple memory hole and DG-hole processing. However, at least some memory hole processing can take place when processing z-holes (and optionally DG-holes) in process 4000. In one embodiment, process 4000 uses a wet etch through slits, as in the process of FIG. 6. As noted, memory hole processing may be decoupled from z-hole processing. In one embodiment, process 4000 uses a wet etch through memory holes and z-holes (and optionally DG-holes) as in the process of FIG. 7A. In one embodiment, process 4000 initially forms alternating layers of insulator and heavily doped polysilicon as in the process of FIG. 7B.

In step 4002, an insulator/polysilicon stack is formed. This stack includes alternating layers of silicon oxide and heavily doped polysilicon, in one embodiment. The polysilicon may be doped with boron, as one example. The stack may be formed by depositing alternating layers of oxide and heavily doped polysilicon. The stack may be formed by depositing alternating layers of undoped polysilicon and heavily doped polysilicon. Then, a wet etch may be performed through either slits or through memory- and z-holes (and optionally DG-holes) to remove the undoped polysilicon. Then, silicon oxide may be formed in the recesses where the undoped polysilicon was.

Figure 25A:
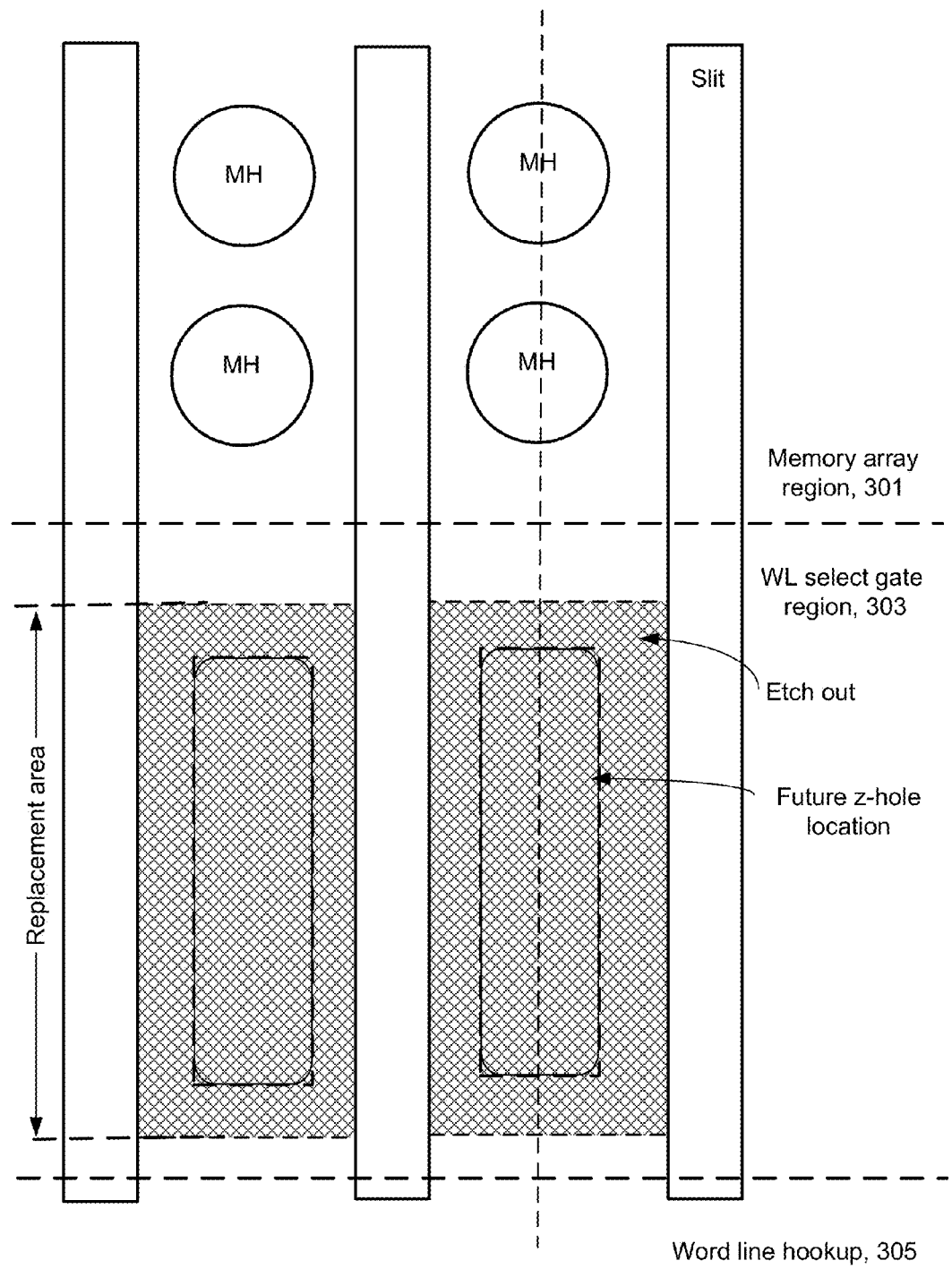
FIG. 25A shows a portion of the WL select gate region and a portion of the memory array.

In step 4004, a mask is formed. This mask will be used to remove material from where the transistors are being formed. In step 4006, etching is performed to open the WL select gate region. FIG. 25A shows a portion of the WL select gate region and a portion of the memory array. FIG. 25A shows a portion of the WL select gate region that may be etched in step 4006. Note that this portion may be larger than the future size of the z-hole (and optionally DG-holes). The size of the replacement region may be determined based on a desired length of the gate of the WL select transistor, accounting for diffusion from the doped to the undoped region.

FIG. 25B shows results after step 4006. FIG. 25B is a cross-section along line 4207 from FIG. 25A. A portion of the WL select gate region has been removed, showing a transistor replacement region. The two memory holes have sacrificial material therein. It is not required that the memory holes be formed at this point.

In step 4008, alternating layers of oxide and undoped (not intentionally doped) polysilicon are deposited. The oxide is aligned with the layers oxide that is already in the stack. The layers of undoped (intrinsic) polysilicon are aligned with the layers of heavily doped polysilicon in the stack. FIG. 25C shows results after step 4008.

In step 4010, a thermal anneal is performed to achieve good electrical connection between the undoped polysilicon and the heavily doped polysilicon. This, and other process steps, may cause diffusion of dopant from the heavily doped polysilicon into the undoped polysilicon. Therefore, a desired doping profile may be achieved in the body of the transistor. Note that the thermal anneal can be performed later in the process.

Next, z-holes (and optionally DG-holes) may be formed. The z-holes may be surrounded at least in part by what was initially undoped polysilicon. However, the doping level may have increased due to diffusion from the heavily doped polysilicon. The z-holes may be filled in with material to form a gate dielectric and a gate. Also, a core dielectric region may be formed. Note that the filling of the z-holes may be performed while the memory holes are being filled, or as a separate process. Therefore, parameters such as the gate dielectric thickness may be controlled independently from forming the memory holes.

Note that various techniques described herein may be used in combination with one another. In one embodiment, the technique of FIG. 20 (in which oxidation of z-hole sidewall is performed) is followed by counter-doping by gas flow (e.g., FIG. 17). In one embodiment, the technique of FIG. 20 (in which oxidation of z-hole sidewall is performed) is followed by counter-doping by PAI (e.g., FIG. 22). In one embodiment, the technique of FIG. 20 (in which oxidation of z-hole sidewall is performed) is followed by counter-doping by implantation (e.g., step 3008 of FIG. 22). The counter-doping may be by any combination of gas flow, implantation, and PAI.

Also, even if oxidation of z-hole sidewalls is not used, any combination of counter doping by gas flow, implantation, and PAI may be used. For example, gas flow may be used with implantation and/or PAI. Also, implantation may be used with PAI.

FIG. 26 shows example operation of one embodiment of WL select gates 229. In one embodiment, these are for a PFET TFT. One embodiment of the transistor may be on with a Vgs of about −5V. The drain may be about 1V below the source. One example is a gate voltage of −5V, source 0V, drain −1V. One example is a gate voltage of 20V, source 25V, drain 24V. One example is a gate voltage of 15V, source 20V, drain 19V. Other voltages could be used.

One embodiment of the transistor may be off with a Vgs of about 5V. One example is a gate voltage of 5V and source 0V. One example is a gate voltage of 30V and source 25V.

One example is a gate voltage of 25V and source 20V. Other voltages could be used.

Embodiments described herein are not limited to U-shaped NAND strings. FIG. 27 depicts an embodiment of a block BLK0B which includes straight NAND strings. The block includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 28:
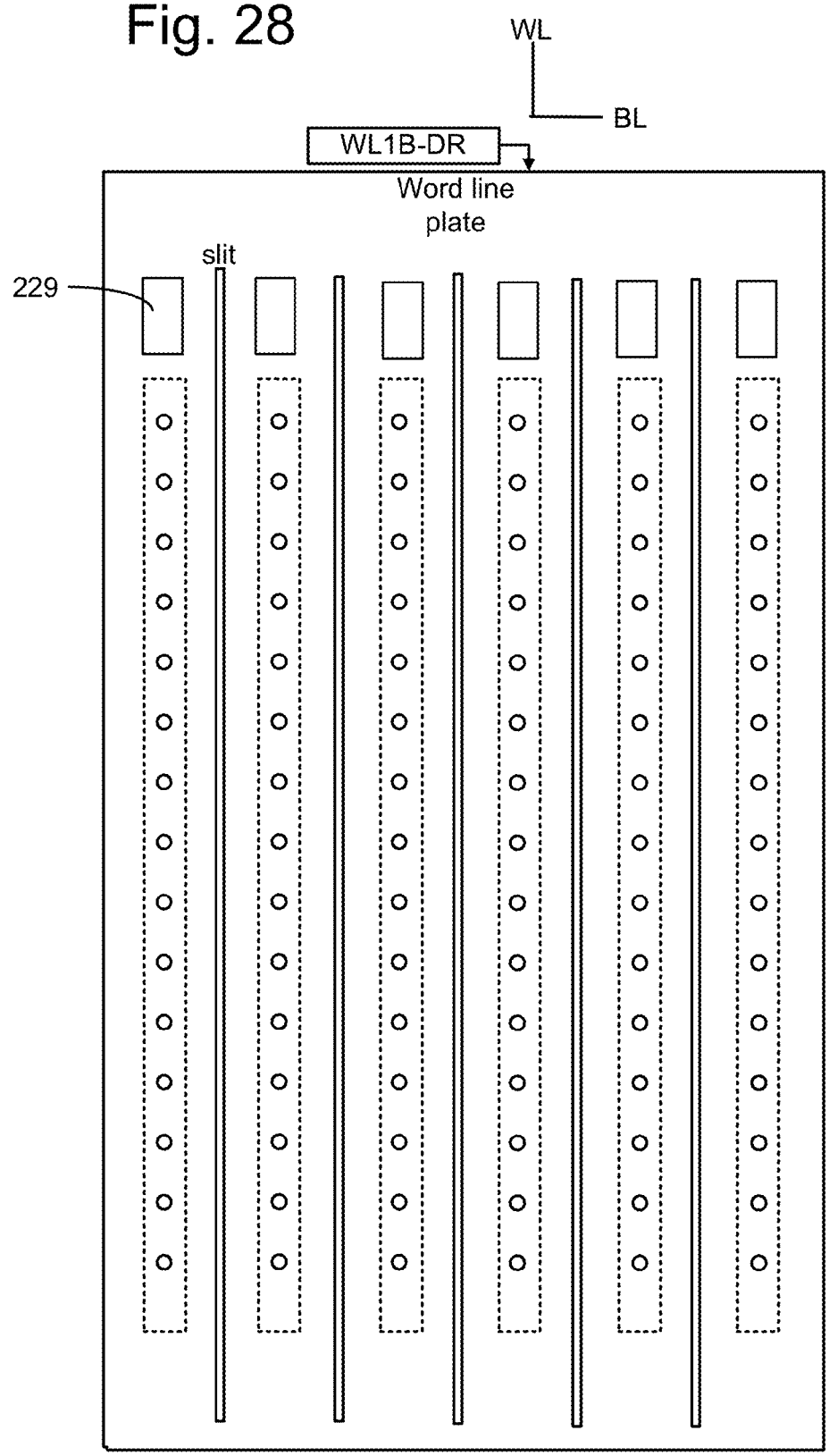
FIG. 28 is a word line plate that is consistent with an embodiment that uses straight NAND strings.
Figure 29:
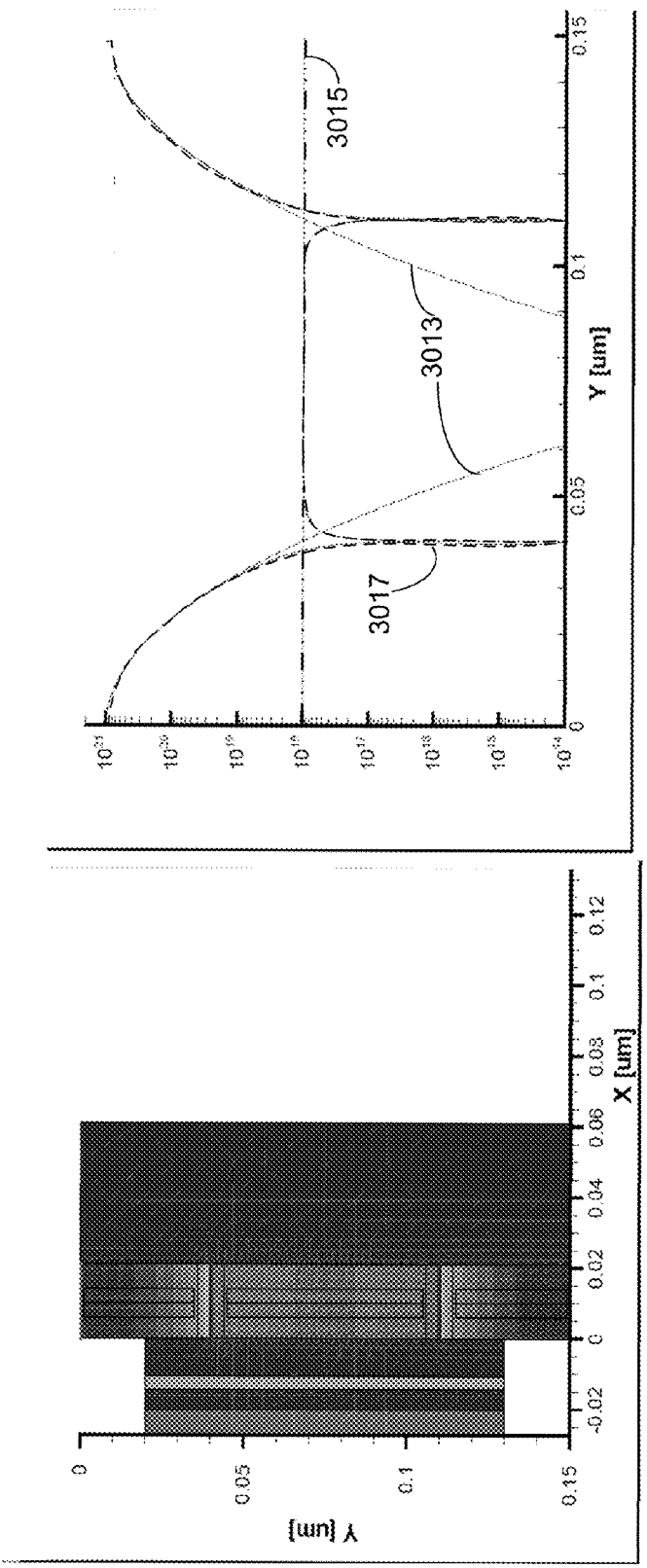
FIG. 29 shows a doping profile for the WL select gate in accordance with one embodiment.

FIG. 28 is a word line plate that is consistent with an embodiment that uses straight NAND strings. Thus, the memory holes in FIG. 28 may be associated with straight NAND strings. There is a WL/BL coordinate system shown. There is a single word line driver (e.g., WL1B-DR) per plate in this example. There is one set of WL select gates 229 at the end of the plate near the WL driver in one embodiment. In this example, each WL select gate 229 select one word line associated with this word line plate. There are six WL select gates 229 and six word lines in this example. There are five slits that separate the word lines. This slits also provide electrical isolation between the WL select gates 229. The plate could have more or fewer word lines. Note that the capacitive load is substantially reduced because the WL plate driver only drives the selected word line, as opposed to all word lines on the plate. As an alternative, a single WL select gate 229 might select two or more word lines. Other configurations for the WL plate are possible. FIG. 29 shows a doping profile for the WL select gate in accordance with one embodiment. In one embodiment, the TFT is an enhancement type with a P+ gate electrode and n-type body. The source and drain may be P+. Curves 3013 depicts the active boron concentration. Curve 3015 shows active phosphorous concentration. In this example, the phosphorous concentration is relatively uniform. Curve 3017 shows net concentration. FIG. 29 is for an example of PFET TFT. In one embodiment, the WLs are P+.

Figure 30:
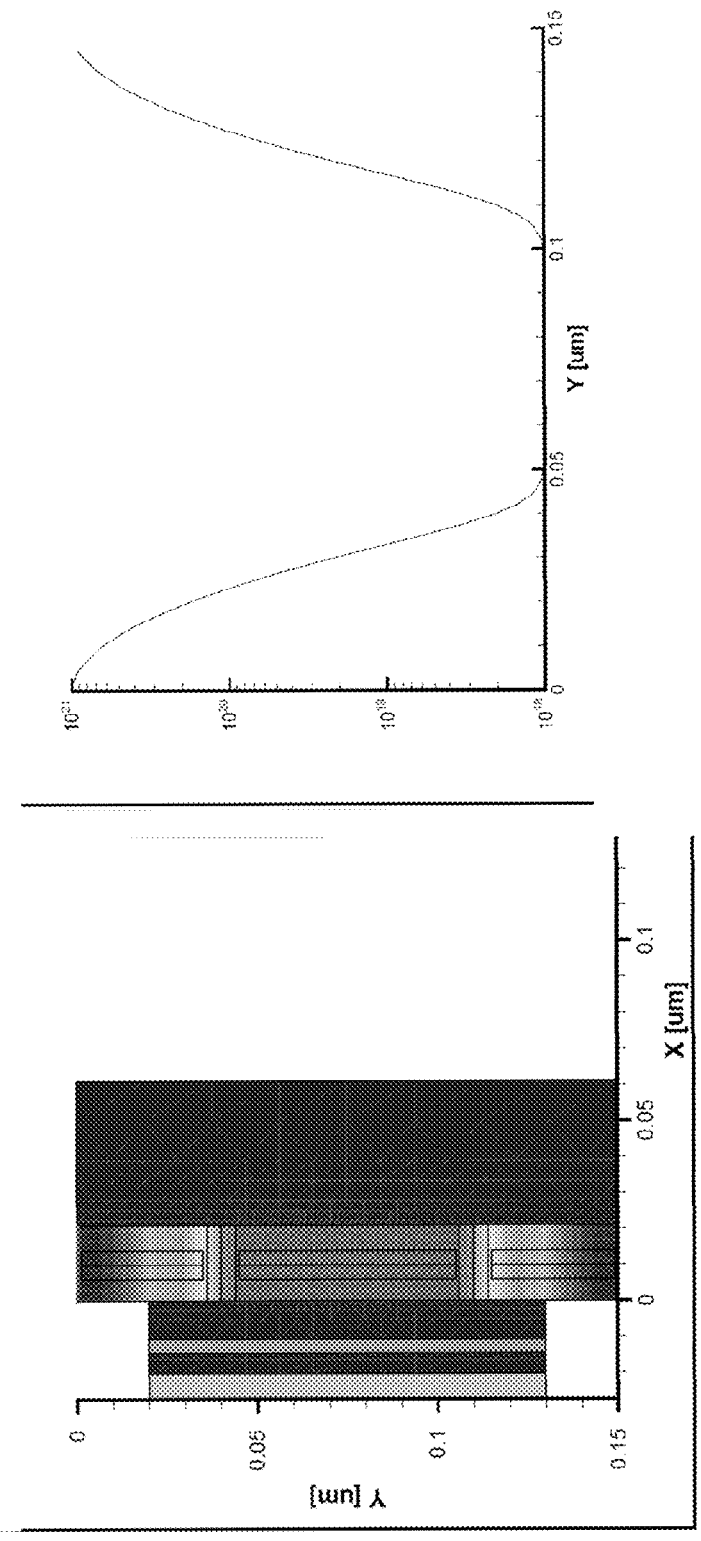
FIG. 30 shows a doping profile for the WL select gate in accordance with one embodiment.

FIG. 30 shows a doping profile for the WL select gate in accordance with one embodiment. In one embodiment, the TFT is a depletion type with a P+ gate electrode and p-type body. The source and drains may be P+.

Figure 31:
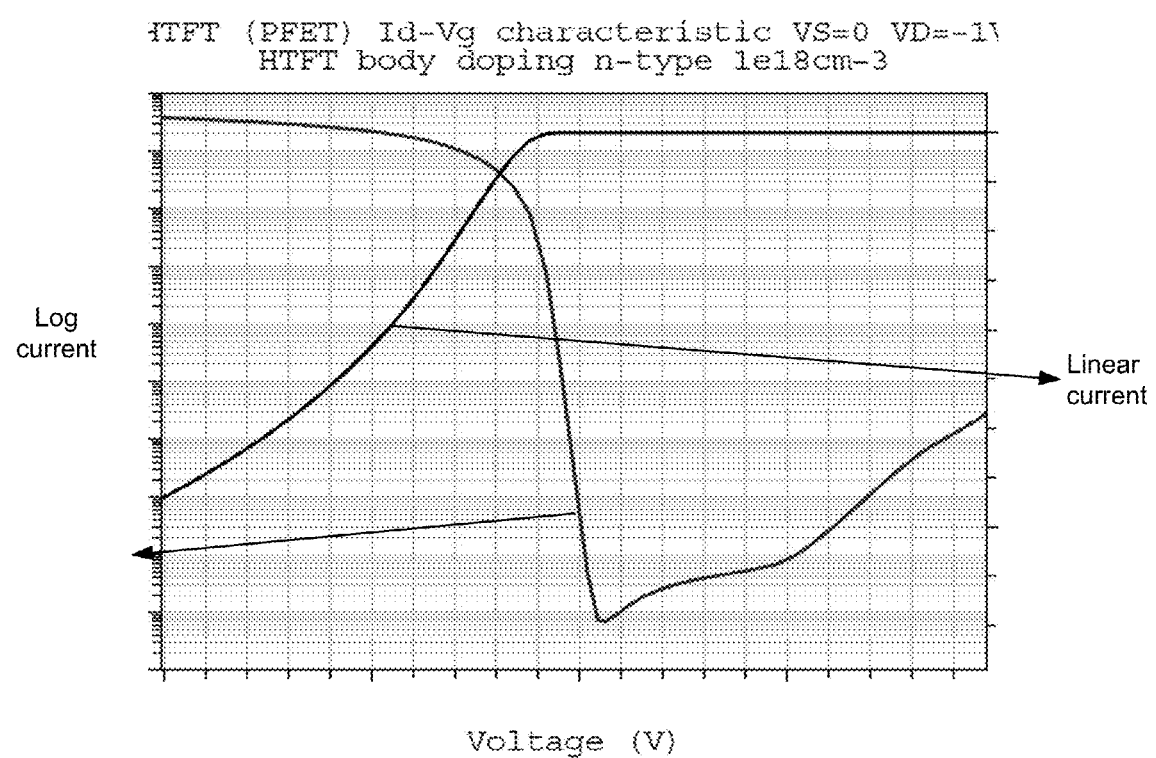
FIG. 31 shows an example of current versus voltage on a log and linear scale for one embodiment.

FIG. 31 shows an example of current versus voltage on a log and linear scale for one embodiment of a WL select gate transistor.

Figure 32:
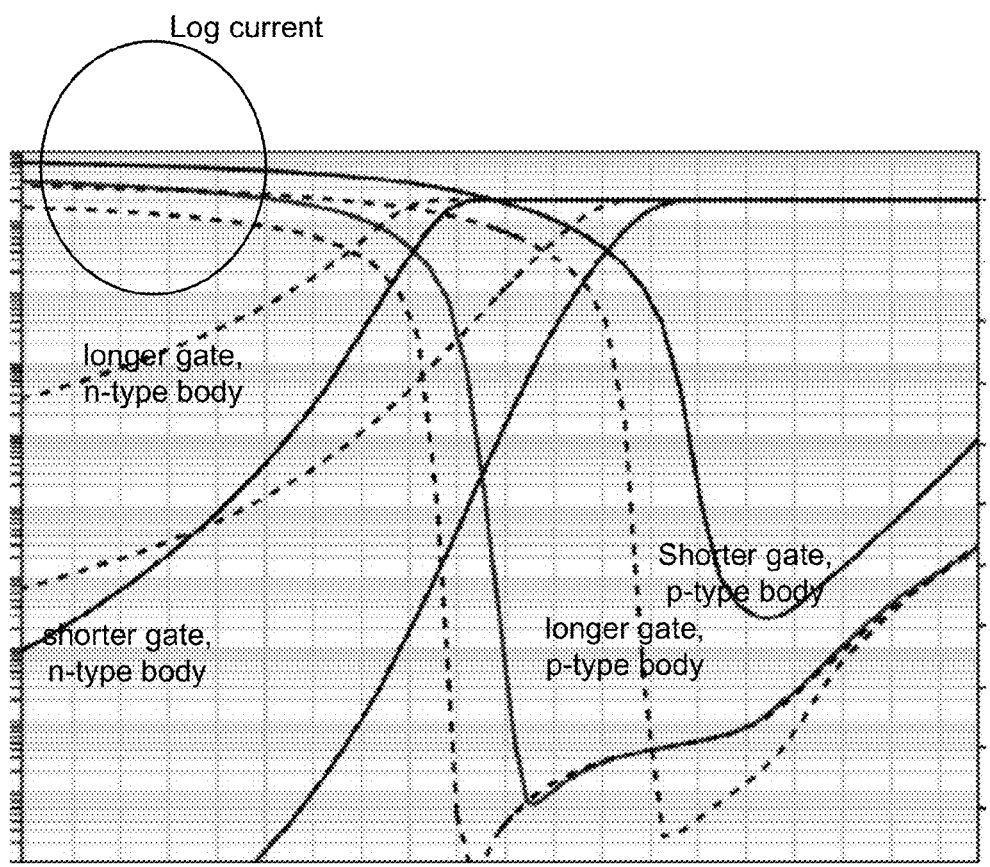
FIG. 32 shows gate length impact on I-V of WL select gate.

Gate length may impact performance of the WL select gate transistor. In FIG. 32, dashed lines are for a longer gate, solid lines are for a shorter gate. The circles curves are for log current, others are linear current.

Figure 33:
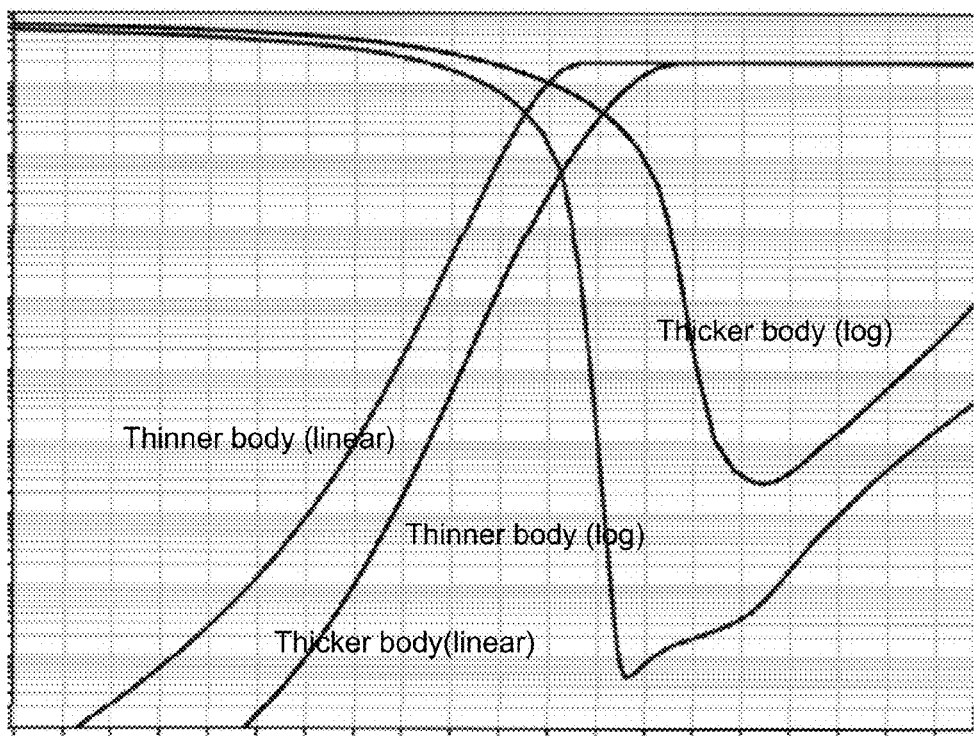
FIG. 33 shows curves of I-V for a p-type body.

The thickness of the body of the WL select gate transistor may impact performance. FIG. 33 shows curves of I-V for a p-type body.

The TFT structure examples in FIG. 29, 30, and I-V characteristics in FIGS. 31, 32 and 33 are just examples. In fact, they may be optimized based on 3D NAND requirements that would determine TFT requirements.

Figure 34:
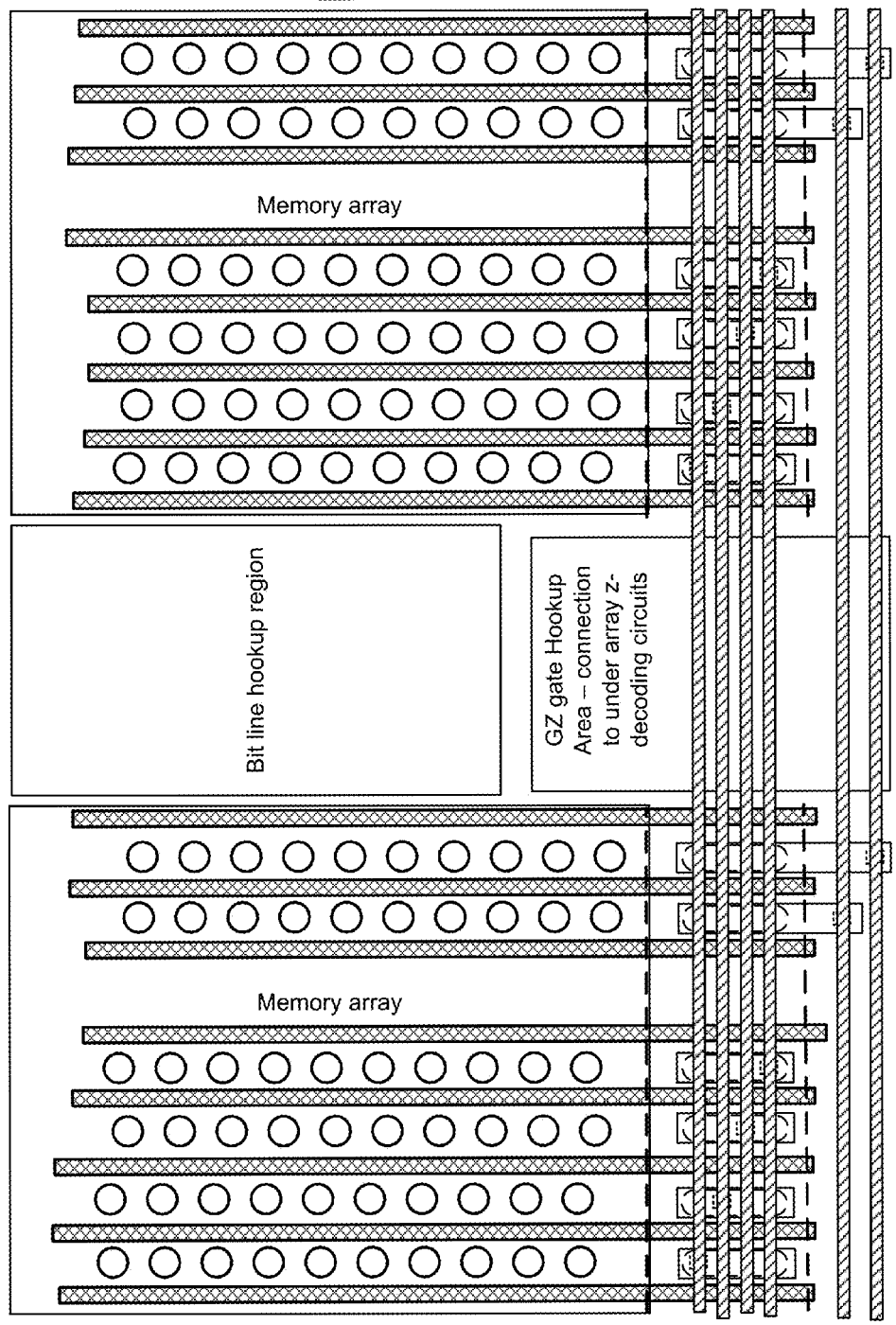
FIG. 34 shows a diagram of one embodiment of a location for connections of the WL select gates to z-decoders.

FIG. 34 shows a diagram of one embodiment of a location for connections of the GZ selection lines 517 to z-decoders. A portion of the memory array is depicted with slits and memory holes. In one embodiment, there is a bit line hookup region in the memory array. Referring back to FIG. 2E, the bit line hookup region could run the length of the memory array as in lines 115a, 115b, 117a, 117b. As noted, those regions allow connections to the S/A, in one embodiment. Note that lines 115a, 115b, 117a, 117b may be extended outside of the memory array into the WL select gate region 303. This extension is represented in FIG. 34 as the WL select gate hookup area, which allows connections of the select lines 517 to z-decoding circuits (which may be under the memory array). Note that the z-decoding circuits may thus be under the stack of alternating polysilicon and insulator layers. Note that FIG. 34 shows select lines 517, and other elements 511, 513, 515 that are depicted in and discussed with respect to FIG. 5H1. Note that this embodiment does not require blocks to be made larger to accommodate the WL select gates and associated connections. Also note that the z-decoding circuits could be placed outside of the memory array.

Note that blocks in a 3D non-volatile storage device (such as BiCS) may be quite large. For example, a 24 layer BiCS could have 9 MB per block, a 32 layer BiCS could have 16 MB per block. This has the possibility of having erase issues. However, embodiments with TFT decoding solve issues of large block size, and erase issues. In one embodiment, erase can be performed at a sub-block level. This may be a small fraction of the physical block. For example, a sub-block of 512 KB may be erased instead of 16 MB. As one example of this, for 32 layers, a sub-block erase can be half of one NAND string. In one embodiment, individual WL erase is performed. Even a smaller erase may be possible.

Figure 35:
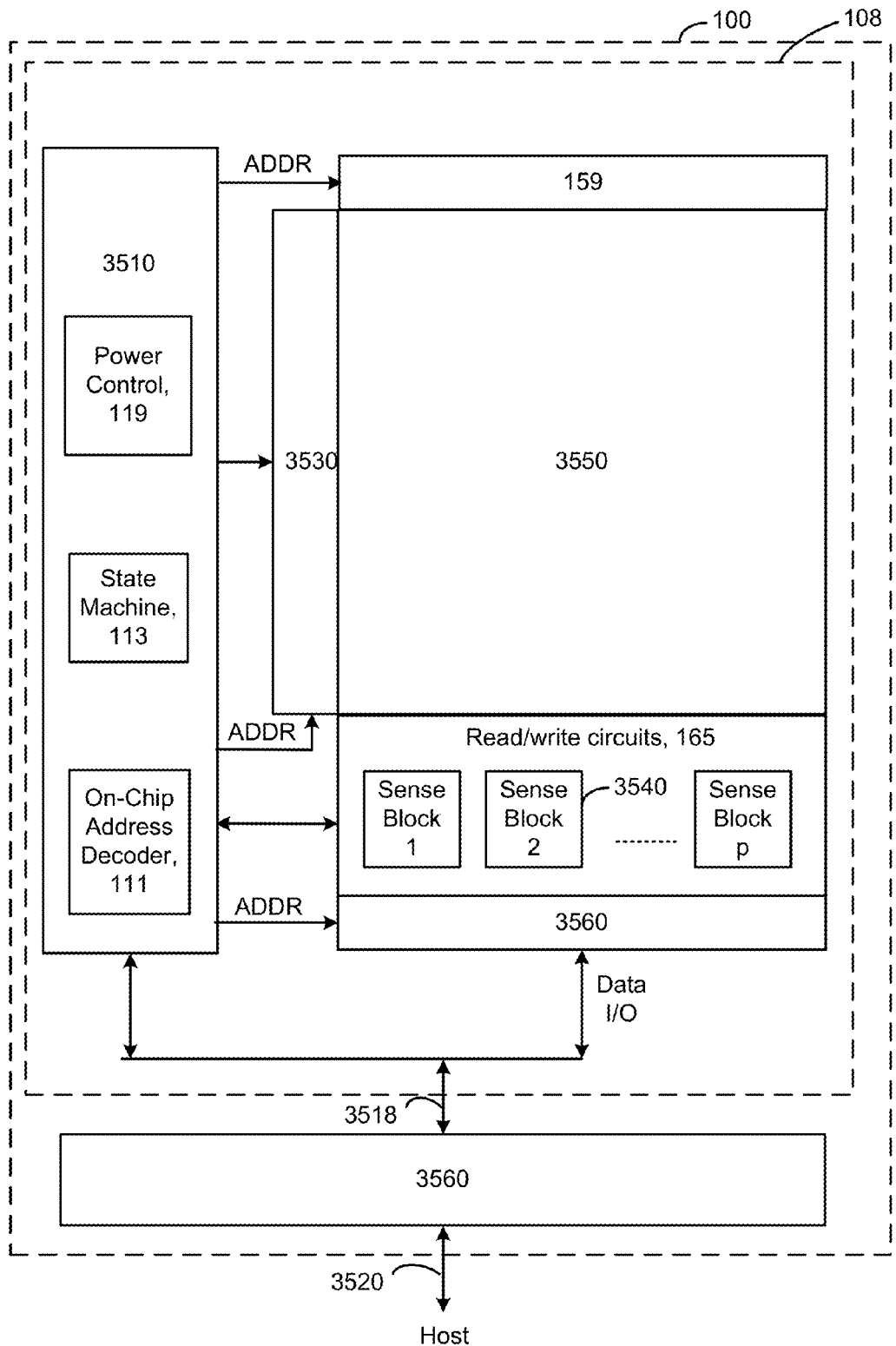
FIG. 35 is a functional block diagram of one embodiment of a 3D stacked non-volatile memory device having 3D decoding.

FIG. 35 is a functional block diagram of one embodiment of a 3D stacked non-volatile memory device having 3D decoding. The memory device 100 may include one or more memory die 108. The memory die 108 includes a 3D (three-dimensional) memory array of storage elements 3550, control circuitry 3510, and read/write circuits 165. The memory array 3550 is addressable by word line plates via a row (x) decoder 3530, by bit lines via a column (y) decoder 3560, and by sub-blocks via a WL select gate (z) decoder 159. The read/write circuits 165 include multiple sense blocks 3540 (sensing circuitry) and allow a page or other unit of storage elements to be read or programmed in parallel. Typically a controller 3560 is included in the same memory device 100 (e.g., a removable storage card) as the one or more memory die 108. Commands and data are transferred between the host and controller 3560 via lines 3520 and between the controller and the one or more memory die 108 via lines 3518.

The control circuitry 3510 cooperates with the read/write circuits 165 to perform memory operations on the memory array 3550, and includes a state machine 113, an on-chip address decoder 111, and a power control module 119. The state machine 113 provides chip-level control of memory operations. The on-chip address decoder 111 provides an address interface between that used by the host or a memory controller to the hardware address used by the decoders 3530, 3560, and 159. The power control module 119 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 3550, can be thought of as at least one control circuit. For example, at least one control circuit may include any one of, or a combination of, control circuitry 110, state machine 113, decoders 3530/3560/159, power control 119, sense blocks 3540, read/write circuits 165, and controller 3550, and so forth.

In another embodiment, a non-volatile memory system uses dual x/y/z decoders and read/write circuits. Access to the memory array 3550 by the various peripheral circuits may be implemented in a symmetric fashion, on opposite sides of the array, so that the densities of access lines and circuitry on each side are reduced by half. Thus, the row decoder may split into two row decoders, the column decoder into two column decoders, and the sub-block decoder into two sub-block decoders. Similarly, the read/write circuits may be split into read/write circuits connecting to bit lines from the bottom and read/write circuits connecting to bit lines from the top of the array 150. In this way, the density of the read/write modules is reduced by one half. Also, more than two decoders of a given type may be used.

Note that the locations of the various decoders in FIG. 35 is not necessarily representative of actual physical locations relative to the memory array 3550.

Other types of non-volatile memory in addition to NAND flash memory can also be used with embodiments disclosed herein.

One embodiment includes a 3D stacked non-volatile storage device, comprising a plurality of word lines layers comprising conductor material. Each word line layer comprises at least one word line plate and a plurality of word lines. Each of the word line plates is associated with multiple ones of the plurality of word lines. The device also comprises a plurality of insulator layers alternating with the word line layers in a stack. The device also comprises a plurality of non-volatile storage element strings. Each non-volatile storage element string comprises a plurality of non-volatile storage elements. Each of the non-volatile storage elements is associated with one of the plurality of word lines. The device also comprises a plurality of word line select gates. An individual one of the word line select gates coupled between one of the word line plates and a first word line of the multiple ones of the word lines associated with the word line plate to allow selection of the first word line.

One embodiment includes a 3D stacked non-volatile storage device comprising a plurality of bit lines and a plurality of word lines layers comprising conductor material. Each word line layer comprises at least one word line plate and a plurality of word lines. Each of the word line plates is associated with multiple ones of the plurality of word lines. The device also comprises a plurality of insulator layers alternating with the word lines layers in a stack and a plurality of strings of non-volatile storage elements. Each of the strings is associated with one of the bit lines. Each of the non-volatile storage elements is associated with one of the word lines. The device also comprises a first decoder that selects the word line plates, a second decoder that selects the bit lines, and a third decoder that selects between word lines associated with a particular word line plate.

One embodiment includes a 3D stacked non-volatile storage device comprising a plurality of word lines layers comprising conductor material having a comb structure. The comb has a base and fingers extending from the base. The fingers form word lines. The base forms a word line plate hookup region. The device has a plurality of insulator layers alternating with the word line layers in a stack, and a plurality of NAND strings. Each NAND string comprises a plurality of non-volatile storage elements. Each of the non-volatile storage elements is associated with one of the plurality of word lines. The device comprises a plurality of word line select gates. Multiple ones of the word line select gates are associated with each of the comb structures. Each of the word line select gates switchably couples a given finger to the base of the respective comb structure.

One embodiment includes a 3D stacked non-volatile storage device comprising a plurality of insulator layers and a plurality of word lines layers comprising conductor material alternating with the insulator layers in a stack. Each of the word line layers has a word line plate hookup region, a word line region, and a word line select gate region interposed between the word line plate hookup region and the word line region. The word line region comprises a plurality of word lines. The word line select gate region comprises a plurality of word line select gates for selecting the word lines. The device also comprises a plurality of NAND strings. Each NAND string comprises a plurality of non-volatile storage elements. Each of the non-volatile storage elements is associated with one of the plurality of word lines.

One embodiment includes a method of forming a 3D stacked non-volatile storage device, comprising forming a plurality of word lines layers comprising conductor material. Each word line layer comprises a word line plate and a plurality of word lines that include heavily doped polysilicon. Each of the word line plates is associated with multiple ones of the plurality of word lines. The method comprises forming a plurality of insulator layers alternating with the word line layers in a stack and forming a plurality of non-volatile storage element strings. Each non-volatile storage element string comprises a plurality of non-volatile storage elements. Each of the non-volatile storage elements is associated with one of the plurality of word lines. The method includes forming a plurality of word line select gates. An individual one of the word line select gates is coupled between one of the word line plates and a first of the plurality of word lines to allow selection of the first word line.

One embodiment includes a method of forming a 3D stacked non-volatile storage device, comprising forming a plurality of word lines layers comprising conductor material. Each word line layer comprises a word line plate and a plurality of word lines. Each of the word line plates is associated with multiple ones of the plurality of word lines. The method comprises forming a plurality of insulator layers alternating with the word line layers in a stack. The method comprises forming a plurality of sets of NAND strings. Each NAND string comprises a plurality of non-volatile storage elements. Each of the non-volatile storage elements is associated with one of the plurality of word lines. The method comprises forming a plurality of word line select transistors in the word line layers at ends of the plurality of word lines.

One embodiment includes a method of forming a 3D stacked non-volatile storage device, comprising forming a plurality of insulator layers and forming a plurality of word lines layers comprising conductor material alternating with the insulator layers in a stack. Forming the plurality of word lines layers includes forming a word line plate hookup region, forming a word line region comprising a plurality of word lines, and forming a word line select gate region interposed between the word line plate hookup region and the word line region. The word line select gate region comprises a plurality of word line select gates for selecting the word lines. The method also comprises forming a plurality of NAND strings. Each NAND string comprises a plurality of non-volatile storage elements. Each of the non-volatile storage elements is associated with one of the plurality of word lines.

One embodiment includes a method of forming a thin film transistor (TFT) comprising forming a layer of polysilicon, and forming a first hole in the polysilicon. The first hole having a sidewall. A gate dielectric layer is formed on the sidewall leaving a second hole inside the gate dielectric layer. A gate electrode layer is formed in the second hole on the gate dielectric layer. A body in the layer of polysilicon is formed adjacent to the gate dielectric layer. Drain and source regions are formed in the layer of polysilicon adjacent to the body.

One embodiment includes a method of forming a set of thin film transistors (TFT), comprising forming a plurality of layers of conductor material, and forming a plurality of insulator layers alternating with the layers of conductor material in a stack. A first hole having a sidewall is formed in the plurality of layers of conductor material and the plurality of insulator layers. A gate dielectric layer for the TFTs is formed on the sidewall of the first hole leaving a second hole inside the gate dielectric layer. A gate electrode layer for the TFTs is formed in the second hole on the gate dielectric layer. Bodies for the TFTs are formed adjacent to the gate dielectric layer. Drain and source regions for the TFTs are formed in the layer of conductor material adjacent to the bodies.

One embodiment includes a device comprising a horizontal layer comprising conductor material. The device has a thin film transistor (TFT) in the horizontal layer comprising conductor material. The TFT includes a gate electrode and a gate dielectric adjacent to the gate electrode. An interface between the gate electrode and gate dielectric extends vertically with respect to the horizontal layer comprising conductor material. The TFT includes a body adjacent to the gate dielectric. An interface between the gate dielectric and body extends vertically with respect to the horizontal layer comprising conductor material.

One embodiment includes a device comprising a plurality of horizontal layers comprising conductor material and a plurality of horizontal insulator layers alternating with the conductor material in a stack. The device has a set of thin film transistors (TFT) in different ones of the horizontal layers comprising conductor material. Ones (e.g., individual ones) of the TFTs in the set includes a gate electrode. The gate electrodes of the set of TFTs are coupled together by conductor material. Ones of the TFTs in the set includes a gate dielectric adjacent to the gate electrode. An interface between the gate electrode and gate dielectric runs vertically with respect to the plurality of horizontal layers comprising conductor material. Ones of the TFTs in the set includes a body formed from polysilicon adjacent to the gate dielectric. An interface between the gate dielectric and body runs vertically with respect to the plurality of horizontal layers comprising conductor material. Ones of the TFTs in the set includes a source and a drain.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A 3D stacked non-volatile storage device, comprising:
   a plurality of word lines layers comprising a conductor, each word line layer comprising at least one word line plate and a plurality of word lines, each of the word line plates is associated with multiple ones of the plurality of word lines;
   a plurality of insulator layers alternating with the word line layers in a stack;
   a plurality of non-volatile storage element strings, each non-volatile storage element string comprises a plurality of non-volatile storage elements, each of the non-volatile storage elements is associated with one of the plurality of word lines; and
   a plurality of word line select gates, an individual one of the word line select gates coupled between one of the word line plate and a first word line of the multiple ones of the word lines associated with the word line plate to allow selection of the first word line.

2. The 3D stacked non-volatile storage device of claim 1, further comprising:
   a z-decoder that selects the word line select gates.

3. The 3D stacked non-volatile storage device of claim 2, further comprising:
   a plurality of bit lines associated with the plurality of non-volatile storage element strings;
   an x-decoder that selects individual ones of the word line plates; and
   a y-decoder that selects individual ones of the bit lines.

4. The 3D stacked non-volatile storage device of claim 2, further comprising a plurality of word line select lines, each of the word line select lines coupled to multiple ones of the plurality of word line select gates at a different level of the 3D stacked non-volatile storage device, the z-decoder selects individual ones of the word line select lines.

5. The 3D stacked non-volatile storage device of claim 1, wherein an individual word line select gate selects two or more of the word lines, each of the word lines is associated with a separate line of non-volatile storage elements.

6. The 3D stacked non-volatile storage device of claim 1, wherein an individual word line select gate selects a single word line.

7. The 3D stacked non-volatile storage device of claim 1, further comprising a plurality of word line plate drivers, each of the word line plates is driven by one of the word line plate drivers.

8. The 3D stacked non-volatile storage device of claim 1, wherein the plurality of non-volatile storage element strings are NAND strings.

9. The 3D stacked non-volatile storage device of claim 1, wherein the individual one of the word line select gates comprises a thin film transistor (TFT) that has a width that is defined by a thickness of a first of the word lines layers.

10. The 3D stacked non-volatile storage device of claim 1, wherein the first word line runs in a first direction, the individual one of the word line select gates comprises a thin film transistor (TFT) that has a channel that runs in the first direction.

11. The 3D stacked non-volatile storage device of claim 1, wherein the individual one of the word line select gates comprises a thin film transistor (TFT) that has a gate electrode and a gate dielectric adjacent to the gate electrode, a plane where the gate dielectric and gate electrode meet runs perpendicular to a plane of the word line layers.

12. The 3D stacked non-volatile storage device of claim 11, wherein the thin film transistor (TFT) has a body adjacent to the gate dielectric, a plane where the gate dielectric and body meet runs perpendicular to the plane of the word line layers.

13. A 3D stacked non-volatile storage device, comprising:
   a plurality of bit lines;
   a plurality of word lines layers comprising a material that is a conductor, each word line layer comprising at least one word line plate and a plurality of word lines, each of the word line plates is associated with multiple ones of the plurality of word lines;
   a plurality of insulator layers alternating with the word lines layers in a stack;
   a plurality of strings of non-volatile storage elements, each of the strings associated with one of the bit lines, each of the non-volatile storage elements is associated with one of the word lines;
   a first decoder that selects the word line plates;
   a second decoder that selects the bit lines; and
   a third decoder that selects between word lines associated with a particular word line plate.

14. The 3D stacked non-volatile storage device of claim 13, wherein the third decoder selects between groups of adjacent word lines associated with a particular word line plate.

15. The 3D stacked non-volatile storage device of claim 13, further comprising:
   a plurality of word line select gates, an individual one of the word line select gates coupled between one of the word line plates and a first word line of the multiple ones of word lines associated with the word line plate, the third decoder selects the individual word line select gate to select the first word line.

16. The 3D stacked non-volatile storage device of claim 15, further comprising a word line select line coupled to multiple ones of the plurality of word line select gates that are each at a different level of the 3D stacked non-volatile storage device, the third decoder selects the word line select line.

17. The 3D stacked non-volatile storage device of claim 13, wherein the plurality of word line select gates each comprise a thin film transistor (TFT), a cross section of the TFT taken in a plane in a first of the word line layers comprises portions of a gate electrode, a gate dielectric, a body, a drain, and a source.

18. The 3D stacked non-volatile storage device of claim 13, wherein the plurality of non-volatile storage element strings are NAND strings.

19. A 3D stacked non-volatile storage device, comprising:
   a plurality of word lines layers comprising a material that is a conductor, the layers having a comb structure, the comb having a base and fingers extending from the base, the fingers forming word lines, the base forming a word line plate hookup region;
   a plurality of insulator layers alternating with the word line layers in a stack;
   a plurality of NAND strings, each NAND string comprises a plurality of non-volatile storage elements, each of the non-volatile storage elements is associated with one of the plurality of word lines; and a plurality of word line select gates, multiple ones of the word line select gates are associated with each of the comb structures, each of the word line select gates switchably couples a given finger to the base of the respective comb structure.

20. The 3D stacked non-volatile storage device of claim 19, further comprising:
a plurality of bit lines, each of the NAND strings associated with one of the bit lines;
a first decoder that selects an individual one of the comb structures;
a second decoder that selects an individual one of the bit lines; and
a third decoder that selects an individual one of the fingers associated with a selected comb structure.

21. The 3D stacked non-volatile storage device of claim 19, wherein the plurality of word line select gates reside in a region between the base and the fingers of a given comb structure, the region comprises a plurality of thin film transistors (TFT) that serve as the word line select gates.

22. A 3D stacked non-volatile storage device, comprising:
a plurality of insulator layers;
a plurality of word lines layers comprising a conductor alternating with the insulator layers in a stack, each of the word line layers having a word line plate hookup region, a word line region, and a word line select gate region interposed between the word line plate hookup region and the word line region, the word line region comprising a plurality of word lines, the word line select gate region comprises a plurality of word line select gates for selecting the word lines; and
a plurality of NAND strings, each NAND string comprises a plurality of non-volatile storage elements, each of the non-volatile storage elements is associated with one of the plurality of word lines.

23. The 3D stacked non-volatile storage device of claim 22, further comprising:
a plurality of bit lines, each of the NAND strings is associated with a bit line;
a first decoder that selects individual ones of the word line plate hookup regions;
a second decoder that selects individual ones of the bit lines; and
a third decoder that selects sets of the word line select gates that include a word line select gate at each of the plurality of word lines layers.

24. The 3D stacked non-volatile storage device of claim 22, further comprising a plurality of drivers, each of the drivers is coupled to one of the word line plate hookup regions.

25. The 3D stacked non-volatile storage device of claim 22, wherein the plurality of word line select gates for selecting the word lines include vertical gate/width thin film transistors (TFT).

26. The 3D stacked non-volatile storage device of claim 22, further comprising a plurality of select lines and a plurality of bit lines, each of the word line select gates is coupled to one of the select lines, the plurality of select lines run parallel to the plurality of bit lines.

27. The 3D stacked non-volatile storage device of claim 26, further comprising first decoding circuits that select the select lines and second decoding circuits that select the bit lines, the plurality of bit lines couple to the second decoding circuits through one or more openings in the plurality of word lines layers, the plurality of select lines couple to the first decoding circuits through one or more openings in the plurality of word lines layers.

28. The 3D stacked non-volatile storage device of claim 26, further comprising first decoding circuits that select the select lines and second decoding circuits that select the bit lines, the first decoding circuits are located under the plurality of word line layers.

29. The 3D stacked non-volatile storage device of claim 22, further comprising a plurality of source lines, a group of the plurality of NAND strings are coupled to one of the source lines.

30. The 3D stacked non-volatile storage device of claim 22, further comprising a plurality of slits that provide electrical isolation, a given word line select gate is between two of the slits that also serve to define a set of the non-volatile storage elements associated with the NAND strings to be selected by the given word line select gate.

* * * * *